US009766547B2

(12) United States Patent
Takizawa et al.

(10) Patent No.: US 9,766,547 B2
(45) Date of Patent: Sep. 19, 2017

(54) PATTERN FORMING METHOD, ACTINIC RAY-SENSITIVE OR RADIATION-SENSITIVE RESIN COMPOSITION, RESIST FILM, METHOD OF MANUFACTURING ELECTRONIC DEVICE USING THE SAME, AND ELECTRONIC DEVICE

(71) Applicant: FUJIFILM Corporation, Tokyo (JP)

(72) Inventors: Hiroo Takizawa, Shizuoka (JP); Shuji Hirano, Shizuoka (JP); Natsumi Yokokawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/864,868

(22) Filed: Sep. 25, 2015

(65) Prior Publication Data

US 2016/0011517 A1 Jan. 14, 2016

Related U.S. Application Data

(63) Continuation of application No. PCT/JP2014/059008, filed on Mar. 27, 2014.

(30) Foreign Application Priority Data

Mar. 29, 2013 (JP) ................................ 2013-075279
Jul. 23, 2013 (JP) ................................ 2013-153102
Mar. 26, 2014 (JP) ................................ 2014-064613

(51) Int. Cl.
*G03F 7/32* (2006.01)
*G03F 7/20* (2006.01)
*G03F 7/40* (2006.01)
*G03F 7/039* (2006.01)
*G03F 7/038* (2006.01)
*G03F 7/004* (2006.01)

(52) U.S. Cl.
CPC ............ *G03F 7/325* (2013.01); *G03F 7/0045* (2013.01); *G03F 7/0046* (2013.01); *G03F 7/038* (2013.01); *G03F 7/0382* (2013.01); *G03F 7/0397* (2013.01); *G03F 7/20* (2013.01); *G03F 7/2004* (2013.01); *G03F 7/2041* (2013.01); *G03F 7/2059* (2013.01); *G03F 7/32* (2013.01); *G03F 7/405* (2013.01)

(58) Field of Classification Search
None
See application file for complete search history.

(56) References Cited

U.S. PATENT DOCUMENTS

| | | | | |
|---|---|---|---|---|
| 8,703,401 | B2 | 4/2014 | Furukawa et al. | |
| 8,980,539 | B2 | 3/2015 | Furukawa et al. | |
| 2002/0061462 | A1 | 5/2002 | Uenishi | |
| 2010/0248143 | A1 | 9/2010 | Ito et al. | |
| 2011/0159433 | A1 | 6/2011 | Takahashi et al. | |
| 2011/0236826 | A1* | 9/2011 | Hatakeyama | C07C 69/54 430/270.1 |
| 2011/0300485 | A1 | 12/2011 | Tsubaki et al. | |
| 2012/0077131 | A1 | 3/2012 | Enomoto et al. | |
| 2012/0308938 | A1* | 12/2012 | Furukawa | G03F 7/327 430/325 |
| 2013/0065183 | A1 | 3/2013 | Kobayashi et al. | |
| 2013/0230804 | A1 | 9/2013 | Sakakibara et al. | |
| 2014/0004467 | A1 | 1/2014 | Hirano et al. | |
| 2016/0048082 | A1* | 2/2016 | Kojima | G03F 7/20 428/172 |

FOREIGN PATENT DOCUMENTS

| | | |
|---|---|---|
| EP | 2530525 | 12/2012 |
| JP | 2002-148806 | 5/2002 |
| JP | 2008-268935 | 11/2008 |
| JP | 2010-085971 | 4/2010 |
| JP | 2010-217884 | 9/2010 |
| JP | 2010-256856 | 11/2010 |
| JP | 2011-123469 | 6/2011 |
| JP | 5056974 | 10/2012 |
| JP | 2013011833 | 1/2013 |

(Continued)

OTHER PUBLICATIONS

"Written Opinion of the International Searching Authority of PCT/JP2014/059008", this report contains the following items: Form PCT/ISA237(cover sheet), PCT/ISA237(Box No. I), and PCT/ISA237(Box No. V), mailed on Apr. 28, 2014, which is an English translation of "Written Opinion of the International Searching Authority", pp. 1-7.
"Office Action of Japan Counterpart Application", issued on Mar. 22, 2016, pp. 1-8, with machine English translation thereof.
"International Search Report (Form PCT/ISA/210)", mailed on Apr. 28, 2014, with English translation thereof, pp. 1-4.
"Office Action of Japan Counterpart Application," issued on Aug. 16, 2016, with machine translation thereof, p. 1-p. 4.
"Office Action of Korea Counterpart Application" with English translation thereof, issued on Jan. 5, 2017, p. 1-p. 11.
"Office Action of Taiwan Counterpart Application," with partial English translation thereof, dated Jun. 13, 2017, pp. 1-10.
"Office Action of Korean Counterpart Application", dated Jul. 18, 2017, with English translation thereof, pp. 1-5.

(Continued)

*Primary Examiner* — Sin Lee
(74) *Attorney, Agent, or Firm* — Jianq Chyun IP Office

(57) ABSTRACT

There is provided a pattern forming method, including: (1) forming a film using an actinic ray-sensitive or radiation-sensitive resin composition, (2) exposing the film with actinic ray or radiation, (3) developing the film exposed by using a developer containing an organic solvent, wherein the actinic ray-sensitive or radiation-sensitive resin composition contains (A) a resin having a repeating unit (R) with a structural moiety capable of decomposing upon irradiation with an actinic ray or radiation to generate an acid, and (B) a solvent, and the developer contains an additive that causes at least one interaction selected from the group consisting of an ionic bond, a hydrogen bond, a chemical bond and a dipole interaction with respect to a polar group contained in the resin (A) after the exposing.

11 Claims, No Drawings

(56) References Cited

FOREIGN PATENT DOCUMENTS

| | | | |
|---|---|---|---|
| JP | 2013011858 | | 1/2013 |
| JP | 2013-057836 | | 3/2013 |
| KR | 20110107299 | | 9/2011 |
| WO | WO 2011/149035 | A1 * | 12/2011 |
| WO | 2012/053527 | | 4/2012 |
| WO | 2012/114963 | | 8/2012 |
| WO | 2012-121278 | | 9/2012 |
| WO | WO 2014/178285 | A1 * | 11/2014 |

* cited by examiner

PATTERN FORMING METHOD, ACTINIC RAY-SENSITIVE OR RADIATION-SENSITIVE RESIN COMPOSITION, RESIST FILM, METHOD OF MANUFACTURING ELECTRONIC DEVICE USING THE SAME, AND ELECTRONIC DEVICE

CROSS REFERENCE TO RELATED APPLICATION(S)

This is a continuation of International Application No. PCT/JP2014/059008 filed on Mar. 27, 2014, and claims priority from Japanese Patent Application Nos. 2013-075279 filed on Mar. 29, 2013, 2013-153102 filed on Jul. 23, 2013 and 2014-064613 filed on Mar. 26, 2014, the entire disclosures of which are incorporated herein by reference.

BACKGROUND

1. Technical Field

The present invention relates to a pattern forming method which use a developer containing an organic solvent that is suitable for an ultra-micro lithography process, such as the manufacture of an ultra-large-scale integrated circuit or a high-volume microchip, or other photo-fabrication processes, an actinic ray-sensitive or radiation-sensitive resin composition, a resist film, a method of manufacturing an electronic device using the same, and an electronic device. More particularly, the present invention relates to a pattern forming method which use a developer containing an organic solvent that is suitable for micro-machining a semiconductor element using an electron beam or EUV light (wavelength: around 13 nm), an actinic ray-sensitive or radiation-sensitive resin composition, a resist film, a method of manufacturing an electronic device using the same, and an electronic device.

2. Background Art

In a conventional manufacturing process for a semiconductor device, such as an IC or LSI, micro-machining is carried out by lithography using a photoresist composition. Recently, with the high density integration of an integrated circuit, the formation of an ultra-fine pattern is required for a submicron area or a quarter-micron area. Accordingly, an exposure wavelength tends to be short, such as a change from the g-line to the i-line, or a KrF excimer laser beam. In addition, currently, the lithography is being developed using electron beams, X-rays, or EUV light as well as the excimer laser beam.

The light lithography using the electron beams, X-rays, or EUV will become a next-generation or a post-next generation pattern formation technology. To this end, a resist composition having high sensitivity and high resolution is required.

Particularly, in order to shorten a wafer processing time, the high sensitivity is very important. However, the pursuit of the high sensitivity may cause a reduction in resolution expressed in a pattern shape or a limiting resolution line width. Therefore, there is a pressing need for a resist composition that is capable of satisfying both the characteristics.

It is very important to simultaneously satisfy the high sensitivity, the high resolution, and the good pattern shape, because they are in a trade-off relation.

The actinic ray-sensitive or radiation-sensitive resin composition is typically classified into a positive type and a negative type: the positive type forms a pattern by solubilizing an exposed portion for an alkali developer by the exposure of radiation using resin that is sparingly soluble or insoluble in the alkali developer, whereas the negative type forms a pattern by making the exposed portion sparingly soluble or insoluble for the alkali developer by the exposure of radiation using resin that is soluble in the alkali developer.

As the actinic ray-sensitive or radiation-sensitive resin composition that is appropriate for the lithography process using the electron beams, X-rays, or EUV light, a chemical amplification positive type resist composition using an acid-catalyzed reaction is mainly considered in terms of high sensitivity. A phenolic resin (hereinafter, referred to as a phenolic acid-decomposable resin) that is insoluble or sparingly soluble in the alkali developer but has solubility in the alkali developer by the action of an acid, and a chemical amplification positive type resist composition composed of an acid generator are effectively used as main components of the aforementioned composition.

Meanwhile, the manufacture of a semiconductor element and the like requires the formation of a pattern having various shapes, such as a line, a trench or a hole. In order to form the patterns having various shapes, the negative type actinic ray-sensitive or radiation-sensitive resin composition as well as the positive type ray-sensitive or radiation-sensitive resin composition is being developed (see, e.g., Japanese Patent Laid-Open Publication No. 2002-148806 and Japanese Patent Laid-Open Publication No. 2008-268935).

The formation of the ultra-fine pattern requires the prevention of a reduction in resolution and a further improvement in a pattern shape. In order to solve the problems, the use of resin having a photo-acid generating group on a main chain or side chain of a polymer is considered (Japanese Patent Laid-Open Publication No. 2010-85971 and Japanese Patent Laid-Open Publication No. 2010-256856). Further, a method of developing acid-decomposable resin using developers other than an alkali developer (Japanese Patent Laid-Open Publication No. 2010-217884 and Japanese Patent Laid-Open Publication No. 2011-123469), a method of developing acid-decomposable resin using developers other than an alkali developer by acid-decomposable resin carrying PAG (International Publication No. 2012/114963), or a method of developing acid-decomposable resin using an organic-based developer to which a nitrogen-containing compound is added (Japanese Patent Publication No. 5056974) have been proposed.

However, as a pattern becomes finer recently, an ultra-fine area (for example, an area having a line width of 50 nm or less) is required, which simultaneously satisfies high sensitivity, high resolution and the performance of decreasing film reduction, exposure latitude (EL), and the local-pattern-dimension uniformity (local-CDU) in a highly advanced manner. Therefore, it is required to further improve the conventional pattern forming method.

An object of the present invention is to provide an actinic ray-sensitive or radiation-sensitive resin composition, a resist film, a method of manufacturing an electronic device using the same, and an electronic device, which are intended to improve performance in micro-machining of a semiconductor element using an actinic ray or radiation properties, thus simultaneously satisfying the high sensitivity, the high resolution and the performance of decreasing the film reduction, the exposure latitude (EL), and the local-pattern-dimension uniformity (local-CDU) in a highly advanced manner.

SUMMARY

The above-described problems are found to be solved by the following configuration.

[1] A pattern forming method, including: (1) forming a film using an actinic ray-sensitive or radiation-sensitive resin composition, (2) exposing the film with actinic ray or radiation, (3) developing the exposed film using a developer that contains an organic solvent, wherein the actinic ray-sensitive or radiation-sensitive resin composition contains (A) a resin having a repeating unit (R) with a structural moiety capable of decomposing upon irradiation with an actinic ray or radiation to generate an acid, and (B) a solvent, and the developer contains an additive that cause at least one interaction selected from the group consisting of an ionic bond, a hydrogen bond, a chemical bond and a dipole interaction with respect to a polar group contained in the resin (A) after the exposing.

[2] The pattern forming method described in [1], wherein the additive is a nitrogen-containing compound.

[3] The pattern forming method described in [1] or [2], wherein the structural moiety of the repeating unit (R) is a structural moiety capable of generating an acid group in a side chain of the resin (A) upon irradiation with an actinic ray or radiation.

[4] The pattern forming method described in [3], wherein the structural moiety of the repeating unit (R) capable of generating an acid group in a side chain of the resin (A) upon irradiation with an actinic ray or radiation is an ionic structural moiety.

[5] The pattern forming method described in [3] or [4], wherein the acid group generated in the structural moiety of the repeating unit (R) capable of generating the acid group in the side chain of the resin (A) upon irradiation with an actinic ray or radiation is a sulfonate group or an imidate group.

[6] The pattern forming method described in any one of [1] to [5], wherein the resin (A) further has a repeating unit having a group capable of decomposing by the action of an acid.

[7] The pattern forming method described in [6], wherein the repeating unit having the group capable of decomposing by the action of an acid is represented by the following Formula (II-1) or (1):

(II-1)

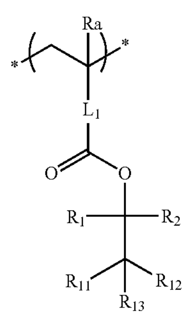

-continued (1)

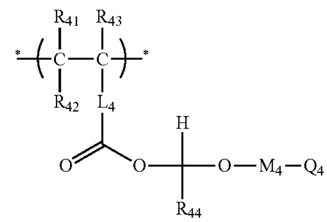

In Formula (II-1), each of $R_1$ and $R_2$ independently represents an alkyl group, each of $R_{11}$ and $R_{12}$ independently represents an alkyl group, $R_{13}$ represents a hydrogen atom or an alkyl group. $R_{11}$ and $R_{12}$ may combine with each other to form a ring, $R_{11}$ and $R_{13}$ may combine with each other to form a ring. Ra represents a hydrogen atom, an alkyl group, a cyano group or a halogen, and $L_1$ represents a single bond or a divalent linking group.

In Formula (1), each of $R_{41}$, $R_{42}$ and $R_{43}$ independently represents a hydrogen atom, an alkyl group, a cycloalkyl group, a halogen atom, a cyano group or an alkoxy carbonyl group. $R_{42}$ and $L_4$ may combine with each other to form a ring, in which $R_{42}$ represents an alkylene group. $L_4$ represents a single bond or a divalent linking group, and represents a trivalentlinking group when $R_{42}$ and $L_4$ combine with each other to form the ring.

$R_{44}$ represents a hydrogen atom, an alkyl group, a cycloalkyl group, an aryl group, an aralkyl group, an alkoxy group, an acyl group or a heterocyclic group. $M_4$ represents a single bond or a divalent linking group. $Q_4$ represents an alkyl group, a cycloalkyl group, an aryl group or a heterocyclic group. At least two of $Q_4$, $M_4$ and $R_{44}$ may combine with each other to form a ring.

[8] The pattern forming method described in [7], wherein the repeating unit having the group capable of decomposing by the action of an acid is a repeating unit represented by the following Formula (I).

[9] The pattern forming method described in any one of [1] to [8], wherein the resin (A) further has a repeating unit represented by the following Formula (I):

(I)

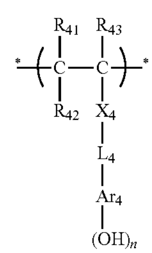

In Formula (I), each of $R_{41}$, $R_{42}$ and $R_{43}$ independently represents a hydrogen atom, an alkyl group, a halogen atom, a cyano group or an alkoxy carbonyl group. However, $R_{42}$ may combine with $Ar_4$ to form a ring, and in this case, $R_{42}$ represents a single bond or an alkylene group. $X_4$ represents a single bond, —COO—, or —$CONR_{64}$—, and represents a trivalentlinking group when combining with $R_{42}$ to form a ring. $R_{64}$ represents a hydrogen atom or an alkyl group. $L_4$ represents a single bond or an alkylene group. $Ar_4$ represents a (n+1)-valent aromatic ring group, and represents a (n+2)-valent aromatic ring group when combining with $R_{42}$ to form a ring. n is an integer of 1 to 4.

[10] The pattern forming method described in [9], wherein, in Formula (I), $X_4$ and $L_4$ are a single bond.

[11] The pattern forming method described in any one of [1] to [10], wherein the actinic ray or radiation is an electron beam or extreme-ultraviolet light.

[12] An actinic ray-sensitive or radiation-sensitive resin composition including:

(A) a resin having a repeating unit (R) with a structural moiety capable of decomposing upon irradiation with an actinic ray or radiation to generate an acid; and (B) a solvent.

[13] The actinic ray-sensitive or radiation-sensitive resin composition according to [12], wherein the structural moiety of the repeating unit (R) is a structural moiety capable of generating an acid group in a side chain of the resin (A) upon irradiation with an actinic ray or radiation.

[14] The actinic ray-sensitive or radiation-sensitive resin composition according to [13], wherein the structural moiety of the repeating unit (R), capable of generating an acid group in a side chain of the resin (A) upon irradiation with an actinic ray or radiation, is an ionic structural moiety.

[15] The actinic ray-sensitive or radiation-sensitive resin composition according to [13] or [14], wherein the acid group generated in the structural moiety of the repeating unit (R), capable of generating the acid group in the side chain of the resin (A) upon irradiation with an actinic ray or radiation, is a sulfonate group or an imidate group.

[16] The actinic ray-sensitive or radiation-sensitive resin composition according to any one of [12] to [15], wherein the resin (A) further contains a repeating unit having a group capable of decomposing by the action of an acid.

[17] The actinic ray-sensitive or radiation-sensitive resin composition according to [16], wherein the repeating unit having the group capable of decomposing by the action of an acid is represented by Formula (II-1) or (1):

(II-1)

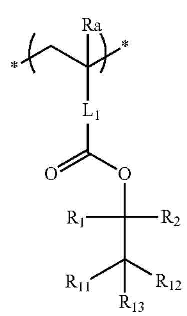

(1)

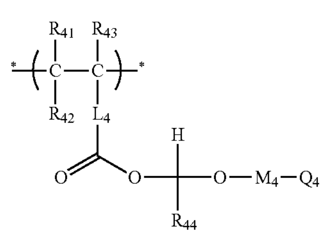

wherein, each of $R_1$ and $R_2$ independently represents an alkyl group, each of $R_{11}$ and $R_{12}$ independently represents an alkyl group, $R_{13}$ represents a hydrogen atom or an alkyl group, $R_{11}$ and $R_{12}$ may combine with each other to form a ring, $R_{11}$ and $R_{13}$ may combine with each other to form a ring, Ra represents a hydrogen atom, an alkyl group, a cyano group or a halogen, $L_1$ represents a single bond or a divalent linking group, each of $R_{41}$, $R_{42}$ and $R_{43}$ independently represents a hydrogen atom, an alkyl group, a cycloalkyl group, a halogen atom, a cyano group or an alkoxy carbonyl group, $R_{42}$ and $L_4$ may combine with each other to form a ring, in which $R_{42}$ represents an alkylene group, $L_4$ represents a single bond or a divalent linking group, and represents a trivalentlinking group when $R_{42}$ and $L_4$ combine with each other to form the ring, $R_{44}$ represents a hydrogen atom, an alkyl group, a cycloalkyl group, an aryl group, an aralkyl group, an alkoxy group, an acyl group or a heterocyclic group, $M_4$ represents a single bond or a divalent linking group, $Q_4$ represents an alkyl group, a cycloalkyl group, an aryl group or a heterocyclic group, at least two of $Q_4$, $M_4$ and $R_{44}$ may combine with each other to form a ring.

[18] The actinic ray-sensitive or radiation-sensitive resin composition according to [17], wherein the repeating unit having the group capable of decomposing by the action of an acid is a repeating unit represented by Formula (1).

[19] The actinic ray-sensitive or radiation-sensitive resin composition according to any one of [12] to [18], wherein the resin (A) further contains a repeating unit represented by Formula (I):

(I)

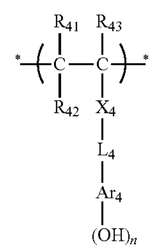

wherein each of $R_{41}$, $R_{42}$ and $R_{43}$ independently represents a hydrogen atom, an alkyl group, a halogen atom, a cyano group or an alkoxy carbonyl group, provided that $R_{42}$ may combine with $Ar_4$ to form a ring, and in this case, $R_{42}$ represents a single bond or an alkylene group, $X_4$ represents a single bond, —COO—, or —$CONR_{64}$—, and represents a trivalentlinking group when combining with $R_{42}$ to form a ring, $R_{64}$ represents a hydrogen atom or an alkyl group, $L_4$ represents a single bond or an alkylene group, $Ar_4$ represents a (n+1)-valent aromatic ring group, and represents a (n+2)-valent aromatic ring group when combining with $R_{42}$ to form a ring, and n is an integer of 1 to 4.

[20] The actinic ray-sensitive or radiation-sensitive resin composition according to [19], wherein $X_4$ and $L_4$ are a single bond.

[21] A resin film formed using the actinic ray-sensitive or radiation-sensitive resin composition described in [12].

[22] A method of manufacturing an electronic device comprising a pattern forming method described in any one of [1] to [11].

[23] An electronic device manufactured by the method of manufacturing the electronic device described in [22].

According to the present invention, it is possible to provide a pattern forming method satisfying high sensitivity, high resolution and performance of decreasing film reduction, exposure latitude (EL), and local pattern dimension uniformity (local-CDU) in a highly advanced manner, an actinic ray-sensitive or radiation-sensitive resin composition, a resist film, a method of manufacturing an electronic device using the same, and an electronic device.

DESCRIPTION OF EMBODIMENTS

Hereinafter, embodiments of the present invention will be described in detail.

In the notation of a group (atomic group) in the present specification, the representation which does not describe the substitution and unsubstitution includes a representation having a substituent along with a representation having no substituent. For example, "an alkyl group" includes not only an alkyl group having no substituent (an unsubstituted alkyl group) but also an alkyl group having a substituent (a substituted alkyl group).

The term "actinic ray" or "radiation" in the present specification refers to, for example, a bright line spectrum of a mercury lamp and the like, far-ultraviolet rays represented by an excimer laser, extreme-ultraviolet rays (EUV light), X-rays, an electron beam (EB) and the like. Further, the term "light" in the present invention refers to an actinic ray or radiation.

In addition, unless otherwise specifically indicated, the term "exposure" in the present specification includes not only the exposure performed using a mercury lamp, far-ultraviolet rays represented by an excimer laser, extreme-ultraviolet rays, X-rays, EUV light and the like, but also drawing performed by a particle beam such as an electron beam, an ion beam and the like.

The pattern forming method of the present invention includes:

(1) forming a film using an actinic ray-sensitive or radiation-sensitive resin composition;

(2) exposing the film using an actinic ray or radiation; and (3) developing the exposed film using a developer containing an organic solvent. The actinic ray-sensitive or radiation-sensitive resin composition contains (A) resin having a repeating unit (R) with a structural moiety capable of decomposing upon irradiation with an actinic ray or radiation to generate acid, and (B) a solvent, and the developer contains an additive that cause at least one interaction selected from the group consisting of an ionic bond, a hydrogen bond, a chemical bond and a dipole interaction with respect to a polar group contained in the resin (A) after exposure. As the additive, a nitrogen-containing compound is preferably used.

The example of the actinic ray or radiation may include infrared light, visible light, ultraviolet light, far ultraviolet light, X-ray, and an electron beam. The actinic ray or radiation more preferably has a wavelength of 250 nm or less, particularly 220 nm or less, for example. Specific examples of the actinic ray or radiation may include a KrF excimer laser (248 nm), an ArF excimer laser (193 nm), an F2 excimer laser (157 nm), an X-ray, an electron beam and the like. Preferred examples of the actinic ray or radiation may include a KrF excimer laser, an ArF excimer laser, an electron beam, an X-ray, and extreme-ultraviolet (EUV) light. The electron beam, the X-ray, and the EUV light are more preferred, and the electron beam or EUV light are still more preferred.

According to the aforementioned pattern forming method of the present invention, it is possible to provide a pattern forming method, an actinic ray-sensitive or radiation-sensitive resin composition, a resist film, a method of manufacturing an electronic device using the same, and an electronic device, which are capable of simultaneously satisfying the high sensitivity, the high resolution and the performance of decreasing the film reduction, in a highly advanced manner. The effect is remarkable particularly when the actinic ray or radiation is the electron beam, the X-ray, or the EUV light. The reason is unclear, but is estimated as follows.

In the pattern forming method of the present invention, it is considered that the resin (A) has the repeating unit (R) with the structural moiety capable of decomposing to generate acid upon irradiation with an actinic ray such as the electron beam or the radiation such as the EUV light and the structural moiety for generating acid is fixed to the resin, so that it is possible to suppress an acid diffusing length (to suppress acid from excessively diffusing into an unexposed portion) and thereby contribute to an improvement in resolution.

Particularly, the effect is remarkable when the structural moiety generating acid in the repeating unit (R) is the structural moiety generating an acid group in a side chain of the resin (A) upon irradiation with an actinic ray or radiation, when the structural moiety capable of generating the acid group in the side chain of the resin (A) upon irradiation with an actinic ray or radiation is an ionic structure, and when it is a structure generating sulfonic acid or imidic acid.

Further, if the resin having the repeating unit (R) is used, it is possible to reduce an amount of low-molecular-weight acid in the exposed portion, in comparison with a conventional case where a low-molecular compound is used as the main component of the acid generator. Thus, it is considered that the use of an organic-based developer may easily decrease solubility for the developer of the exposed portion, and the use of the resin containing the repeating unit (R) may particularly improve dissolution contrast for the organic-based developer, thus contributing to an improvement in resolution.

Furthermore, the pattern forming method of performing the exposure by the electron beam or extreme-ultraviolet light is expected to form a very fine pattern (for example, a pattern having a line width of 50 nm or less) well.

However, for example, when a line and space pattern, which is 50 nm or less in line width and is 1:1 in ratio of a line width and a space width, is formed, a stronger capillary force is easily generated in a fine space created during the developing, and when the developer is discharged from the space, this capillary force acts on a sidewall of a pattern having a fine line width. Further, if the positive type pattern is formed by the alkali developer, an affinity between the pattern having the resin as the main component and the alkali developer tends to be low, so that the capillary force acting on the sidewall of the pattern is large and thus the pattern is prone to destroy. In contrast, if the negative type pattern is formed by the organic-based developer as in the present invention, an affinity between the pattern having the resin as the main component and the organic-based developer tends to be high, so that a contact angle of the developer in the pattern sidewall becomes higher and thus it is possible to reduce the capillary force. As a result, it is though that the destruction of the pattern is prevented and a high resolution (superior limiting resolution) is achieved.

Moreover, when the organic-based developer contains the additive, particularly nitrogen-containing compound (amines, and the like) that forms at least one interaction of the ionic bond, the hydrogen bond, the chemical bond and the dipole interaction with the polar group included in the resin (A) after the exposure, it is guessed that the organic-based developer becomes more insoluble with respect to the organic-based developer, because of the interaction, such as the formation of salt, between an acidic group, such as carboxylic acid, generated in the exposed portion and the nitrogen-containing compound in the organic-based developer. As a result, it is considered that it is possible to decrease the film reduction, improve the Local-CDU and resolution due to the improvement in contrast, and achieve high sensitivity, and in addition, a contact angle a resist side is improved by the interaction such as the salt formation, thus preventing the formed pattern from being destroyed and improving the resolution.

Further, in comparison with a conventional system disclosed in patent document 8 using the acid-decomposable polymer and low-molecular-weight acid generator, it is though that the use of the polymer having both the acid generating portion and the acid-decomposable portion according to the present invention causes the sulfonic acid generated in the polymer from the acid generating portion to further interact with the nitrogen-containing compound. Therefore, the decrease in film reduction, the improvement in resolution and the high sensitivity can be more remarkably achieved.

In addition, since an acid diffusion length is short in the acid-decomposable polymer carrying the acid generating portion of the present invention, the EL becomes better. In the case of a polymer further containing a phenol moiety represented by hydroxy styrene as well as the aforementioned acid generating portion and acid-decomposable portion, it is considered that the phenol moiety also interacts with the nitrogen-containing compound, thus more remarkably achieving the decrease in film reduction, the improvement in resolution, and the high sensitivity.

That is, as described above, it is considered that the present invention can simultaneously satisfy the high sensitivity, the high resolution and the performance of decreasing the film reduction in the highly advanced manner, due to the improvement in resolution resulting from the reduction in capillary force, the decrease in film reduction resulting from the interaction between the acidic group and a basic compound, the improvement in resolution and sensitivity resulting from the improvement in contrast, and the further improvement in resolution, sensitivity and performance of decreasing the film reduction caused by the function of the repeating unit (R).

Hereinafter, the pattern forming method of the present invention will be described in detail.

<Pattern Forming Method>

The pattern forming method according to the present invention includes (1) a process of forming the resist film using the above-described composition, (2) a process of exposing the film by the actinic ray or radiation, and (3) a process of developing the exposed film using the organic-based developer. The method may further include (4) a process of rinsing the developed film using rinsing liquid.

The present invention also relates to the resist film that is formed using the above-described composition of the process (1).

It is also preferred that the method include, after the formation of the film, a prebake (PB) process before the exposure process. Further, it is also preferred that the method include a post exposure bake (PEB) process after the exposure process and before the development process.

As for a heating temperature, both the PB process and the PEB process are performed preferably at 40 to 130° C., more preferably at 50 to 120° C., and still more preferably at 60 to 110° C. Particularly, if the PEB process is performed at a low temperature of 60 to 90° C., the exposure latitude EL and the resolution can be remarkably improved.

Further, a heating time is preferably 30 to 300 seconds, more preferably 30 to 180 seconds, and still more preferably 30 to 90 seconds.

In the pattern forming method according to the present invention, a process of forming the film by the composition on a substrate, a process of exposing the film, a heating process, and a development process may be performed by a method that is generally known to those skilled in the art.

A light source used in the exposure is preferably the extreme-ultraviolet (EUV) light or the electron beam (EB).

A liquid immersion exposure may be applied to the film formed using the composition according to the present invention. This can further enhance the resolution. Any liquid may be used as the liquid immersion medium as long as the liquid is higher in refractive index than air. However, pure water is preferably used as the liquid immersion medium. In this case, the aforementioned hydrophobic resin may be previously added to the composition. Alternatively, as described above, after the film is formed, a topcoat may be provided thereon. Further, the performance and usage of the topcoat are found in chapter 7 of "Process and material of liquid immersion lithography" of CMC Publishing Co., Ltd.

When the topcoat is peeled off after the exposure, the developer may be used, or a peeling agent may be separately used. As the peeling agent, a solvent that rarely penetrates the film is preferred. Form the viewpoint that the peeling process may be performed simultaneously with the developing treatment process of the film, it is preferred that the topcoat be peeled off by the developer.

In the invention, the substrate on which the film is formed is not particularly limited. As this substrate, it is possible to apply a substrate that is generally used in the process of manufacturing a semiconductor such as an IC, the process of manufacturing a circuit substrate such as liquid crystal or thermal head, and the lithography process of other photofabrication processes. The example of the substrate may include an inorganic substrate such as silicone, SiN and $SiO_2$, and a coating-type inorganic substrate such as SOG. Furthermore, if necessary, an organic antireflection film may be formed between the film and the substrate.

As the organic-based developer, for example, a polar solvent such as a ketone-based solvent, an ester-based solvent, an alcohol-based solvent, an amide-based solvent and an ether-based solvent, and a hydrocarbon-based solvent may be used.

Examples of the ketone-based solvent may include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, methyl amyl ketone, acetyl acetone, acetonyl acetone, ionone, diacetonyl alcohol, acetyl carbinol, acetophenone, methyl naphthyl ketone, isophorone, propylene carbonate and the like.

Examples of the ester-based solvent may include methyl acetate, butyl acetate, ethyl acetate, isopropyl acetate, amyl acetate, isoamyl acetate, n-pentyl acetate, propylene glycol monomethyl ether acetate, propylene glycol monoethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl propionate, 3-methoxymethyl propionate (MMP), ethyl propionate, 3-ethoxy ethyl propionate (EEP), and propyl propionate. Particularly, alkyl ester acetate, such as methyl acetate, butyl acetate, ethyl acetate, isopropyl acetate and amyl acetate, or alkyl ester propionate, such as methyl propionate, ethyl propionate and propyl propionate, are preferred.

Examples of the alcohol-based solvent may include alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol and n-decanol; glycol such as ethylene glycol, diethylene glycol and triethylene glycol; and glycol ether such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent may include, in addition to the glycol ether-based solvents, dioxane, tetrahydrofuran and the like.

As the amide-based solvent, it is possible to use N-methyl-2-pyrrolidone, N,N-dimethylacetamide, N,N-dimethylformamide, hexamethylphosphoric triamide, and 1,3-dimethyl-2-imidazolidinone, for example.

Examples of the hydrocarbon-based solvent may include an aromatic hydrocarbon-based solvent such as toluene, xylene, and anisole, and an aliphatic hydrocarbon-based solvent such as pentane, hexane, octane and decane.

Two or more kinds of the aforementioned solvents may be mixed with each other. Further, the aforementioned solvents may be mixed with a solvent other than those described above or with water, as long as the mixture sufficiently exhibits a performance. However, it is preferred that the water content ratio of the entire developer is less than 10% by mass, and it is more preferred that the developer contains substantially no moisture. That is, it is preferred that the developer substantially contains only an organic solvent. Further, even in this case, the developer may contain a surfactant that will be described below. Further, in this case, the developer may contain inevitable impurities derived from the atmosphere.

The amount of the organic solvent used in developer is preferably 80% by mass to 100% by mass, more preferably 90% by mass to 100% by mass, and still more preferably 95% by mass to 100% by mass, based on the total amount of the developer.

In particular, the organic solvent contained in the developer is preferably at least one of the organic solvents selected from the group consisting of a ketone-based solvent, an ester-based solvent, an alcohol-based solvent, an amide-based solvent and an ether-based solvent.

The vapor pressure of the organic-based developer is preferably 5 kPa or less, more preferably 3 kPa or less, and particularly preferably 2 kPa or less, at 20° C. By adjusting the vapor pressure of the developer to 5 kPa or less, evaporation of the developer on a substrate or in a development cup is suppressed so that temperature uniformity in the wafer plane is enhanced, and as a result, the dimensional uniformity in the wafer plane is improved.

Specific examples of the developer having a vapor pressure of 5 kPa or less may include a ketone-based solvent such as 1-octanone, 2-octanone, 1-nonanone, 2-nonanone, 2-heptanone, 4-heptanone, 2-hexanone, diisobutyl ketone, cyclohexanone, methylcyclohexanone, phenylacetone and methyl isobutyl ketone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene, and an aliphatic hydrocarbon-based solvent such as octane and decane.

Specific examples of the developer having a vapor pressure of 2 kPa or less may include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, 4-methyl-2-pentanol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

In the pattern forming method of the present invention, the organic-based developer, namely, the developer having the organic solvent contains the additive that forms at least one interaction of the ionic bond, the hydrogen bond, the chemical bond and the dipole interaction with the polar group.

(Additive)

An additive used in this process is a compound that may form at least one interaction of the ionic bond, the hydrogen bond, the chemical bond and the dipole interaction with the polar group included in the resin (A) after the exposure. As described above, a predetermined interaction is formed between the resin (A) and the additive, so that the solubility of the resin (A) is changed, and thereby the film reduction is inhibited and the local-CDU, the sensitivity and the resolution are enhanced. Further, the ionic bond means an electrostatic interaction between a cation and an anion, and includes the formation of salt as well.

For the superior effect of the present invention, as the additive, at least one selected from a group consisting of an onium salt compound, a nitrogen-containing compound, and a phosphorus-based compound, may be used.

Hereinafter, respective compounds will be described in detail.

(Onium Salt Compound)

The onium salt compound means a compound having an onium salt structure. In addition, the onium salt structure refers to a salt structure generated by a coordinate bond between an organic component and a Lewis base. The onium salt compound mainly forms interaction by the ionic bond with the polar group. For example, if the polar group is a carboxyl group, the cation in the onium salt compound forms the electrostatic interaction (ionic bond) with a carboxyl-derived carboxyl anion (COO—).

The kind of the onium salt structure is not limited particularly, and may include a structure such as an ammonium salt having a cationic structure that will be shown below, a phosphonium salt, an oxonium salt, a sulfonium salt, a selenonium salt, a carbonium salt, a diazonium salt, or an iodonium salt, for example.

Further, the cation in the onium salt structure includes that having a positive charge on a heteroatom of a heterocyclic ring. Examples of such an onium salt may include pyridinium salt, imidazolium salt and the like.

Furthermore, herein, the pyridinium salt and the imidazolium salt are included as an aspect of the ammonium salt.

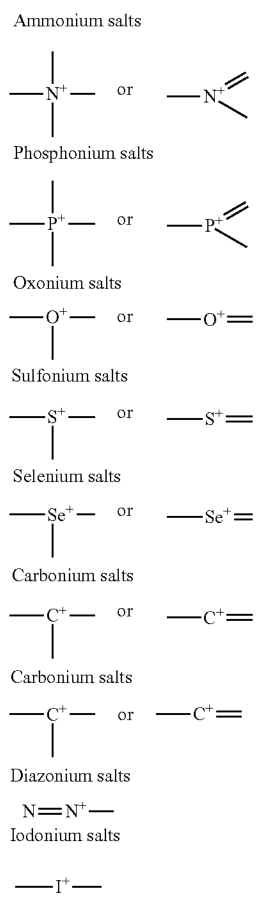

As the onium salt compound, a polyvalent onium salt compound having two or more onium ion atoms in one molecule is preferred in terms of the superior effect of the present invention. As the polyvalent onium salt compound, a compound to which two or more cations are connected by a covalent bond is preferred.

Examples of the polyvalent onium salt compound may include a diazonium salt, an iodonium salt, a sulfonium salt, an ammonium salt, and a phosphonium salt. Among them, the diazonium salt, the iodonium salt, the sulfonium salt, and the ammonium salt are preferred in that they are superior in the effect of the present invention, and in addition, the ammonium salt is more preferred in terms of stability.

Further, any anion may be used as the anion included in the onium salt compound (onium salt structure). Both monovalent ion and polyvalent ion are possible. Examples of the monovalent anion may include sulfonate anion, formate anion, carboxylate anion, sulfinate anion, boron anion, halide ion, phenol anion, alkoxy anion, hydroxide ion and the like. Further, examples of the divalent anion may include oxalate ion, phthalate ion, maleate ion, fumarate ion, tartrate ion, malate ion, lactate ion, sulfate ion, diglycolate ion, 2,5-flandicarboxylate ion and the like.

More specifically, examples of the monovalent anion may include $OH^-$, $Cl^-$, $Br^-$, $I^-$, $AlCl_4^-$, $Al_2Cl_7^-$, $BF_4^-$, $PF_6^-$, $ClO_4^-$, $NO_3^-$, $CH_3COO^-$, $CF_3COO^-$, $CH_3SO_3^-$, $CF_3SO_3^-$, $(CF_3SO_2)_2N^-$, $(CF_3SO_2)_3C^-$, $AsF_6^-$, $SbF_6^-$, $NbF_6^-$, $TaF_6^-$, $F(HF)_n^-$, $(CN)_2N^-$, $C_4F_9SO_3^-$, $(C_2F_5SO_2)_2N^-$, $C_3F_7COO^-$, $(CF_3SO_2)(CF_3CO)N^-$, $C_9H_{19}COO^-$, $(CH_3)_2PO_4^-$, $(C_2H_5)_2PO_4^-$, $C_2H_5OSO_3^-$, $C_6H_{13}OSO_3^-$, $C_8H_{17}OSO_3^-$, $CH_3(OC_2H_4)_2OSO_3^-$, $C_6H_4(CH_3)SO_3^-$, $(C_2F_5)_3PF_3^-$, $CH_3CH(OH)COO^-$, $B(C_6F_5)_4^-$, $FSO_3^-$, $C_6H_5O^-$, $(CF_3)_2CHO^-$, $(CF_3)_3CHO^-$, $C_6H_3(CH_3)_2O^-$, $C_2H_5OC_6H_4COO^-$ and the like.

Among them, the sulfonate anion, the carboxylate anion, bis(alkylsulfonyl)amide anion, tris(alkylsulfonyl)methide anion, $BF_4^-$, $PF_6^-$, $SbF_6^-$, $OH^-$ and like are preferred. Organic anion containing a carbon atom is more preferred.

Hereinafter, the specific example of the cation included in the onium salt structure will be illustrated.

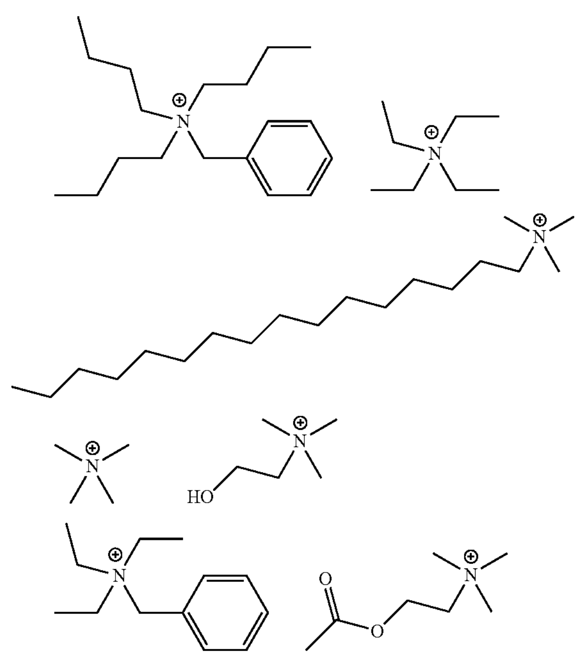

-continued
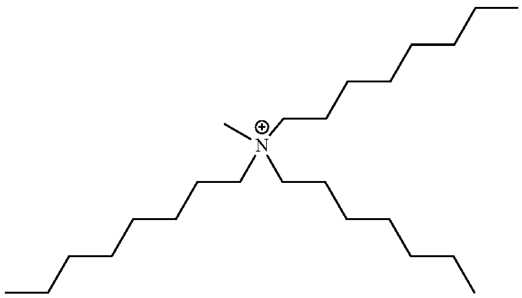
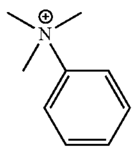
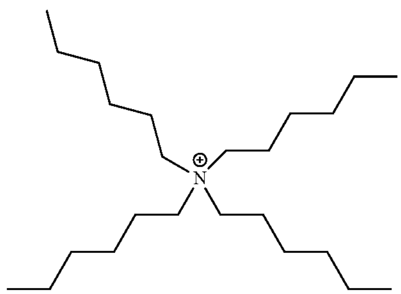
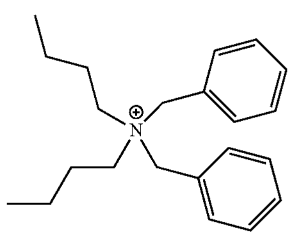
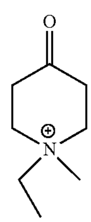
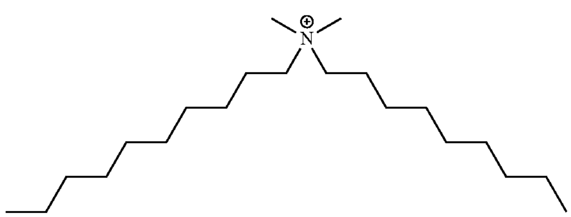
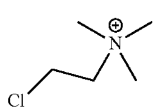
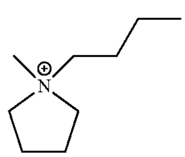
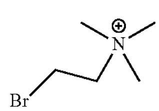
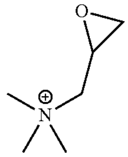
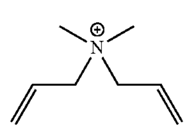
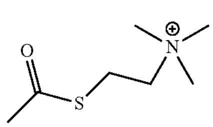
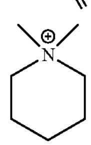
-continued
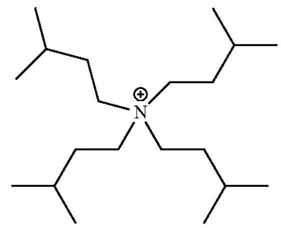
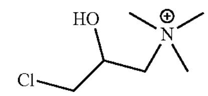
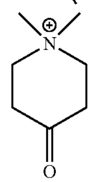
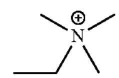
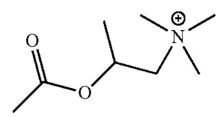
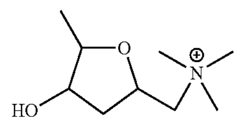
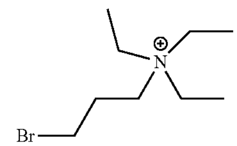
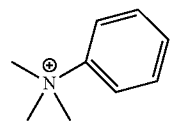
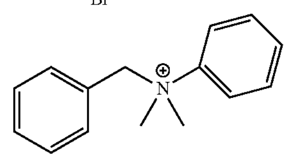
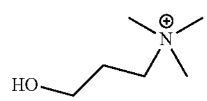
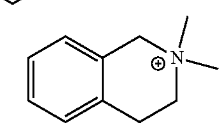
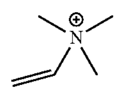
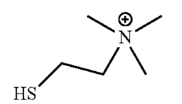
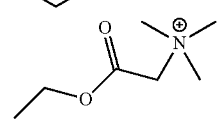
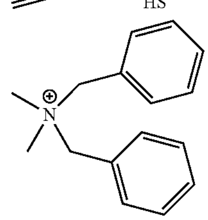
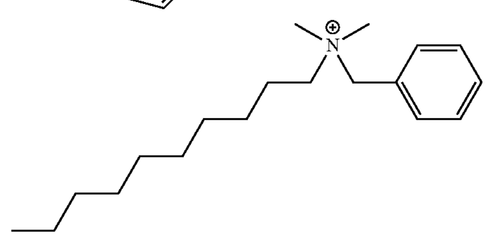
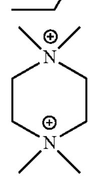
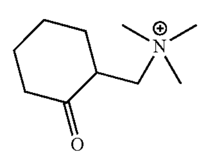
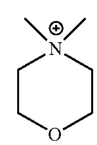
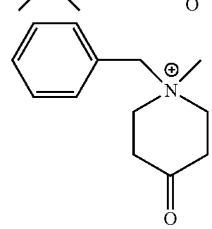
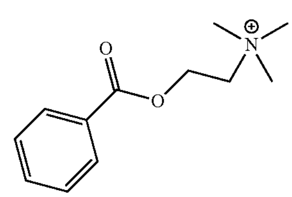

-continued
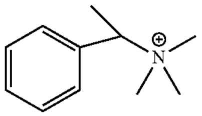
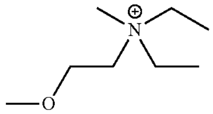
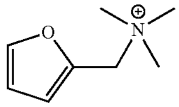
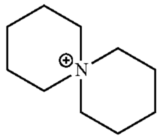
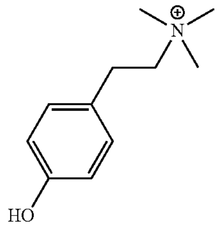
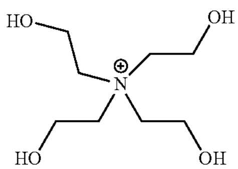
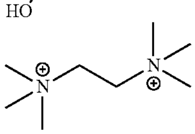
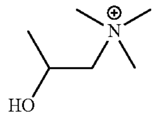
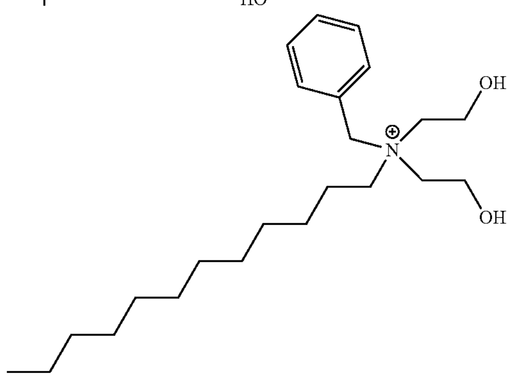
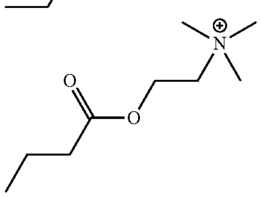
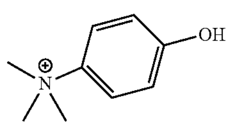
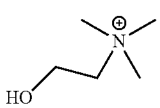
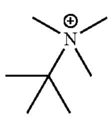
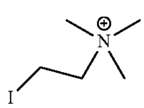
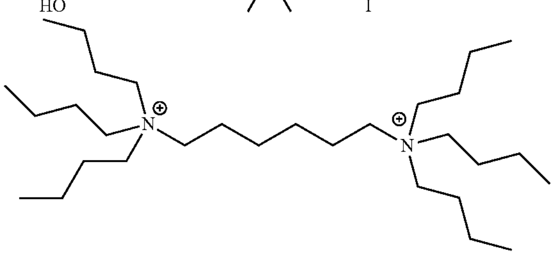
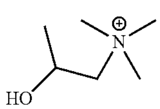
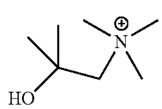
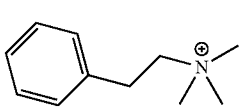
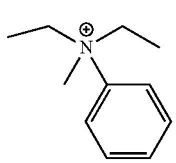
-continued
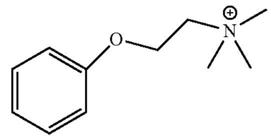
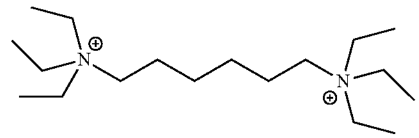
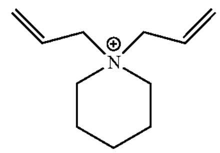
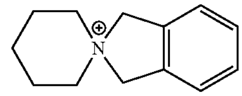
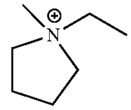
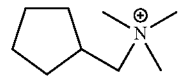
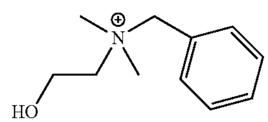
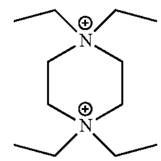
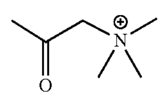
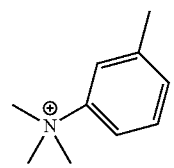
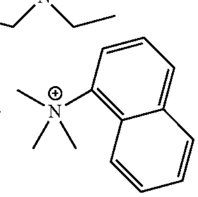
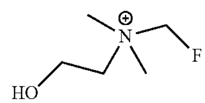
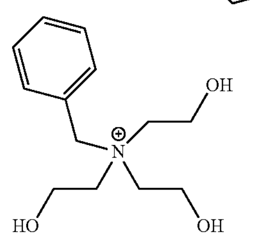
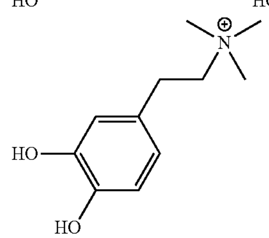
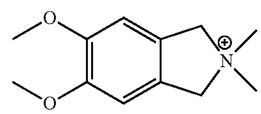
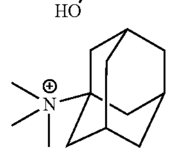
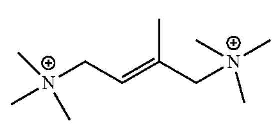
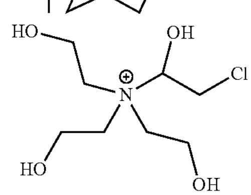
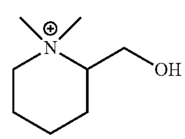

-continued
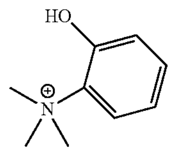
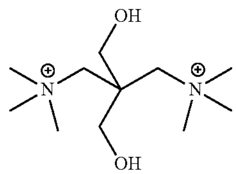
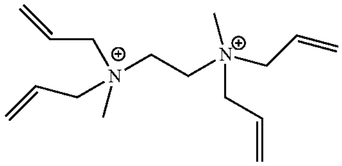
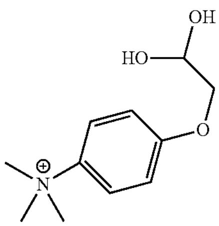
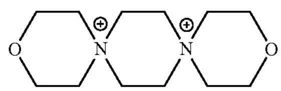
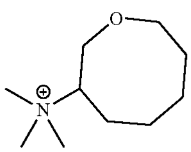
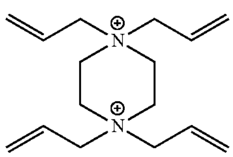
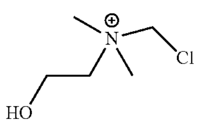
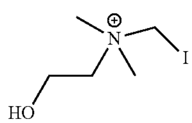
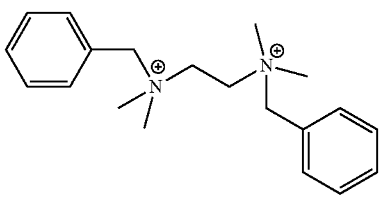
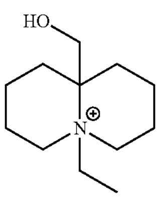
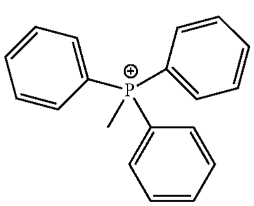
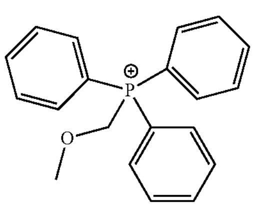
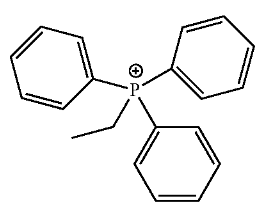
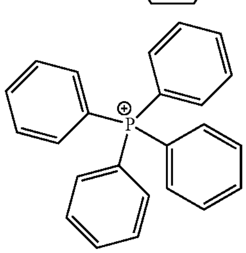
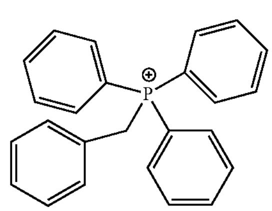
-continued
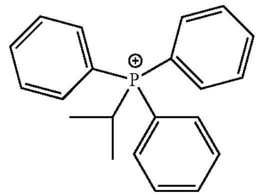
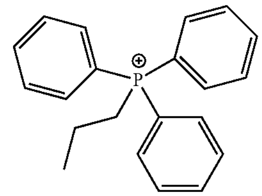
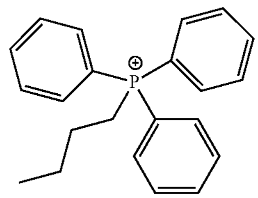
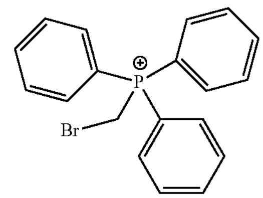
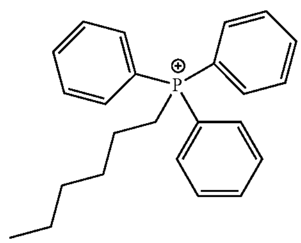
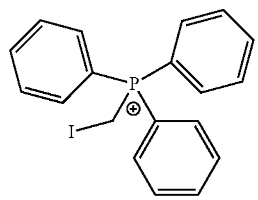
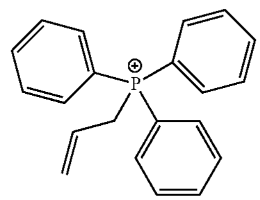
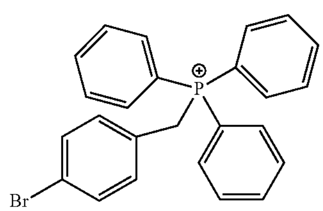
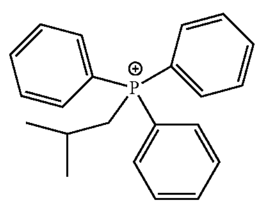
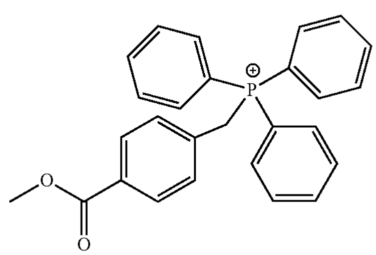
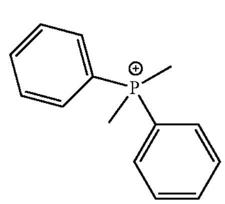
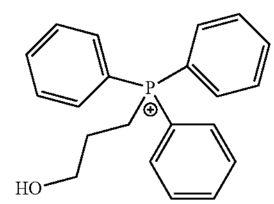

-continued
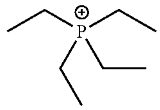
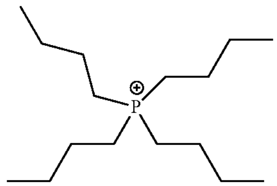
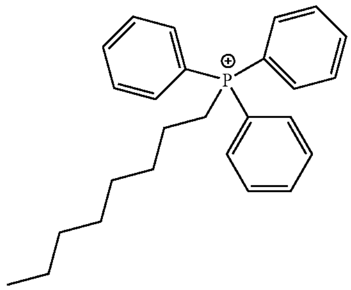
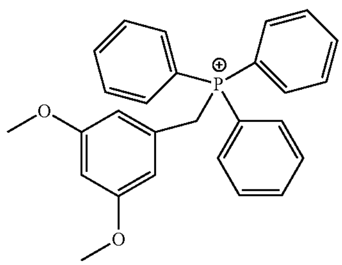
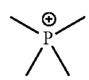
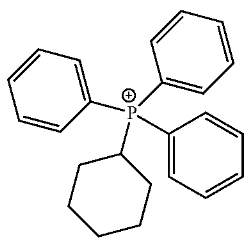
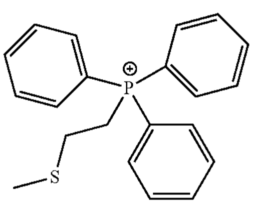
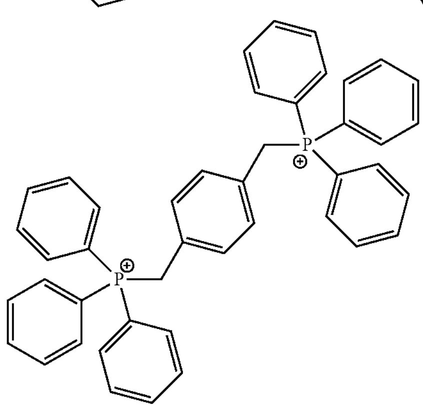
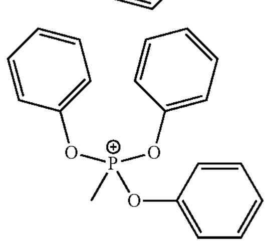
-continued
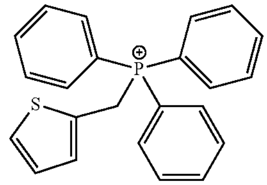
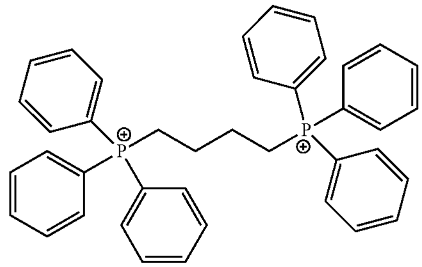
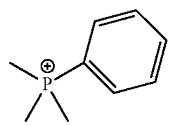
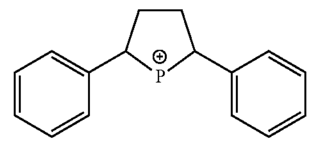
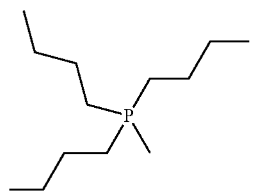
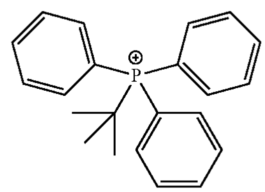
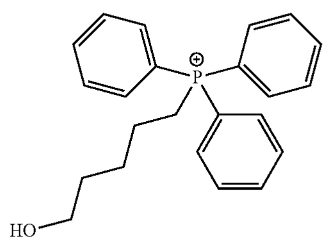
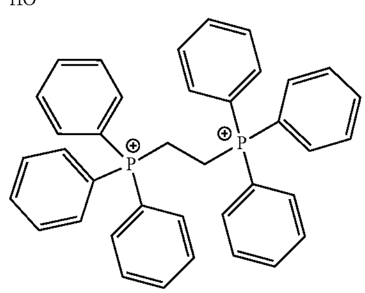
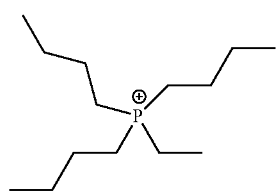
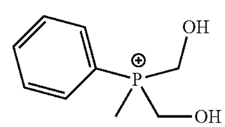
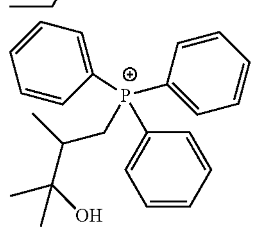
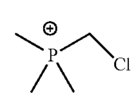

-continued
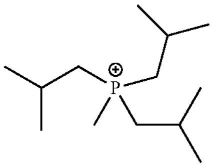
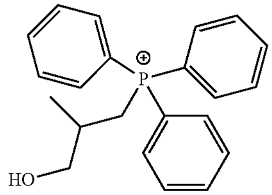
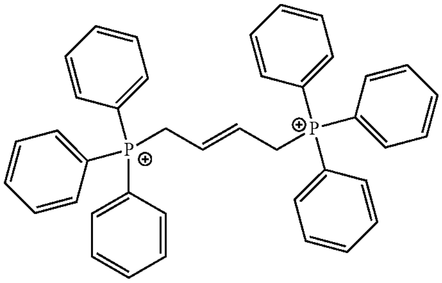
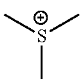
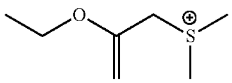
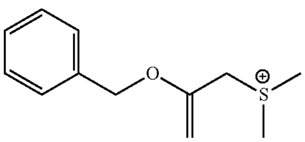
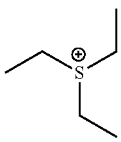
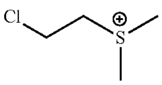
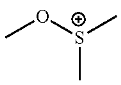
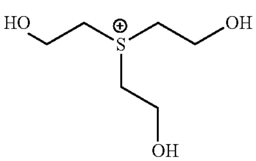
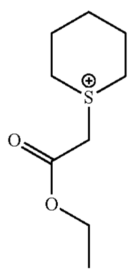
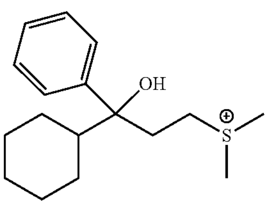
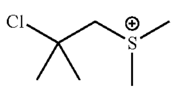
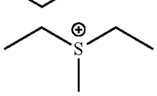
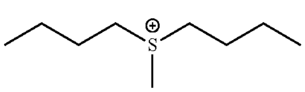
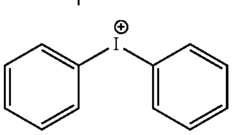
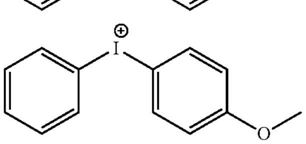
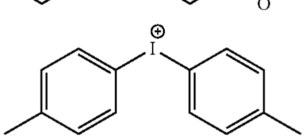
-continued
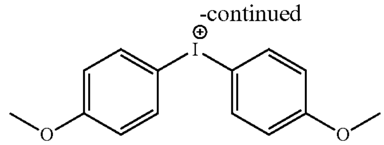
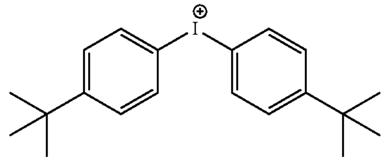
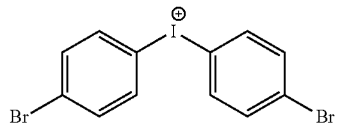
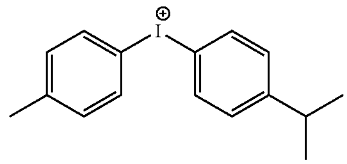
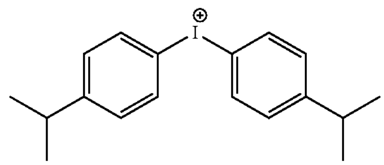
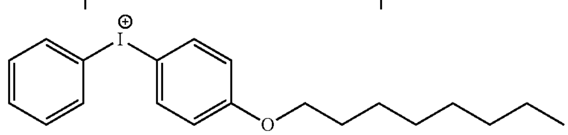
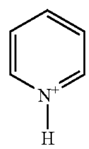
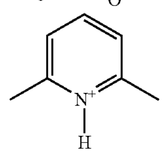
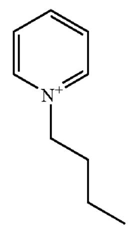
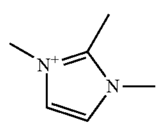
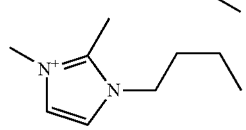
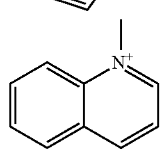
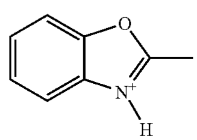
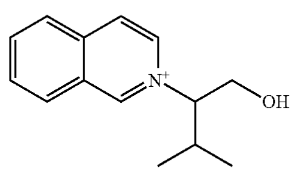
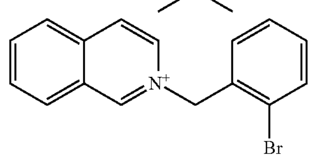
Hereinafter, the specific example of the anion included in the onium salt structure will be illustrated.

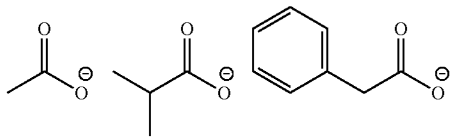
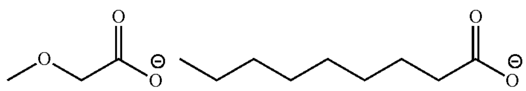
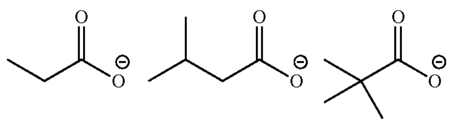
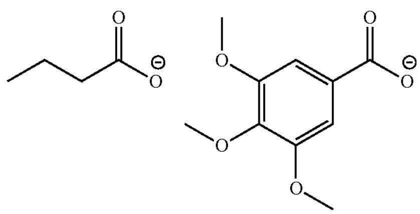
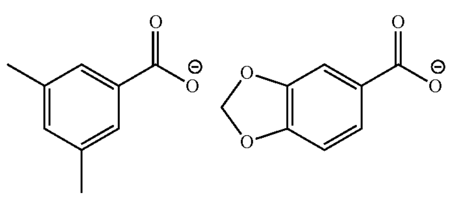
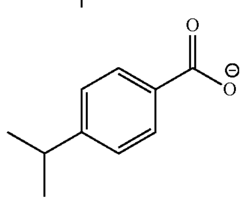
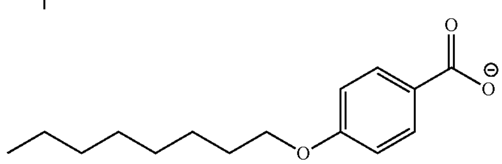
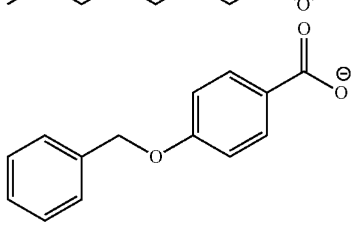
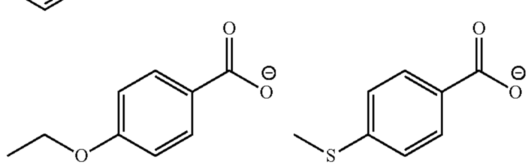
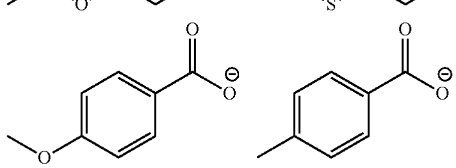
-continued
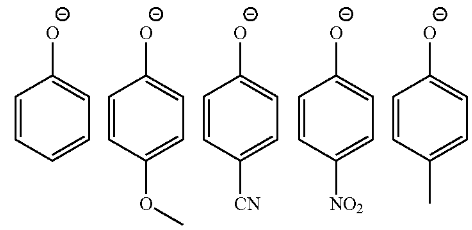
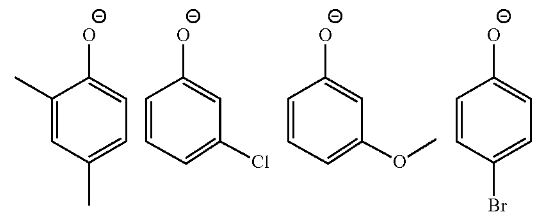
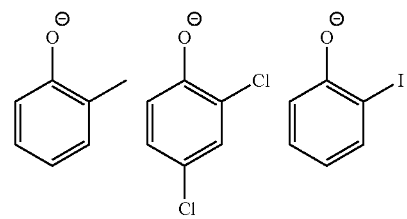
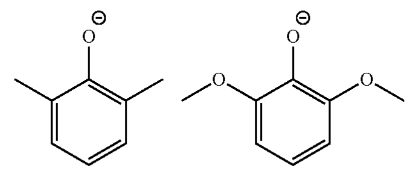
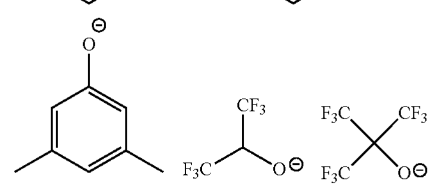
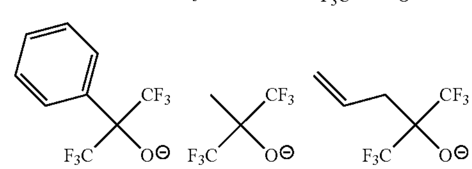
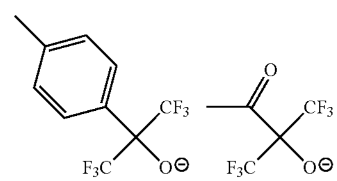
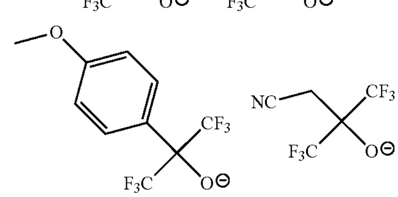
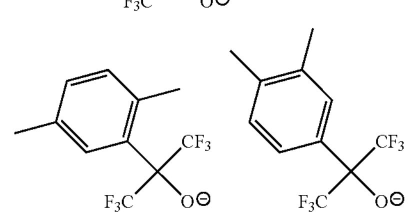

-continued
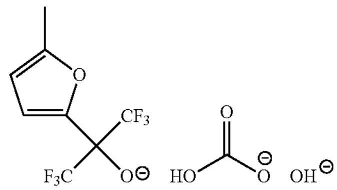
Hereinafter, the specific example of the onium salt structure will be illustrated.
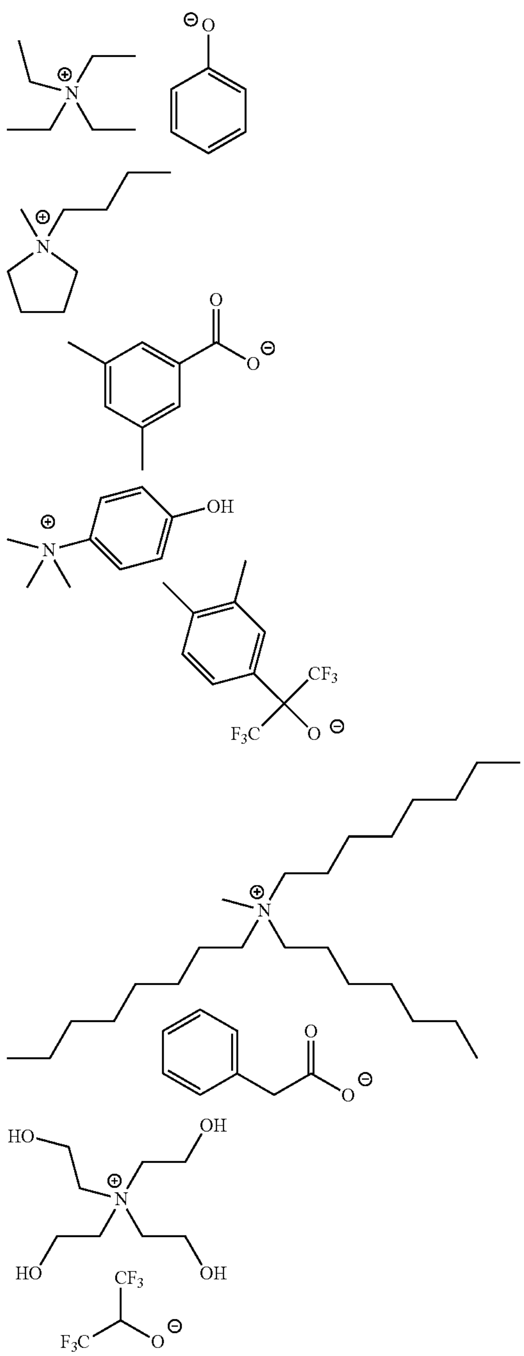
-continued
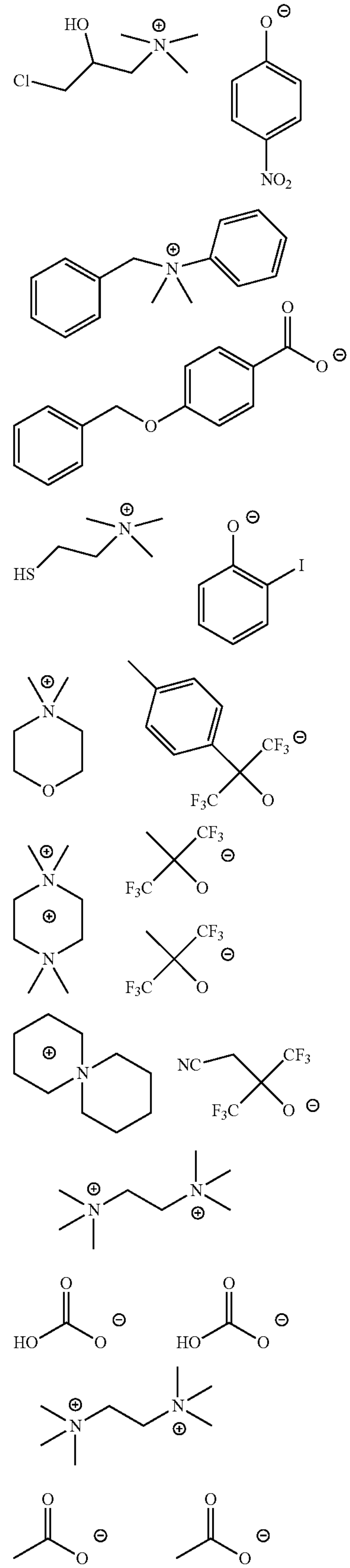

-continued
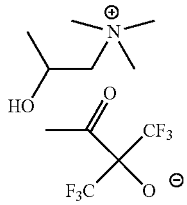
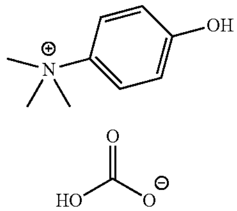
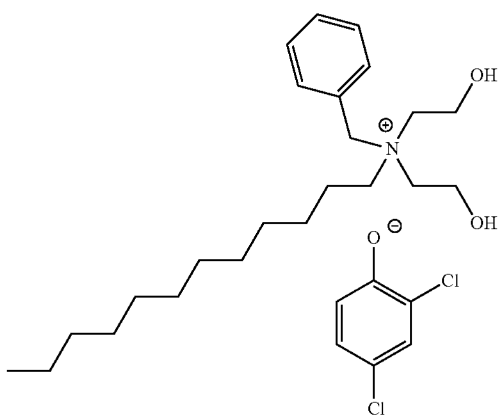
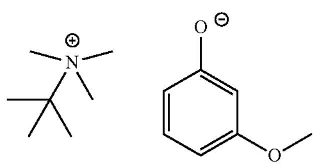
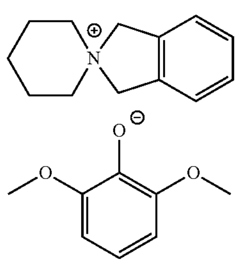
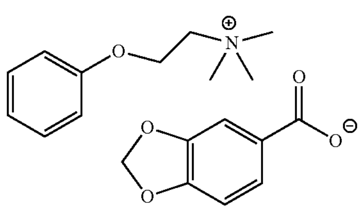
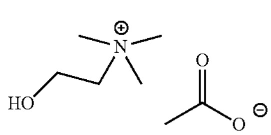
-continued
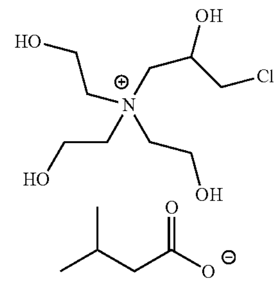
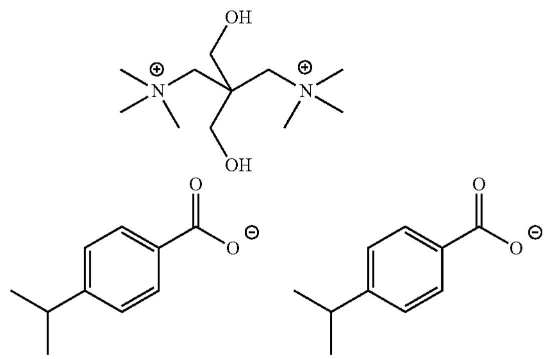
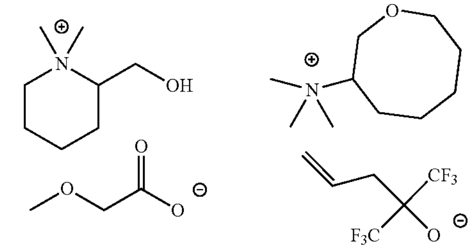
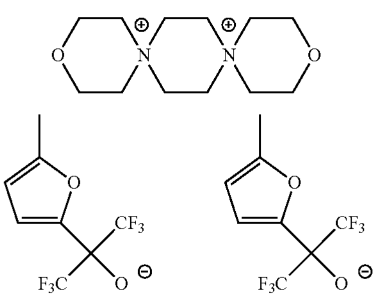
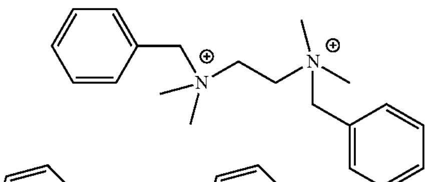
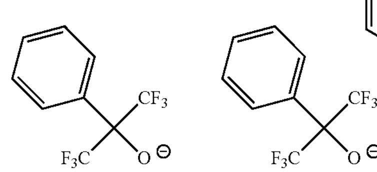

-continued
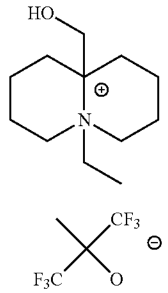
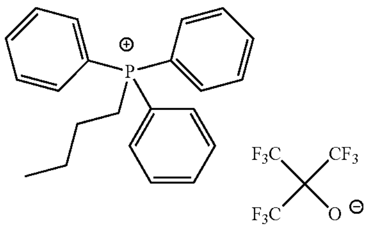
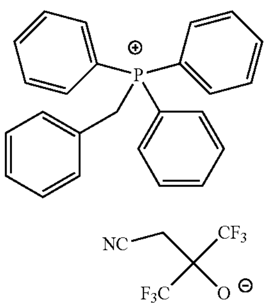
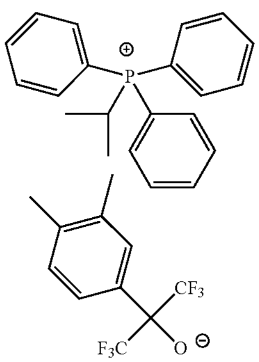
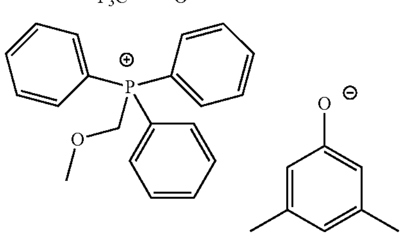
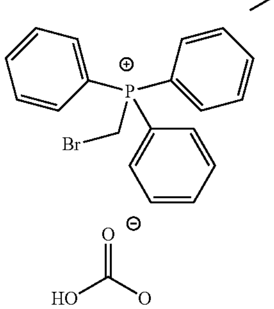
-continued
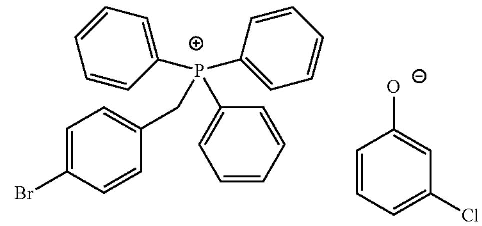
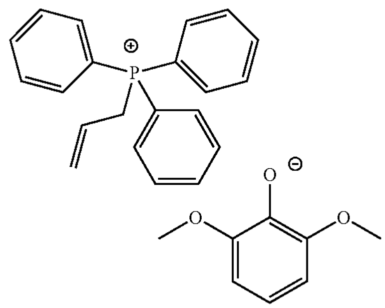
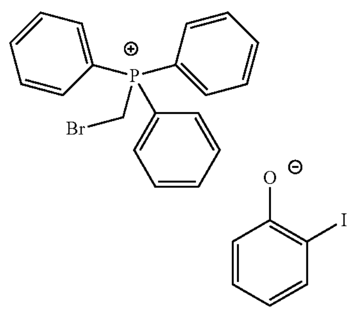
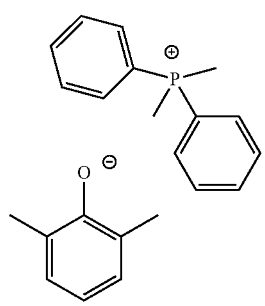
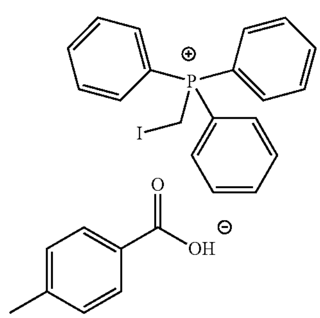

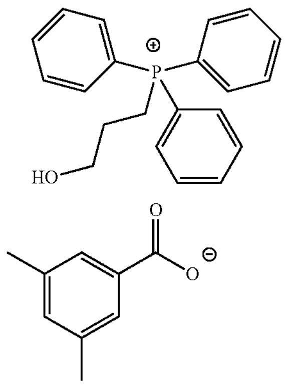
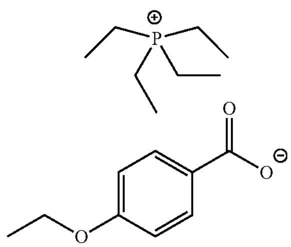
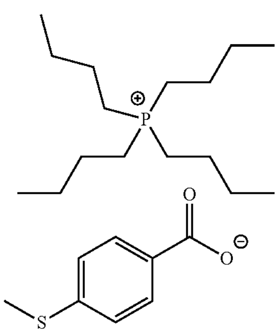
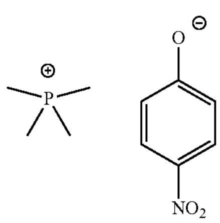
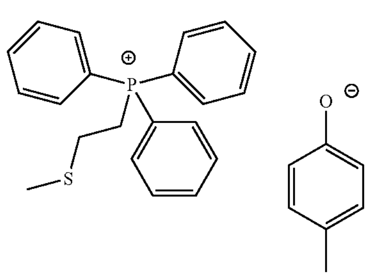
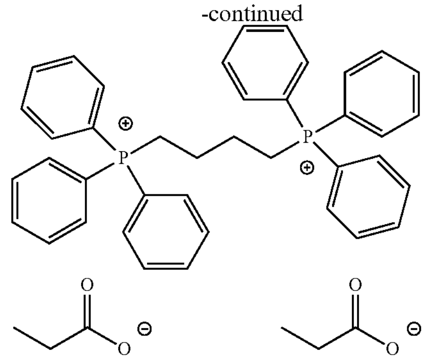
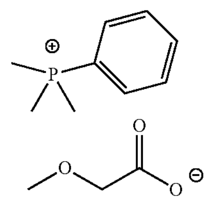
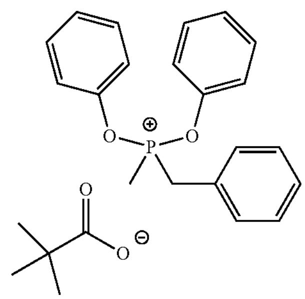
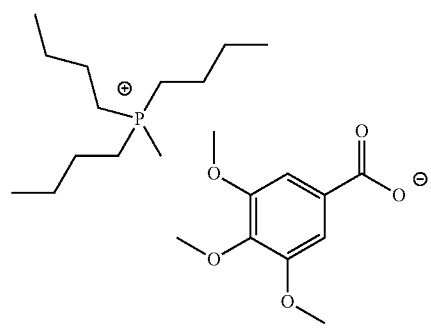
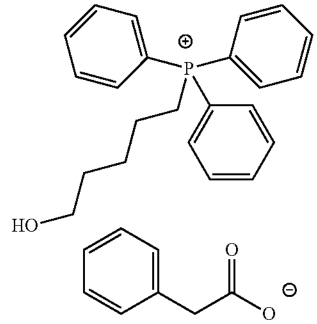

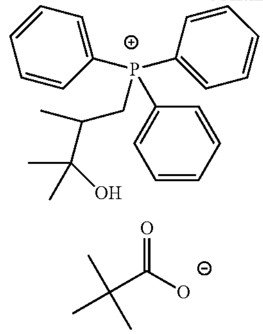
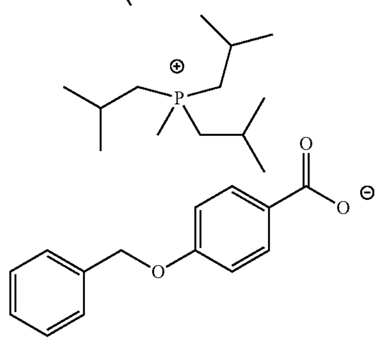
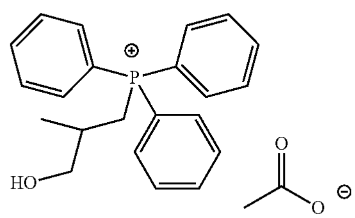
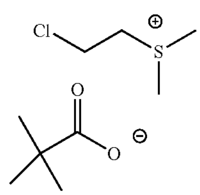
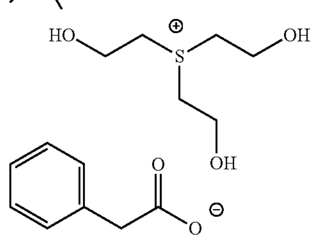
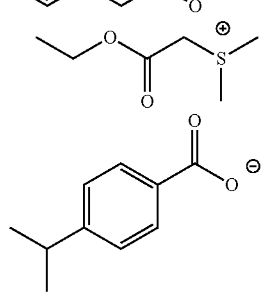
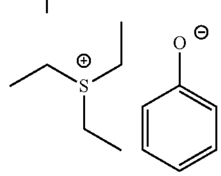
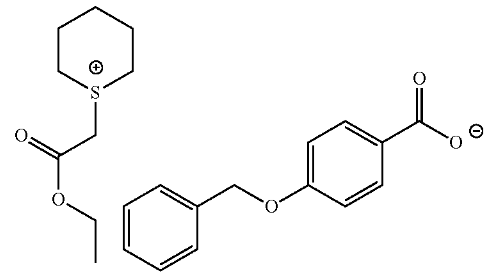
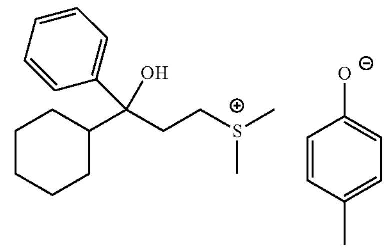
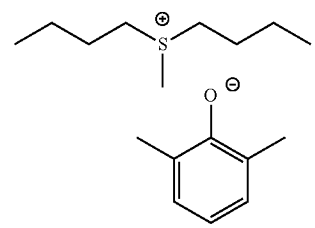
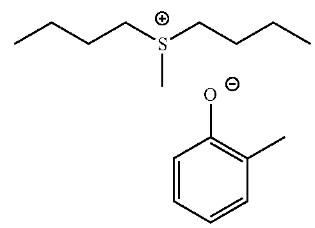
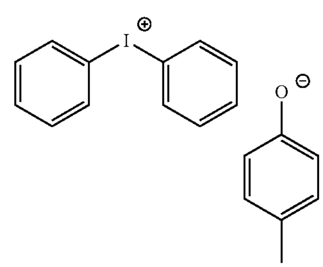
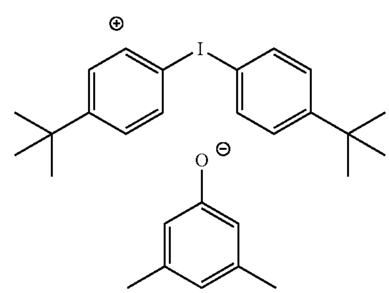

-continued

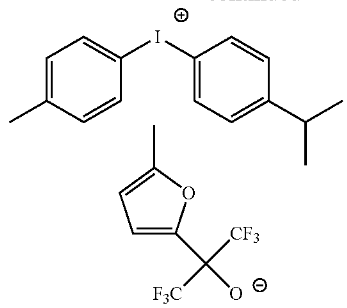

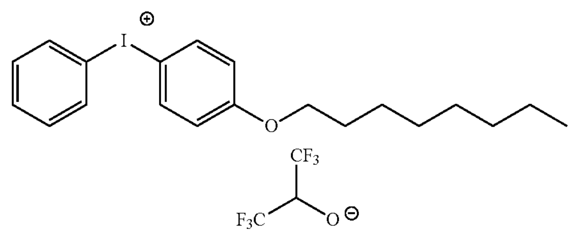

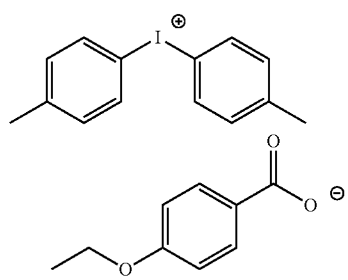

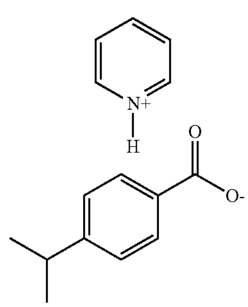

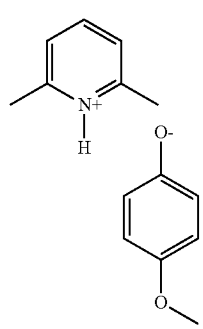

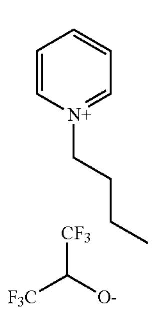

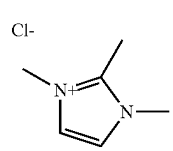

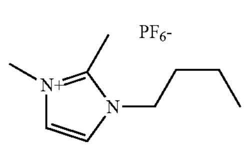

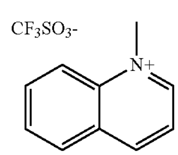

-continued

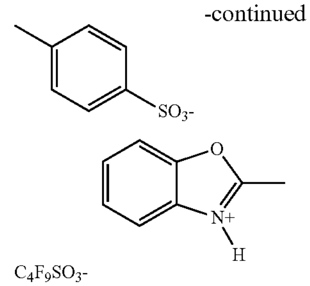

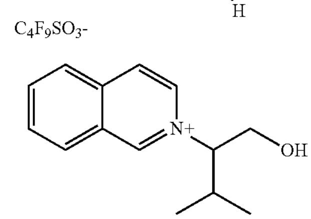

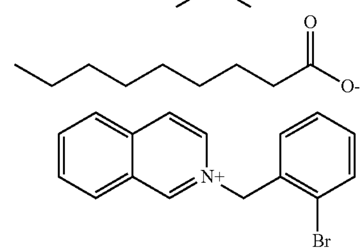

A suitable aspect of the onium salt compound may be at least one selected from a group consisting of an onium salt compound represented by Formula (1-1) and an onium salt compound represented by Formula (1-2) in terms of the superior effect of the present invention.

Further, the onium salt compound represented by Formula (1-1) may be used either alone or in combination of two or more thereof. Furthermore, the onium salt compound represented by Formula (1-2) may be used either alone or in combination of two or more thereof. Further, it is possible to use the onium salt compound represented by Formula (1-1) and the onium salt compound represented by Formula (1-2) in combination.

$$M^{+}\text{-}(\text{-}R)_n x^{-}$$ Formula(1-1)

$$L\text{-}[\text{-}M^{+}\text{-}(\text{-}R)_m]_2 2x^{-}$$ Formula(1-2)

In Formula (1-1), M represents a nitrogen atom, a phosphorus atom, a sulfur atom, or an iodine atom. Among them, the nitrogen atom is preferred in terms of the superior effect of the present invention.

Each R independently represents aliphatic hydrocarbon that may contain a hydrogen atom and a heteroatom, aromatic hydrocarbon that may contain a heteroatom, and a group combining two or more kinds of them together.

Any of straight, branched, and cyclic aliphatic hydrocarbon group may be used. Further, the number of carbon atoms contained in the aliphatic hydrocarbon group is not limited particularly, but is preferably 1 to 15, and more preferably 1 to 5 in terms of the superior effect of the present invention.

Examples of the aliphatic hydrocarbon group may include an alkyl group, a cycloalkyl group, an alkene group, an alkyne group, or a combination of two or more of them.

The aliphatic hydrocarbon group may include the heteroatom. That is, it may be the hydrocarbon group containing the heteroatom. The kind of the contained heteroatom is not limited particularly, but may include halogen atom, oxygen atom, nitrogen atom, sulfur atom, selenium atom, tellurium atom and the like. For example, it is included in the aspect of the group of —$Y_1$H, —$Y_1$—, —N(Ra)—, —C(=$Y_2$)—, —CON(Rb)—, —C(=$Y_3$)$Y_4$—, —SOt-, —$SO_2$N(Rc)-, halogen atom, or combinations of two or more of them.

Each of Y1 to Y4 is independently selected from a group consisting of oxygen atom, sulfur atom, selenium atom and tellurium atom. Among them, the oxygen atom and the sulfur atom are preferred in terms of convenient handling.

Each of Ra, Rb and Rc is independently selected from a hydrocarbon group whose hydrogen atoms or carbon are 1 to 20 in number.

t represents an integer of 1 to 3.

Although the number of carbon atoms included in the aromatic hydrocarbon group is not limited particularly, the number of carbon atoms is preferably 6 to 20, and more preferably 6 to 10 in terms of the superior effect of the present invention.

Examples of the aromatic hydrocarbon group may include a phenyl group, a naphthyl group and the like.

The aromatic hydrocarbon group may include the heteroatom. The aspect including the heteroatom is described above. Further, if the heteroatom is included in the aromatic hydrocarbon group, an aromatic heterocyclic group may be constituted.

A suitable aspect of R may include an alkyl group that may include a heteroatom, an alkene group that may include a heteroatom, a cycloalkyl group that may include a heteroatom, and an aryl group that may include a heteroatom, in that they are superior in the effect of the present invention.

Further, a plurality of Rs may combine with each other to form a ring. The kind of the ring to be formed is not limited particularly, but may include a 5- or 6-membered ring structure, for example.

Further, the formed ring may have aromaticity. For example, the cation of the onium salt compound represented by Formula (1-1) may be a pyridinium ring represented by the following Formula (10). Further, some of the formed ring may include the heteroatom. For example, the cation of the onium salt compound represented by Formula (1-1) may be an imidazolium ring represented by the following Formula (11).

Further, R of Formula (10) and Formula (11) is defined as described above.

Rv of each of Formula (10) and Formula (11) independently represents a hydrogen atom or an alkyl group. A plurality of Rvs may combine with each other to form a ring.

Formula (10)

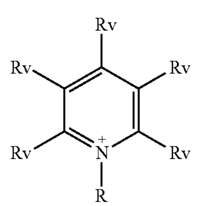

Formula (11)

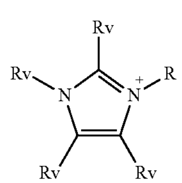

$X^-$ represents a monovalent anion. The monovalent anion is defined as described above.

In Formula (1-1), n represents an integer of 2 to 4. Further, n represents 4 when M is the nitrogen atom or phosphorus atom, n represents 3 when M is the sulfur atom, and n represents 2 when M is the iodine atom.

In Formula (1-2), M, R and $X^-$ are defined as described above. Further, Formula (1-2) includes two $X^-$'s.

L represents a divalent linking group. Examples of the divalent linking group may include a substituted or unsubstituted divalent aliphatic hydrocarbon group (preferably, having 1 to 8 carbon atoms, for example, an alkylene group such as a methylene group, an ethylene group or a propylene group), a substituted or unsubstituted divalent aromatic hydrocarbon group (preferably, having 6 to 12 carbon atoms, for example, a phenylene group), —O—, —S—, —$SO_2$—, —N(R)— (R: an alkyl group), —CO—, —NH—, —COO—, —CONH—, or a group combining two or more of them (for example, an alkylene oxy group, an alkylene oxycarbonyl group, an alkylene carbonyloxy group, and the like).

Among them, the divalent aliphatic hydrocarbon group or the divalent aromatic hydrocarbon group is preferred in terms of the superior effect of the present invention.

In Formula (1-2), each m independently represents the integer of 1 to 3. Further, m represents 3 when M is the nitrogen atom or phosphorus atom, m represents 2 when M is the sulfur atom, and m represents 1 when M is the iodine atom.

Further, another suitable aspect of the onium salt compound may include a polymer having an onium salt in terms of the superior effect of the present invention. The polymer having the onium salt means the polymer having the onium salt structure on the side chain or the main chain. In particular, the polymer with the repeating unit having the onium salt structure is preferred.

The definition of the onium salt structure is as described above, and the definition of the cation and anion likewise has the same meaning.

A suitable aspect of the polymer having the onium salt may include a polymer having the repeating unit represented by Formula (5-1) in terms of the superior effect of the present invention.

Formula (5-1)

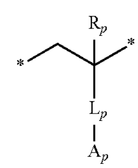

Formula (1-1)

$$M^+\text{—}(R)_n\ \ X^-$$

Formula (1-2)

$$L\text{—}\left[M^+\text{—}(R)_m\right]_2\ \ 2X^-$$

In Formula (5-1), $R_p$ represents a hydrogen atom or alkyl group. Although the number of carbon atoms included in the alkyl group is not particularly limited, the number of 1 to 20 is preferred and the number of 1 to 10 is more preferred in terms of the superior effect of the present invention.

$L_p$ represents a divalent linking group. The definition of the divalent linking group represented by $L_p$ is equal to that of L represented by Formula (1-2).

Among them, as $L_a$, an alkylene group, an arylene group, —COO—, and a group (-arylene group-alkylene group-, —COO-alkylene group- and the like) obtained by combining two or more of them are preferred, and the alkylene group is more preferred, in that they are superior in the effect of the present invention.

$A_p$ represents a residue excluding one hydrogen atom from the onium salt represented by either of Formula (1-1) or Formula (1-2). Further, the residue refers to a group that is of a structure where one hydrogen atom is emitted from any position of the structural formula representing the onium salt and which is combinable with the $L_p$. Usually, this is of the structure that emits one hydrogen atom from R and is combinable with the $L_p$.

Each group of Formula (1-1) and Formula (1-2) is defined as described above.

The content of the repeating unit represented by Formula (5-1) in the polymer is not particularly limited, but is preferably 30 to 100 mol % and more preferably 50 to 100 mol % based on the entire repeating unit in the polymer in terms of the superior effect of the present invention.

The weight average molecular weight of the polymer is not particularly limited, but is preferably 1,000 to 30,000 and more preferably 1,000 to 10,000 in terms of the superior effect of the present invention.

A suitable aspect of the repeating unit represented by Formula (5-1) may include a repeating unit represented by Formula (5-2).

Formula (5-2)

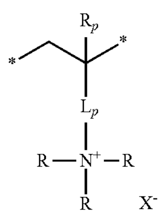

In Formula (5-2), R, $R_p$, $L_p$ and $X^-$ are defined as described above.

Further, a suitable aspect of the repeating unit represented by Formula (5-2) may include repeating units represented by Formula (5-3) to Formula (5-5).

Formula (5-3)

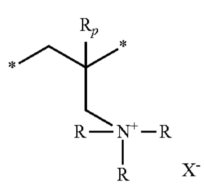

Formula (5-4)

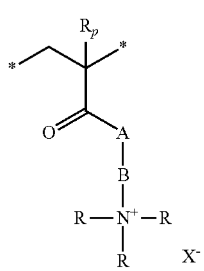

-continued

Formula (5-5)

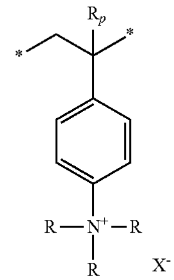

In Formula (5-3), R, $R_p$ and $X^-$ are defined as described above.

In Formula (5-4), R, $R_p$ and $X^-$ are defined as described above.

A represents —O—, —NH— or —NR—. The definition of R is equal to that of R in the Formula (1-1).

B represents an alkylene group.

In Formula (5-5), R, $R_p$ and $X^-$ are defined as described above.

(Nitrogen-Containing Compound)

The nitrogen-containing compound means a compound that contains a nitrogen atom therein. Further, herein, the nitrogen-containing compound has no onium salt compound. The nitrogen-containing compound mainly forms an interaction between the nitrogen atom and the polar group in the compound. For example, if the polar group is the carboxyl group, it interacts with the nitrogen atom in the nitrogen-containing compound, thus forming the salt.

Examples of the nitrogen-containing compound may include a compound represented by the following Formula (6).

Formula (6)

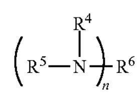

In Formula (6), each of $R_4$ and $R_5$ independently represents a hydrogen atom, a hydroxyl group, a formyl group, an alkoxy group, an alkoxy carbonyl group, a chained hydrocarbon group having 1 to 30 carbon atoms, an alicyclic hydrocarbon group having 3 to 30 carbon atoms, an aromatic hydrocarbon group having 6 to 14 carbon atoms or a group obtained by combining two or more of them together. $R_6$ represents a hydrogen atom, a hydroxyl group, a formyl group, an alkoxy group, an alkoxy carbonyl group, an n-valent chained hydrocarbon group having 1 to 30 carbon atoms, an n-valent alicyclic hydrocarbon group having 3 to 30 carbon atoms, an n-valent aromatic hydrocarbon group having 6 to 14 carbon atoms, or an n-valent group obtained by combining two or more groups with each other. n is an integer of 1 or more. Only if n is 2 or more, the plurality of $R_4$ or $R_5$ may be same or different. Further, any two of $R_4$ to $R_6$ may combine and form a ring structure with a nitrogen atom to which each combination is bonded.

Examples of the chained hydrocarbon group represented by $R_4$ and $R_5$ and having 1 to 30 carbon atoms may include an ethyl group, n-propyl group, i-propyl group, n-butyl group, 2-methylpropyl group, 1-methylpropyl group, t-butyl group, and the like.

Examples of the alicyclic hydrocarbon group represented by $R_4$ and $R_6$ and having 3 to 30 carbon atoms may include a cyclopropyl group, a cyclopentyl group, a cyclohexyl group, an adamantyl group, an norbornyl group and the like.

Examples of the aromatic hydrocarbon group represented by $R_4$ and $R_6$ and having 6 to 14 carbon atoms may include a tolyl group, a naphthyl group and the like.

Examples of a group obtained by combining two or more groups represented by $R_4$ and $R_5$ may include an aralkyl group having 6 to 12 carbon atoms, such as a benzyl group, a phenethyl group, a naphthylmethyl group or a naphthylethyl group.

Examples of the n-valent chained hydrocarbon group represented by $R_6$ and having 1 to 30 carbon atoms may include a group formed by subtracting (n−1) hydrogen atoms from the group exemplified as the chained hydrocarbon group represented by $R_4$ and $R_5$ and having 1 to 30 carbon atoms.

Examples of the alicyclic chained hydrocarbon group represented by $R_6$ and having 3 to 30 carbon atoms may include a group formed by subtracting (n−1) hydrogen atoms from the group exemplified as the cyclic hydrocarbon group represented by $R_4$ and $R_5$ and having 3 to 30 carbon atoms.

Examples of the aromatic chained hydrocarbon group represented by $R_6$ and having 6 to 14 carbon atoms may include a group formed by subtracting (n−1) hydrogen atoms from the group exemplified as the aromatic hydrocarbon group represented by $R_4$ and $R_5$ and having 6 to 14 carbon atoms.

Examples of a group obtained by combining two or more groups represented by $R_6$ may include a group formed by subtracting (n−1) hydrogen atoms from the group exemplified as the group that is obtained by combining two or more groups represented by $R_4$ and $R_5$.

The group represented by $R_4$ to $R_6$ may be substituted. The specific examples of the substituent may include a methyl group, an ethyl group, a propyl group, an n-butyl group, a t-butyl group, a hydroxyl group, a carboxyl group, a halogen atom, an alkoxy group and the like. The examples of the halogen atom may include a fluorine atom, a chlorine atom, a bromine atom and the like. Further, the examples of the alkoxy group may include a methoxy group, an ethoxy group, a propoxy group, a butoxy group and the like.

Examples of the compound represented by Formula (6) may include a (cyclo)alkylamine compound, a nitrogen-containing heterocyclic ring compound, an amide-group-containing compound, an urea compound and the like.

Examples of the (cyclo)alkylamine compound may include a compound having one nitrogen atom, a compound having two nitrogen atoms, a compound having three or more nitrogen atoms, and the like.

Examples of the (cyclo)alkylamine compound having one nitrogen atom may include mono(cyclo)alkylamines such as n-hexylamine, n-heptylamine, n-octylamine, n-nonylamine, 1-aminodecane and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine and tricyclohexylamine; substituted alkylamine such as triethanolamine; aromatic amines such as aniline, N-methylaniline, N,N-dimethylaniline, 2-methylaniline, 3-methylaniline, 4-methylaniline, N,N-dibutylaniline, 4-nitroaniline, diphenylamine, triphenylamine, naphthylamine, 2,4,6-tri-tert-butyl-N-methylaniline, N-phenyldiethanolamine, 2,6-diisopropylaniline, 2-(4-aminophenyl)-2-(3-hydroxyphenyl)propane and 2-(4-aminophenyl)-2-(4-hydroxyphenyl)propane.

Examples of the (cyclo)alkylamine compound having two nitrogen atoms may include ethylenediamine, tetramethylethylenediamine, tetramethylenediamine, hexamethylenediamine, 4,4'-diaminodiphenylmethane, 4,4'-diaminodiphenylether, 4,4'-diaminobenzophenone, 4,4'-diaminodiphenylamine, 2,2-bis(4-aminophenyl)propane, 2-(3-aminophenyl)-2-(4-aminophenyl)propane, 1,4-bis1-(4-aminophenyl)-1-methylethyl]benzene, 1,3-bis[1-(4-aminophenyl)-1-methylethyl]benzene, bis(2-dimethylaminoethyl) ether, bis(2-diethylaminoethyl)ether, 1-(2-hydroxyethyl)-2-imidazolidinone, 2-quinoxalinol, N,N,N',N'-tetrakis(2-hydroxypropyl)ethylenediamine and the like.

The (cyclo)alkylamine compound having three or more nitrogen atoms may include a polymer such as polyethyleneimine, poly allylamine and 2-dimethylaminoethylacrylamide.

Examples of the nitrogen-containing heterocyclic ring compound may include a nitrogen-containing aromatic heterocyclic ring compound, a nitrogen-containing aliphatic heterocyclic ring compound and the like.

Examples of the nitrogen-containing aromatic heterocyclic ring compound may include imidazoles such as imidazole, 4-methylimidazole, 4-methyl-2-phenylimidazole, benzimidazole, 2-phenylbenzimidazole, 1-benzyl-2-methylimidazole or 1-benzyl-2-methyl-1H-imidazole; and pyridines, such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acidamide, quinoline, 4-hydroxyquinoline, 8-oxyquinoline, acridine or 2,2':6',2"-terpyridine.

Examples of the nitrogen-containing aliphatic heterocyclic ring compound may include piperazines such as piperazine or 1-(2-hydroxyethyl)piperazine; pyrazine, pyrazole, pyridazine, quinoxaline, purine, pyrrolidine, proline, piperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine or 1,4-diaza bicyclo[2.2.2]octane.

Examples of the amide-group-containing compound may include an N-t-butoxy-carbonyl-group containing amino compound such as N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonyl hexamethylendiamine, N,N,N',N'-tetra-t-butoxycarbonyl hexamethylendiamine, N,N'-di-t-butoxycarbonyl-1,7-diaminoheptane, N,N'-di-t-butoxycarbonyl-1,8-diaminooctane, N,N'-di-t-butoxycarbonyl-1,9-diamino nonane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2- methylbenzimidazole and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine or isocyanuric acid tris(2-hydroxyethyl).

Examples of the urea compound may include urea, methylurea, 1,1-dimethylurea, 1,3-dimethylurea, 1,1,3,3-tetramethylurea, 1,3-diphenylurea, tri-n-butylthiourea and the like.

Among them, the (cyclo)alkylamine compound and the nitrogen-containing aliphatic heterocyclic ring compound are preferred, and 1-aminodecane, di-n-octylamine, tri-n-octylamine, tetramethylethylenediamine, N,N-dibutylaniline and proline are more preferred.

As the suitable aspect of the nitrogen-containing compound, a nitrogen-containing compound (polyvalent nitrogen-containing compound) having a plurality of (two or more) nitrogen atoms is preferred. In particular, the aspect having three or more atoms is preferred, and the aspect having four or more atoms is more preferred.

Further, another suitable aspect of the nitrogen-containing compound may include a compound represented by Formula (3) in terms of the superior effect of the present invention.

Formula (3)

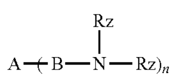

In Formula (3), A represents a single bond or an n-valent organic group.

The specific example of A may include a group represented by Formula (1A) or a group represented by Formula (1B) in single bond:

(1A)

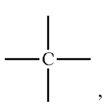

(1B)

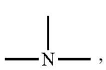

As a preferred example, there are —NH—, —NRw-, —O—, —S—, a carbonyl group, an alkylene group, an alkenylene group, an alkynylene group, a cycloalkylene group, an aromatic group, a heterocyclic group, and an n-valent organic group obtained by combining two or more of them together. In the above formula, Rw represents an organic group, preferably an alkyl group, an alkylcarbonyl group and an alkylsulfonyl group. Further, there is no case that only the heteroatoms combine with each other in the combination.

Among them, the aliphatic hydrocarbon group (an alkylene group, an alkenylene group, an alkynylene group, a cycloalkylene group), the group represented by Formula (1B), —NH—, and —NRw- are preferred.

Here, the alkylene group, the alkenylene group and the alkynylene group have preferably 1 to 40 carbon atoms, more preferably 1 to 20 carbon atoms and still more preferably 2 to 12 carbon atoms. The alkylene group may be a straight chain or branch, or have a substituent. Here, the cycloalkylene group has preferably 3 to 40 carbon atoms, more preferably 3 to 20 carbon atoms and still more preferably 5 to 12 carbon atoms. The cycloalkylene group may be monocyclic or polycyclic, and may have a substituent on the ring.

The aromatic group may be monocyclic or polycyclic, and may have a non-benzene-based aromatic group. By way of example, the monocyclic aromatic group may have a benzene residue, a pyrrole residue, a furan residue, a thiophene residue, an indole residue and the like, while the polycyclic aromatic group may have a naphthalene residue, an anthracene residue, a tethracene residue, a benzofuran residue, a benzothiophene residue and the like. The aromatic group may have a substituent.

The n-valent organic group may have a substituent, is not limited to a particular kind but may include an alkyl group, an alkoxy group, an alkylcarbonyl group, an alkylcarbonyloxy group, an alkyloxycarbonyl group, an alkenyl group, an alkenyloxy group, an alkenylcarbonyl group, an alkenylcarbonyloxy group, an alkenyloxycarbonyl group, an alkynyl group, an alkynyleneoxy group, an alkynylenecarbonyl group, an alkynylenecarbonyloxy group, an alkynyleneoxycarbonyl group, an aralkyl group, an aralkyloxy group, an aralkylcarbonyl group, an aralkylcarbonyloxy group, an aralkyloxycarbonyl group, a hydroxyl group, an amide group, a carboxyl group, a cyano group, a fluorine atom and the like.

B represents a single bond, an alkylene group, a cycloalkylene group or an aromatic group, and the alkylene group, the cycloalkylene group and the aromatic group may each have a substituent. The alkylene group, the cycloalkylene group and the aromatic group follow the above description.

However, there is no case that both A and B are single bonds.

Each Rz independently represents the aliphatic hydrocarbon group that may contain the hydrogen atom or the heteroatom, or the aromatic hydrocarbon group that may contain the heteroatom.

Examples of the aliphatic hydrocarbon group may include the alkyl group, the alkenyl group, the alkynyl group and the like. Although the number of carbon atoms includes in the aliphatic hydrocarbon group is not particularly limited, 1 to 20 carbon atoms are preferred and 1 to 10 carbon atoms are more preferred in terms of the superior effect of the present invention.

Examples of the aromatic hydrocarbon group may include the phenyl group, the naphthyl group and the like.

The aliphatic hydrocarbon group and the aromatic hydrocarbon group each may have the heteroatom. The definition and suitable aspect of the heteroatom have the same meaning as those of the heteroatom described in Formula (1-1).

Further, the aliphatic hydrocarbon group and the aromatic hydrocarbon group each may have a substituent (for example, a functional group such as a hydroxyl group, a cyano group, an amino group, a pyrrolidino group, a piperidino group, a morpholino group or an oxo group, an alkoxy group, a halogen atom).

n represents an integer of 2 to 8, and preferably represents an integer of 3 to 8.

Further, the compound represented by Formula (3) may have three or more nitrogen atoms. In this aspect, if n is 2, A contains at least one nitrogen atom. In this context, the sentence "A contains the nitrogen atom" means that A contains at least one selected from a group consisting of the group represented by Formula (1B), —NH—, and —NRw-.

Hereinafter, a compound represented by Formula (3) is exemplified.

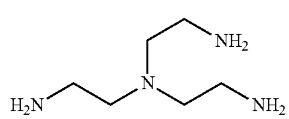
NH2
H2N
N
NH2
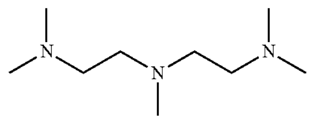
N
N
N
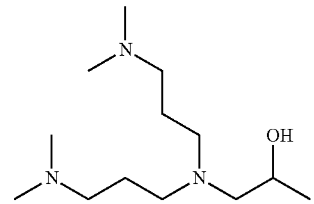
N
OH
N
N
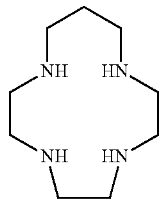
NH
HN
NH
HN
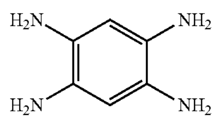
H2N
NH2
H2N
NH2
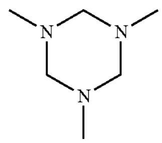
N
N
N
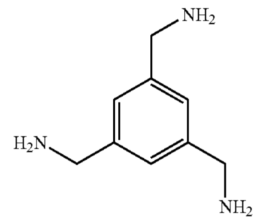
NH2
H2N
NH2
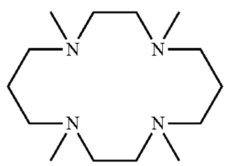
N
N
N
N
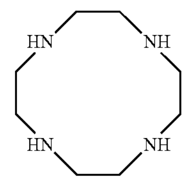
HN
NH
HN
NH
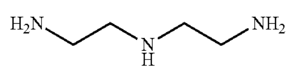
H2N
N
H
NH2
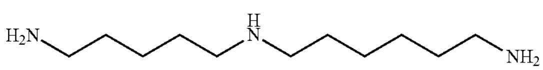
H2N
H
N
NH2
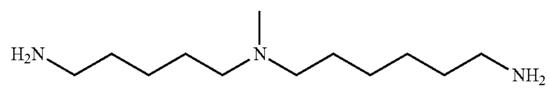
H2N
N
NH2
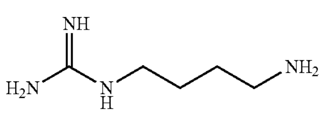
NH
H2N
N
H
NH2
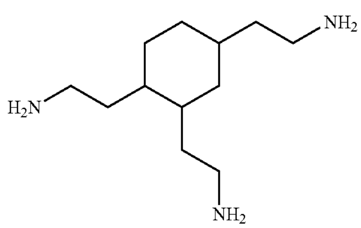
NH2
H2N
NH2
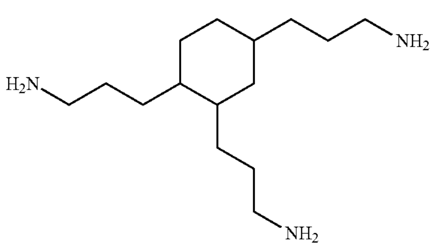
NH2
H2N
NH2
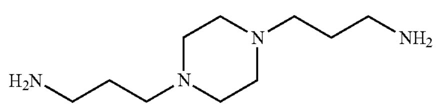
N
NH2
H2N
N
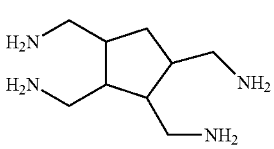
H2N
H2N
NH2
NH2
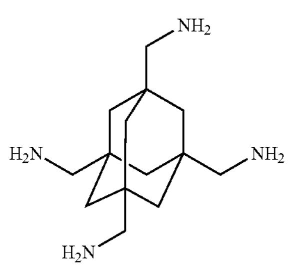
NH2
H2N
NH2
H2N
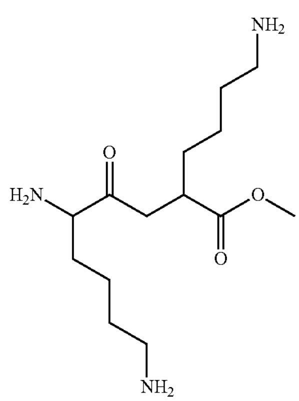
NH2
O
H2N
O
O
NH2

-continued
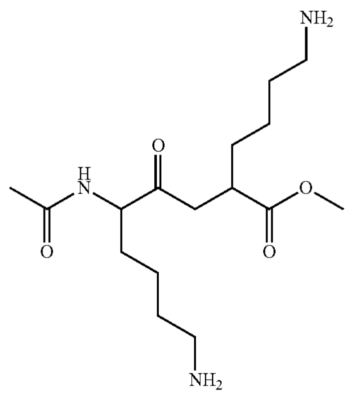
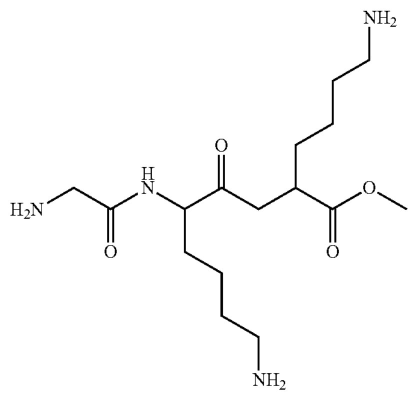
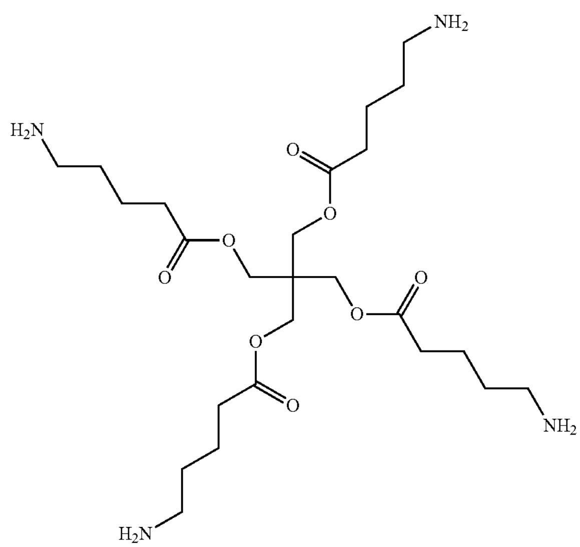
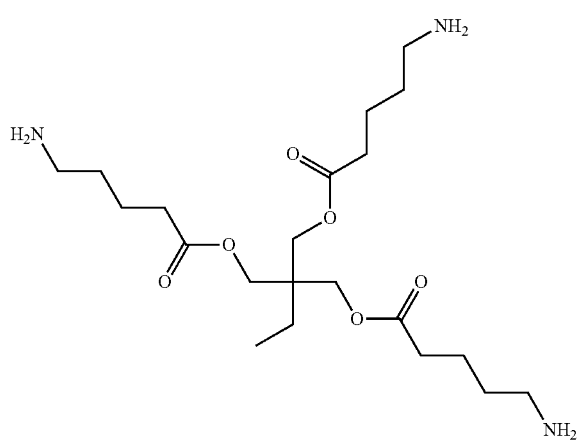

-continued

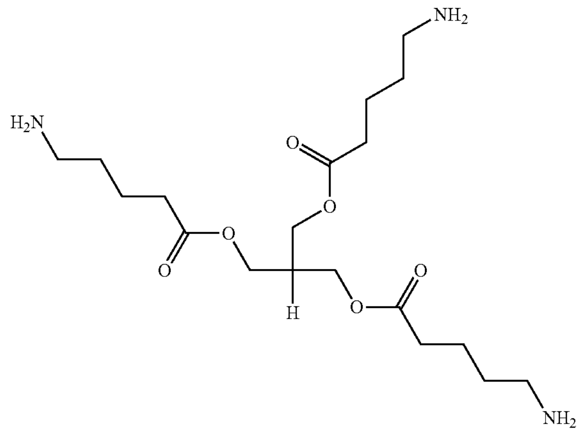

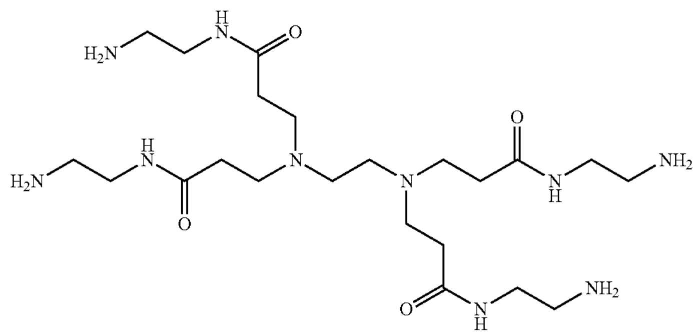

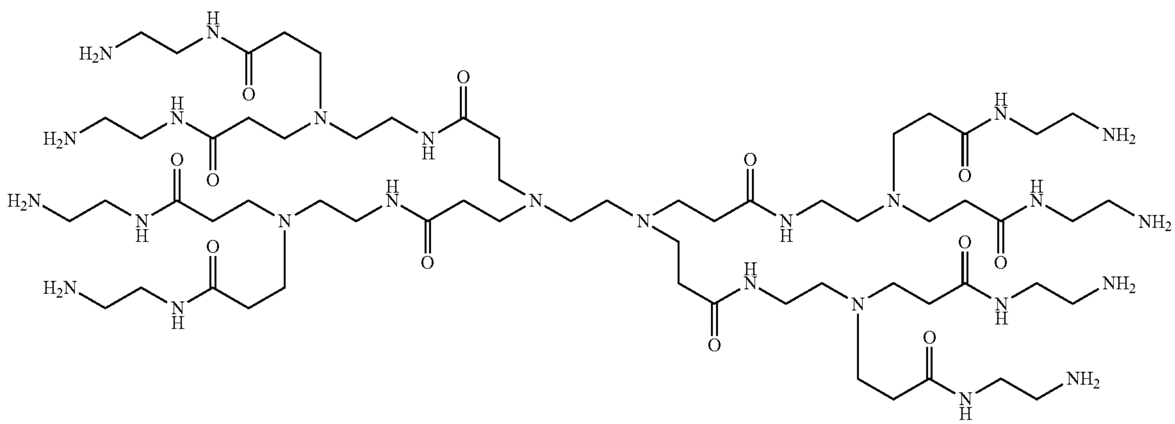

Another suitable aspect of the nitrogen-containing compound may preferably include a polymer having an amino group in terms of the superior effect of the present invention. Further, herein, the "amino group" is the concept including a primary amino group, a secondary amino group and a tertiary amino group. Also, the secondary amino group includes a secondary cyclic amino group such as a pyrrolidino group, a piperidino group, a piperidino group or a hexahydrotriadino group.

The amino group may be included in the main chain or side chain of the polymer. A specific example where the amino group is included in a part of the side chain will be described below. Further, * represents a connection with polymer.

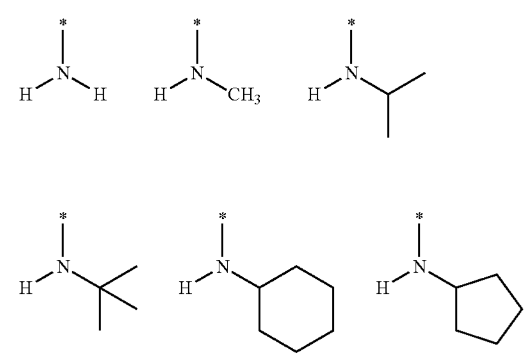

-continued
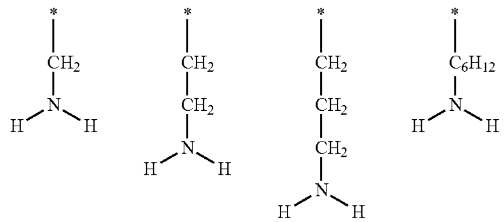
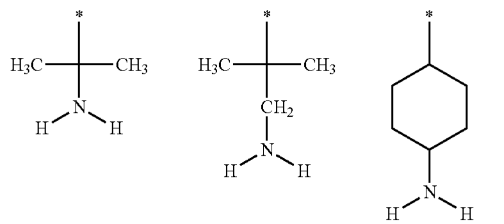
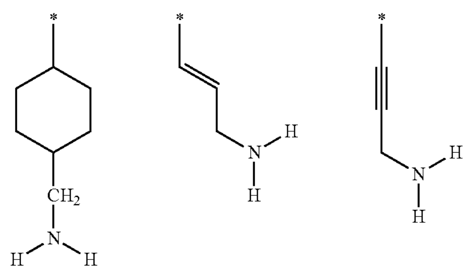
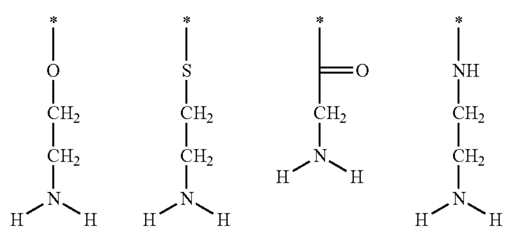
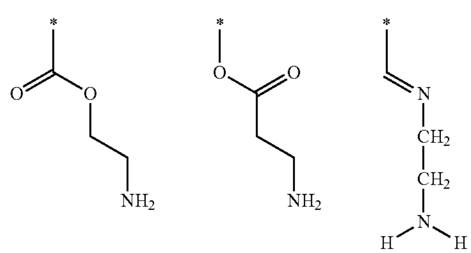
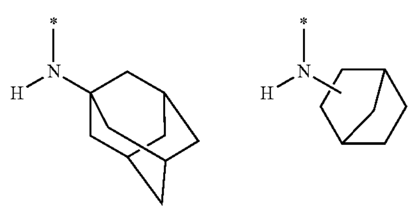
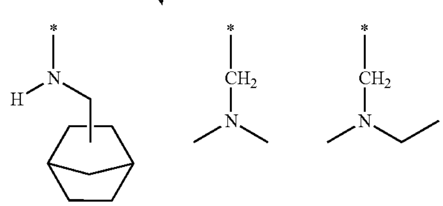
-continued
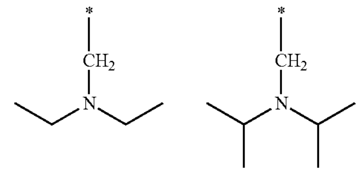
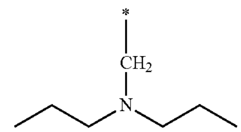
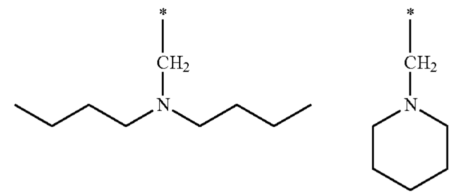
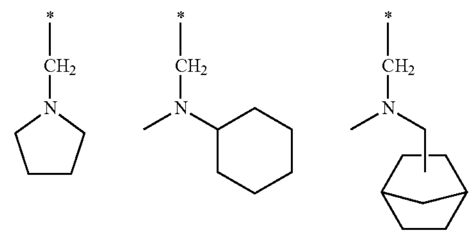
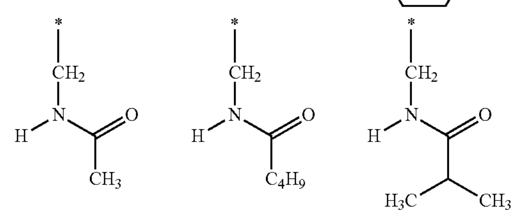
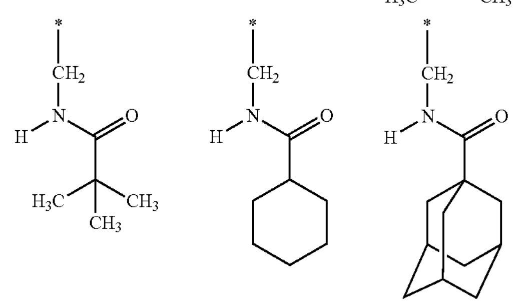
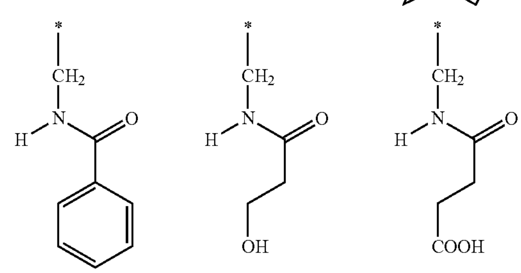
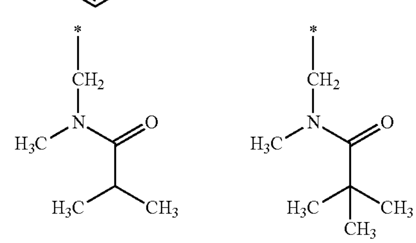

-continued

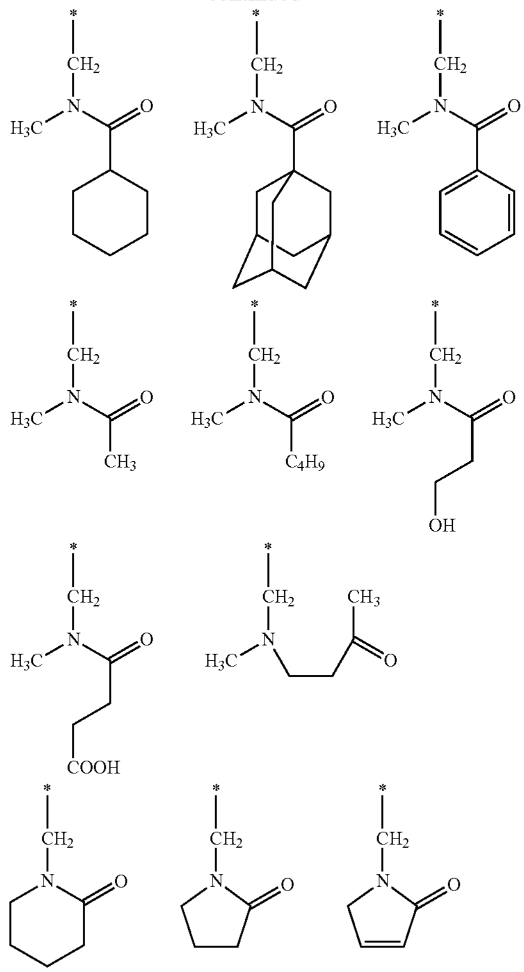

Examples of the polymer having the amino group may include polyallylamine, polyethyleneimine, polyvinylpyridine, polyvinylimidazole, polypyrimidine, polytriazole, polyquinoline, polyindole, polyphrine, polyvinylpyrrolidone, polybenzimidazole and the like.

A suitable aspect of the polymer having the amino group may include a polymer having a repeating unit represented by Formula (2).

Formula (2)

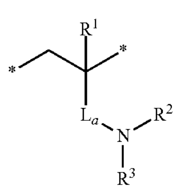

In Formula (2), $R_1$ represents the hydrogen atom or alkyl group. The number of carbon atoms included in the alkyl group is not particularly limited, but is preferably 1 to 4 and more preferably 1 to 2 in terms of the superior effect of the present invention.

Each of $R_2$ and $R_3$ independently represents an alkyl group that may include the hydrogen atom and the heteroatom, the cycloalkyl group that may include the heteroatom, or the aromatic group that may include the heteroatom.

The number of carbon atoms included in each of the alkyl group and the cycloalkyl group is not particularly limited, but is preferably 1 to 20 and more preferably 1 to 10. Examples of the aromatic group may include aromatic hydrocarbon, the aromatic heterocyclic group and the like.

Each of the alkyl group, the cycloalkyl group and the aromatic group may include the heteroatom. The definition and the suitable aspect of the heteroatom have the same meaning as those of the heteroatom described by Formula (1-1).

Further, each of the alkyl group, the cycloalkyl group and the aromatic group may include a substituent (for example, a functional group such as a hydroxyl group, a cyano group, an amino group, a pyrrolidino group, a piperidino group, a morpholino group or an oxo group, an alkoxy group, a halogen atom).

$L_a$ represents a divalent linking group. The definition of the divalent linking group represented in La is the same as that of L represented by Formula (1-2).

Among them, as La, an alkylene group, an arylene group, —COO—, and a group (-arylene group-alkylene group-, —COO-alkylene group- and the like) obtained by combining two or more of them are preferred, and an alkylene group is more preferred, in terms of the superior effect of the present invention.

Further, the group represented by $R_1$ to $R_3$, and the divalent linking group represented by La may be further substituted with a substituent (for example, a hydroxyl group and the like).

Hereinafter, the repeating unit represented by Formula (2) will be exemplified.

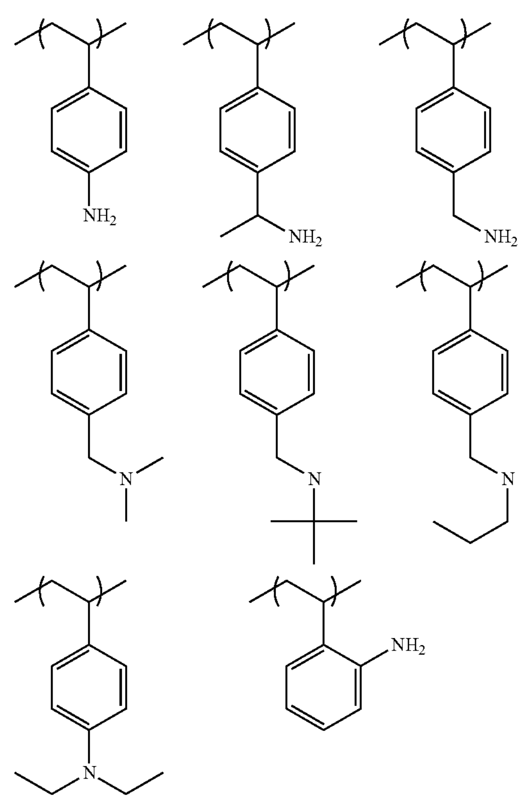

-continued

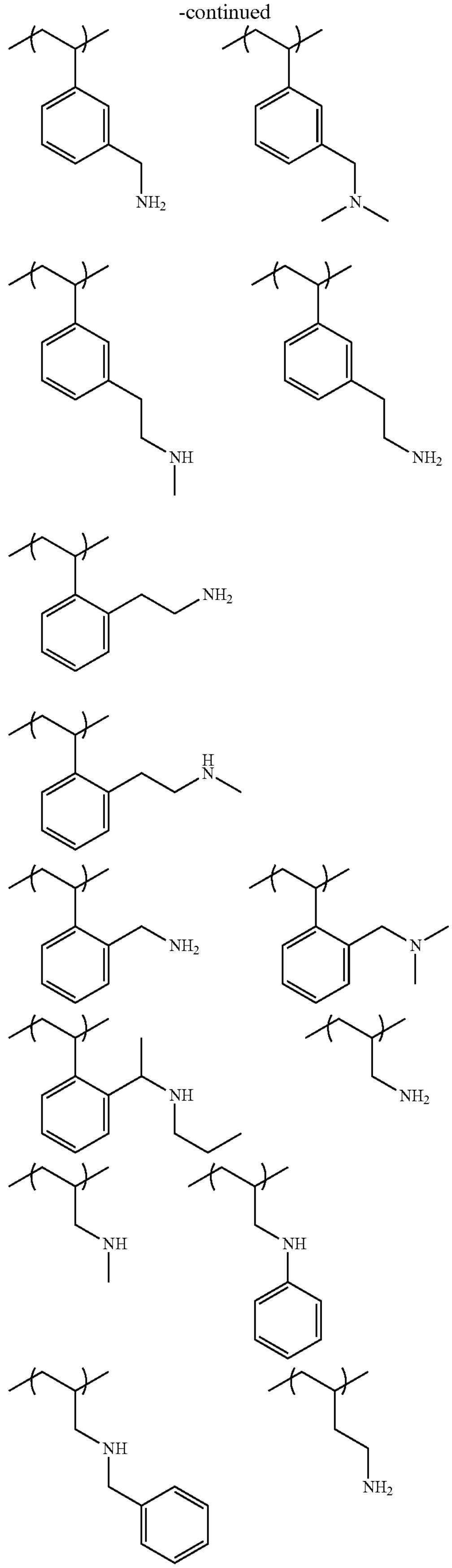

-continued

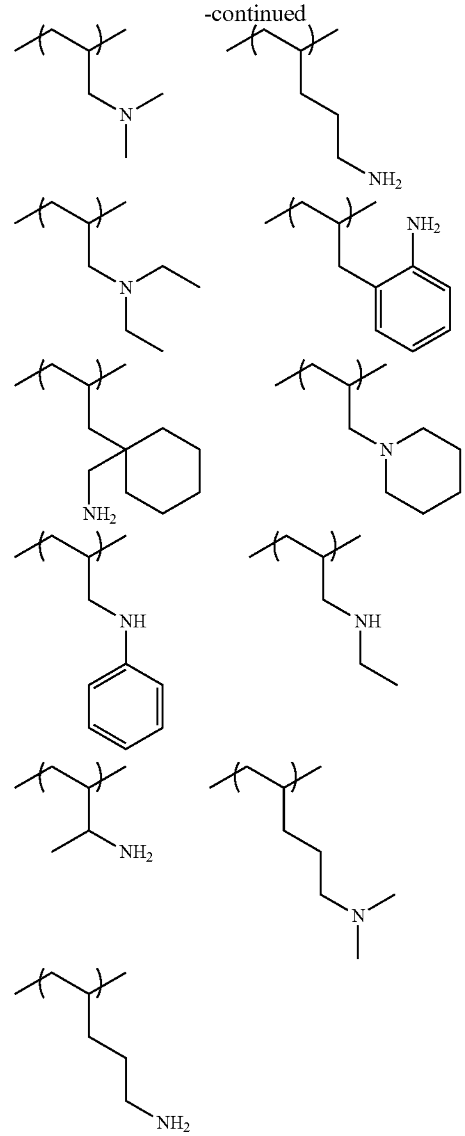

A content of the repeating unit in the polymer represented by Formula (2) is not particularly limited, but is preferably 40 to 100 mol % and more preferably 70 to 100 mol % based on the entire repeating unit in the polymer in terms of the superior effect of the present invention.

Further, the polymer may include repeating units other than the repeating unit represented by Formula (2).

The weight average molecular weight of the polymer having the amino group is not particularly limited, but is preferably 1,000 to 30,000 and more preferably 1,000 to 10,000 in terms of the superior effect of the present invention.

(Phosphorus-Based Compound)

A phosphorus-based compound is a compound that contains —P<(phosphorus atom). In addition, the phosphorus-based compound contains no onium salt compound. The phosphorus-based compound mainly forms interaction between the phosphorus atom in the compound and the polar group. For example, if the polar group is the carboxyl group, it interacts with the phosphorus atom in the phosphorus-based compound, thus forming a salt.

The phosphorus-based compound may include at least one phosphorus atom, and may include a plurality of (two or more) atoms.

The molecular weight of the phosphorus-based compound is not particularly limited, is preferably 70 to 500 and more particularly 70 to 300 in terms of the superior effect of the present invention.

A suitable aspect of the phosphorus-based compound is preferably a phosphorus-based compound selected from a group consisting of a compound represented by the following Formula (4-1) and a compound represented by the following Formula (4-2) in terms of the superior effect of the present invention.

Formula (4-1)

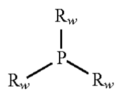

Formula (4-2)

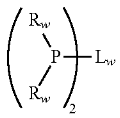

Each $R_w$ of Formula (4-1) and Formula (4-2) independently represents a group consisting of an aliphatic hydrocarbon group that may include a heteroatom, an aromatic hydrocarbon group that may include a heteroatom, or group obtained by combining two or more of them together.

As the aliphatic hydrocarbon group, any of a straight type, a branched type and a cyclic type is possible. Further, the number of carbon atoms included in the aliphatic hydrocarbon group is not particularly limited, but is preferably 1 to 15 and more preferably 1 to 5 in terms of the superior effect of the present invention.

Examples of the aliphatic hydrocarbon group may include an alkyl group, a cycloalkyl group, an alkene group, an alkyne group or a group obtained by combining two or more of them.

The number of carbon atoms included in the aromatic hydrocarbon group is not particularly limited, but is preferably 6 to 20 and more preferably 6 to 10 in terms of the superior effect of the present invention.

Examples of the aromatic hydrocarbon group may include a phenyl group, a naphthyl group and the like.

Each of the aliphatic hydrocarbon group and the aromatic hydrocarbon group may include the heteroatom. The definition and the suitable aspect of the heteroatom have the same meaning as those of the heteroatom described by Formula (1-1). Further, the heteroatom preferably includes an oxygen atom. Preferably, it includes the oxygen atom in the aspect of —O—.

Lw represents a divalent linking group. Examples of the divalent linking group may include a substituted or unsubstituted divalent aliphatic hydrocarbon group (preferably, an alkylene group having 1 to 8 carbon atoms, for example, a methylene group, an ethylene group or a propylene group), a substituted or unsubstituted divalent aromatic hydrocarbon group (preferably, an arylene group having 6 to 12 carbon atoms), —O—, —S—, —$SO_2$—, —N(R)— (R: alkyl group), —CO—, —NH—, —COO—, —CONH—, or a group (for example, an alkylene oxy group, an alkylene oxycarbonyl group, an alkylene carbonyloxy group, and the like) obtained by combining two or more of them.

Among them, the divalent aliphatic hydrocarbon group or the divalent aromatic hydrocarbon group is preferred in terms of the superior effect of the present invention.

Hereinafter, the specific example of the phosphorus-based compound will be exemplified.

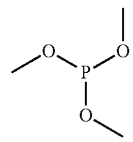

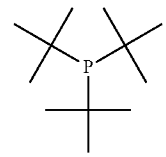

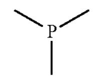

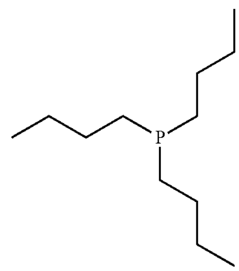

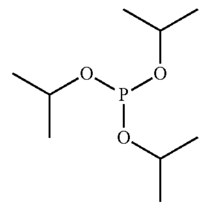

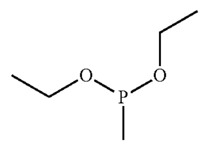

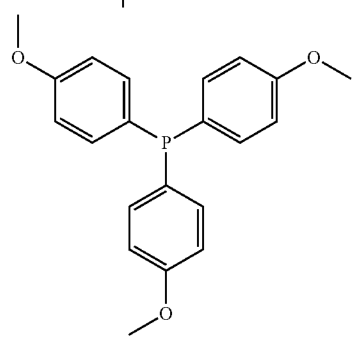

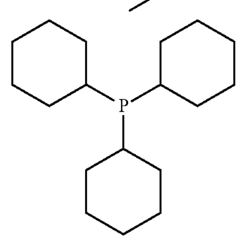

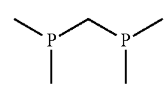

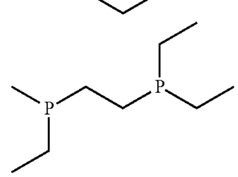

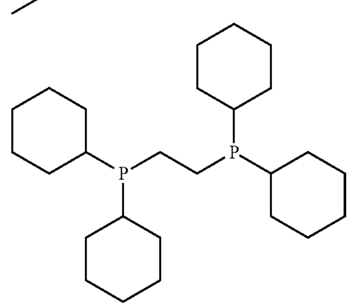

-continued

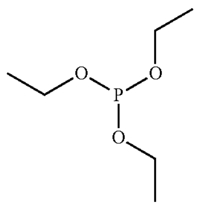

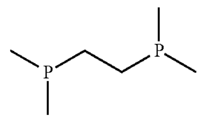

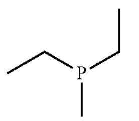

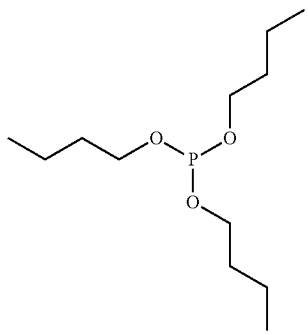

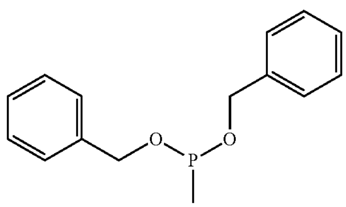

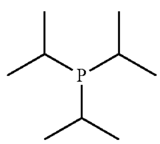

A content (the total contents of the additives in case of containing two or more additives) of the aforementioned additive in the developer is not particularly limited, is preferably 0.1 to 20% by mass or less, more preferably 0.1 to 15.0% by mass, and still more preferably 0.1 to 10% by mass, based on the entire amount of the developer in terms of the superior effect of the present invention. Further, in the present invention, the above-mentioned additive may be used alone or in combination of two or more compounds that are different from each other in chemical structure.

An appropriate amount of surfactant may be added to the developer, if necessary.

The surfactant is not particularly limited but, for example, ionic or nonionic fluorine-based and/or silicon-based surfactant may be used. Examples of the fluorine and/or silicone-based surfactants may include surfactants described in Japanese Patent Application Laid-Open Nos. S62-36663, S61-226746, S61-226745, S62-170950, S63-34540, H7-230165, H8-62834, H9-54432, and H9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but a fluorine-based surfactant or a silicone-based surfactant is more preferably used.

Further, the amount of the surfactant used is usually 0.001 to 5% by mass, preferably 0.005 to 2% by mass, and more preferably 0.01 to 0.5% by mass, based on the total amount of the developer.

As for the developing method, it is possible to apply, for example, a method of dipping a substrate in a bath filled with a developer for a predetermined time (a dipping method), a method of raising a developer on a substrate surface sufficiently by the effect of a surface tension and keeping the substrate still for a predetermined time, thereby performing development (a paddle method), a method of spraying a developer on a substrate surface (a spray method), a method of continuously ejecting a developer on a substrate spinning at a constant speed while scanning a developer ejecting nozzle at a constant rate (a dynamic dispense method) and the like.

When the above-described various developing methods include a process of ejecting a developer toward a resist film from a development nozzle of a developing apparatus, the ejection pressure of the developer ejected (the flow velocity per unit area of the developer ejected) is preferably 2 $mL/sec/mm^2$ or less, more preferably 1.5 $mL/sec/mm^2$ or less, and still more preferably 1 $mL/sec/mm^2$ or less. The flow velocity has no particular lower limit, but is preferably 0.2 $mL/sec/mm^2$ or more in consideration of throughput.

By setting the ejection pressure of the ejected developer to the aforementioned range, pattern defects resulting from the resist scum after development may be significantly reduced.

Details on the mechanism are not clear, but it is thought that it is because the pressure imposed on the resist film by the developer is decreased by setting the ejection pressure to the above-described range, so that the composition film and/or pattern is suppressed from being inadvertently cut or collapsing.

Further, the ejection pressure ($mL/sec/mm^2$) of the developer is the value at the outlet of the development nozzle in the developing apparatus.

Examples of the method for adjusting the ejection pressure of the developer may include a method of adjusting the ejection pressure by a pump and the like, a method of supplying a developer from a pressurized tank and adjusting the pressure to change the ejection pressure and the like.

In addition, after the process of performing development, a process of stopping the development while replacing the solvent with another solvent may be performed.

The pattern forming method according to the present invention may preferably include a rinsing process (a process of rinsing a film using a rinsing liquid containing an organic solvent) after the aforementioned developing process. Various performances may be enhanced particularly by performing the rinsing process depending on the formed pattern or the pattern forming process.

The rinsing liquid used in the rinsing process is not particularly limited as long as the rinsing liquid does not dissolve the pattern after the development, and a solution including a general organic solvent may be used.

As for the rinsing liquid, a rinsing liquid containing at least one of the organic solvents selected from the group consisting of a hydrocarbon-based solvent, a ketone-based solvent, an ester-based solvent, an alcohol-based solvent, an amide-based solvent and an ether-based solvent is used. This rinsing liquid more preferably includes at least one of the organic solvents selected from the group consisting of the ketone-based solvent, the ester-based solvent, the alcohol-based solvent and the amide-based solvent, and still more preferably, the alcohol-based solvent or the ester-based solvent may be used.

The rinsing liquid more preferably contains monovalent alcohol, and still more preferably contains monovalent alcohol having 5 or more carbon atoms.

The monovalent alcohol may be a straight type, a branched type, or a cyclic type. Examples of the monohydric alcohol may include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol and the like. As the monohydric alcohol having 5 or more carbon atoms, it is possible to use 1-hexanol, 2-hexanol, 4-methyl-2-pentanol, 1-pentanol, 3-methyl-1-butanol and the like.

Two or more components may be mixed, or may be used by being mixed with an organic solvent other than those described above.

The water content ratio in the rinsing liquid is preferably less than 10% by mass, more preferably less than 5% by mass, and still more preferably less than 3% by mass. That is, an amount of using the organic solvent in the rinsing liquid is preferably 90% by mass to 100% by mass, more preferably 95% by mass to 100% by mass, and particularly preferably 97% by mass to 100% by mass, based on the total amount of the rinsing liquid. By setting the water content ratio in the rinsing liquid below 10% by mass, better development characteristics may be obtained.

The vapor pressure of the rinsing liquid is preferably 0.05 kPa to 5 kPa, more preferably 0.1 kPa to 5 kPa, and still more preferably 0.12 kPa to 3 kPa, at 20° C. By setting the vapor pressure of the rinsing liquid to 0.05 kPa to 5 kPa, the temperature uniformity in the wafer plane is enhanced, and furthermore, swelling caused by permeation of the rinsing liquid is suppressed, and as a result, the dimensional uniformity in the wafer plane is improved. Further, a suitable amount of surfactant may be added to the rinsing liquid.

In the rinsing process, the wafer subjected to development is rinsed by using the aforementioned rinsing liquid. The method of rinsing treatment is not particularly limited, but it is possible to apply, for example, a method of continuously ejecting a rinsing liquid on a substrate spinning at a constant speed (spin coating method), a method of dipping a substrate in a bath filled with a rinsing liquid for a predetermined time (dipping method), a method of spraying a rinsing liquid on a substrate surface (spraying method) and the like. Among them, it is preferred that the rinsing treatment be performed by the spin coating method and subsequently, the substrate be spun at a rotational speed of 2,000 rpm to 4,000 rpm to remove the rinsing liquid from the substrate.

The pattern forming method of the present invention may also include a process of forming a resist pattern by performing development using an alkaline solution (alkali developing process). Therefore, it is possible to form a finer pattern.

In the present invention, a portion in which exposure strength is weak is removed by an organic solvent developing process, and a portion in which exposure strength is strong is also removed by further performing an alkali development process. By multiple development processes of performing a plurality of development processes as such, a pattern may be formed without dissolving an area of intermediate exposure strength alone, so that a pattern which is finer than a usual pattern may be formed (the mechanism as disclosed in [0077] of Japanese Patent Application Laid-Open No. 2008-292975).

The alkali development may be carried out before or after the process of performing the development using the developer containing the organic solvent, but is more preferably carried out before the organic solvent developing process.

The kind of the alkali developer is not particularly limited, but aqueous solution of tetramethylammonium hydroxide is usually used. A suitable amount of alcohols and/or surfactant may be added to the alkali developer.

Examples of the alkali developer may include inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetraalkylammonium hydroxide, such as tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide or dibutyldipentylammonium hydroxide, trimethylphenylammonium hydroxide, trimethylbenzylammonium hydroxide or triethylbenzylammonium hydroxide, and cyclic amines such as pyrrole and piperidine. Further, alcohols and surfactant may be added to the alkaline aqueous solution in an appropriate amount.

The alkali concentration of the alkali developer is usually 0.1 to 20% by mass. The pH of the alkali developer is usually 10.0 to 15.0. It is possible to appropriately adjust and use the alkali concentration and the pH of the alkali developer. A surfactant or an organic solvent may be added to the alkali developer.

The pattern obtained by the pattern forming method of the present invention is generally suitable for an etching mask for a semiconductor device and the like, and may also be used for other applications. Examples of the applications may include the formation of a guide pattern on DSA (Directed Self-Assembly) (for example, refer to ACS Nano Vol. 4 No. 8 Page-4815-4823), the use as a core for a so-called spacer process (for example, refer to Japanese Patent Application Laid-Open H3-270227, Japanese Patent Laid-Open Publication No. 2013-164509, and the like) and the like.

Further, the present invention also relates to a method of manufacturing an electronic device, including the pattern forming method of the present invention, and an electronic device manufactured by this manufacturing method.

The electronic device of the present invention is suitably mounted on electric electronic devices (such as home appliances, OA•media-related devices, optical devices and communication devices).

<Actinic Ray-Sensitive or Radiation-Sensitive Resin Composition>

Hereinafter, an actinic ray-sensitive or radiation-sensitive resin composition that may be used in the present invention will be described.

The actinic ray-sensitive or radiation-sensitive resin composition according to the present invention is used in a negative-type development (the exposure decreases solubility in the developer, so that the exposed portion remains as a pattern and the unexposed portion is removed). That is, the actinic ray-sensitive or radiation-sensitive resin composition according to the present invention may be used as an actinic ray-sensitive or radiation-sensitive resin composition for organic solvent development, which is used for development using a developer including an organic solvent. Here, the term, for organic solvent development refers to a use that is used in a process of performing the development using a developer including at least an organic solvent.

As such, the present invention also relates to the actinic ray-sensitive or radiation-sensitive resin composition that is used for the pattern forming method of the present invention. It is preferred that the actinic ray-sensitive or radiation-sensitive resin composition of the present invention be typically a resist composition and a negative-type resist composition (i.e., a resist composition for organic solvent development), because a particularly good effect may be obtained. In addition, the composition according to the present invention is typically a chemical amplification resist composition.

The composition used in the present invention includes [A] a resin and [B] a solvent. This composition may further include at least one of [C] a compound (hereinafter referred to as an acid generator) generating acid by performing decomposition upon irradiation with an actinic ray or radiation, [D] a basic compound, [E] hydrophobic resin, [F] surfactant, and [G] other additives. However, in the present invention, it is preferred that the composition have no [C].

Hereinafter, the respective components will be described sequentially.

[A] Resin

The composition according to the present invention contains the resin. The resin includes a repeating unit (hereinafter referred to as a repeating unit (R)) having a structural moiety that dcomposes upon irradiation with an actinic ray or radiation to generate an acid.

[1] Repeating Unit (R)

The repeating unit (R) may have any structure as long as it has a structural moiety capable of decomposing upon irradiation with an actinic ray or radiation to generate an acid.

The repeating unit (R) is preferably represented by any one of the following Formulas (III) to (VII), more preferably represented by any one of the following Formula (III), (VI) and (VII), and still more preferably represented by any one of the following Formula (III).

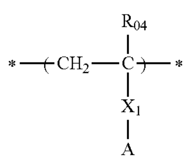

(III)

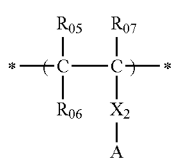

(IV)

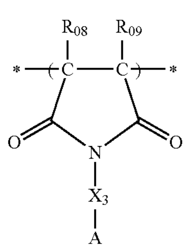

(V)

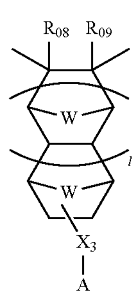

(VI)

-continued

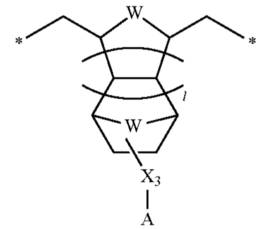

(VII)

In the formulas,

Each of $R_{04}$, $R_{05}$ and $R_{07}$ to $R_{09}$ independently represents a hydrogen atom, an alkyl group, a cycloalkyl group, a halogen atom, a cyano group or an alkoxy carbonyl group.

$R_{06}$ represents a cyano group, a carboxyl group, —CO—$OR_{25}$ or —CO—$N(R_{26})(R_{27})$. If $R_{06}$ represents —CO—N$(R_{26})(R_{27})$, $R_{26}$ and $R_{27}$ may combine with each other to form a ring along with a nitrogen atom.

Each of $X_1$ to $X_3$ independently represents a single bond, or an arylene group, an alkylene group, a cycloalkylene group, —O—, —$SO_2$—, —CO—, —$N(R_{33})$— or a divalent linking group obtained by combining two or more of them.

$R_{25}$ represents an alkyl group, a cycloalkyl group, an alkenyl group, a cycloalkenyl group, an aryl group or an aralkyl group.

Each of $R_{26}$, $R_{27}$ and $R_{33}$ independently represents a hydrogen atom, an alkyl group, a cycloalkyl group, an alkenyl group, a cycloalkenyl group, an aryl group or an aralkyl group.

W represents —O—, —S— or a methylene group.

l represents 0 or 1.

A represents a structural moiety capable of decomposing upon irradiation with an actinic ray or radiation to generate an acid.

Each of $R_{04}$, $R_{05}$ and $R_{07}$ to $R_{09}$ independently represents a hydrogen atom, an alkyl group, a cycloalkyl group, a halogen atom, a cyano group or an alkoxy carbonyl group. Each of $R_{04}$, $R_{05}$ and $R_{07}$ to $R_{09}$ is preferably the hydrogen atom or the alkyl group.

Each of $R_{04}$, $R_{05}$ and $R_{07}$ to $R_{09}$ may have a straight or branched alkyl group. The alkyl group has preferably 20 or less carbon atoms, and more preferably 8 or less carbon atoms. Examples of the alkyl group may include a methyl group, an ethyl group, a propyl group, an isopropyl group, an n-butyl group, a sec-butyl group, a hexyl group, a 2-ethylhexyl group, an octyl group, and a dodecyl group.

Each of $R_{04}$, $R_{05}$ and $R_{07}$ to $R_{09}$ may have a monocyclic or polycyclic cycloalkyl group. The cycloalkyl group preferably has 3 to 8 carbon atoms. Examples of the cycloalkyl group may include a cyclopropyl group, a cyclopentyl group, and a cyclohexyl group.

Examples of the halogen atom of $R_{04}$, $R_{05}$ and $R_{07}$ to $R_{09}$ may include a fluorine atom, a chlorine atom, a bromine atom and an iodine atom. Among them, the fluorine atom is particularly preferred.

The alkyl-group moiety of the alkoxy carbonyl group of $R_{04}$, $R_{05}$ and $R_{07}$ to $R_{09}$ preferably takes the aforementioned examples as the alkyl group of $R_{04}$, $R_{05}$ and $R_{07}$ to $R_{09}$.

$R_{06}$ represents a cyano group, a carboxyl group, a —CO—$OR_{25}$ or —CO—$N(R_{26})(R_{27})$. $R_{06}$ is preferably the carboxyl group or —CO—$OR_{25}$.

Each of $X_1$ to $X_3$ independently represents a single bond, or an arylene group, an alkylene group, a cycloalkylene group, —O—, —$SO_2$—, —CO—, —$N(R_{33})$— or a divalent linking group obtained by combining a plurality of them together. Each of $X_1$ to $X_3$ preferably includes —COO— or the arylene group, and more preferably includes —COO—.

The arylene group that may include the divalent linking group of $X_1$ to $X_3$ preferably has 6 to 14 carbon atoms. Examples of the arylene group may include a phenylene group, tolylene group and naphthylene group.

The alkylene group that may include the divalent linking group of $X_1$ to $X_3$ preferably has 1 to 8 carbon atoms. Examples of the alkylene group may include a methylene group, an ethylene group, a propylene group, a butylene group, a hexylene group, and an octylene group.

The cycloalkylene group that may include the divalent linking group of $X_1$ to $X_3$ preferably has 5 to 8 carbon atoms. Examples of the cycloalkylene group may include a cyclopentylene group and a cyclohexylene group.

$R_{25}$ represents an alkyl group, a cycloalkyl group, an alkenyl group, a cycloalkenyl group, an aryl group or an aralkyl group. $R_{25}$ is preferably the alkyl group.

Each of $R_{26}$, $R_{27}$ and $R_{33}$ independently represents a hydrogen atom, an alkyl group, a cycloalkyl group, an alkenyl group, a cycloalkenyl group, an aryl group or an aralkyl group. Each of $R_{26}$, $R_{27}$ and $R_{33}$ is preferably the hydrogen atom or the alkyl group.

The alkyl group of $R_{25}$ to $R_{27}$ and $R_{33}$ may take the aforementioned examples as the alkyl group of $R_{04}$, $R_{05}$ and $R_{07}$ to $R_{09}$.

The cycloalkyl group of $R_{25}$ to $R_{27}$ and $R_{33}$ may take the aforementioned examples as the cycloalkyl group of $R_{04}$, $R_{05}$ and $R_{07}$ to $R_{09}$.

$R_{25}$ to $R_{27}$ and $R_{33}$ may have a straight or branched alkenyl group. The alkenyl group preferably preferably has 2 to 6 carbon atoms. Examples of the alkenyl group may include a vinyl group, a prophenyl group, an allyl group, a butenyl group, a pentenyl group, and a hexenyl group.

$R_{25}$ to $R_{27}$ and $R_{33}$ may be preferably a monocyclic or a polycyclic cycloalkenyl group. The cycloalkenyl group preferably has 3 to 6 carbon atoms. Examples of the cycloalkenyl group may include a cyclohexenyl group.

$R_{25}$ to $R_{27}$ and $R_{33}$ may be preferably a monocyclic or a polycyclic aryl group. The aryl group is preferably an aromatic group having 6 to 14 carbon atoms. Examples of the aryl group may include a phenyl group, a tolyl group, a chlorophenyl group, a methoxyphenyl group, and a naphthyl group. Further, the aryl groups may combine with each other to form a double ring.

$R_{25}$ to $R_{27}$ and $R_{33}$ is preferably the aralkyl group having 7 to 15 carbon atoms. Examples of the aralkyl group may include a benzyl group, a phenethyl group, and a cumyl group.

As described above, $R_{265}$ and $R_{27}$ may combine with each other to form a ring along with a nitrogen atom. This ring is preferably a 5 to 8-membered ring. Examples of the ring may include a pyrrolidine ring, a piperidine ring, and a piperazine ring.

W represents —O—, —S— or a methylene group. It is preferred that W is the methylene group.

l represents 0 or 1. l is preferably 0.

Each of the aforementioned groups may have a substituent. Examples of the substituent may include a hydroxy group; a halogen atom (fluorine, chlorine, bromine, or iodine atom); a nitro group; a cyano group; an amide group; a sulfonamide group; an alkyl group exemplified for $R_{04}$-$R_{09}$, $R_{25}$-$R_{27}$ and $R_{33}$; an alkoxy group such as a methoxy group, an ethoxy group, a hydroxyethoxy group, a propoxy group, a hydroxypropoxy group, and a butoxy group; an alkoxy carbonyl group such as a methoxycarbonyl group and an ethoxycarbonyl group; an acyl group such as a formyl group, an acetyl group and a benzoyl group; an acyloxy group such as an acetoxy group and a butyryloxy group; and a carboxyl group. The substituent preferably has 8 or less carbon atoms.

A represents a structural moiety capable of decomposing upon irradiation of an actinic ray or radiation to generate an acid. The structural unit will be described below in detail.

The structural moiety (for example, structural moiety represented by A) of the repeating unit (R) capable of decomposing upon irradiation of an actinic ray or radiation to generate an acid may utilize a structural moiety of a compound that generates an acid by light, which is used for a photo-initiator for cationic photopolymerization, a photo-initiator for radical photopolymerization, a photodecoloring agent for dyes, a photodiscoloring agent, or microresist, for example.

The structural moiety is preferably a structural moiety capable of decomposing upon irradiation with an actinic ray or radiation to generate an acid. Further, the generated acid group is preferably a sulfonate group or an imidate group, and more preferably a sulfonate group.

If the generated acid group is the sulfonic acid or imidic acid, the diffusion of the generated acid is further suppressed, thus further improving the resolution, the exposure latitude (EL), and the pattern shape.

This structural moiety may be an ionic structure or a non-ionic structure. The structural moiety may be preferably the ionic structural moiety.

Hereinafter, both the nonionic structural moiety and the ionic structural moiety will be described in detail.

(Nonionic Structural Moiety)

A preferred example of the nonionic structural moiety may be a structural moiety having an oxime structure.

An example of the nonionic structural moiety may include a structural moiety represented by the following Formula (N1). This structural moiety has an oxime sulfonate structure.

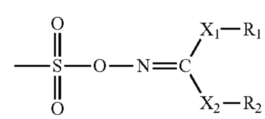

(N1)

In the formula,

Each of $R_1$ and $R_2$ independently represents a hydrogen atom, a halogen atom, a cyano group, an alkyl group, a cycloalkyl group, an alkenyl group, a cycloalkenyl group, an aryl group, or aralkyl group. Here, an aromatic ring of the aryl group or aralkyl group may be an aromatic heterocyclic ring.

Each of $X_1$ and $X_2$ independently represents a single bond or a divalent linking group. $X_1$ and $X_2$ may combine with each other to form a ring.

$R_1$ and $R_2$ may have a straight or branched alkyl group. The alkyl group has preferably 30 or less carbon atoms, and more preferably 18 or less carbon atoms. Examples of the alkyl group may include a methyl group, an ethyl group, a propyl group, an isopropyl group, an n-butyl group, a sec-butyl group, a hexyl group, a 2-ethylhexyl group, an octyl group, and a dodecyl group.

$R_1$ and $R_2$ may have a monocyclic or polycyclic cycloalkyl group. The cycloalkyl group preferably has 3 to 30 carbon atoms. Examples of the cycloalkyl group may include a cyclopropyl group, a cyclopentyl group, and a cyclohexyl group.

$R_1$ and $R_2$ may have a straight or branched alkenyl group. The alkenyl group preferably has 2 to 30 carbon atoms. Examples of the alkeyl group may include a vinyl group, a prophenyl group, an allyl group, a butenyl group, a pentenyl group, and a hexenyl group.

$R_1$ and $R_2$ may have a monocyclic or polycyclic cycloalkenyl group. The cycloalkenyl group preferably has 3 to 30 carbon atoms. An example of the cycloalkenyl group may include a cyclohexenyl group.

$R_1$ and $R_2$ may have a monocyclic or polycyclic aryl group. The aryl group preferably has 6 to 30 carbon atoms. An example of the aryl group may include a phenyl group, a tolyl group, a chlorophenyl group, a methoxyphenyl group, a naphthyl group, a non-phenyl group, and Terphenyl. Further, the aryl groups may combine with each other to form a ring.

The aralkyl group of $R_1$ and $R_2$ preferably has 7 to 15 carbon atoms. Examples of the aralkyl group may include a benzyl group, a phenethyl group, and a cumyl group.

Further, as described above, the aromatic ring of each of the aryl group and the aralkyl group may be the aromatic heterocyclic ring. That is, these groups may have the heterocyclic ring structure including an oxygen atom, a nitrogen atom, a sulfur atom and the like.

Each group may have a substituent. Examples of the substituent may include a hydroxy group; a halogen atom (fluorine, chlorine, bromine, or iodine atom); a nitro group; a cyano group; an amide group; a sulfonamide group; an alkyl group exemplified for $R_1$ and $R_2$; an alkoxy group such as a methoxy group, an ethoxy group, a hydroxyethoxy group, a propoxy group, a hydroxypropoxy group, and a butoxy group; an alkoxy carbonyl group such as a methoxycarbonyl group or an ethoxycarbonyl group; an acyl group such as a formyl group, an acetyl group or a benzoyl group; an acyloxy group such as an acetoxy group and a butyryloxy group; and a carboxyl group. The substituent preferably has 8 or less carbon atoms.

Examples of the divalent linking group of $X_1$ and $X_2$ may include a group exemplified in the following, or a group obtained by combining at least two structural units with each other. The linking group may have a substituent. The atom number of the divalent linking group as $X_1$ and $X_2$ is preferably 40 or less.

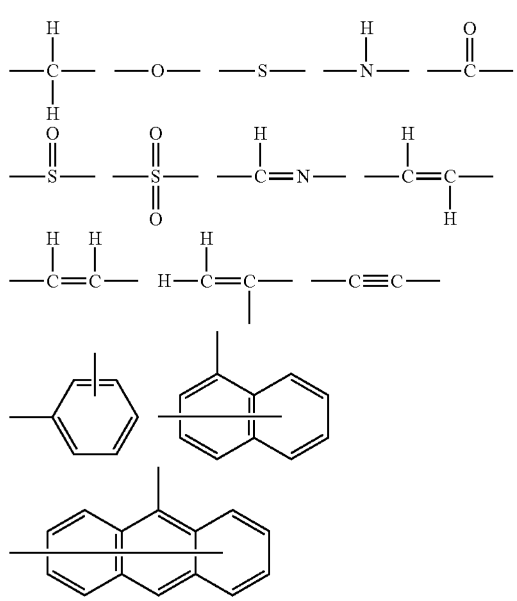

Examples of the substituent of the divalent linking group may be the same as those described for $R_1$ and $R_2$.

As described above, $X_1$ and $X_2$ may combine with each other to form a ring. This ring is preferably a 5- to 7-membered ring. Further, the ring may include a sulfur atom or an unsaturated bond.

The structural moiety represented by Formula (N1) is more preferably represented by either of the following Formula (N1-I) or (N1-II).

(N1-I)

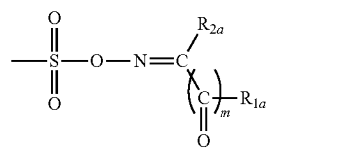

(N1-II)

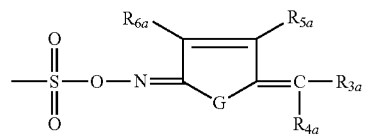

In the formulas, $R_{1a}$ represents a hydrogen atom, an alkyl group (preferably having 1 to 18 carbon atoms, it may have a divalent linking group in the chain), a cycloalkyl group (preferably having 3 to 30 carbon atoms, it may have a divalent linking group in the ring), a monocyclic or polycyclic aryl group (preferably having 6 to 30 carbon atoms, a plurality of aryl groups may be bonded to each other via a single bond, an ether group or a thioether group), a heteroaryl group (preferably having 6 to 30 carbon atoms), an alkenyl group (preferably having 2 to 12 carbon atoms), a cycloalkenyl group (preferably having 4 to 30 carbon atoms), an aralkyl group (preferably having 7 to 15 carbon atoms, it may have a heteroatom), a halogen atom, a cyano group, an alkoxy carbonyl group (preferably having 2 to 6 carbon atoms) or a phenoxycarbonyl group.

$R_{2a}$ represents a hydrogen atom, an alkyl group (preferably having 1 to 18 carbon atoms, it may have a divalent linking group in the chain), a cycloalkyl group (preferably having 3 to 30 carbon atoms, it may have a divalent linking group in the ring), a monocyclic or polycyclic aryl group (preferably having 6 to 30 carbon atoms, a plurality of aryl groups may be bonded to each other via a single bond, an ether group, or a thioether group), a heteroaryl group (preferably having 6 to 30 carbon atoms), an alkenyl group (preferably having 2 to 12 carbon atoms), a cycloalkenyl group (preferably having 4 to 30 carbon atoms), an aralkyl group (preferably having 7 to 15 carbon atoms, it may have a heteroatom), a halogen atom, a cyano group, an alkoxy carbonyl group (preferably having 2 to 6 carbon atoms), a phenoxycarbonyl group, an alkanoyl group (preferably having 2 to 18 carbon atoms), a benzoyl group, a nitro group, an —$S(O)_p$-alkyl group (preferably having 1 to 18 carbon atoms, p of the formula represents 1 or 2), an —$S(O)_p$-aryl group (preferably having 6 to 12 carbon atoms, p of the formula represents 1 or 2), an —$SO_2O$-alkyl group (preferably having 1 to 18 carbon atoms) or an —$SO_2O$-aryl group (preferably having 6 to 12 carbon atoms).

$R_{1a}$ and $R_{2a}$ may combine with each other to form a ring (preferably a 5- to 7-membered ring).

m represents 0 or 1.

Each of $R_{3a}$ and $R_{4a}$ independently represents a hydrogen atom, an alkyl group (preferably having 1 to 18 carbon atoms, it may have a divalent linking group in the chain), a cycloalkyl group (preferably having 3 to 30 carbon atoms, it may have a divalent linking group in the chain), a monocyclic or polycyclic aryl group (preferably having 6 to 30 carbon atoms, a plurality of aryl groups may combine with each other via a single bond, an ether group, and a thioether group), a heteroaryl group (preferably having 6 to 30 carbon atoms), an alkenyl group (preferably having 2 to 12 carbon atoms), a cycloalkenyl group (preferably having 4 to 30 carbon atoms), a cyano group, an alkoxy carbonyl group (preferably having 2 to 6 carbon atoms), a phenoxycarbonyl group, an alkanoyl group (preferably having 2 to 18 carbon atoms), a benzoyl group, a nitro group, a cyano group, an —S(O)p-alkyl group (preferably having 1 to 18 carbon atoms, p of the formula represents 1 or 2), an $—S(O)_p$-aryl group (preferably having 6 to 12 carbon atoms, p of the formula represents 1 or 2), an $—SO_2O$-alkyl group (preferably having 1 to 18 carbon atoms) or an $—SO_2O$-aryl group (preferably having 6 to 12 carbon atoms).

$R_{3a}$ and $R_{4a}$ may combine with each other to form a ring (preferably a 5 to 7-membered ring).

Each of $R_{5a}$ and $R_{6a}$ independently represents a hydrogen atom, an alkyl group (preferably having 1 to 18 carbon atoms), a cycloalkyl group (preferably having 3 to 30 carbon atoms, it may have a divalent linking group in a ring), a halogen atom, a nitro group, a cyano group, an aryl group (preferably having 6 to 30 carbon atoms) or a heteroaryl group (preferably having 6 to 30 carbon atoms).

The divalent linking group in $R_{1a}$ to $R_{6a}$ may be the divalent linking group such as $X_1$ and $X_2$ in Formula (N1), and the ether group or the thioether group is more preferred.

G represents an ether group or a thioether group.

Each group may have a substituent. Examples of the substituent may include a hydroxy group; a halogen atom (fluorine, chlorine, bromine, or iodine atom); a nitro group; a cyano group; an amide group; a sulfonamide group; an alkyl group exemplified for $R_1$ and $R_2$ of Formula (N1); an alkoxy group such as a methoxy group, an ethoxy group, a hydroxyethoxy group, a propoxy group, a hydroxypropoxy group, and a butoxy group; an alkoxy carbonyl group such as a methoxycarbonyl group or an ethoxycarbonyl group; an acyl group such as a formyl group, an acetyl group or a benzoyl group; an acyloxy group such as an acetoxy group and a butyryloxy group; and a carboxyl group. The substituent preferably has 8 or less carbon atoms.

Hereinafter, the specific example of a group represented by Formula (N1-I) or (N1-II) will be described.

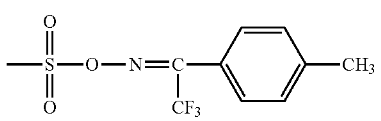

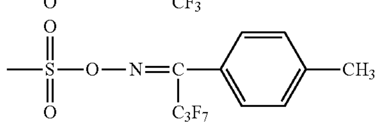

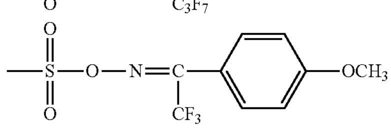

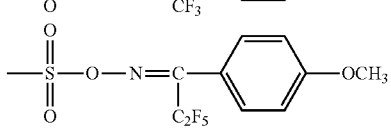

-continued

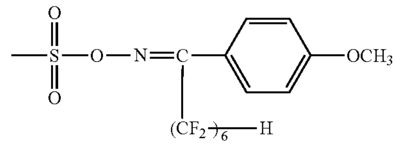

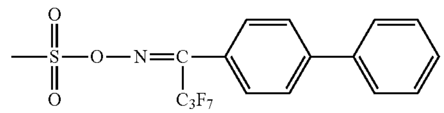

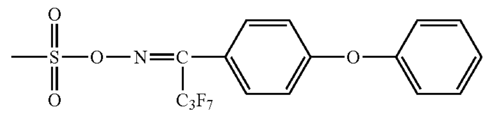

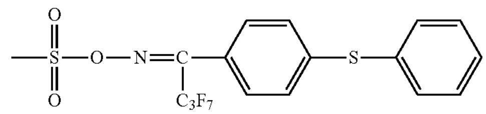

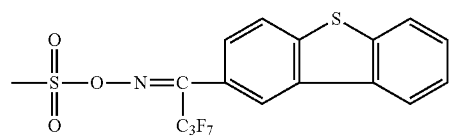

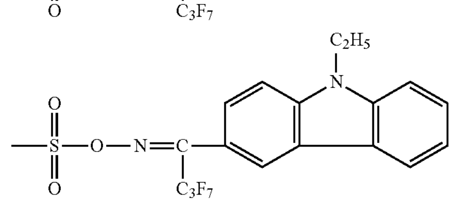

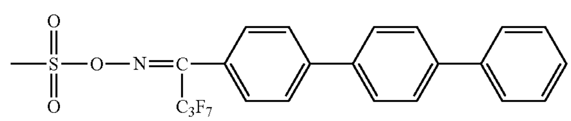

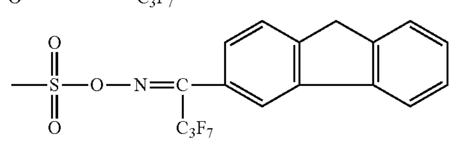

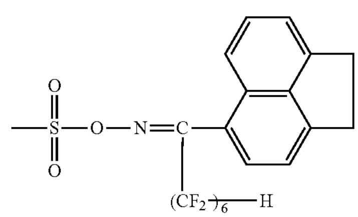

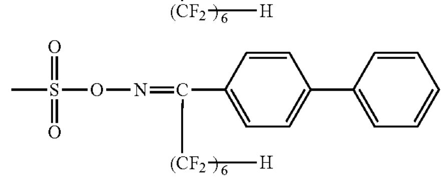

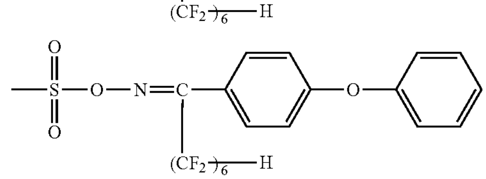

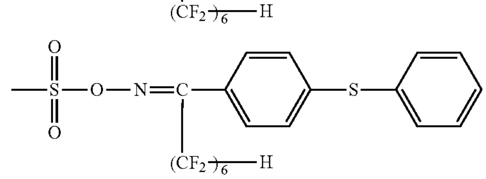

-continued

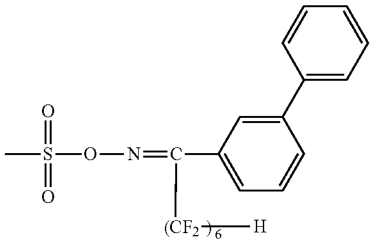

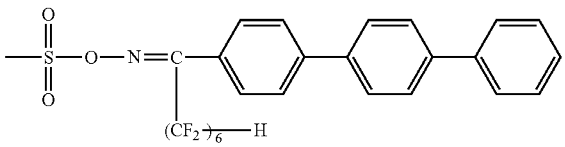

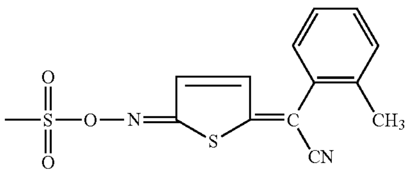

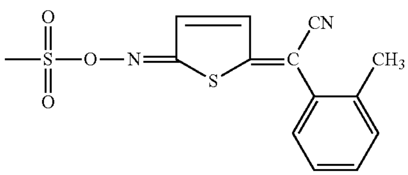

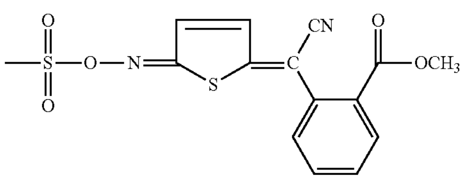

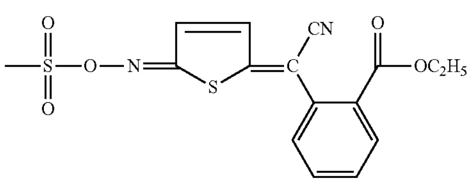

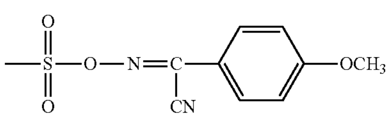

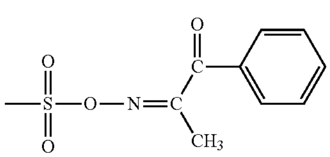

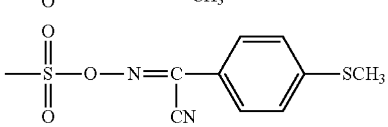

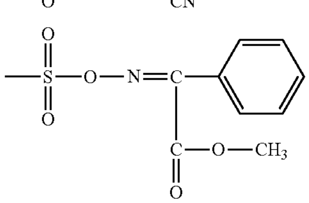

-continued

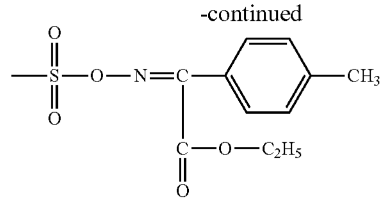

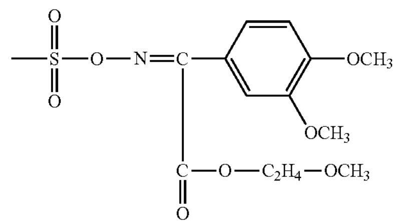

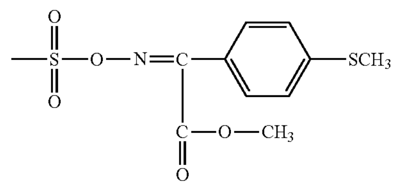

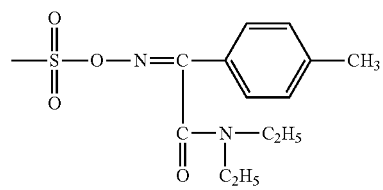

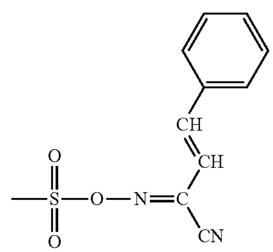

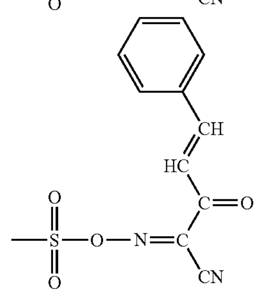

Alternatively, the nonionic structural moiety may be a structural moiety represented by any one of the following Formulas (N2) to (N9). As the nonionic structural moiety, a structural moiety represented by any one of the following Formulas (N1) to (N4) is more preferred, and a structural moiety represented by Formula (N1) is still more preferred.

$$—SO_2—SO_2—Ar_6 \tag{N2}$$

-continued (N3)

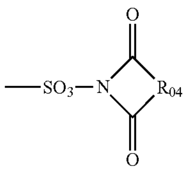

(N4)

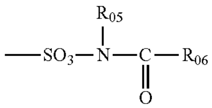

(N5)

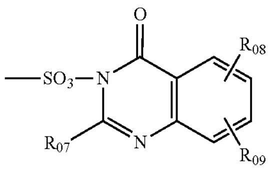

(N6)

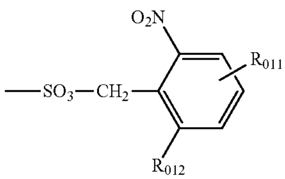

(N7)

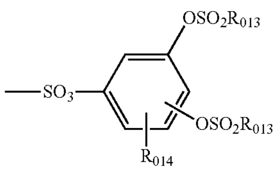

(N8)

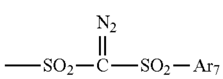

(N9)

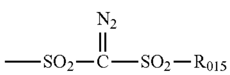

In the formulas,

Each of $Ar_6$ and $Ar_7$ independently represents an aryl group. The aryl group may be exemplified by the same as those described for $R_{25}$ to $R_{27}$ and $R_{33}$.

$R_{04}$ represents an arylene group, an alkylene group or an alkenylene group. The alkenylene group preferably has 2 to 6 carbon atoms. Examples of the alkenylene group may include an ethenylene group, a prophenylene group and a butenylene group. The alkenylene group may have a substituent. The substituent that may be included in the arylene group and alkylene group of $R_{04}$ and a group represented by $R_{04}$ may be exemplified by those described for the divalent linking group of $X_1$ to $X_3$ in Formulas (III) to (VII).

Each of $R_{05}$ to $R_{09}$, $R_{013}$ and $R_{015}$ independently represents may be an alkyl group, a cycloalkyl group, an aryl group and an aralkyl group. The groups may be exemplified by those described for $R_{25}$ to $R_{27}$ and $R_{33}$. Further, if the alkyl group of $R_{05}$ to $R_{09}$, $R_{013}$ and $R_{015}$ has a substituent, the alkyl group is preferably haloalkyl group.

Each of $R_{011}$ and $R_{014}$ independently represents a hydrogen atom, a hydroxy group, a halogen atom (fluorine, chlorine, bromine, or iodine atom), an alkyl group, an alkoxy group, an alkoxy carbonyl group, or an acyloxy group represented as the preferred substituent.

$R_{012}$ represents a hydrogen atom, a nitro group, a cyano group, or a perfluoroalkyl group. Examples of the perfluoroalkyl group may include a trifluoromethyl group and a pentafluoroethyl group.

Specific examples of the nonionic structural moiety may include a moiety corresponding to a specific example of the repeating unit (R) that will be described below.

(Ionic Structural Moiety)

As described above, the repeating unit (R) preferably has an ionic structural moiety capable of decomposing upon irradiation with an actinic ray or radiation to generate an acid.

Examples of the ionic structural moiety may include more preferably a sulfonium salt of sulfonic acid, an iodonium salt, a sulfonium salt of imidic acid, an iodonium salt and the like, and still more preferably include the sulfonium salt of the sulfonic acid and the sulfonium salt of the imidic acid.

An example of the ionic structural moiety may include a structural moiety having an onium salt. Such a structural unit may be a structural unit represented by either of the following Formulas (ZI) and (ZII), for example. The structural units represented by the following Formulas (ZI) and (ZII) include the sulfonium salt and the iodonium salt, respectively.

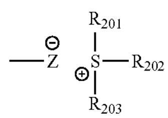

ZI

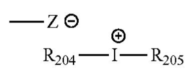

ZII

First, the structural unit represented by Formula (ZI) will be described.

In Formula (ZI), each of $R_{201}$, $R_{202}$ and $R_{203}$ independently represents an organic group.

The organic group as $R_{201}$, $R_{202}$ and $R_{203}$ generally has 1 to 30 carbon atoms, and preferably has 1 to 20 carbon atoms. Further, two of $R_{201}$ to $R_{203}$ may combine with each other to form a ring structure, and may include an oxygen atom, a sulfur atom, an ester bond, an amide bond, or a carbonyl group in the ring. As a group formed by combining two of $R_{201}$ to $R_{203}$ with each other, it is possible to use an alkylene group (for example, a butylene group, a pentylene group).

$Z^-$ represents an acid anion that is generated by decomposition upon irradiation with an actinic ray or radiation, and preferably a non-nucleophilic anion. Examples of the non-nucleophilic anion may include sulfonate anion ($—SO_3^-$), carboxylate anion ($—CO_2^-$), imidic acid anion, methide acid anion and the like. As the imidic acid anion, the anion represented by the following Formula (AN-1) is preferred. Further, as the methide acid anion, the anion represented by the following Formula (AN-2) is preferred.

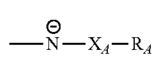

(AN-1)

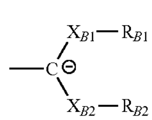

(AN-2)

In the formula,

Each of $X_A$, $X_{B1}$ and $X_{B2}$ independently represents —CO— or —SO2-.

Each of $R_A$, $R_{B1}$ and $R_{B2}$ independently represents an alkyl group. This alkyl group may have a substituent. As the substituent, a fluorine atom is particularly preferred.

Further, $R_{B1}$ and $R_{B2}$ may combine with each other to form a ring. Furthermore, each of $R_A$, $R_{B1}$ and $R_{B2}$ may combine with any atom constituting a side chain of the repeating unit (R) to form a ring. In this case, each of $R_A$, $R_{B1}$ and $R_{B2}$ represents a single bond or an alkylene group, for example.

The non-nucleophilic anion is an anion having an extremely low ability of causing a nucleophilic reaction and capable of suppressing the decomposition with time due to an intramolecular nucleophilic reaction. Accordingly, the stability of the resin with time is enhanced, and the stability of the composition with time is likewise enhanced.

Examples of an organic group of $R_{201}$, $R_{202}$ and $R_{203}$ in Formula (ZI) may include corresponding groups in the structural unit (ZI-1), (ZI-2), (ZI-3) or (ZI-4) that will be described below.

The structural unit (ZI-1) is a structural unit where at least one of $R_{201}$ to $R_{203}$ of Formula (ZI) is an aryl group. That is, the structural unit (ZI-1) is a structural unit having arylsulfonium as a cation.

In the structural unit, all of $R_{201}$ to $R_{203}$ may be an aryl group or a part of $R_{201}$ to $R_{203}$ may be an aryl group, with the remaining being an alkyl group or a cycloalkyl group. Examples of the structural unit (ZI-1) may include a triarylsulfonium structural unit, a diarylalkylsulfonium structural unit, an aryldialkylsulfonium structural unit, a diarylcycloalkylsulfonium structural unit and an aryldicycloalkylsulfonium structural unit.

The aryl group in the arylsulfonium is preferably a phenyl group and a naphthyl group, and more preferably a phenyl group. The aryl group may be an aryl group having a heterocyclic structure having an oxygen atom, a nitrogen atom, a sulfur atom and the like. Examples of the heterocyclic structure may include the structure of pyrrole, furan, thiophene, indole, benzofuran, benzothiophene and the like. When the arylsulfonium has two or more aryl groups, the two or more aryl group may be same as or different.

The alkyl group or the cycloalkyl group, which the arylsulfonium has, if necessary, is preferably a straight or branched alkyl group having 1 to 15 carbon atoms and a cycloalkyl group having 3 to 15 carbon atoms, and examples thereof may include a methyl group, an ethyl group, a propyl group, an n-butyl group, a sec-butyl group, a t-butyl group, a cyclopropyl group, a cyclobutyl group, a cyclohexyl group and the like.

The aryl group, the alkyl group and the cycloalkyl group of $R_{201}$ to $R_{203}$ may have, as a substituent, an alkyl group (for example, having from 1 to 15 carbon atoms), a cycloalkyl group (for example, having from 3 to 15 carbon atoms), an aryl group (for example, having from 6 to 14 carbon atoms), an alkoxy group (for example, having from 1 to 15 carbon atoms), a halogen atom, a hydroxyl group or a phenylthio group. The substituent is preferably a straight or branched alkyl group having 1 to 12 carbon atoms, a cycloalkyl group having 3 to 12 carbon atoms, and a straight, branched or cyclic alkoxy group having 1 to 12 carbon atoms, and more preferably an alkyl group having 1 to 4 carbon atoms and an alkoxy group having 1 to 4 carbon atoms. The substituent may be substituted with any one of three $R_{201}$ to $R_{203}$ or may be substituted with all of the three.

Furthermore, when $R_{201}$ to $R_{203}$ are an aryl group, the substituent is preferably substituted at the p-position of the aryl group.

Next, the structural unit (ZI-2) will be shown.

The structural unit (ZI-2) is a structural unit in which each of $R_{201}$ to $R_{203}$ in Formula (ZI) independently represents an organic group having no aromatic ring. Here, the aromatic ring also includes an aromatic ring containing a heteroatom.

The organic group having no aromatic ring as $R_{201}$ to $R_{203}$ has generally 1 to 30 carbon atoms, and preferably 1 to 20 carbon atoms.

Each of $R_{201}$ to $R_{203}$ independently represents preferably an alkyl group, a cycloalkyl group, an allyk group or a vinyl group, more preferably a straight or branched 2-oxoalkyl group, a 2-oxocycloalkyl group and an alkoxycarbonylmethyl group, and particularly preferably a straight or branched 2-oxoalkyl group.

Preferred examples of the alkyl group and the cycloalkyl group of $R_{201}$ to $R_{203}$ may include a straight or branched alkyl group having 1 to 10 carbon atoms (for example, a methyl group, an ethyl group, a propyl group, a butyl group and a pentyl group) and a cycloalkyl group having 3 to 10 carbon atoms (a cyclopentyl group, a cyclohexyl group and a norbornyl group). More preferred examples of the alkyl group may include a 2-oxoalkyl group and an alkoxycarbonylmethyl group. More preferred examples of the cycloalkyl group may include a 2-oxocycloalkyl group.

The 2-oxoalkyl group may be either straight or branched, and preferred examples thereof may include a group having >C═O at the 2-position of the aforementioned alkyl group.

Preferred examples of the 2-oxocycloalkyl group may include a group having >C═O at the 2-position of the aforementioned cycloalkyl group.

Preferred examples of the alkoxy group in the alkoxycarbonylmethyl group may include an alkoxy group having 1 to 5 carbon atoms (a methoxy group, an ethoxy group, a propoxy group, a butoxy group and a pentoxy group). $R_{201}$ to $R_{203}$ may be further substituted with a halogen atom, an alkoxy group (for example, having 1 to 5 carbon atoms), a hydroxyl group, a cyano group or a nitro group.

A structural unit (ZI-3) is a structural unit represented by the following Formula (ZI-3). The structural unit has a phenacylsulfonium salt structure.

(ZI-3)

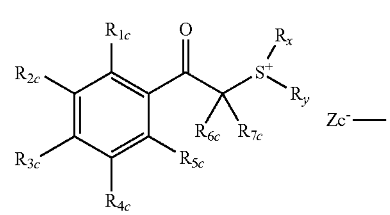

In Formula (ZI-3),

Each of $R_{1c}$ to $R_{5c}$ independently represents a hydrogen atom, an alkyl group, a cycloalkyl group, an alkoxy group, a halogen atom or a phenylthio group.

Each of $R_{6c}$ and $R_{7c}$ independently represents a hydrogen atom, an alkyl group, a cycloalkyl group, a halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more of $R_{1c}$ to $R_{5c}$, $R_{6c}$ and $R_{7c}$, and $R_x$ and $R_y$ may combine with each other to form a ring structure, respectively, and the ring structure may include an oxygen atom, a sulfur atom, an ester bond and an amide bond.

Examples of the ring structure may include an aromatic or non-aromatic hydrocarbon ring, an aromatic or non-aromatic heterocyclic ring, or a polycyclic condensed ring formed by combining two or more of these rings. Examples of the group formed by combining any two or more of $R_{1c}$ to $R_{5c}$, $R_{6c}$ and $R_{7c}$, and $R_x$ and $R_y$ may include a butylene group, a pentylene group and the like.

$Zc^-$ represents an acid anion that is generated by the decomposition upon irradiation with an actinic ray or radiation, and preferably represents a non-nucleophilic anion. Examples of the anion may include the anion which is the same as $Z^-$ in Formula (ZI).

Hereinafter, a specific example of a cation moiety of the structural unit (ZI-3) will be shown.

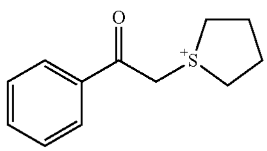

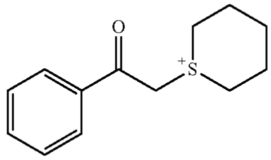

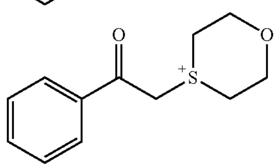

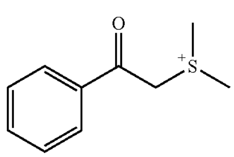

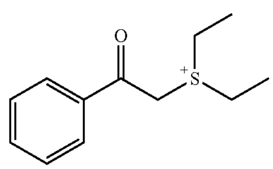

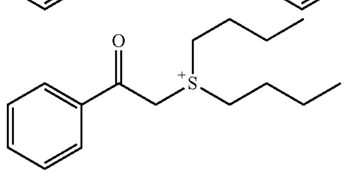

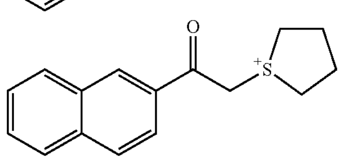

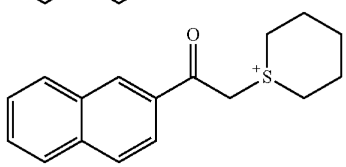

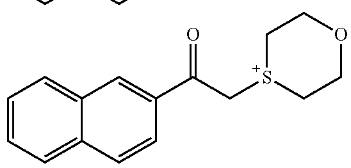

-continued

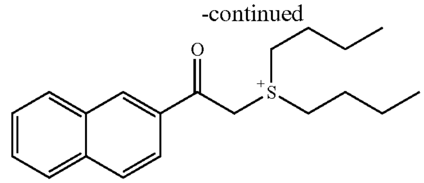

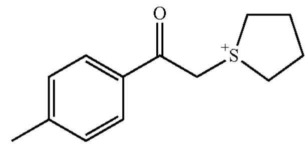

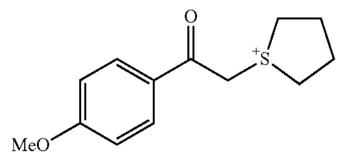

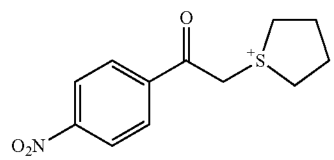

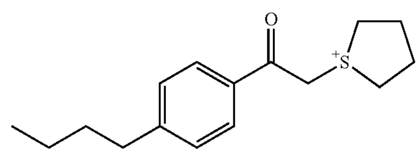

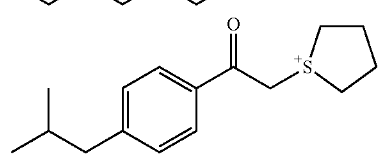

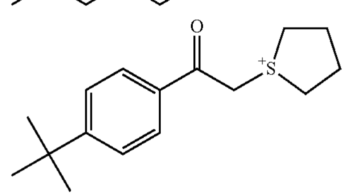

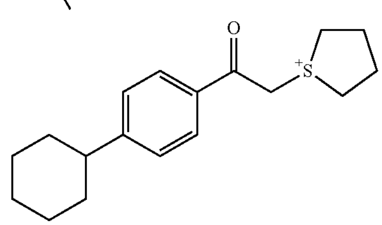

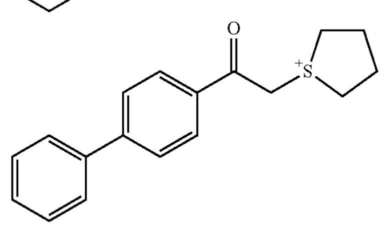

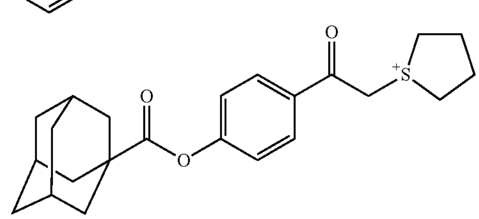

-continued
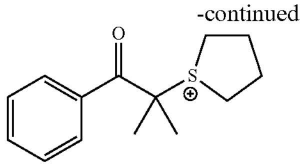
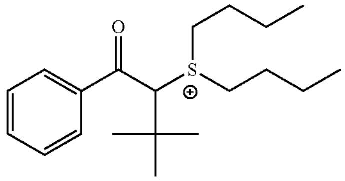
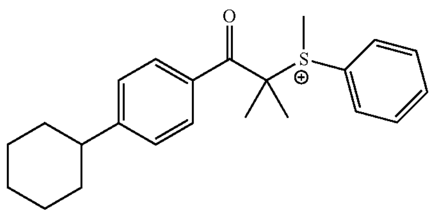
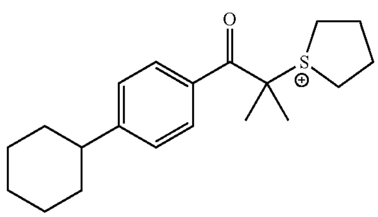
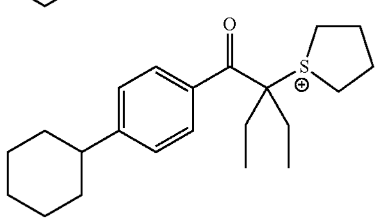
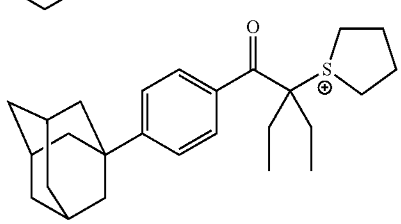
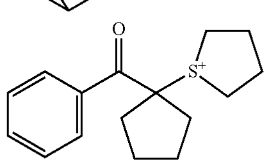
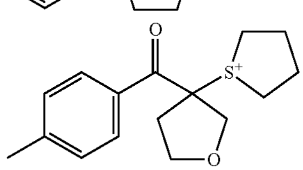
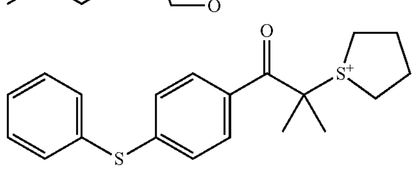
-continued
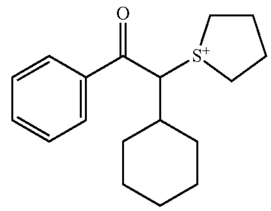
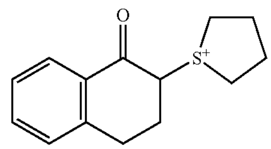
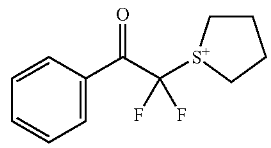
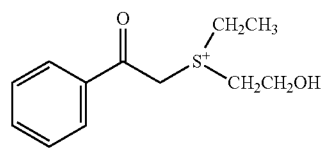
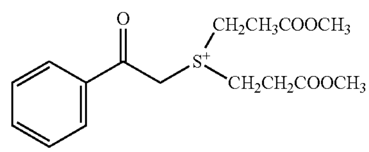
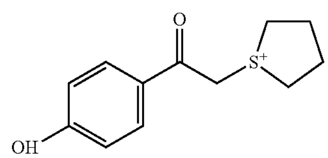
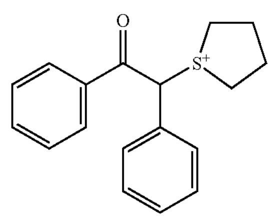
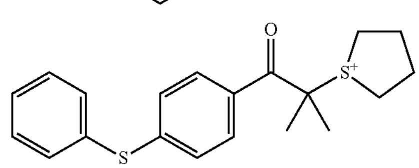
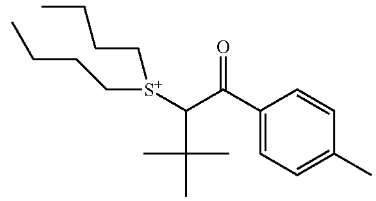
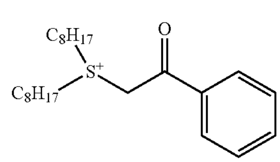

-continued

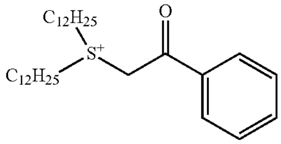

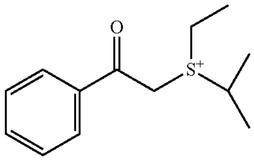

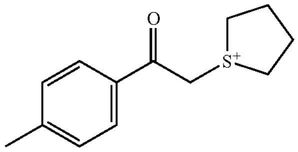

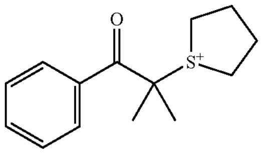

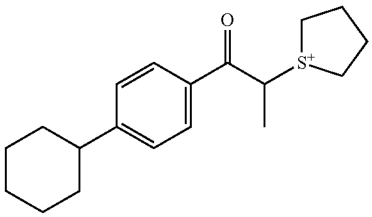

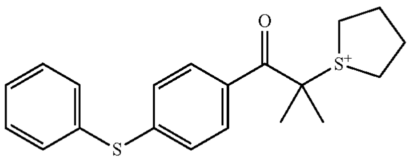

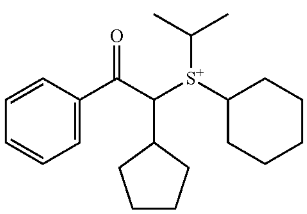

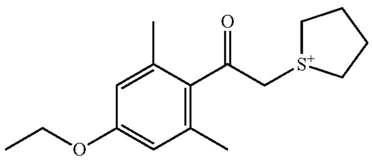

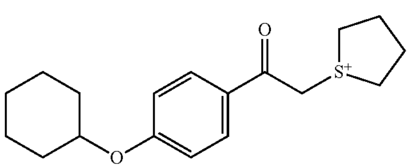

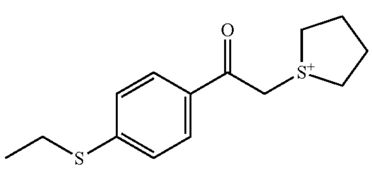

-continued

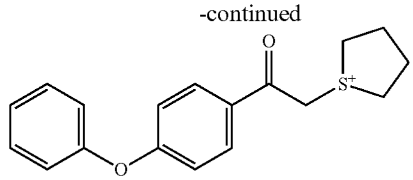

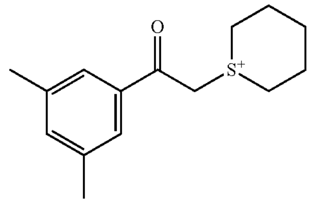

A structural unit (ZI-4) is a structural unit represented by the following Formula (ZI-4).

(ZI-4)

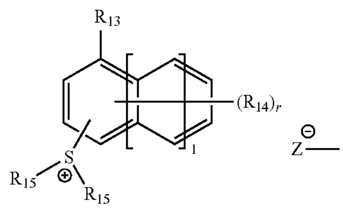

In the formula, $R_{13}$ represents a hydrogen atom, a fluorine atom, a hydroxy group, an alkyl group, a cycloalkyl group, an alkoxy group, an alkoxy carbonyl group, or a group having a monocyclic or polycyclic cycloalkyl skeleton. These groups may have a substituent.

If a plurality of $R_{14}$ is present, each $R_{14}$ represents independently an alkyl group, a cycloalkyl group, an alkoxy group, an alkoxy carbonyl group, an alkylcarbonyl group, an alkylsulfonyl group, a cycloalkylsulfonyl group, or a group having a monocyclic or polycyclic cycloalkyl skeleton. These groups may have a substituent.

Each $R_{15}$ independently represents an alkyl group, a cycloalkyl group or a naphthyl group. Two $R_{15}$ may combine with each other to form a ring. These groups may have a substituent.

l represents an integer of 0 to 2.

r represents an integer of 0 to 8.

$Z^-$ represents an acid anion that is generated by decomposition upon irradiation with an actinic ray or radiation, and preferably represents a non-nucleophilic anion. The examples of the anion are the same as those of $Z^-$ in Formula (ZI).

Hereinafter, a specific example of a cation moiety of the structural unit (ZI-4) will be shown.

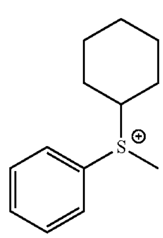

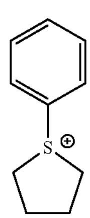

-continued
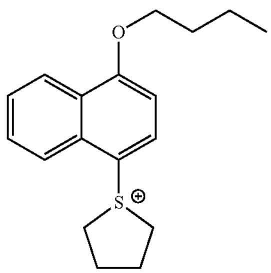
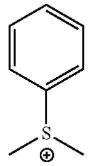
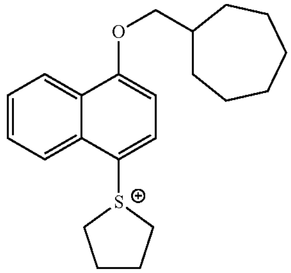
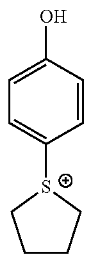
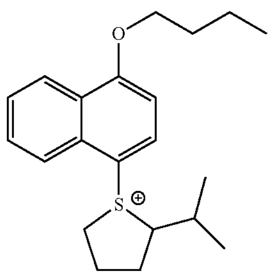
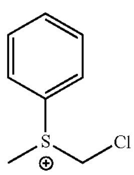
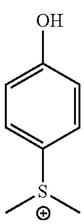
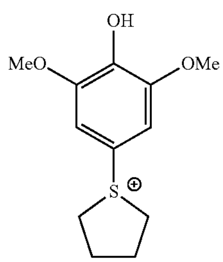
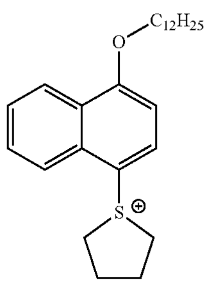
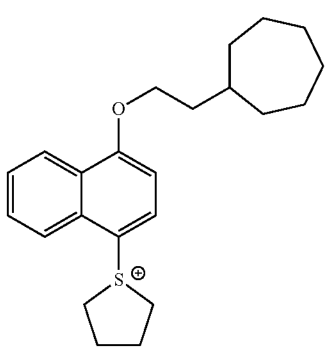
-continued
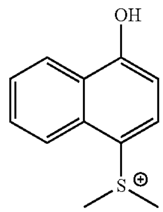
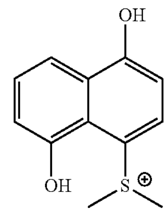
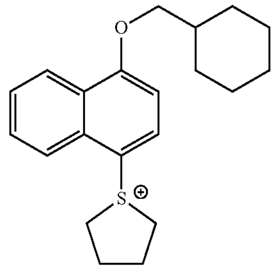
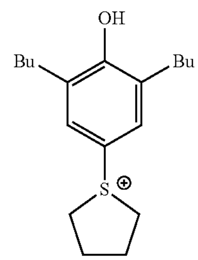
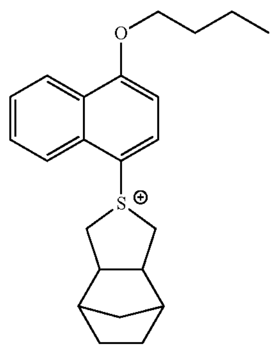
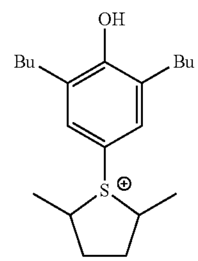
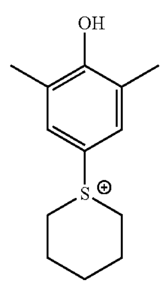
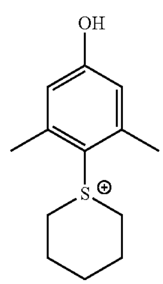
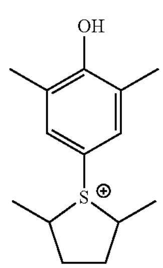
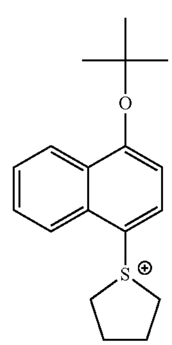

-continued
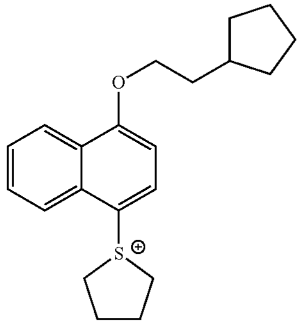
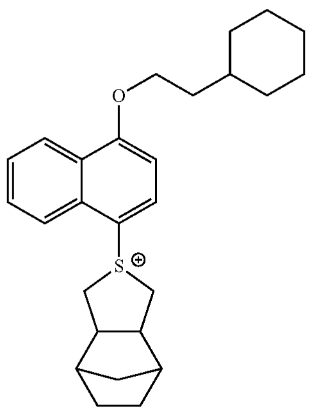
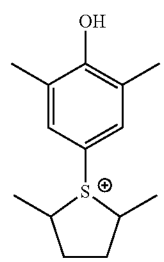
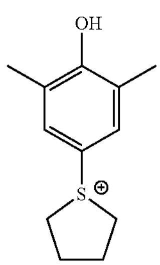
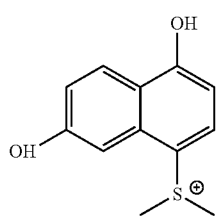
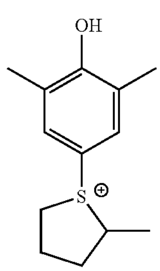
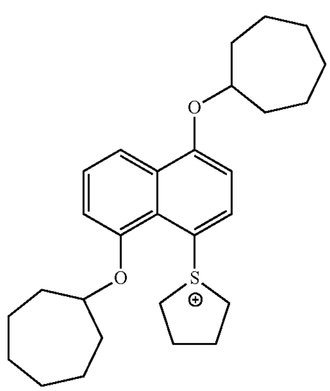
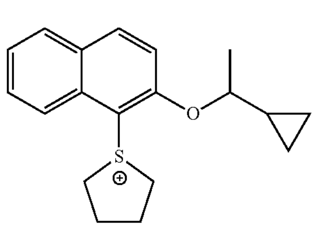
-continued
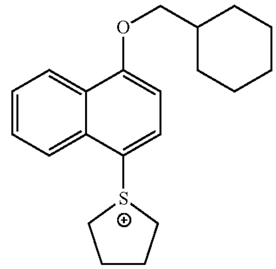
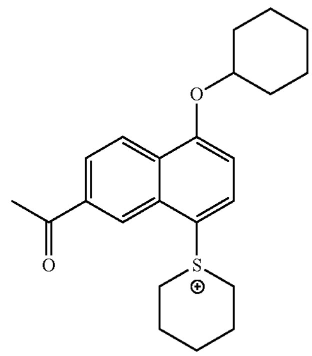
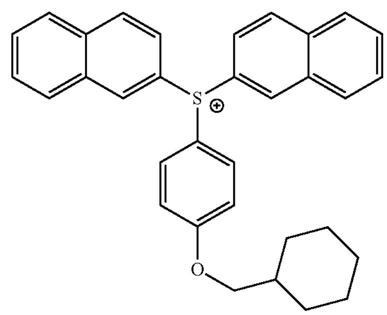
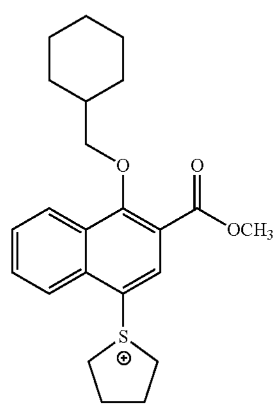
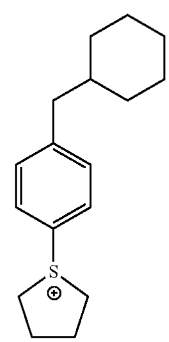
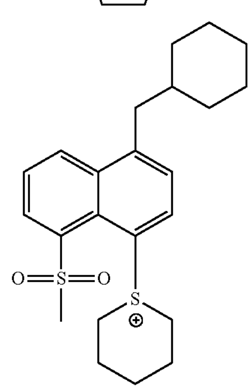

-continued
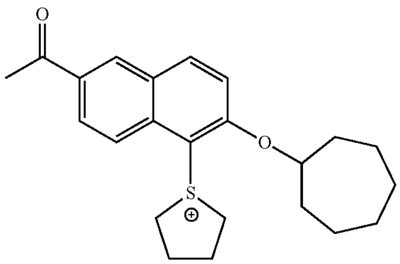
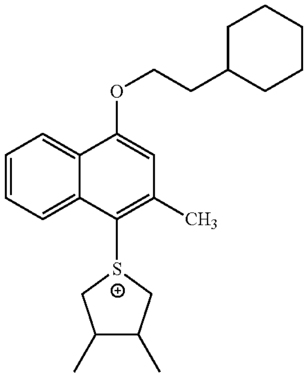
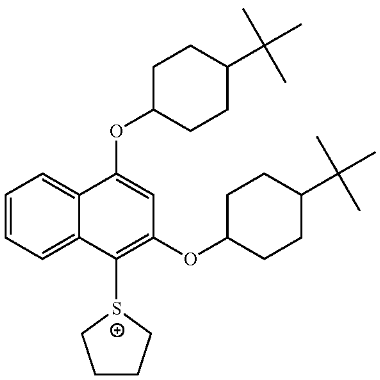
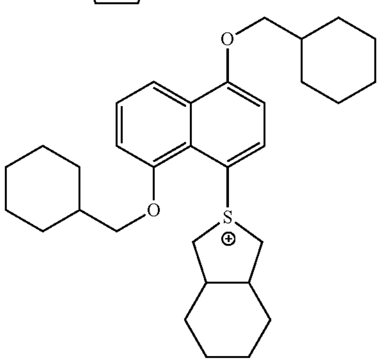
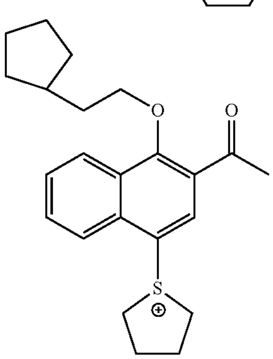
-continued
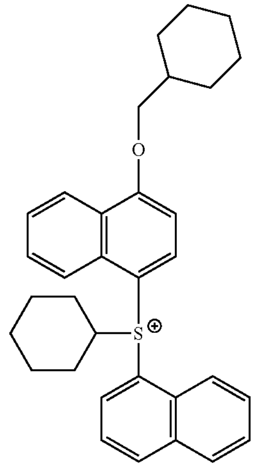
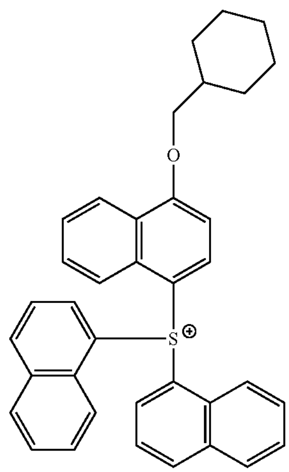
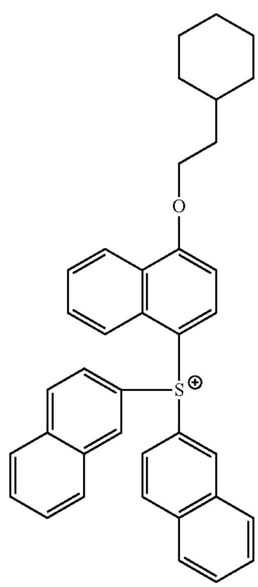

-continued

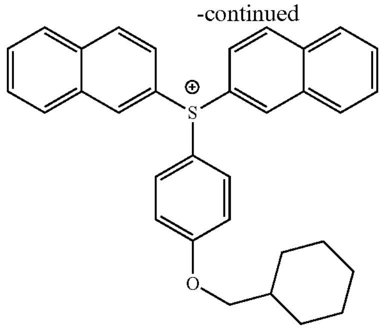

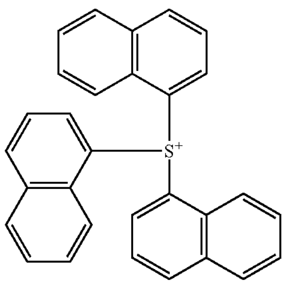

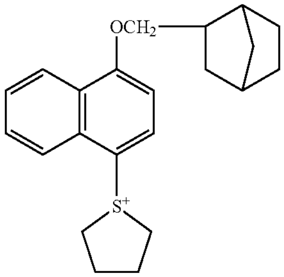

Next, a structural unit represented by Formula (ZII) will be shown.

In Formula (ZII), each of $R_{204}$ and $R_{205}$ independently represents an aryl group, an alkyl group or a cycloalkyl group.

A specific example or a suitable aspect of the aryl group, the alkyl group, and the cycloalkyl group of $R_{204}$ to $R_{207}$ are the same as those of the aryl group described as the aryl group, the alkyl group, and the cycloalkyl group of $R_{201}$ to $R_{203}$ in the structural unit (ZI-1).

The aryl group, the alkyl group and the cycloalkyl group of $R_{204}$ to $R_{207}$ may have a substituent. Examples of the substituent may be the same as those of the substituent that may be included in the aryl group, the alkyl group and the cycloalkyl group of $R_{201}$ to $R_{203}$ in the structural unit (ZI-1).

$Z^-$ represents an acid anion that is generated by decomposition upon irradiation with an actinic ray or radiation, and preferably a non-nucleophilic anion. Examples thereof may include the anion which is the same as $Z^-$ in Formula (ZI).

As an ionic structural unit, a structural unit represented by the following Formulas (ZCI) or (ZCII) is preferred.

ZCI

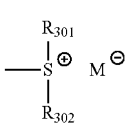

ZCII

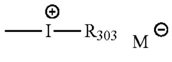

In the formulas,

Each of $R_{301}$ and $R_{302}$ independently represents an organic group.

The organic group of $R_{301}$ and $R_{302}$ generally has 1 to 30 carbon atoms, and preferably has 1 to 20 carbon atoms.

Further, $R_{301}$ and $R_{302}$ may combine with each other to form a ring structure, and may include an oxygen atom, a sulfur atom, an ester bond, an amide bond, and a carbonyl group in the ring. Examples of the group formed by combination may include an alkylene group (for example, a butylene group and a pentylene group).

Specific examples of the organic group of $R_{301}$ and $R_{302}$ may include an aryl group, an alkyl group, a cycloalkyl group and the like which are described as the example of $R_{201}$ to $R_{203}$ in Formula (ZI).

M represents an atom group that receives a proton to form an acid.

$R_{303}$ represents an organic group. The organic group of $R_{303}$ generally has 1 to 30 carbon atoms, and preferably has 1 to 20 carbon atoms. Specific examples of the organic group of $R_{303}$ may include the aryl group, the alkyl group and the cycloalkyl group that are described as the specific examples of $R_{204}$ and $R_{205}$ in Formula (ZII).

The repeating unit (R) may be any one of repeating units that are represented by the following Formulas (III-1) to (III-6), Formulas (IV-1) to (IV-4), and Formulas (V-1) and (V-2).

(III-1)

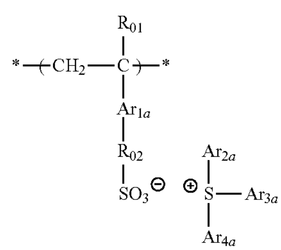

(III-2)

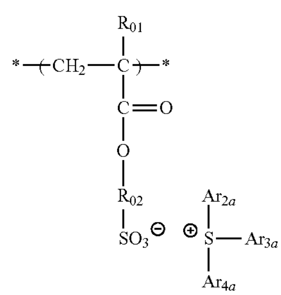

(III-3)

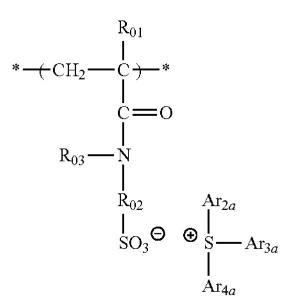

-continued (III-4)

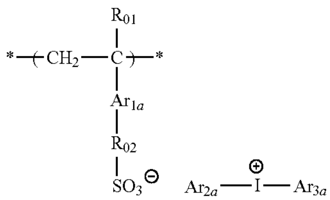

(III-5)

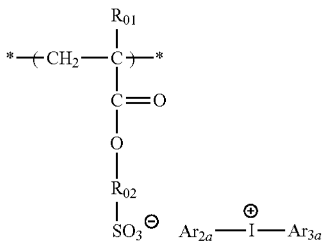

(III-6)

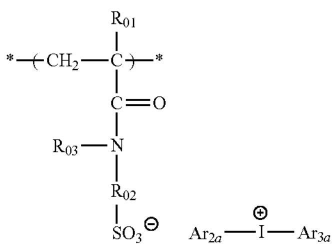

(IV-1)

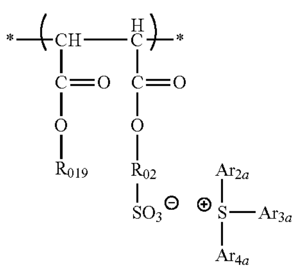

(IV-2)

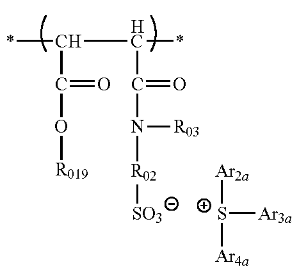

(IV-3)

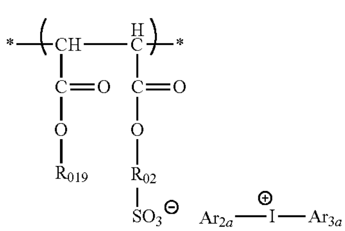

-continued (IV-4)

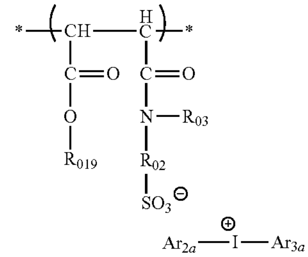

(V-1)

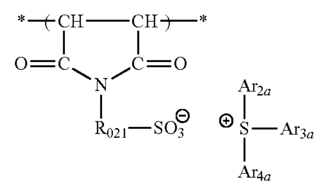

(V-2)

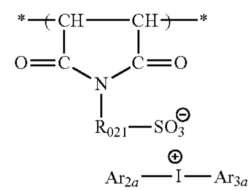

In the formulas, $Ar_{1a}$ represents an arylene group that is the same as that described for $X_1$ to $X_3$ in Formulas (III) to (VII).

$Ar_{2a}$ to $Ar_{4a}$ represent an aryl group that is the same as that described for $R_{201}$ to $R_{203}$ and $R_{204}$ and $R_{205}$ in Formulas (ZI) and (ZII).

$R_{01}$ represents a hydrogen atom, a methyl group, a chloromethyl group, a trifluoromethyl group, or a cyano group.

$R_{02}$ and $R_{021}$ represent a single bond, an arylene group, an alkylene group, a cycloalkylene group, —O—, $—SO_2^-$, CO—, $—N(R_{33})—$ or a divalent linking group obtained by combining them with each other, which are the same as that described for $X_1$ to $X_3$ in Formulas (III) to (VII).

Each of $R_{03}$ and $R_{019}$ independently represents a hydrogen atom, an alkyl group, a cycloalkyl group, an aryl group, or an aralkyl group. Examples of the groups are the same as those described for $R_{25}$ in Formula (IV).

Preferred examples of the repeating unit (R) may further include the repeating unit represented by any one of the following Formulas (I-7) to (I-34).

(I-7)

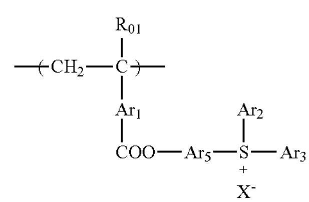

(I-8)

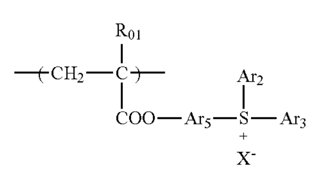

-continued
(I-9)
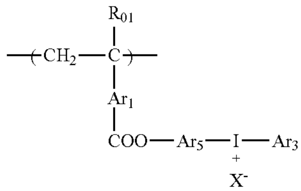
(I-10)
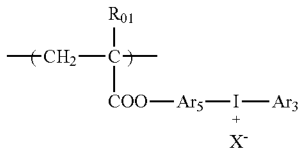
(I-11)
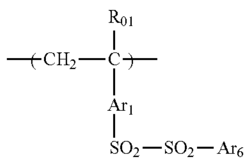
(I-12)
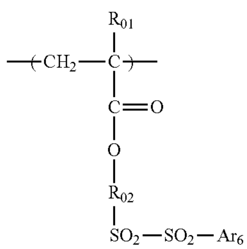
(I-13)
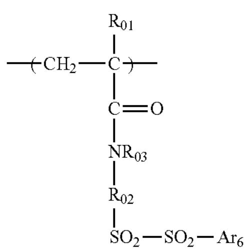
(I-14)
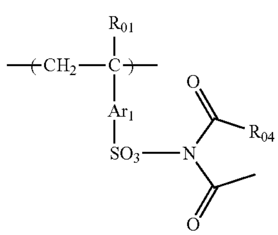
(I-15)
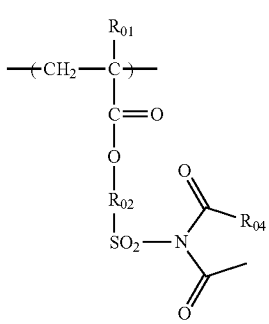
-continued
(I-16)
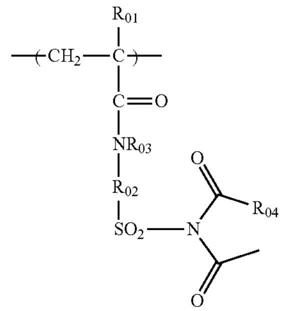
(I-17)
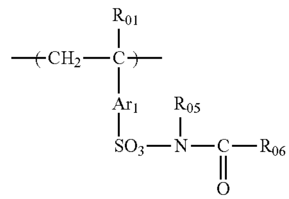
(I-18)
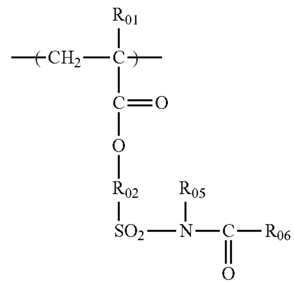
(I-19)
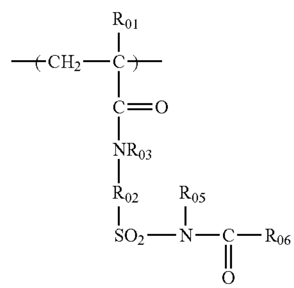
(I-20)
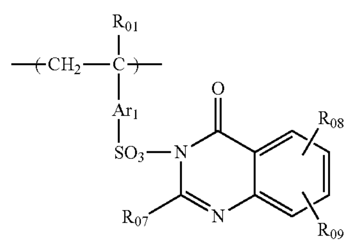
(I-21)
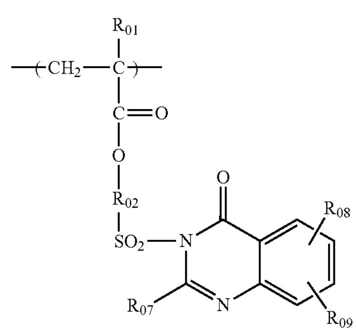

-continued
(I-22)
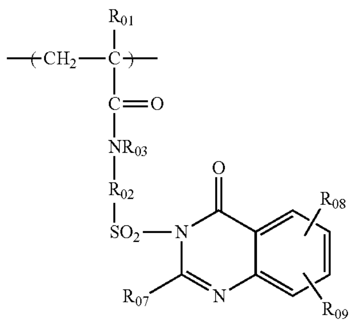
(I-23)
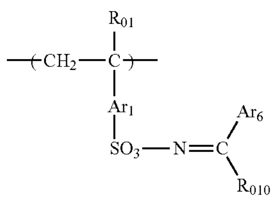
(I-24)
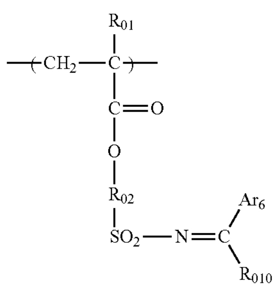
(I-25)
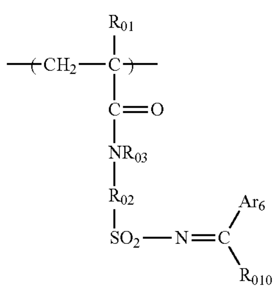
(I-26)
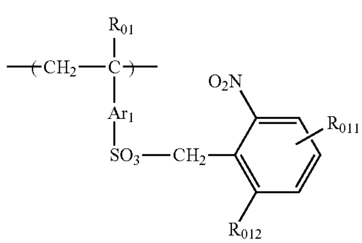
(I-27)
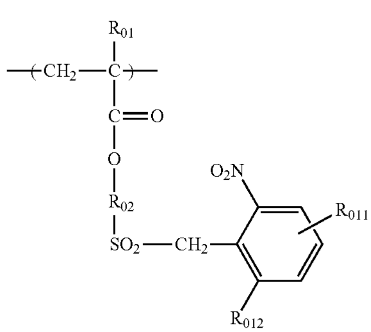
-continued
(I-28)
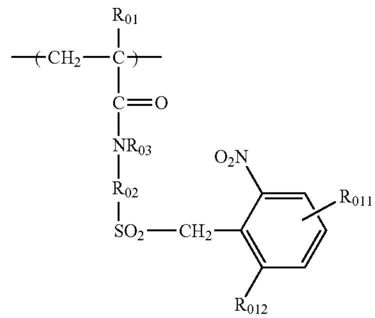
(I-29)
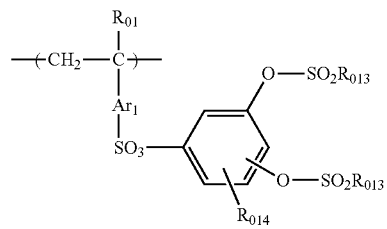
(I-30)
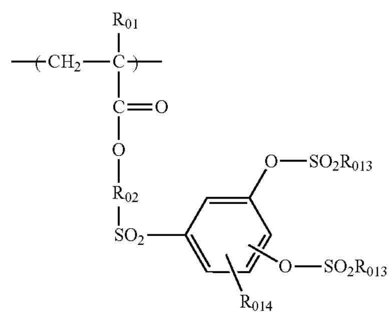
(I-31)
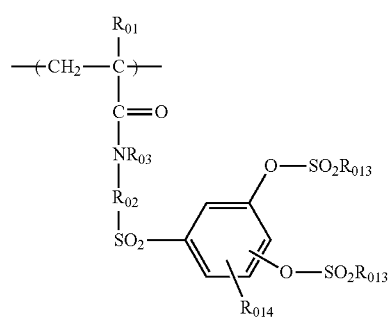
(I-32)
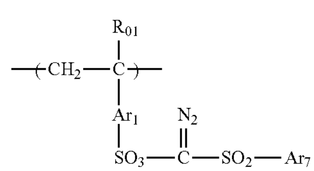
(I-33)
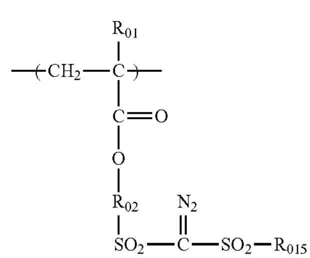

-continued (I-34)

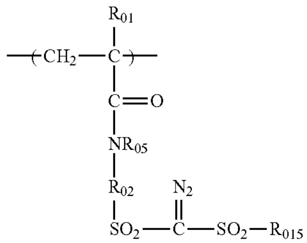

In the formulas, $A_{r1}$ and $A_{r5}$ represent an arylene group that is the same as that described for $X_1$ to $X_3$ in Formulas (III) to (VII), for example. $Ar_2$ and $Ar_3$ and $Ar_6$ and $Ar_7$ represent an aryl group that is the same as that described for $R_{25}$ to $R_{27}$ and $R_{33}$, for example. $R_{01}$ has the same meaning as that described for Formulas (III-1) to (III-6), Formulas (IV-1) to (IV-4), and Formulas (V-1) and (V-2).

$R_{02}$ represents an arylene group, an alkylene group or a cycloalkylene group that are the same as those described for $X_1$ to $X_3$, for example. $R_{03}$, $R_{05}$ to $R_{010}$, $R_{013}$ and $R_{015}$ represent an alkyl group, a haloalkyl group, a cycloalkyl group, an aryl group, or an aralkyl group. $R_{04}$ represents an arylene group, an alkylene group, or an alkenylene group. The alkenylene group may have a substituent. An alkenylene group having 2 to 6 carbon atoms, such as an ethylene group, a prophenylene group or a butenylene, is preferred.

$R_{011}$ and $R_{014}$ represent a hydrogen atom, a hydroxyl group, a halogen atom (fluorine, chlorine, bromine, iodine), and an alkyl group, an alkoxy group, an alkoxy carbonyl group, or an acyloxy group that are a more preferred substituent, for example.

$R_{012}$ represents a hydrogen atom, a nitro group, a cyano group, or a perfluoroalkyl group such as a trifluoromethyl group and a pentafluoroethyl group.

$X^-$ represents an acid anion. Examples of $X^-$ may include anions of arylsulfonic acid, heteroarylsulfonic acid, alkylsulfonic acid, cycloalkylsulfonic acid, and perfluoroalkylsulfonic acid.

A content of the repeating unit (R) occupied in the resin is preferably within a range of 0.5 to 80 mol %, more preferably within a range of 1 to 60 mol %, still more preferably within a range of 5 to 40 mol %, particularly preferably within a range of 7 to 30 mol %, and most preferably within a range of 10 to 20 mol %, based on an entire repeating unit.

A synthesis method of a monomer corresponding to the repeating unit (R) is not particularly limited, but an example thereof may include a method of synthesizing the monomer by exchanging an acid anion having a polymerizable unsaturated bond corresponding to the repeating unit with halide of a known onium salt.

More specifically, a metal ion salt (for example, sodium ion, potassium ion, and the like) or an ammonium salt (ammonium, triethylammonium salt, and the like) of acid having a polymerizable unsaturated bond corresponding to the repeating unit, and an onium salt having a halogen ion (chloride ion, bromide ion, iodide ion, and the like) are stirred in the presence of water or methanol, thus performing an anion exchange reaction, and then separating and rinsing operations are performed with an organic solvent, such as dichloromethane, chloroform, ethyl acetate, methyl isobutyl ketone or tetrahydroxyfuran, and water. Thereby, it is possible to synthesize the monomer corresponding to an intended repeating unit (R).

Further, after the anion exchange reaction is carried out in the presence of water and the organic solvent separable from water, such as dichloromethane, chloroform, ethyl acetate, methyl isobutyl ketone or tetrahydroxyfuran, the separating and rinsing operations are performed with water, thus synthesizing the monomer.

Hereinafter, a specific example of the repeating unit (R) will be shown.

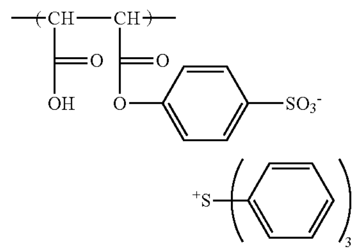

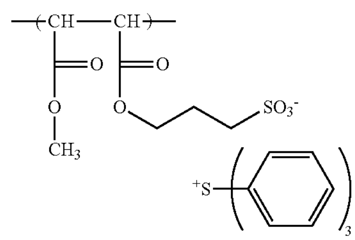

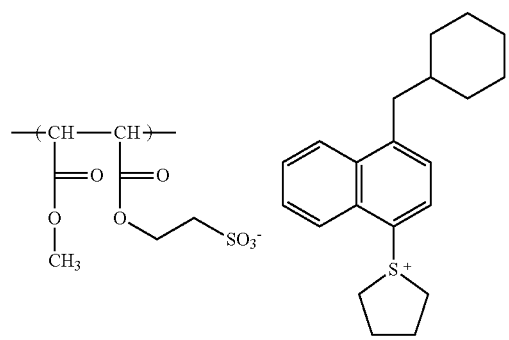

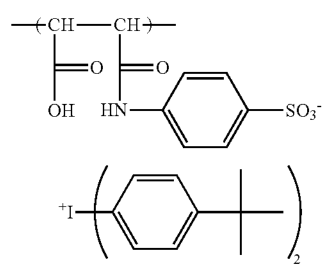

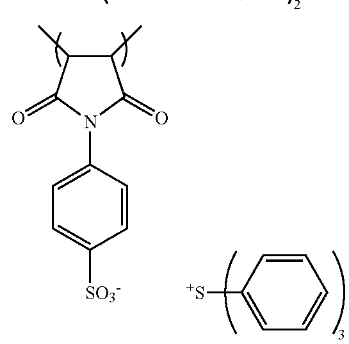

-continued
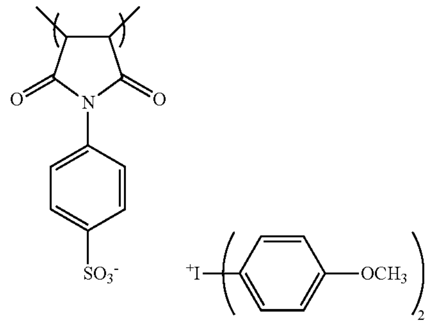
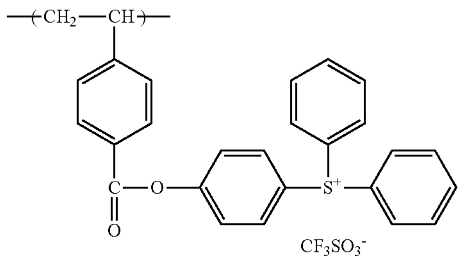
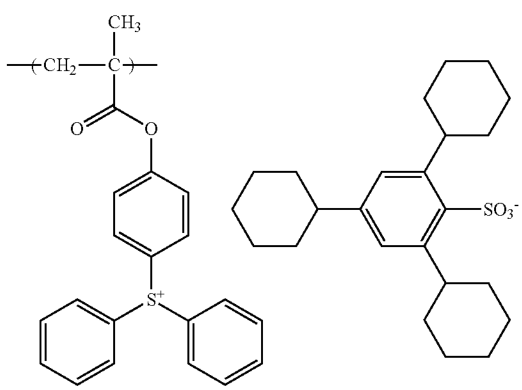
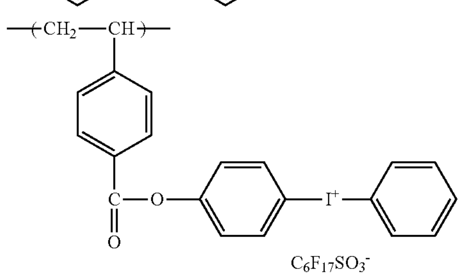
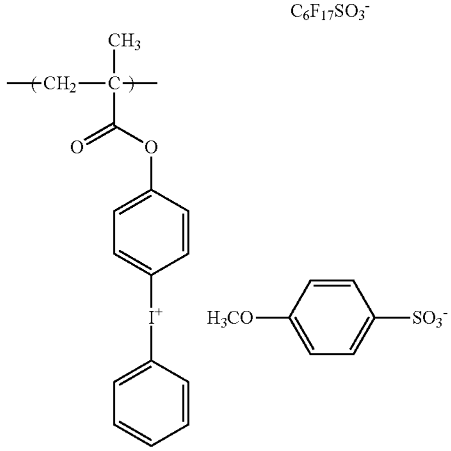
-continued
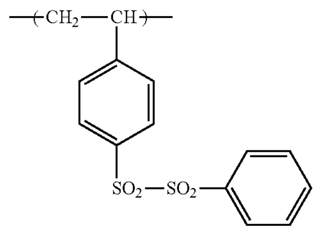
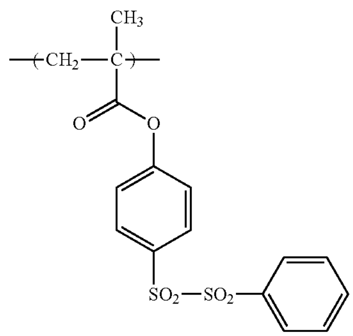
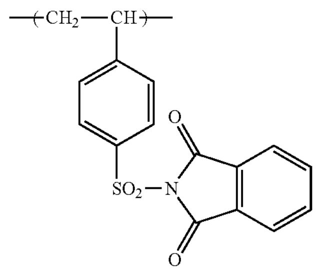
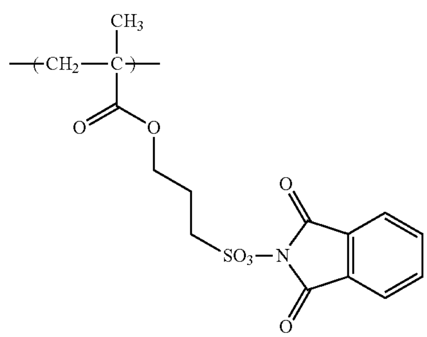
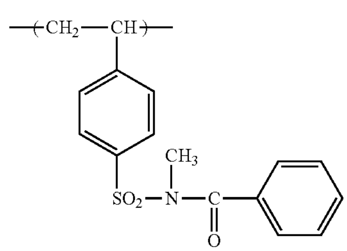
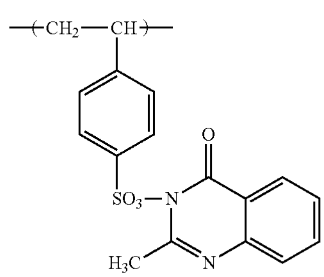

-continued
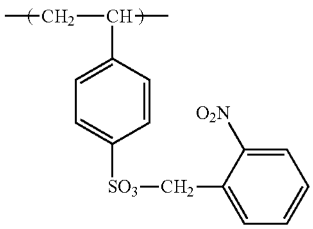
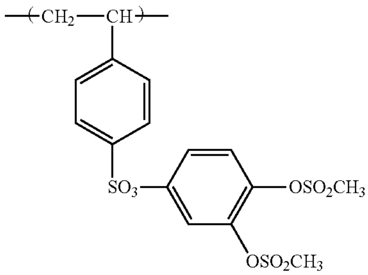
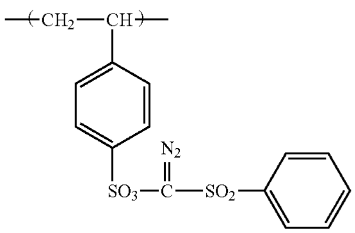
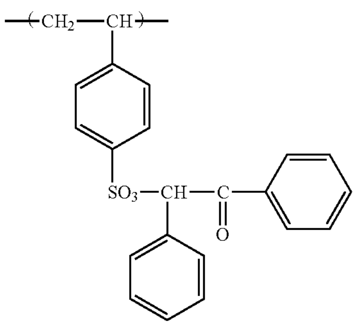
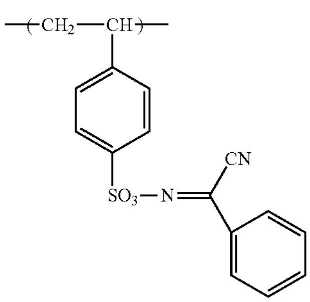
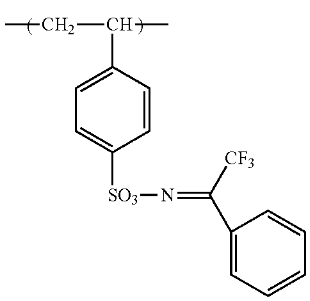
-continued
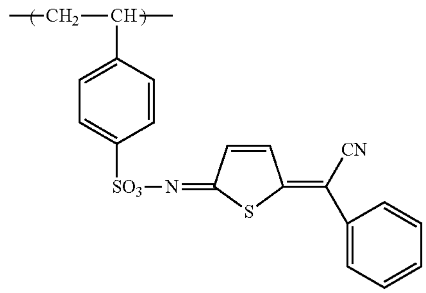
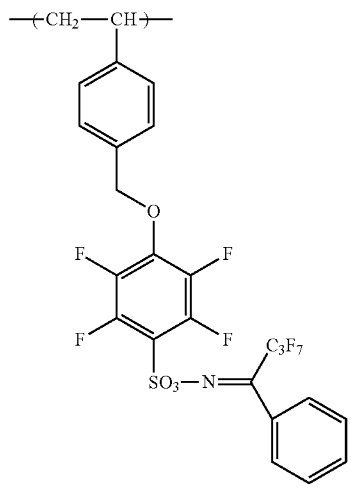
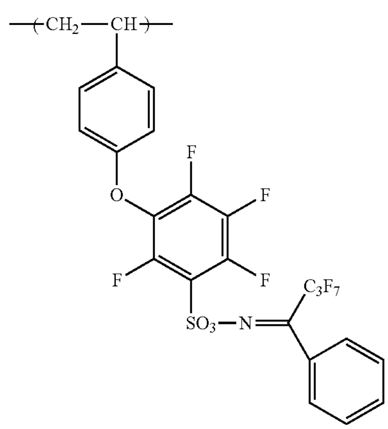
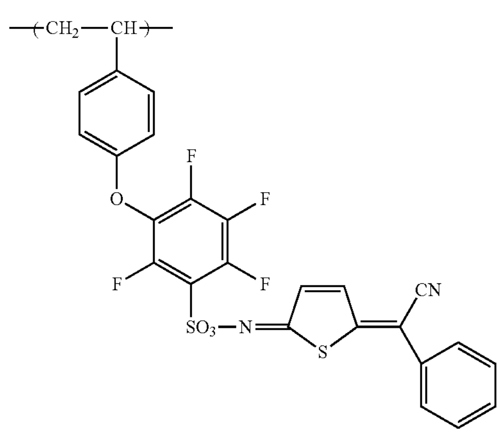

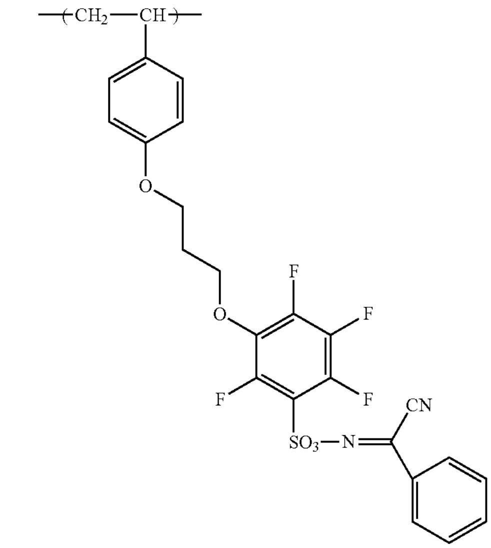
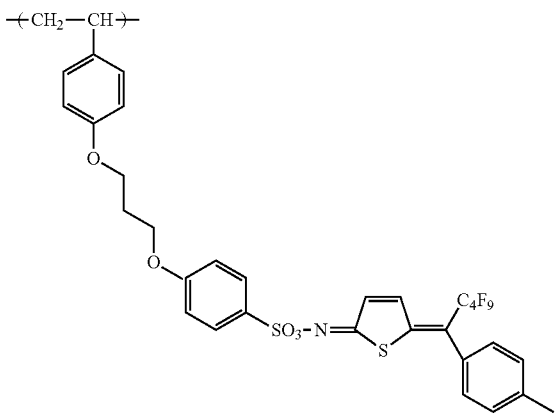
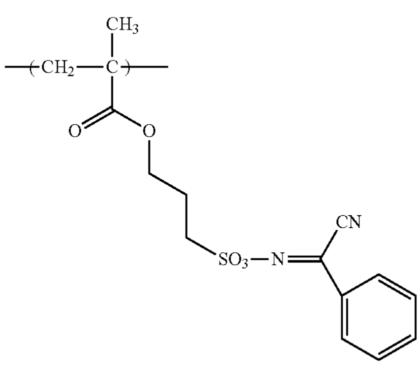
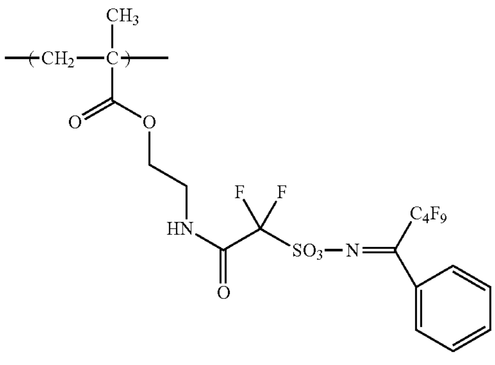
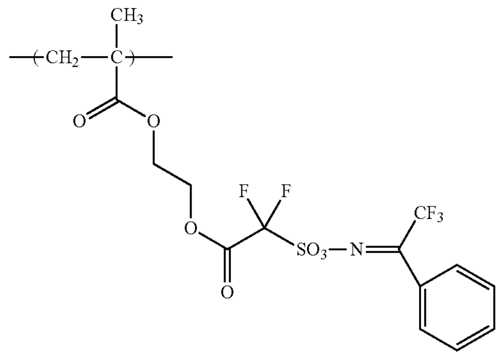
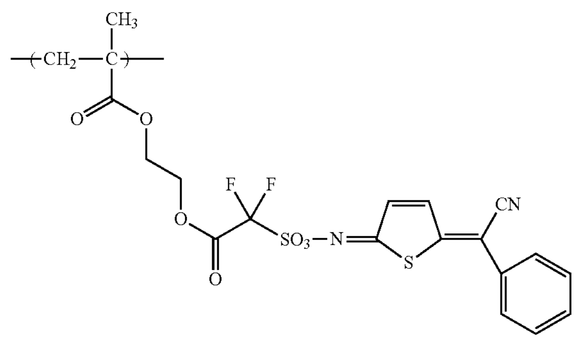
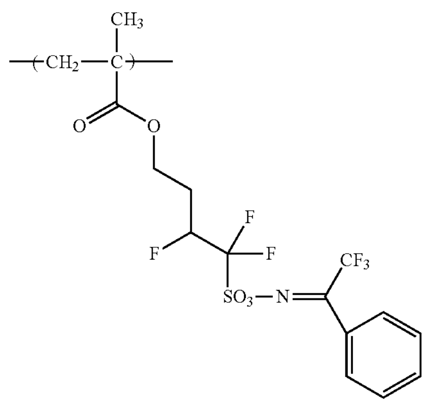
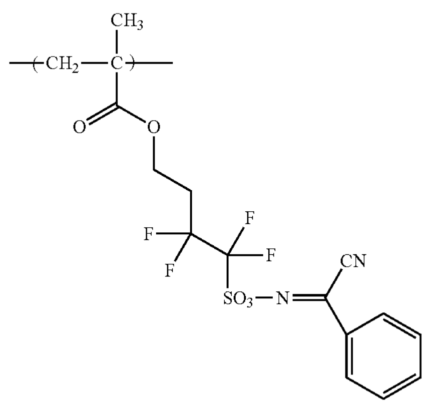

-continued
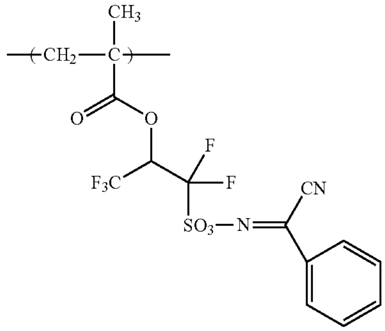
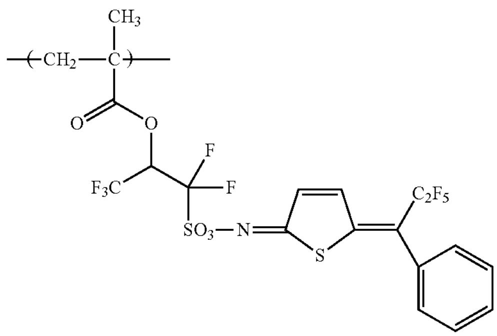
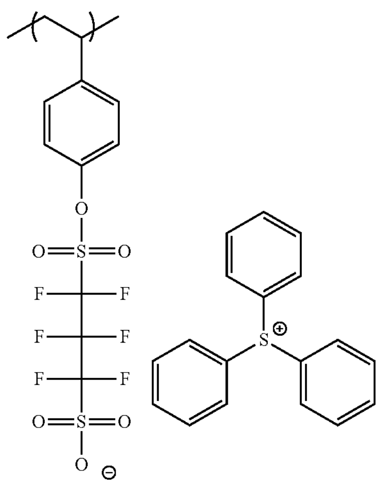
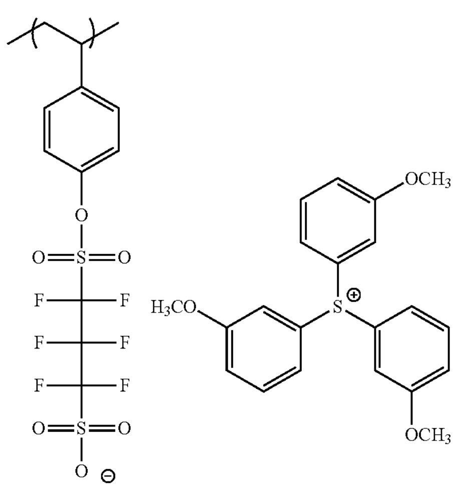
-continued
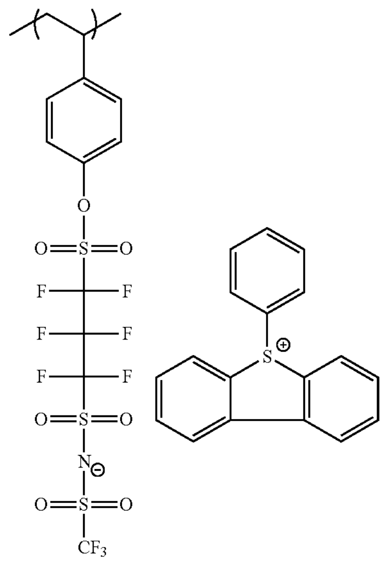
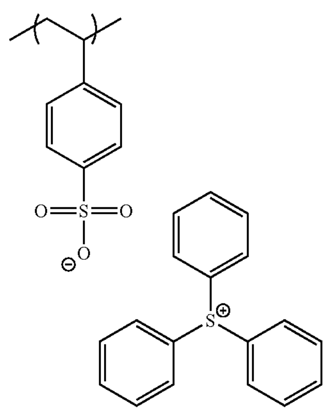
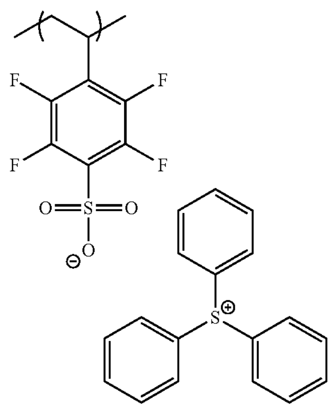
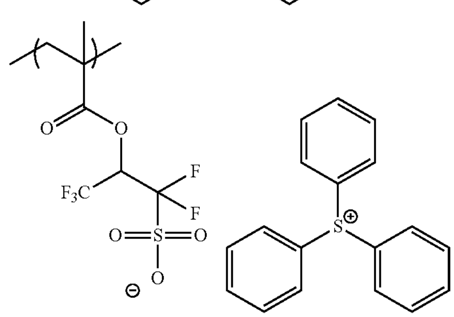

-continued
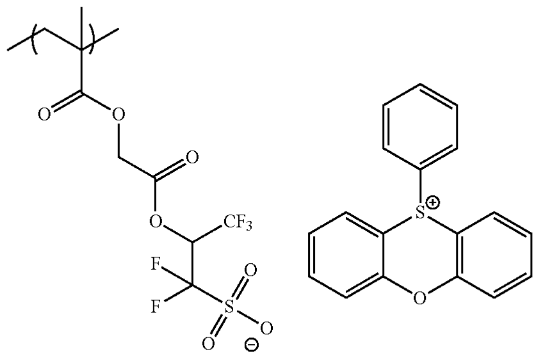
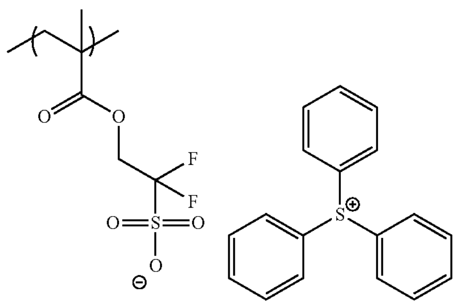
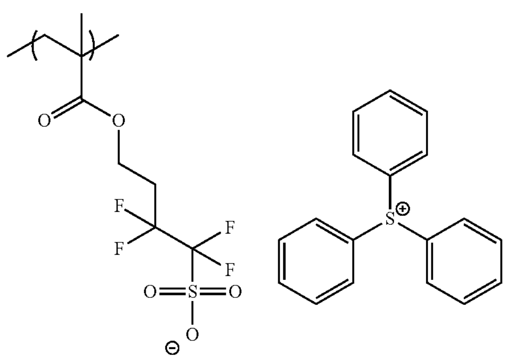
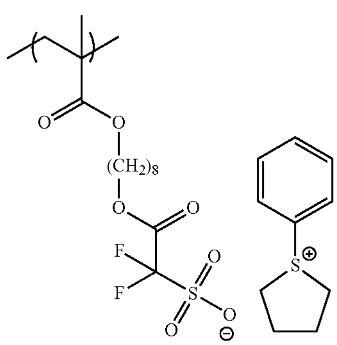
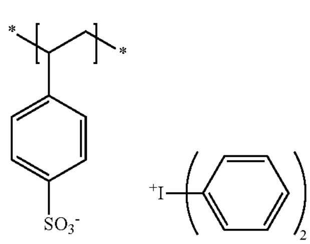
-continued
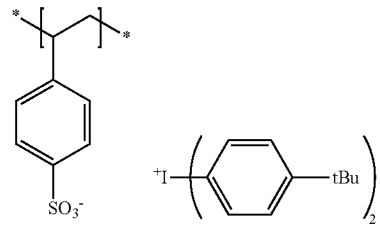
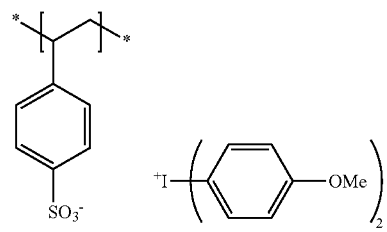
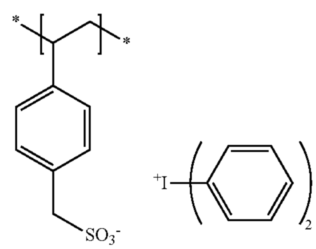
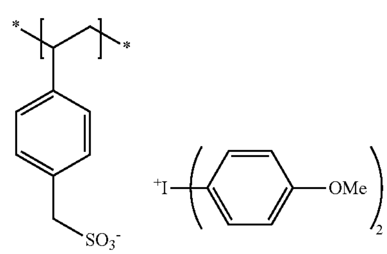
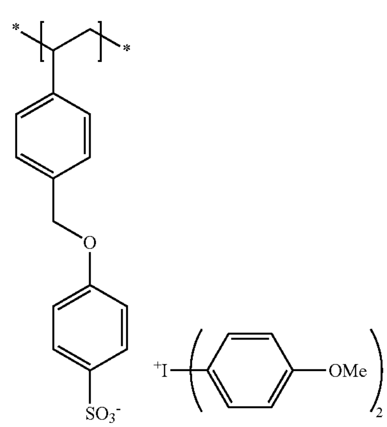

-continued
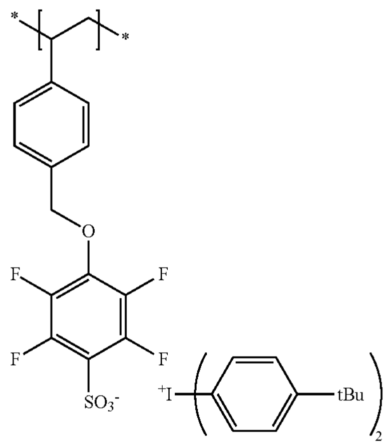
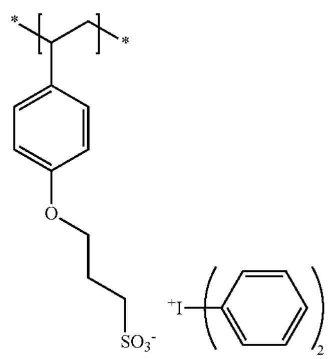
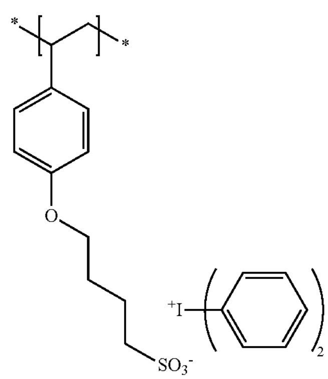
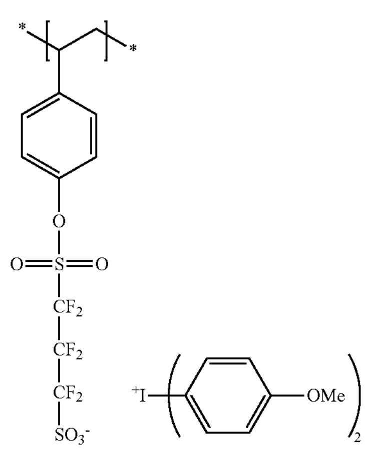
-continued
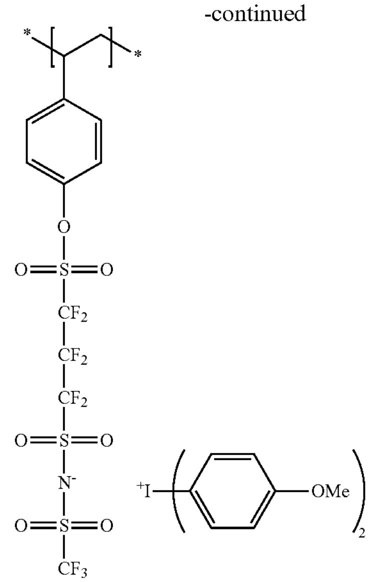
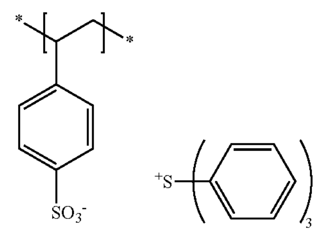
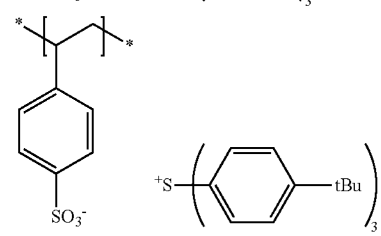
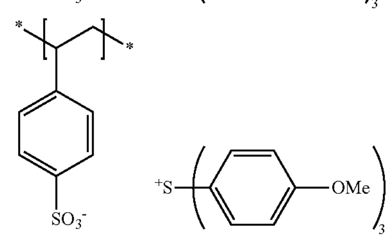
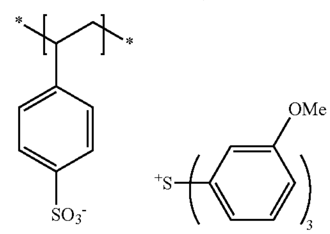
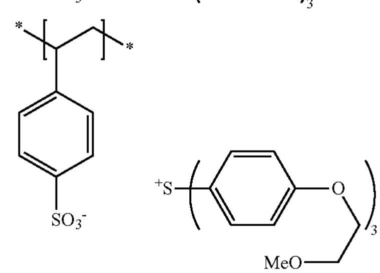

-continued
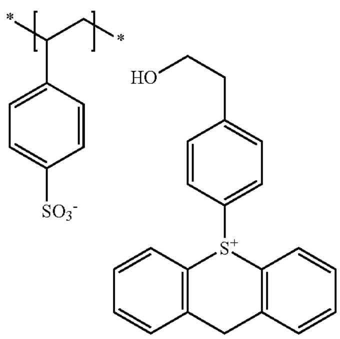
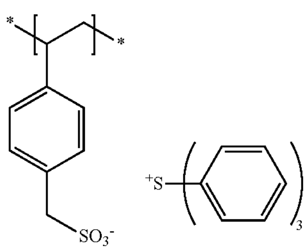
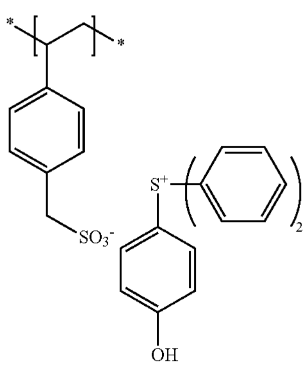
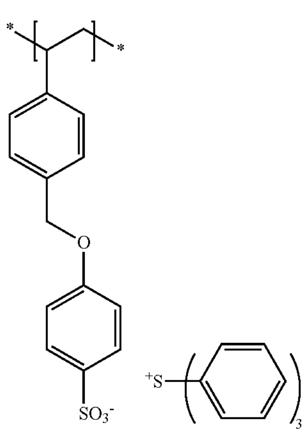
-continued
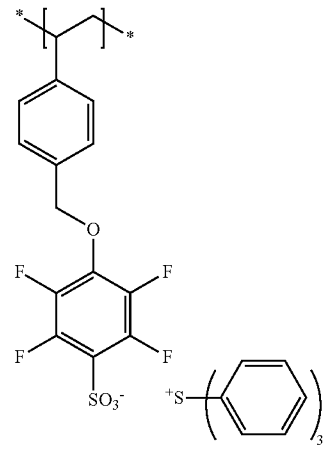
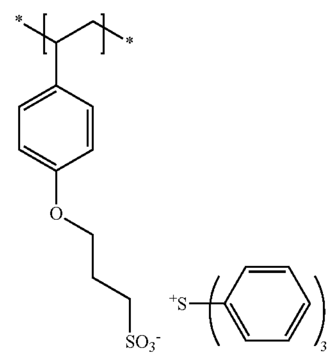
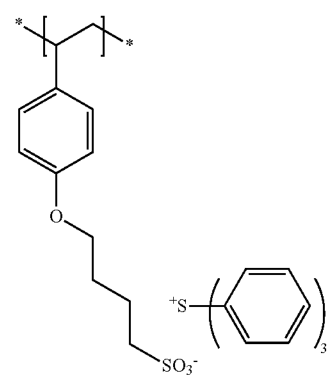
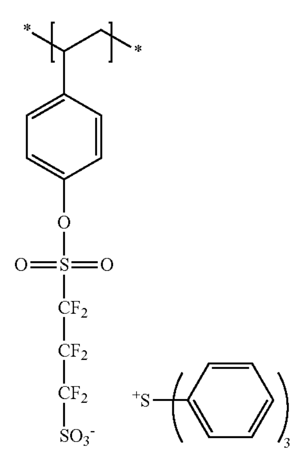

-continued
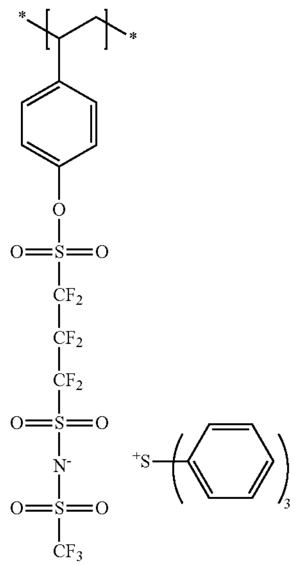
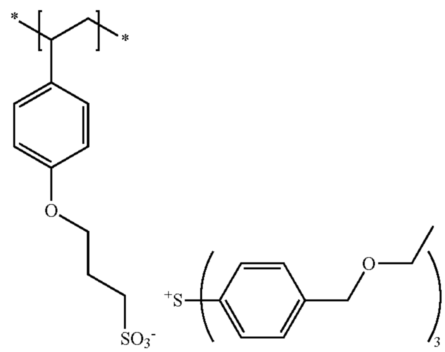
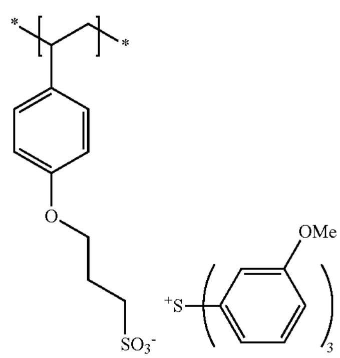
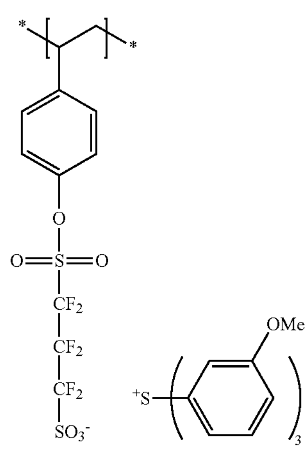
-continued
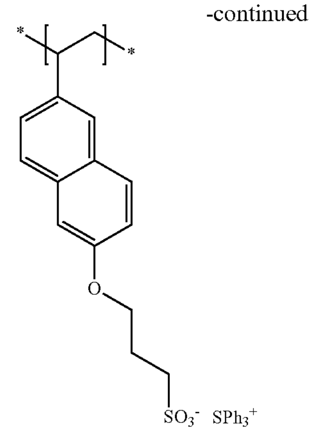
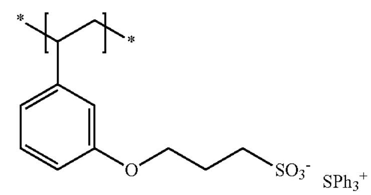
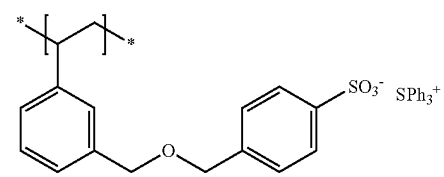
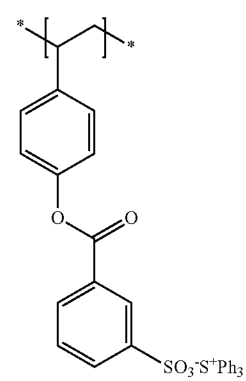
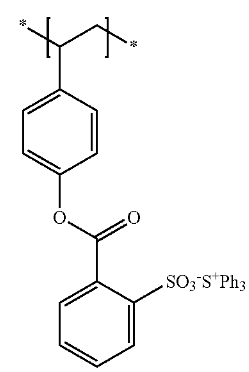
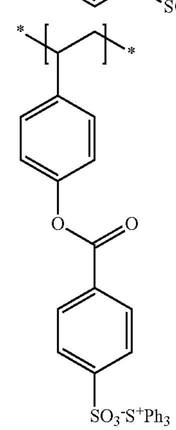
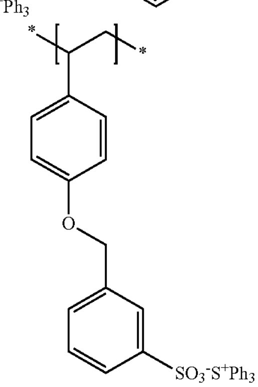

-continued
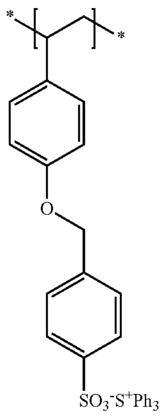
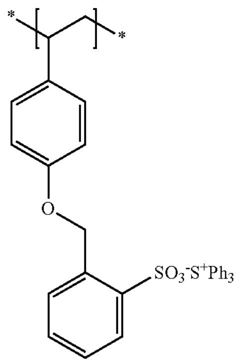
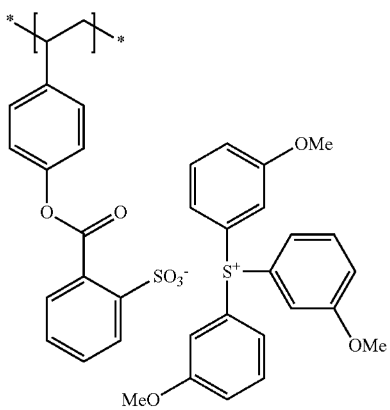
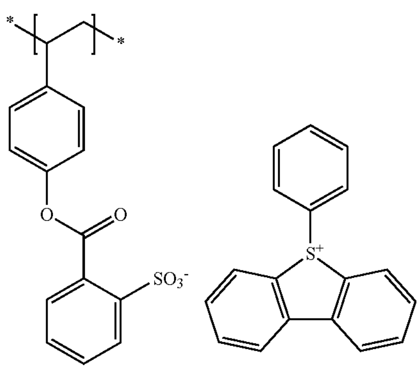
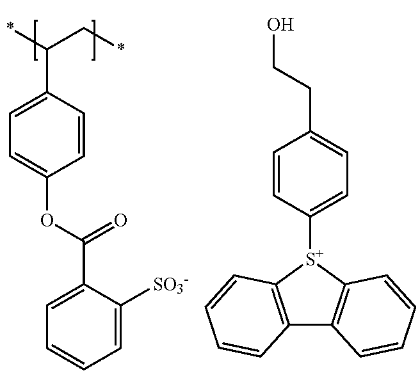
-continued
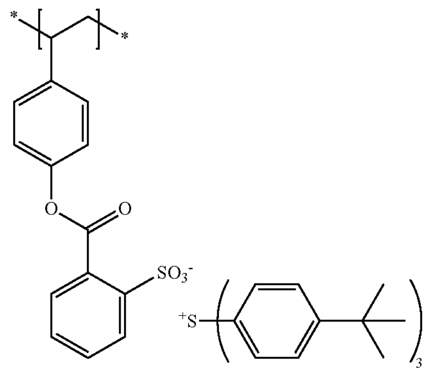
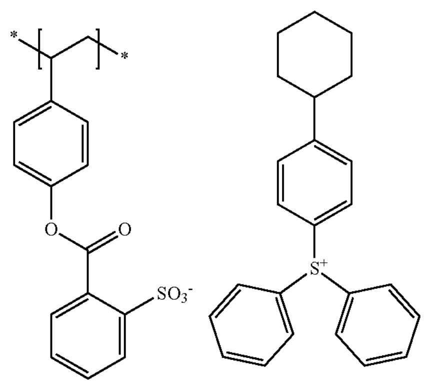
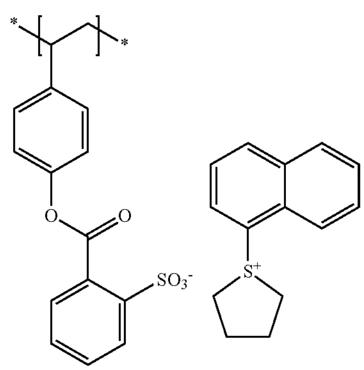
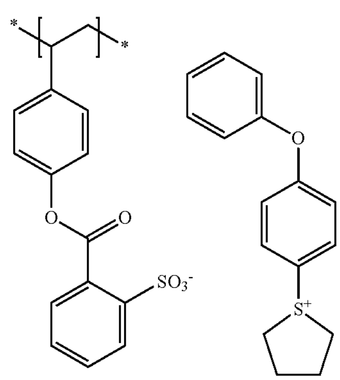

-continued
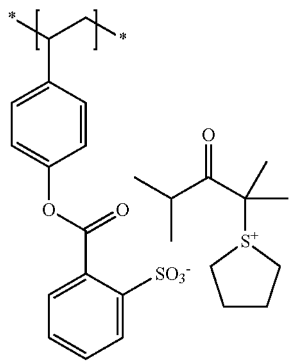
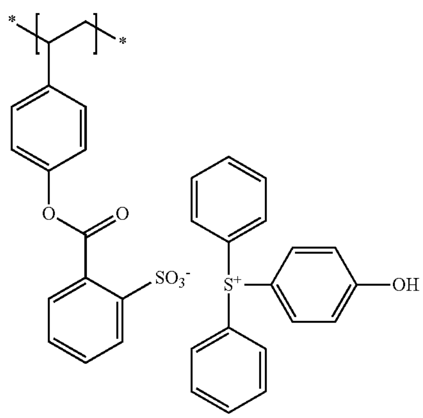
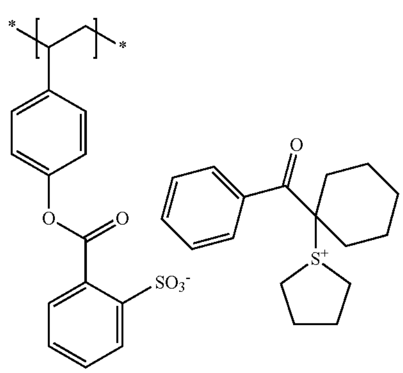
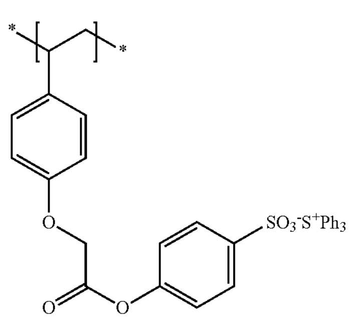
-continued
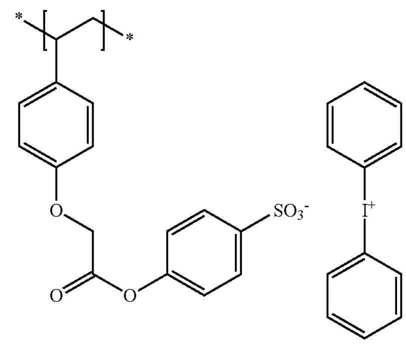
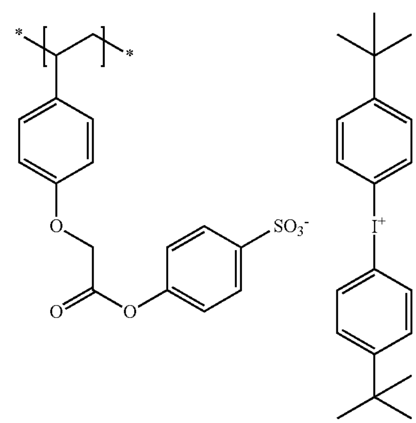
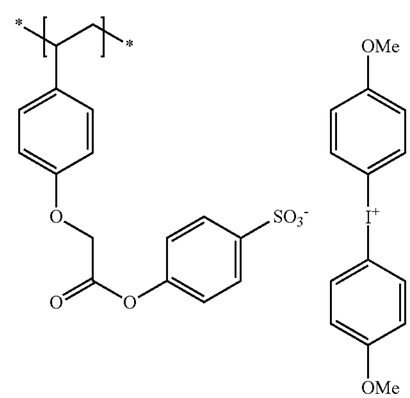
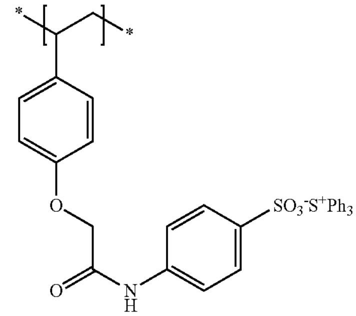

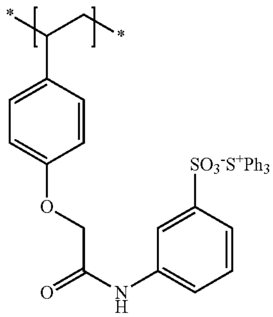
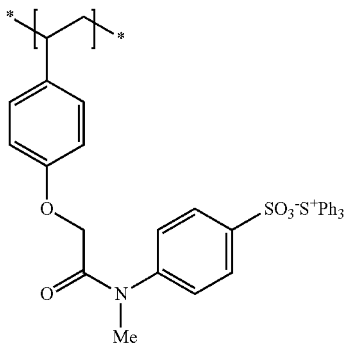
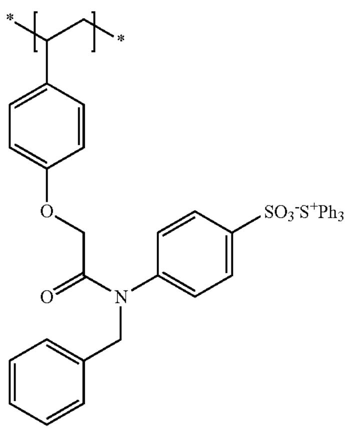
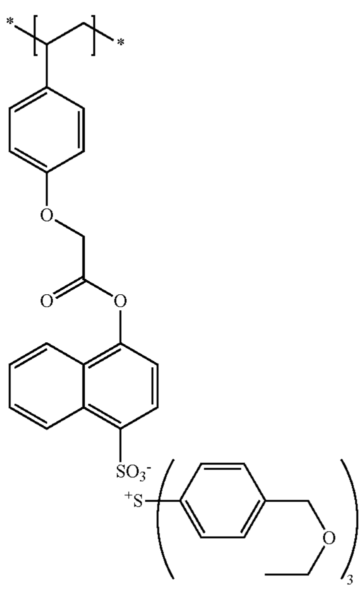
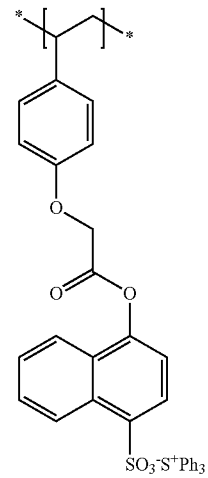
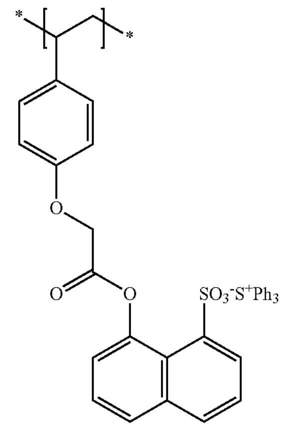
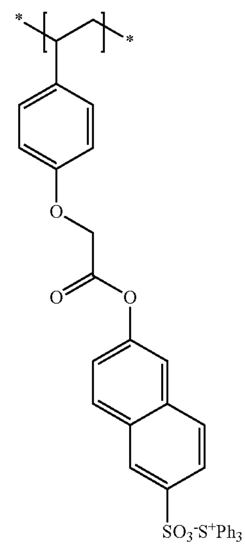
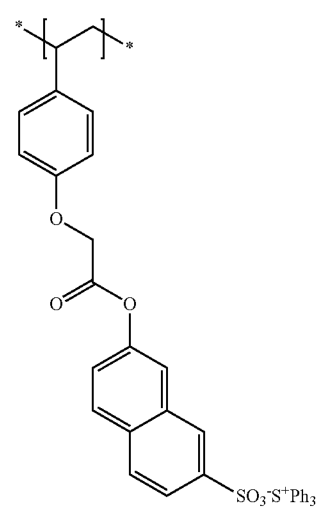

-continued
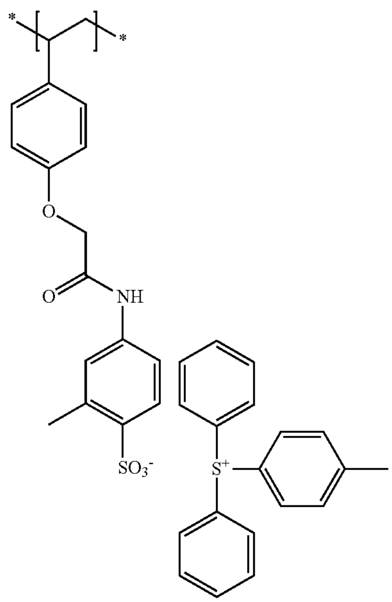
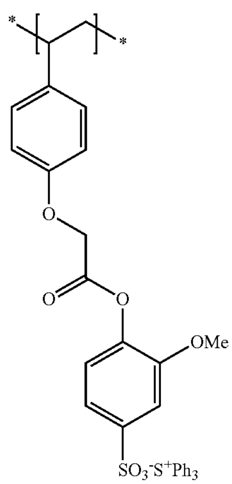
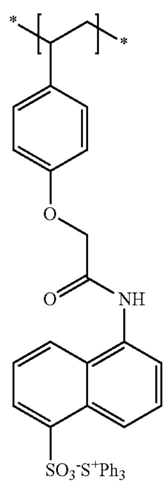
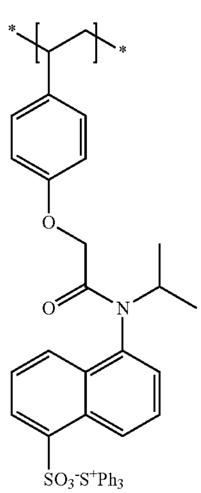
-continued
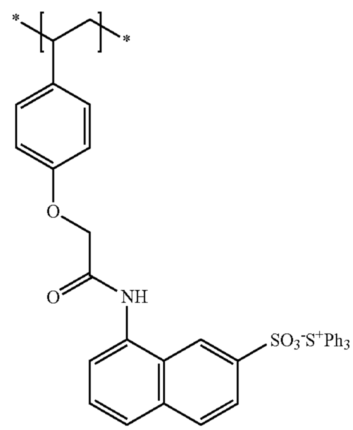
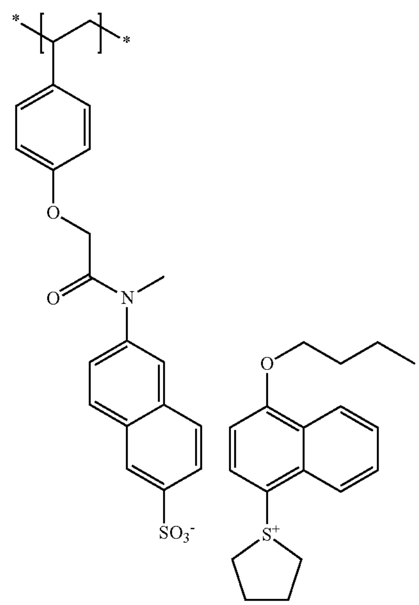
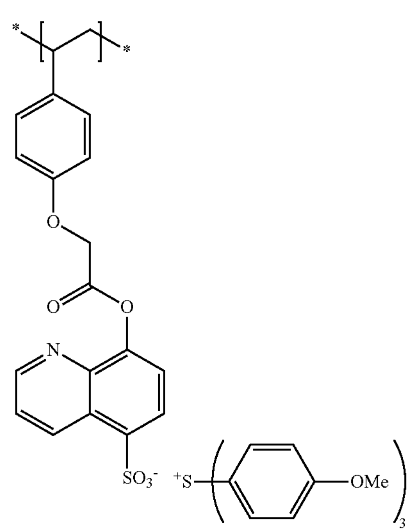

-continued
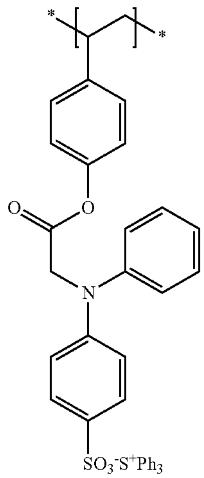
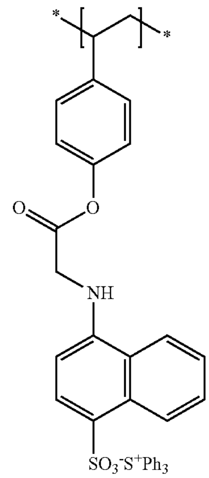
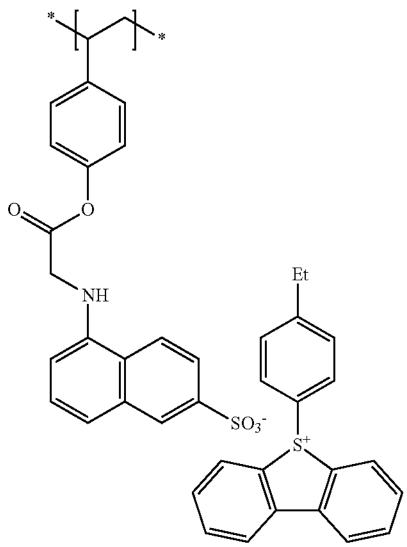
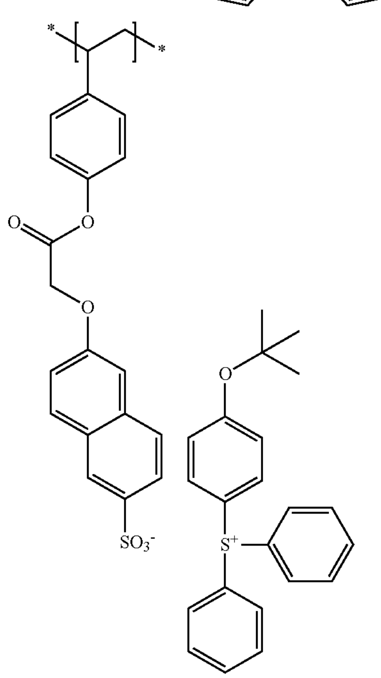
-continued
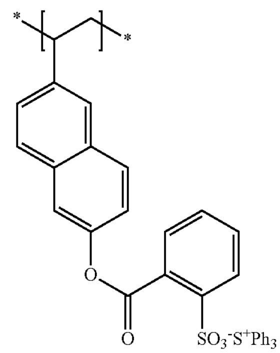
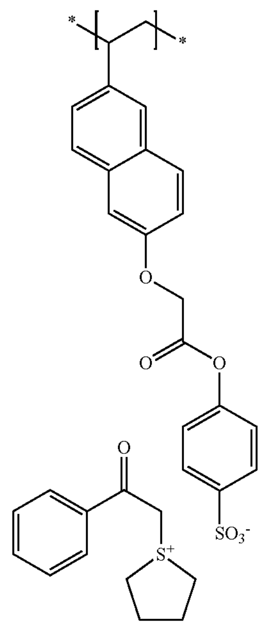
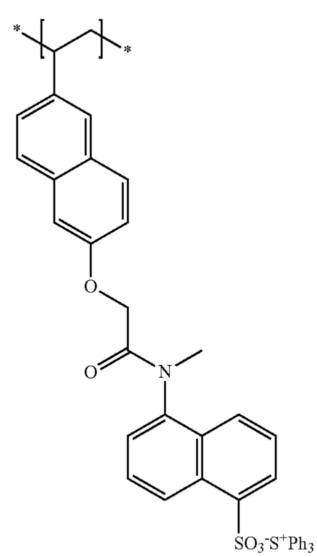

-continued
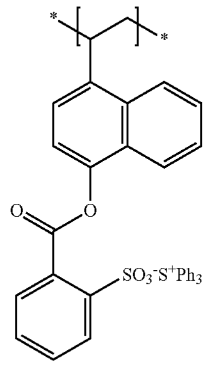
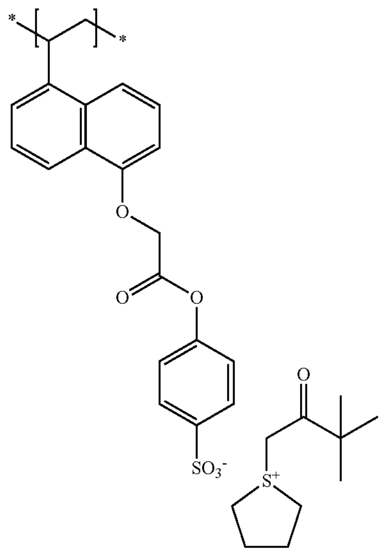
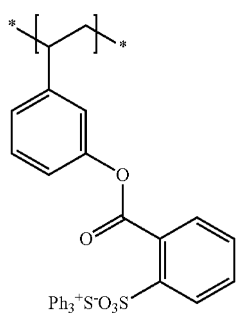
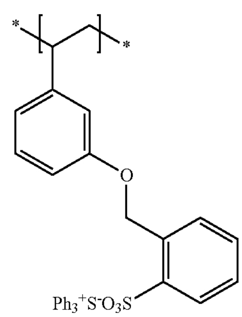
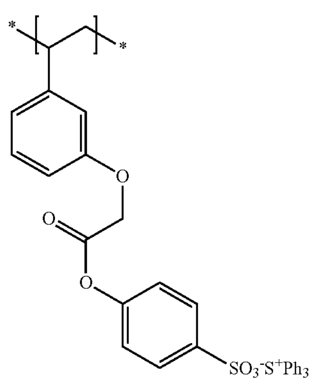
-continued
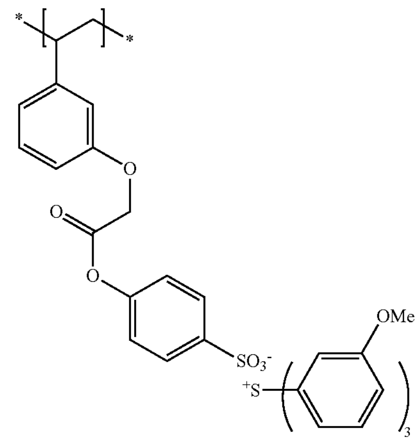
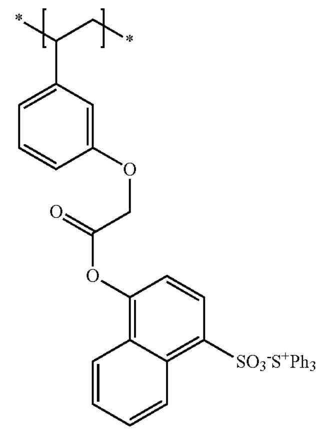
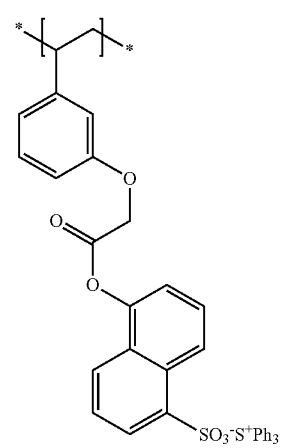

-continued
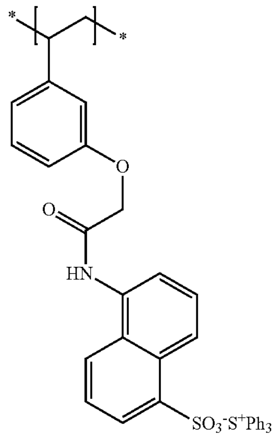
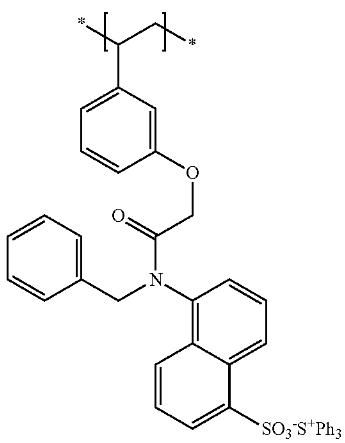
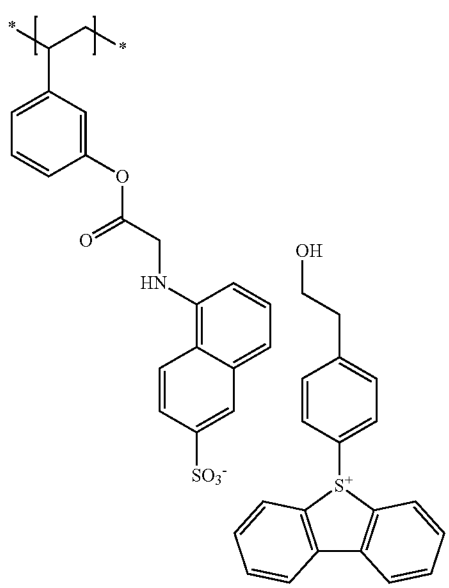
-continued
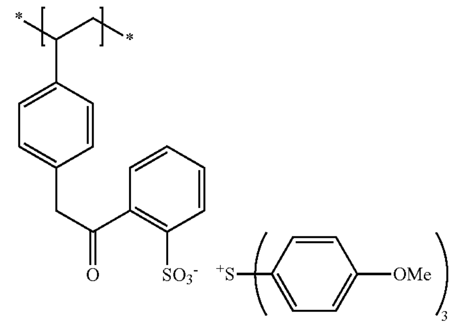
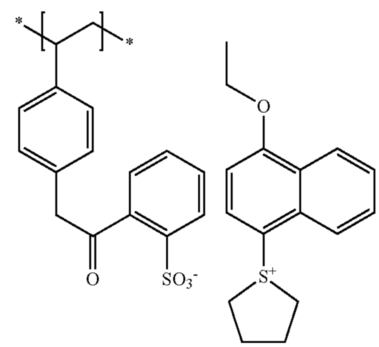
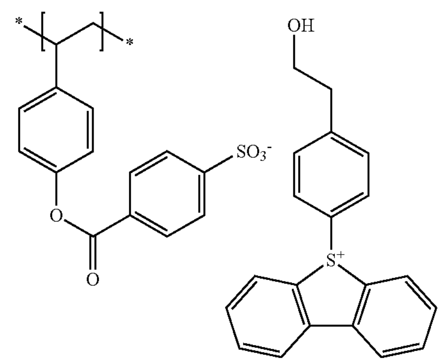
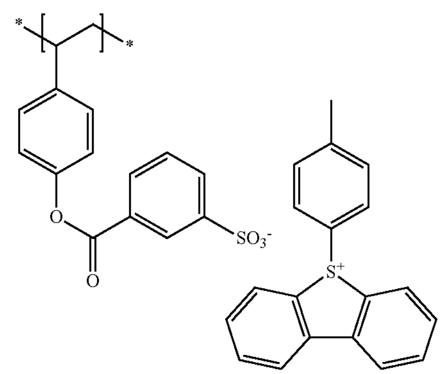

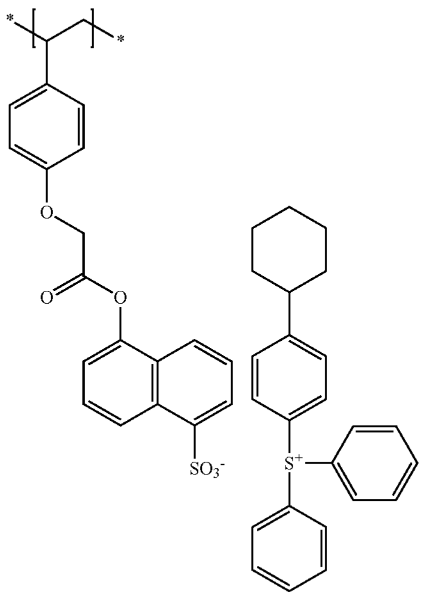
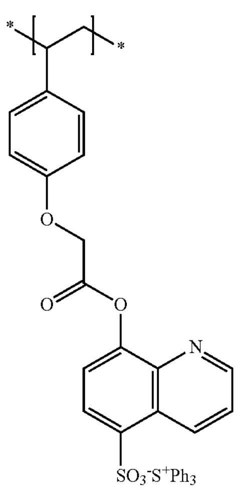
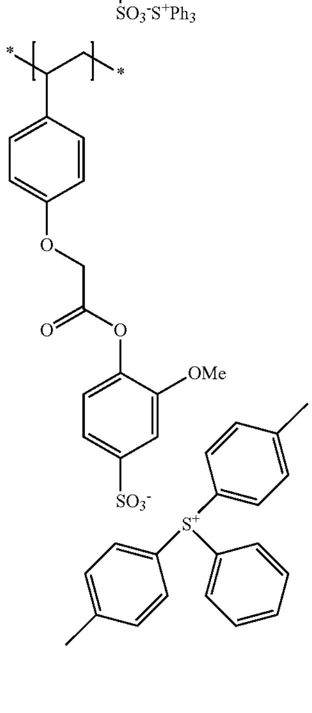
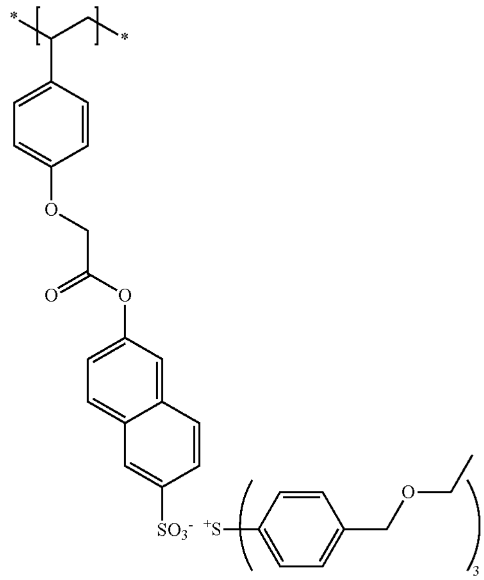
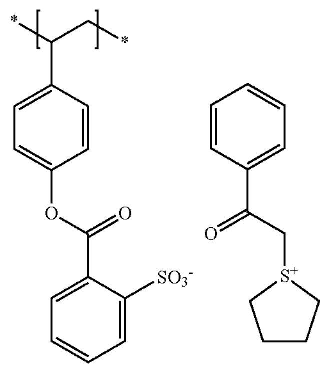
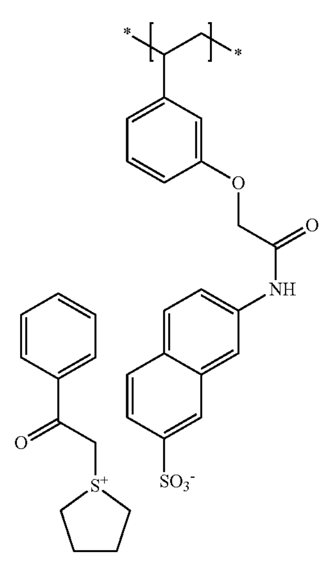

-continued
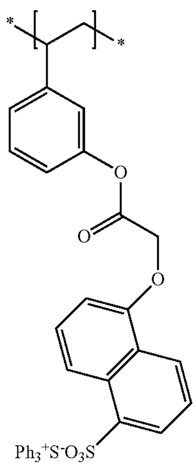
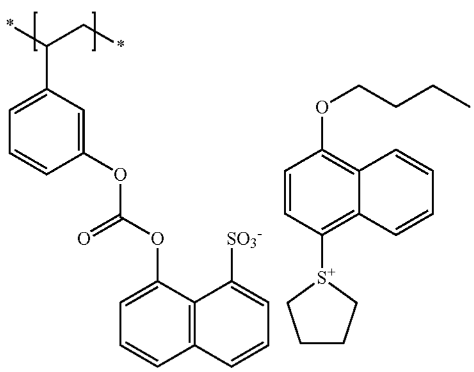
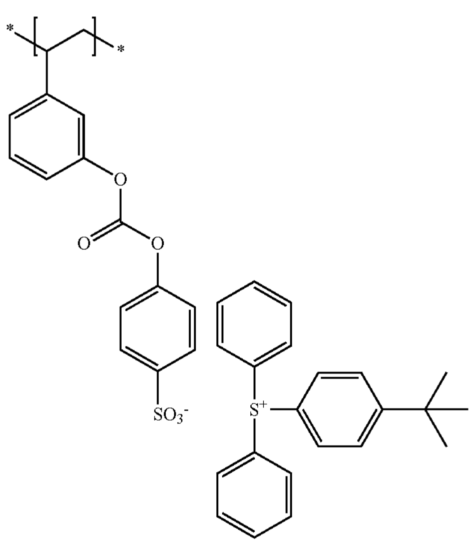
-continued
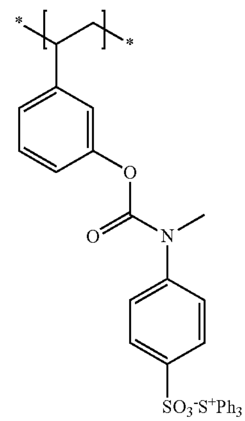
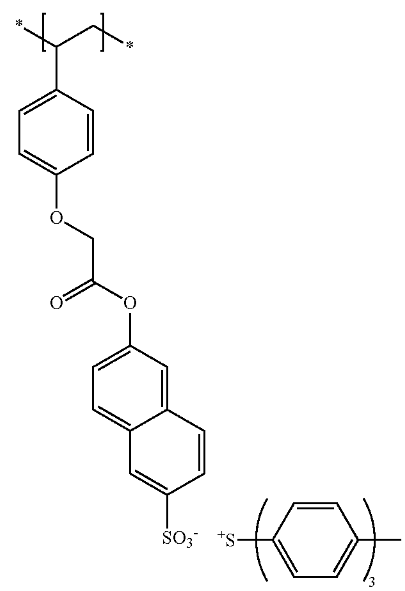
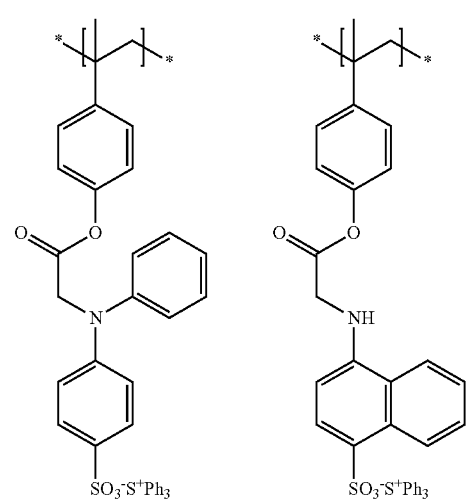

-continued
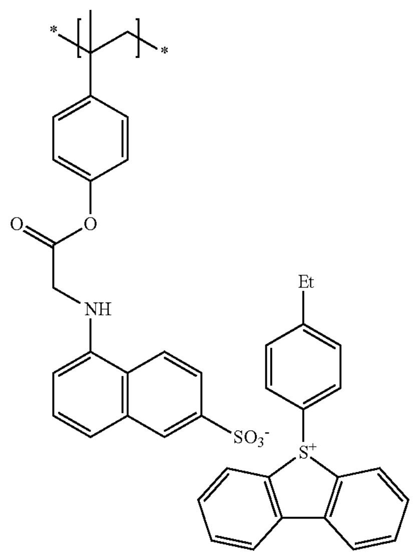
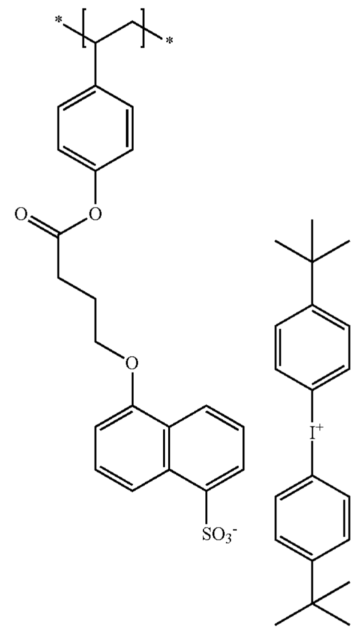
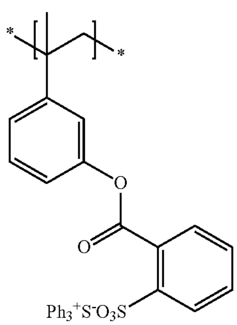
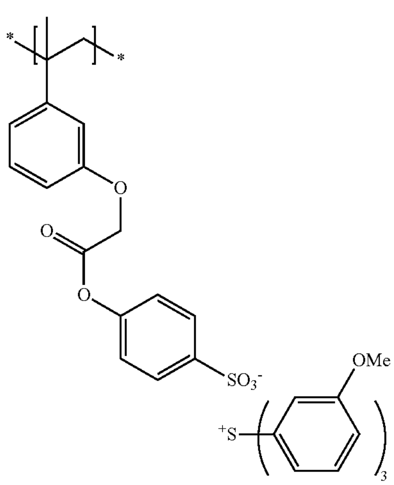
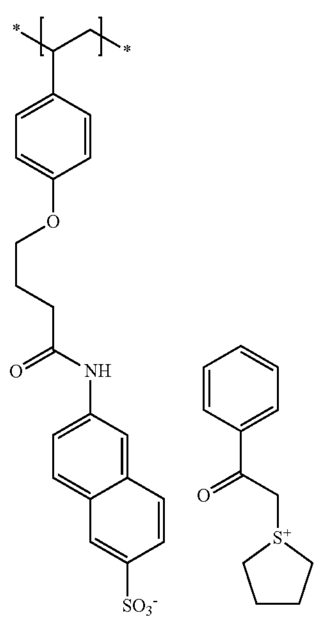
-continued -continued
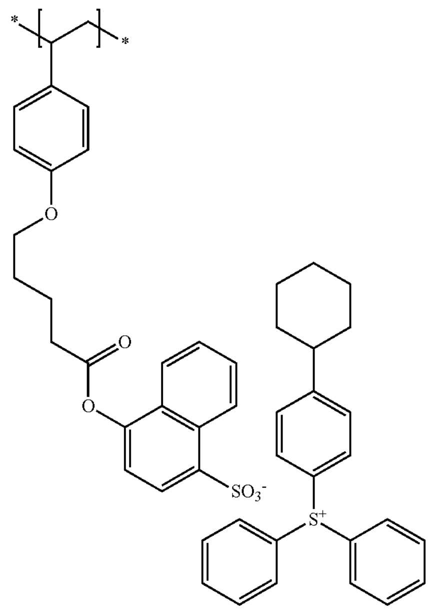
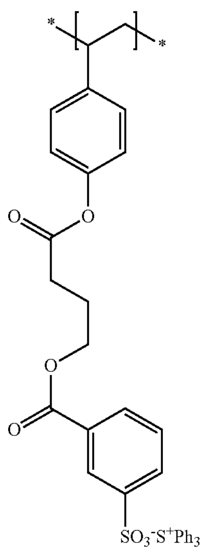
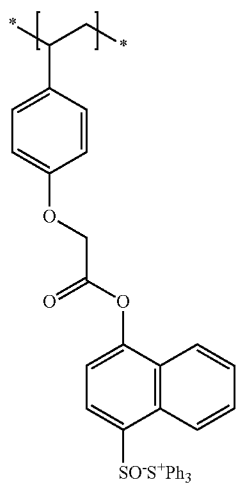
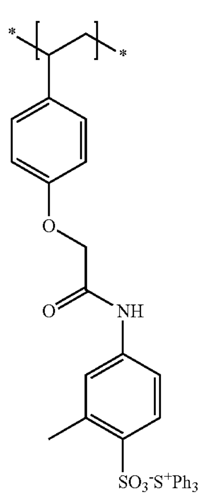
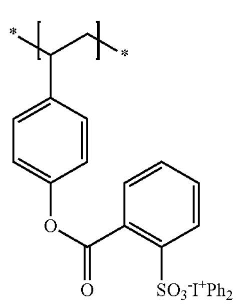
-continued
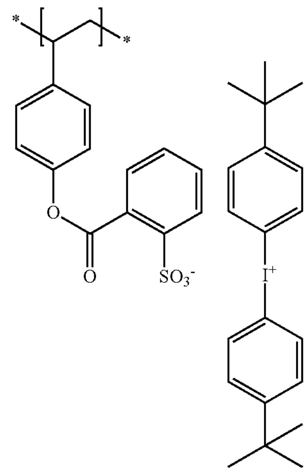
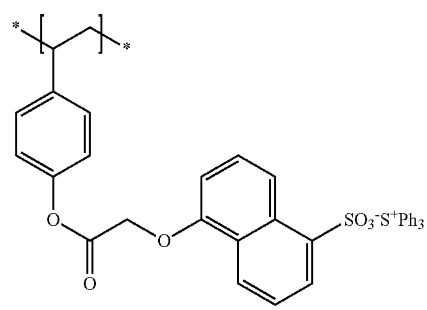
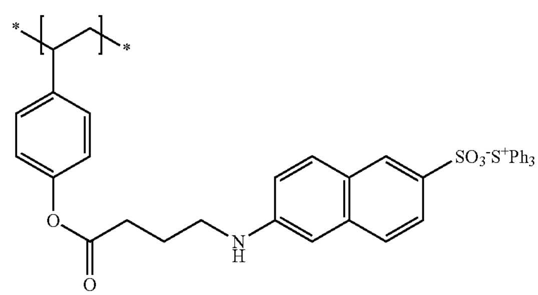
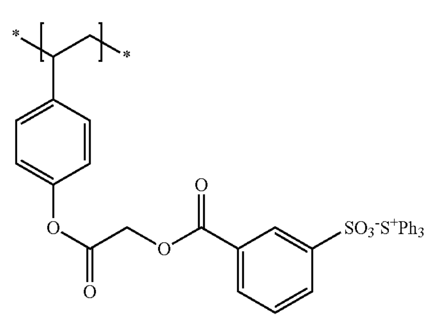

-continued
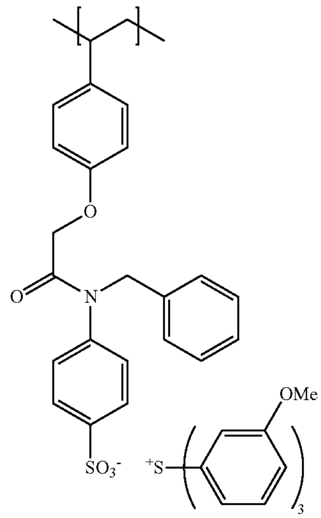
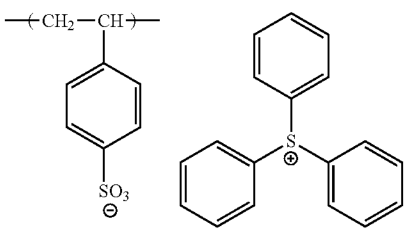
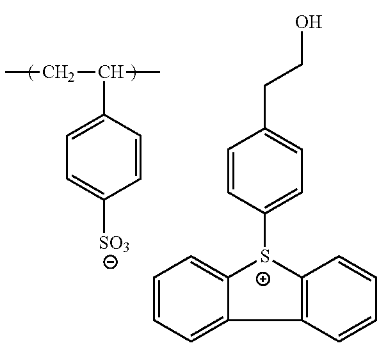
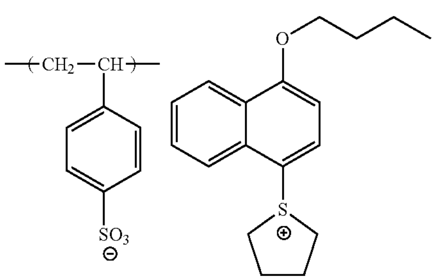
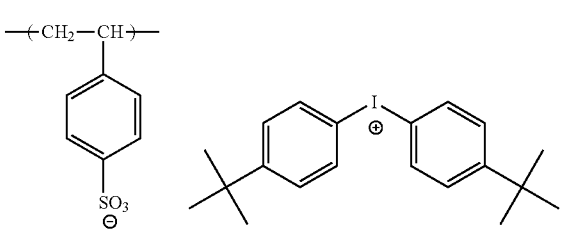
-continued
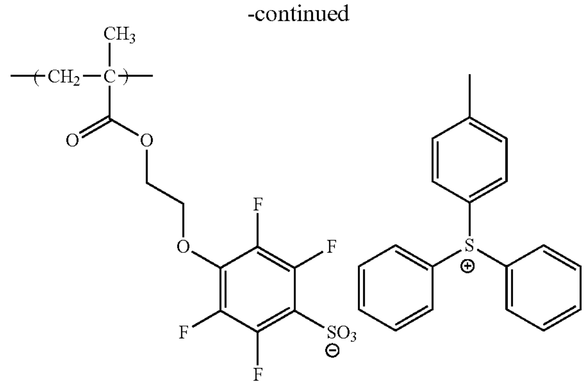
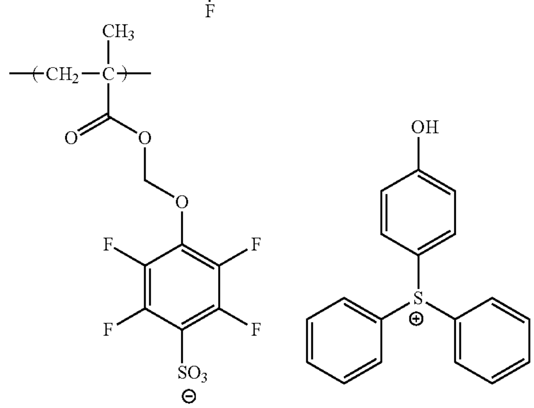
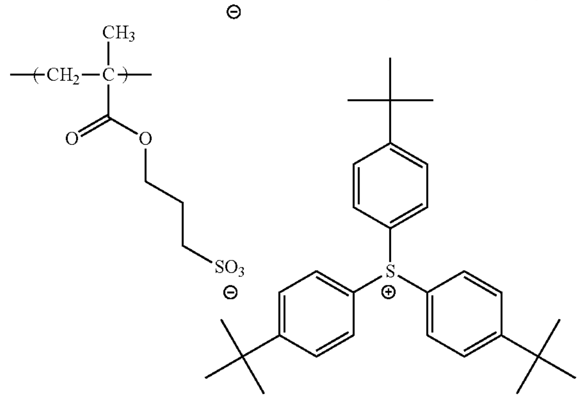
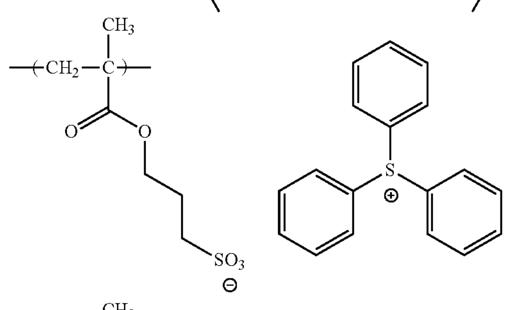
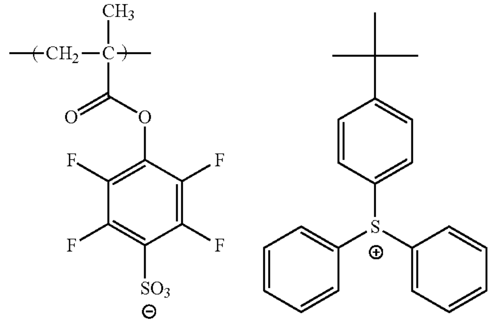

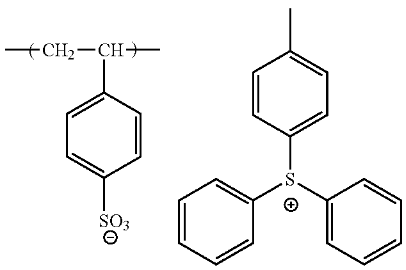
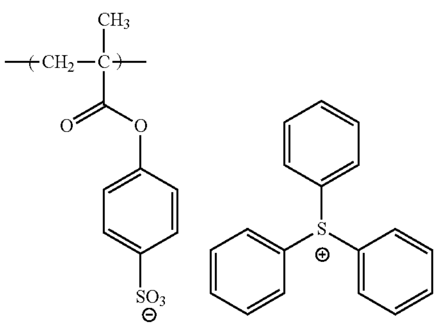
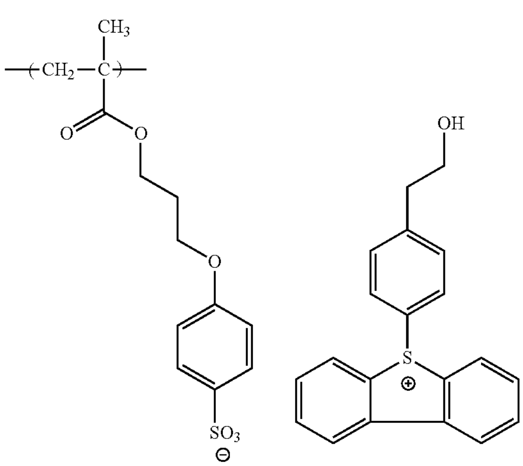
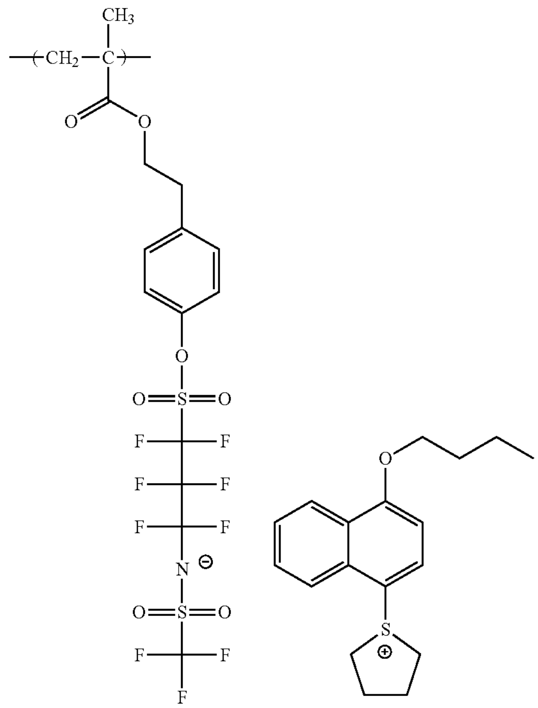
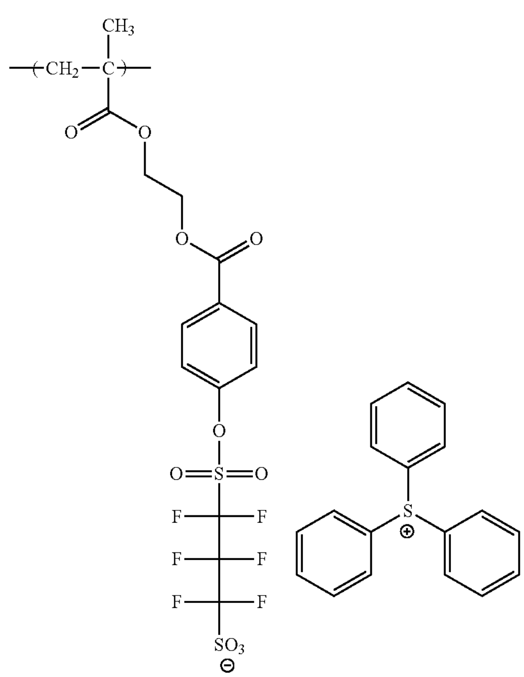

-continued
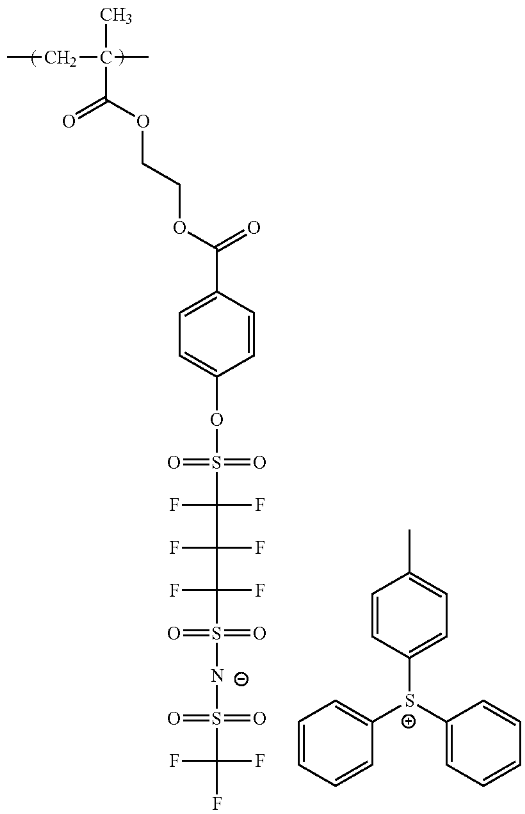
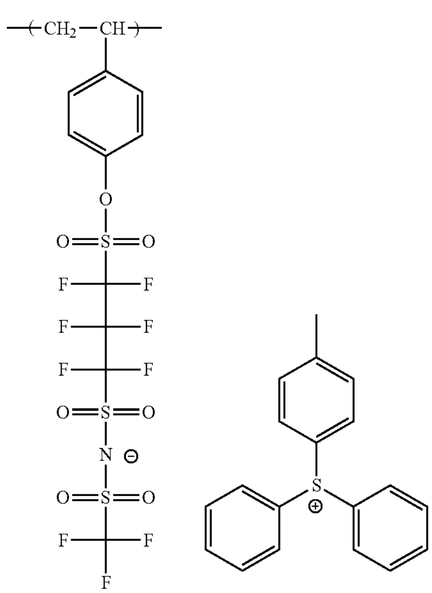
-continued
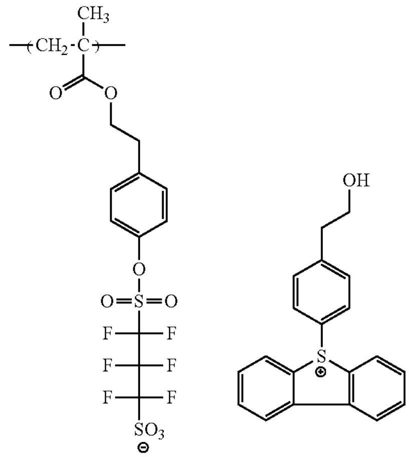
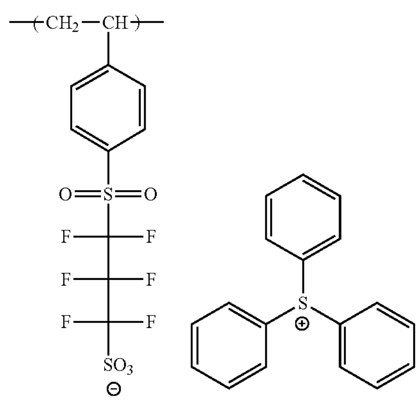
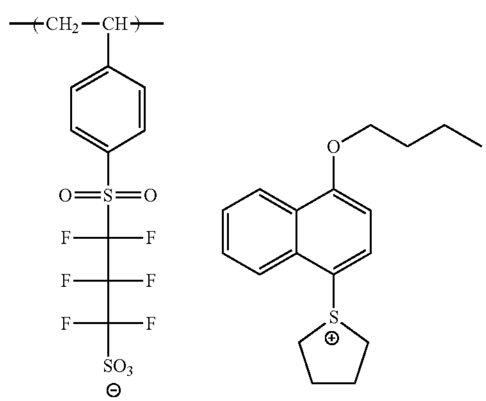
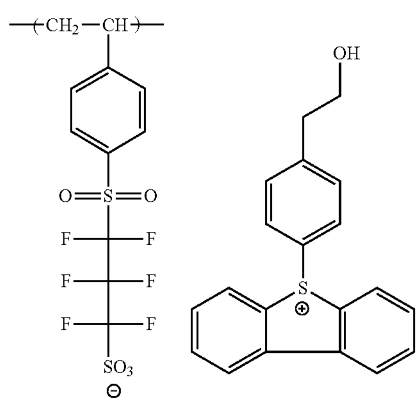

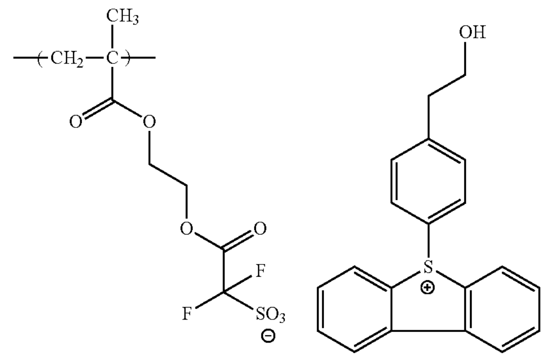
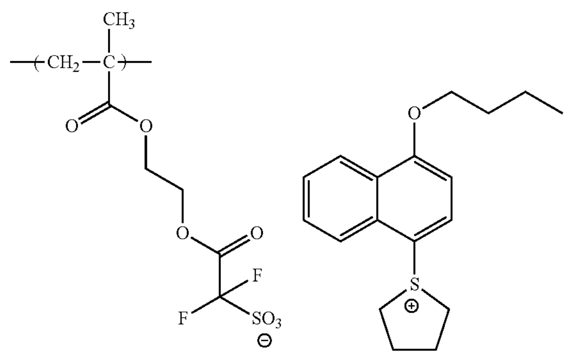
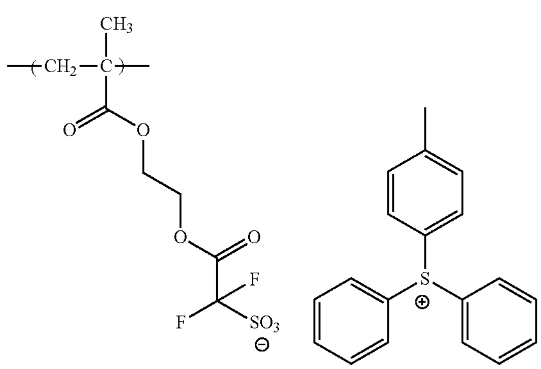
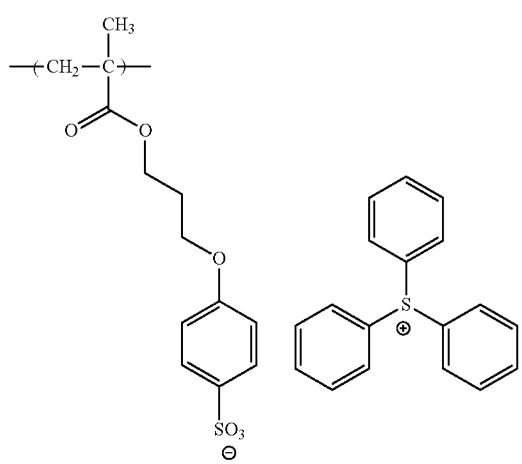
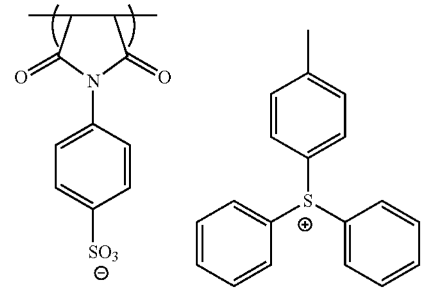
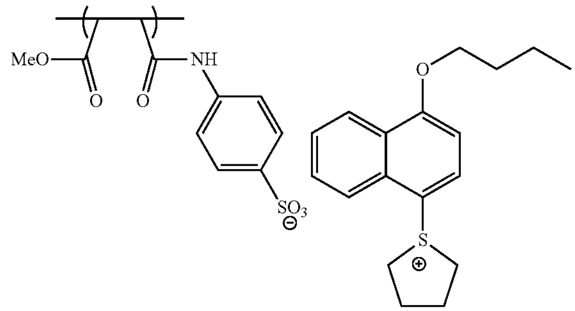
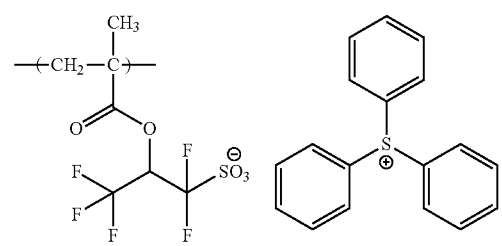
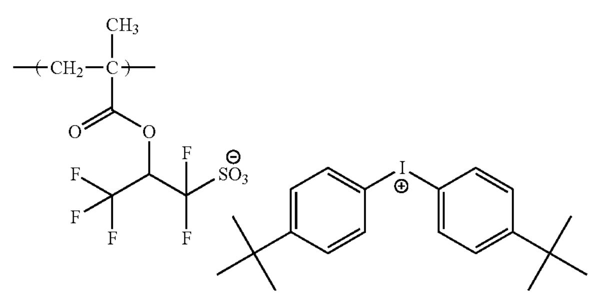
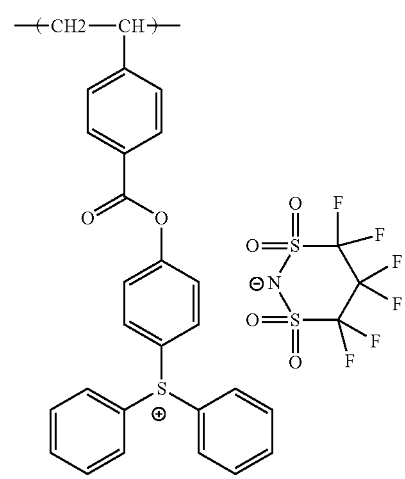

-continued
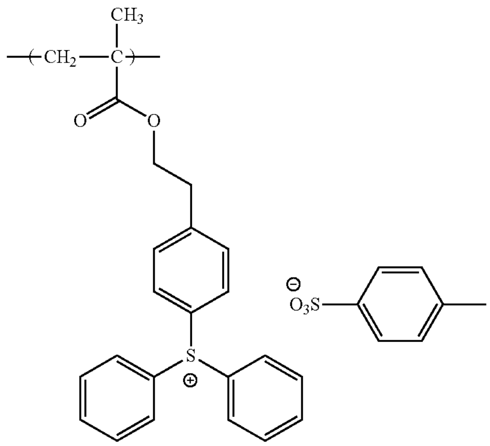
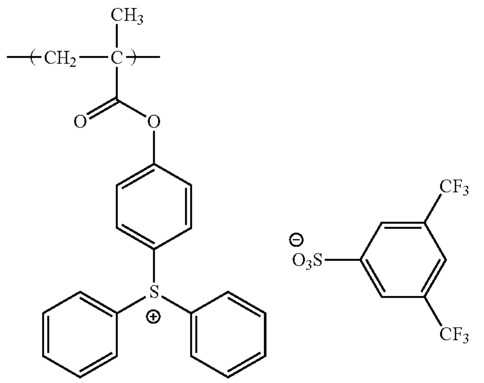
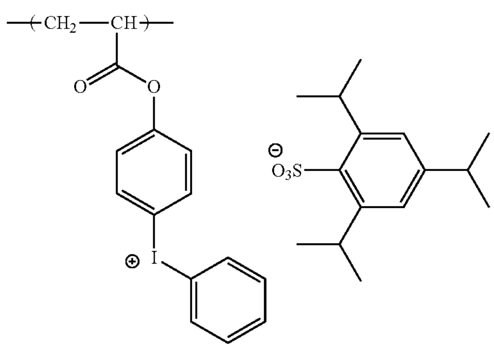
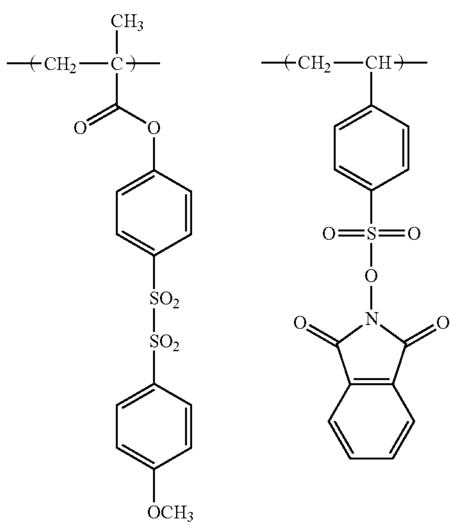
-continued
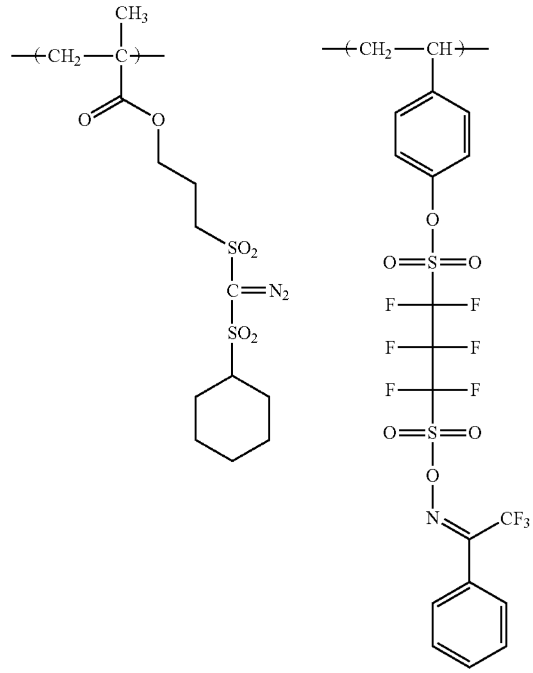
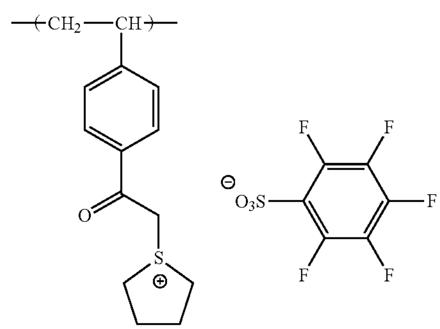
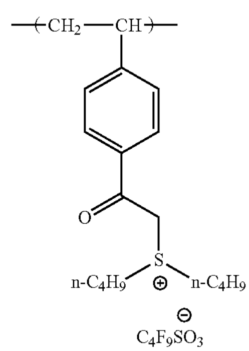
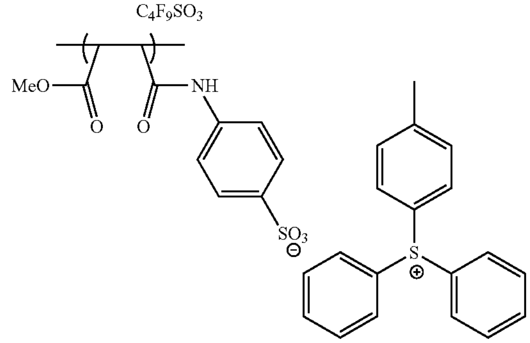

-continued
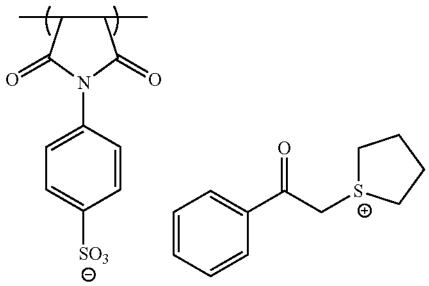
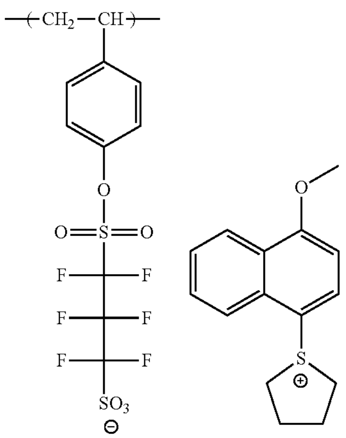
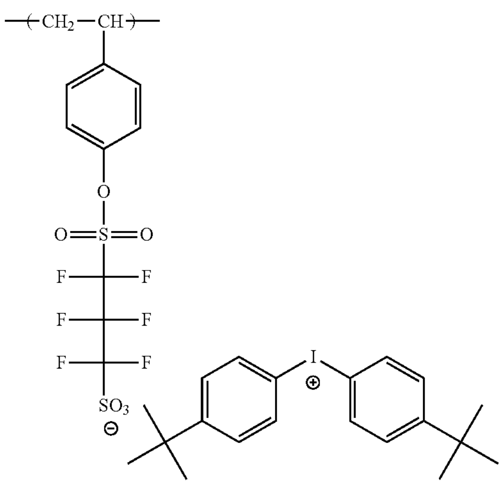
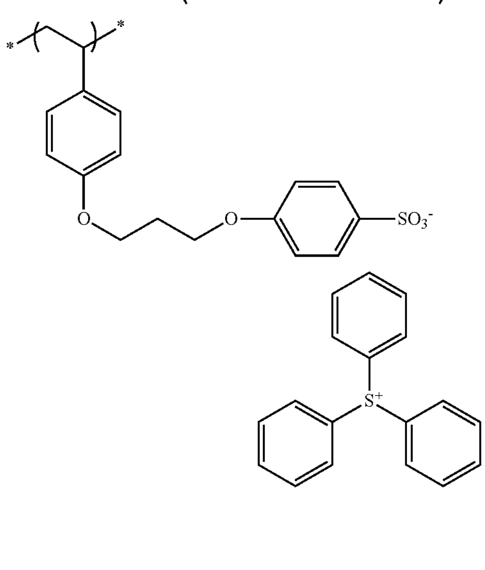
-continued
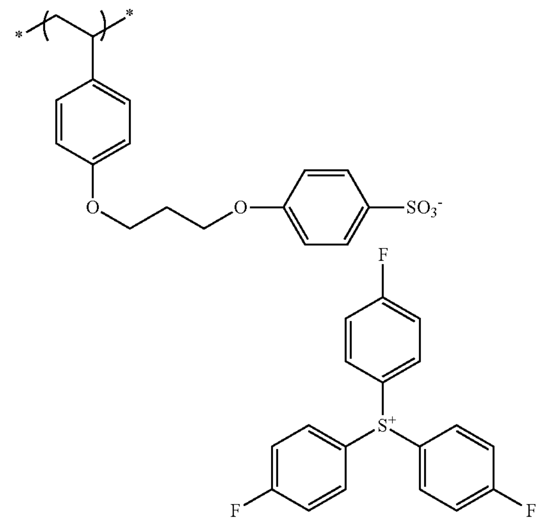
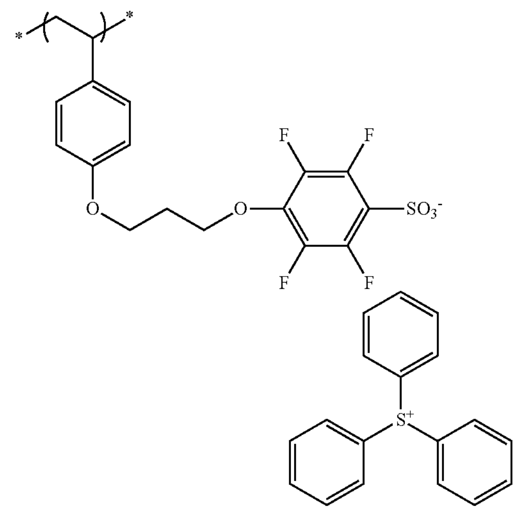
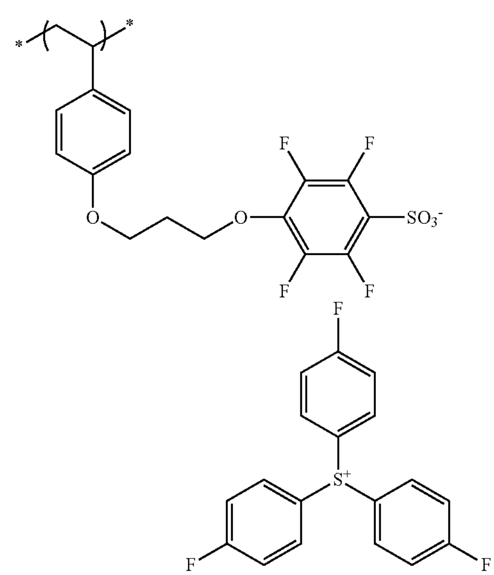

-continued
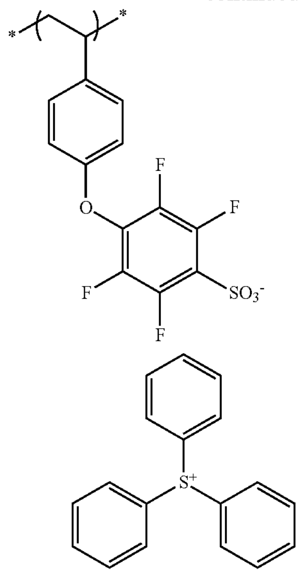
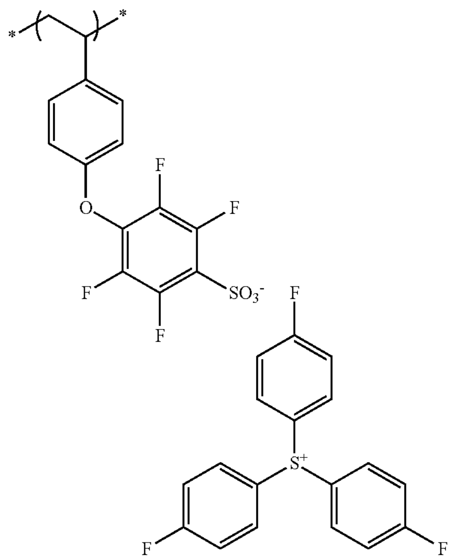
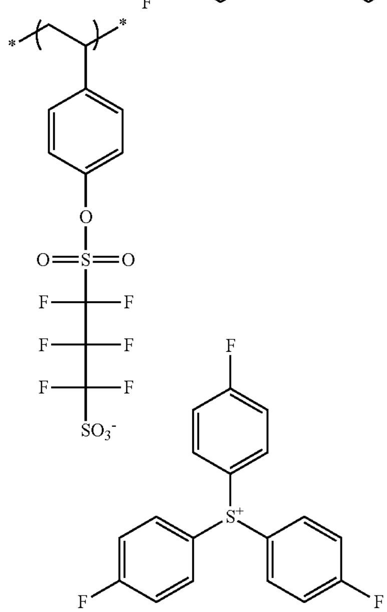
-continued
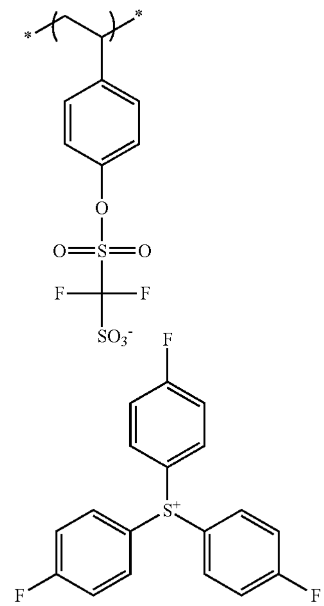
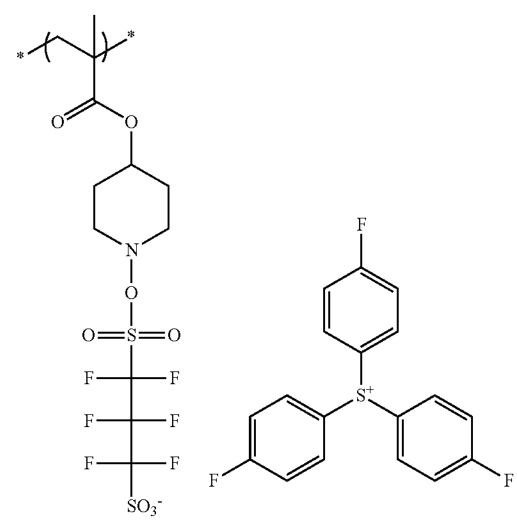
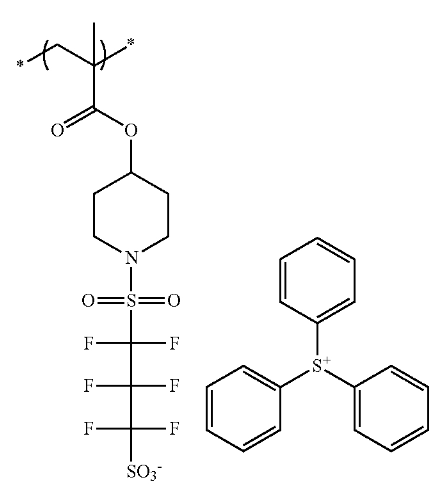

-continued
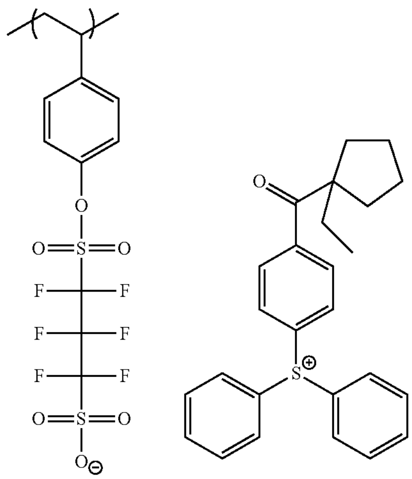
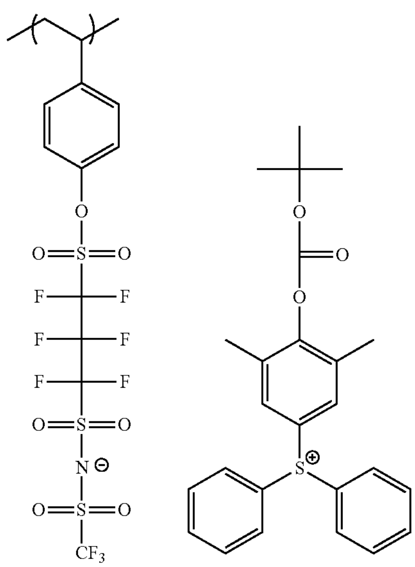
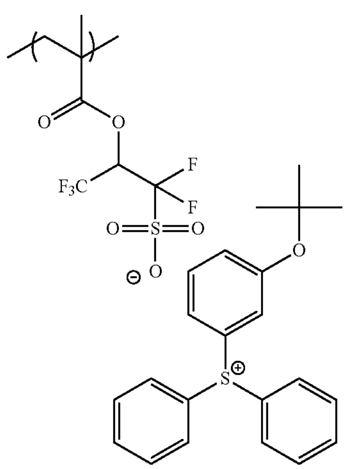
-continued
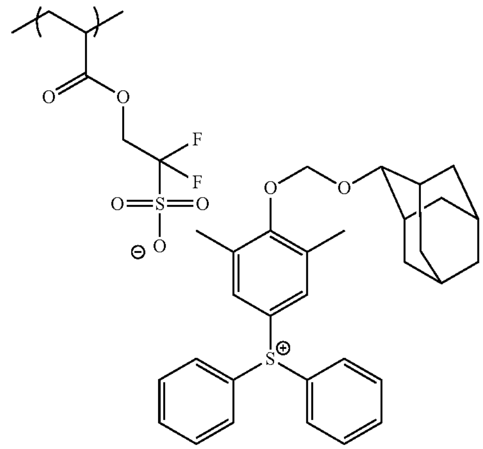
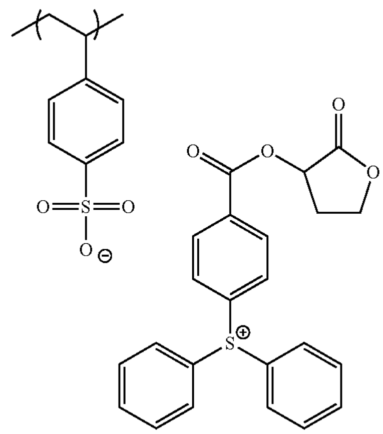
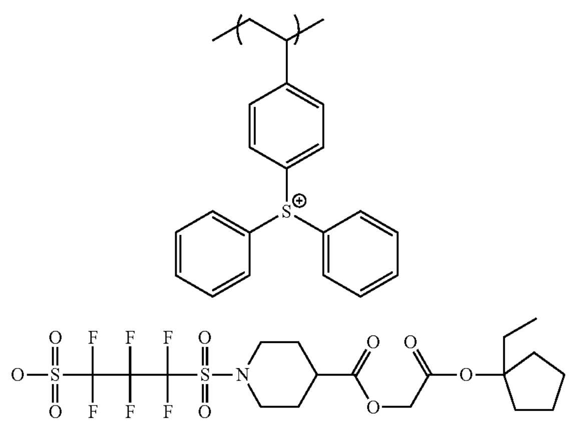
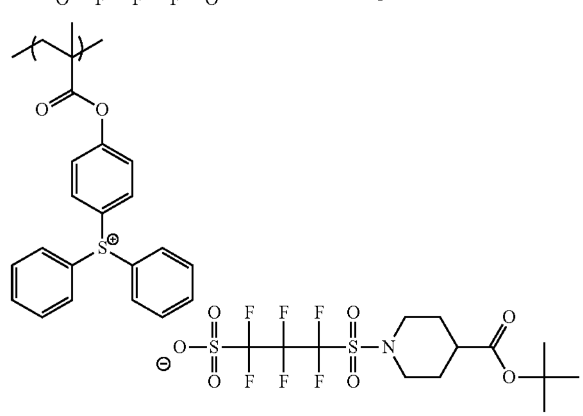

-continued
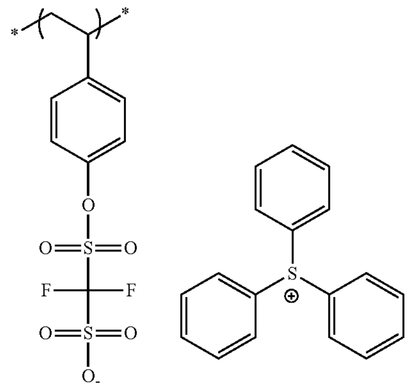
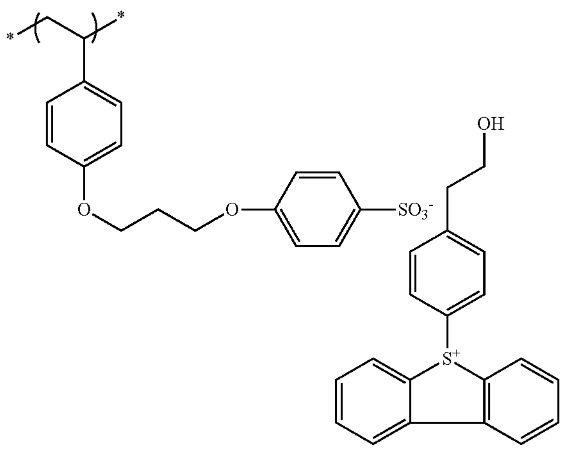
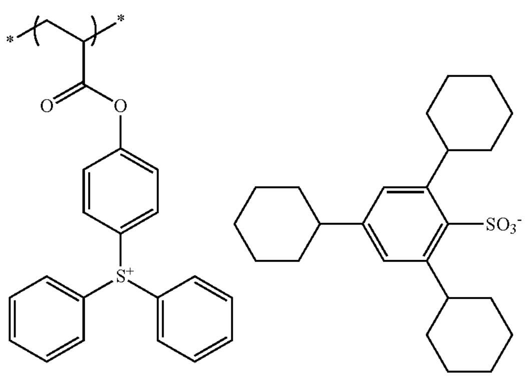
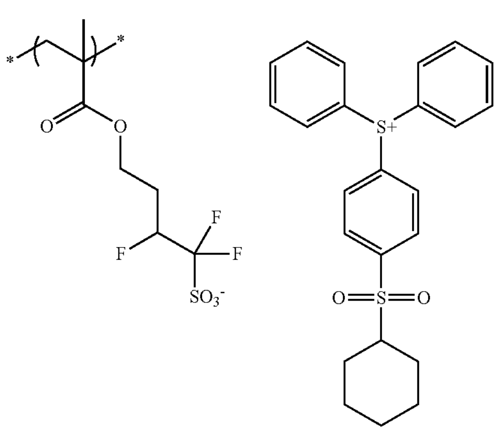
-continued
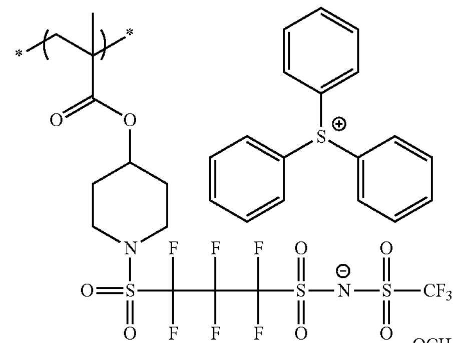
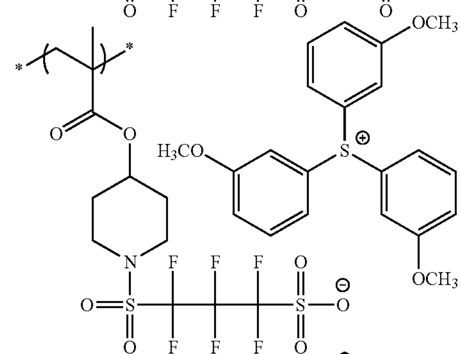
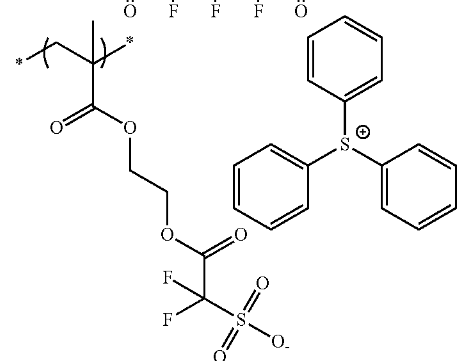
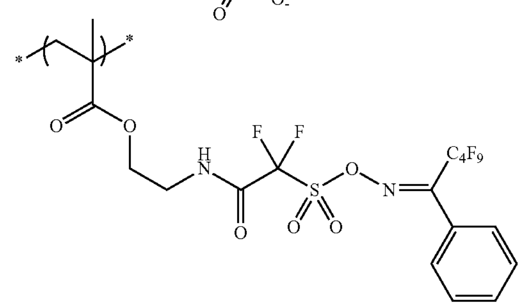
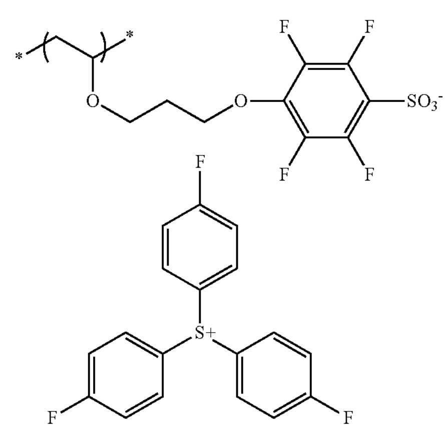

-continued

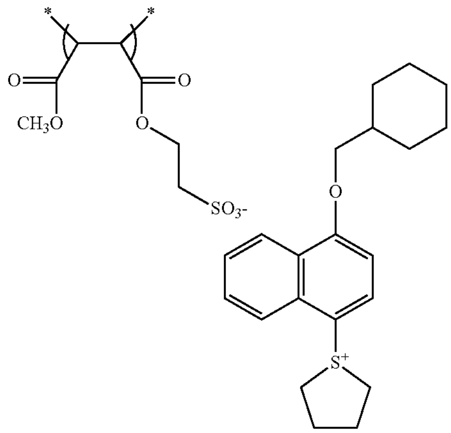

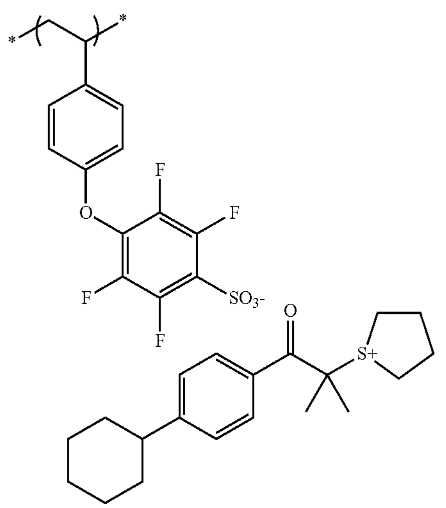

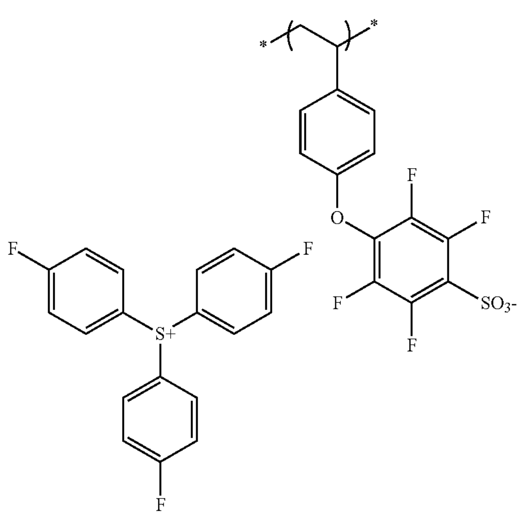

-continued

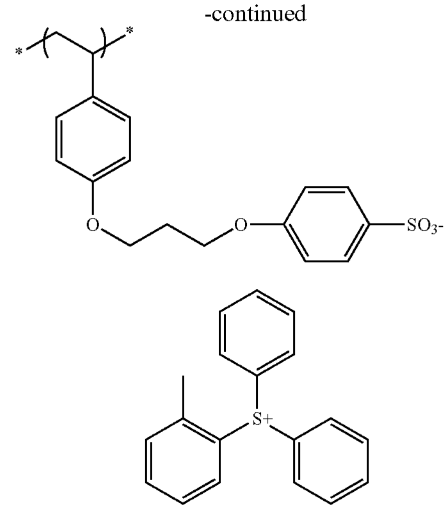

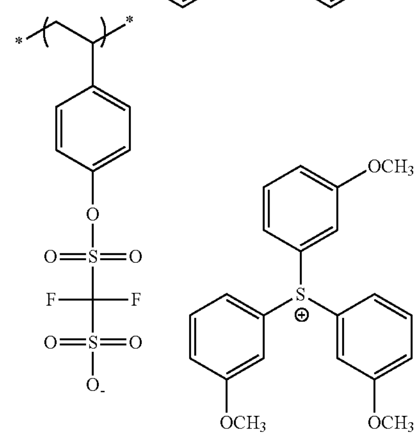

[2] Repeating Unit having Acid-Decomposable Group

Typically, the resin (A) further includes a repeating unit having an acid-decomposable group (a group which decomposes by the action of an acid to generate a polar group). The repeating unit may have the acid-decomposable group on either or both of a main chain and a side chain.

A polar group of the acid-decomposable group preferably has a structure protected by a group capable of decomposing and leaving by the action of an acid. Examples of the polar group may include a phenolichydroxy group, a carboxyl group, an alcoholic hydroxy group, a fluorinated alcohol group, a sulfonate group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred examples of the polar group may include a carboxyl group, an alcoholic hydroxy group, a fluorinated alcohol group (preferably hexafluoroisopropanol), and sulfonate group.

A group preferred as the acid-decomposable group is a group that substitutes the hydrogen atom of the polar group thereof with the group capable of leaving by the action of an acid.

Examples of the group capable of leaving by the action of an acid may include $—C(R_{36})(R_{37})(R_{38})$, $—C(R_{36})(R_{37})(OR_{39})$, and $—C(R_{01})(R_{02})(OR_{39})$. In the formulas, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring. Each of $R_{01}$ and $R_{02}$ independently represents a hydrogen atom, an alkyl group, a cycloalkyl group, an aryl group, an aralkyl group or an alkenyl group.

Preferred examples of the acid-decomposable group may include a cumylester group, an enolester group, an acetalester group, a tertiary alkylester group, and an alcoholic hydroxy group. Particularly preferred examples of the acid-decomposable group may include the tertiary alkylester group and the acetalester group.

As the preferred repeating unit having the acid-decomposable group, for example, it is possible to use at least one of the repeating unit (R1), the repeating unit (R2) and the repeating unit (R3).

<Repeating Unit (R1)>

The repeating unit (R1) has a group which decomposes by the action of an acid to generate a carboxyl group. The repeating unit (R1) is represented by the following Formula (AI), for example.

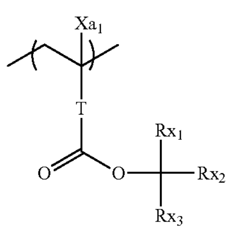

(AI)

In the formula, $Xa_1$ represents a hydrogen atom, a methyl group that may have a substituent, or a group represented by —$CH_2$—$R_9$. Here, $R_9$ represents a hydroxy group or a monovalent organic group.

T represents a single bond or a divalent linking group.

Each of $Rx_1$ to $Rx_3$ independently represents an alkyl group (a straight chain or a branch), a cycloalkyl group (monocyclic or polycyclic), an aryl group, or an aralkyl group. Two of $Rx_1$ to $Rx_3$ may combine with each other to form a (monocyclic or polycyclic) ring.

The repeating unit represented by Formula (AI) decomposes by the action of an acid, and then is converted into a repeating unit represented by the following Formula (AI').

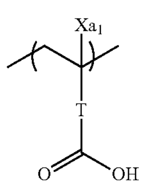

(AI')

In the formula, $Xa_1$ and T have the same meaning as those of Formula (AI), respectively.

The repeating unit represented by Formula (AI) is converted into the repeating unit represented by Formula (AI'), thus leading to a change in the dissolution parameter of the resin. The extent of the change depends on the configuration of each group (particularly a group represented by $Rx_1$ to $Rx_3$) in Formula (AI), and a content of the repeating unit represented by Formula (AI) based on the entire repeating unit of the resin (A), for example.

$Xa_1$ and T in Formula (AI) are typically not changed before and after the decomposition by the action of an acid. Thus, the groups may be appropriately selected depending on properties required for the repeating unit represented by Formula (AI).

$Xa_1$ represents a hydrogen atom, a methyl group that may have a substituent or a group represented by —$CH_2$—$R_9$. Here, $R_9$ represents a hydroxy group or a monovalent organic group. Examples of $R_9$ may include an acyl group or an alkyl group having 5 or less carbon atoms, and the alkyl group having 3 or less carbon atoms is preferred and a methyl group is more preferred. $Xa_1$ preferably represents a hydrogen atom, a methyl group, a trifluoromethyl group or a hydroxymethyl group.

As the divalent linking group of T, for example, an alkylene group, an arylene group, a —COO-Rt-group, and an —O-Rt-group may be used. In the formula, Rt represents an alkylene group, and a cycloalkylene group.

T is preferably a single bond, an arylene group, or a —COO-Rt-group. The arylene group is preferably a 1,4-phenylene group, a 1,3-phenylene group, a 1,2-phenylene group, or an 1,4-Naphthylen group. Rt is preferably an alkylene group having 1 to 5 carbon atoms, and —$CH_2$-group, —$(CH_2)_2$-group, or —$(CH_2)_3$-group are more preferred.

The alkyl group of $Rx_1$ to $Rx_3$ is preferably a methyl group, an ethyl group, an n-propyl group, an isopropyl group, an n-butyl group, an isobutyl group, or a t-butyl group, which has 1 to 4 carbon atoms.

As the cycloalkyl group of $Rx_1$ to $Rx_3$, a monocyclic cycloalkyl group such as a cyclopentyl group or a cyclohexyl group, or a polycyclic cycloalkyl group such as a norbornyl group, a tetracyclodecanyl group, a tetracyclododecanyl group and an adamantyl group are preferred.

Examples of the aryl group of $Rx_1$ to $Rx_3$ may include a phenyl group, a 1-naphthyl group, a 2-naphthyl group, a 4-methylphenyl group, a 4-methoxyphenyl group and the like.

Examples of the aralkyl group of $Rx_1$ to $Rx_3$ may include a benzyl group and a 1-naphthylmethyl group and the like.

A ring formed by combining two of $Rx_1$ to $Rx_3$ with each other is preferably a monocyclic aliphatic hydrocarbon ring such as a cyclopentane ring and a cyclohexane ring, or a polycyclic aliphatic hydrocarbon ring such as a norbornane ring, a tetracyclodecane ring, a tetracyclododecane ring and an adamantane ring. Among them, the monocyclic aliphatic hydrocarbon ring having 5 to 6 carbon atoms is particularly preferred.

Particularly, $Rx_1$ is a methyl group or an ethyl group, and an aspect by combining $Rx_2$ and $Rx_3$ with each other to form the aforementioned ring is preferred.

Each group and ring may have a substituent. Examples of the substituent may include an alkyl group (having 1 to 4 carbon atoms), a halogen atom, a hydroxyl group, an alkoxy group (having 1 to 4 carbon atoms), a carboxyl group, an alkoxy carbonyl group (having 2 to 6 carbon atoms) and the like, and 8 or less carbon atoms are preferred.

The resin (A) more preferably includes, as a repeating unit represented by Formula (AI), at least one of a repeating unit represented by the following Formula (I) and a repeating unit represented by the following Formula (II).

(I)

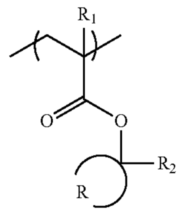

(II)

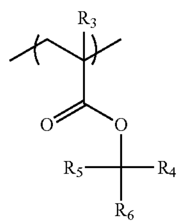

In Formulas (I) and (II),

Each of $R_1$ and $R_3$ independently represents a hydrogen atom, a methyl group that may have a substituent or a group represented by —$CH_2$—$R_9$. $R_9$ represents a hydroxy group or a monovalent organic group.

Each of $R_2$, $R_4$, $R_5$ and $R_6$ independently represents an alkyl group, a cycloalkyl group, an aryl group, or an aralkyl group.

R represents an atom group that is required to form an alicylic structure along with carbon atom to which $R_2$ is bonded.

$R_1$ preferably represents a hydrogen atom, a methyl group, a trifluoromethyl group or a hydroxymethyl group.

The alkyl group of $R_2$ may be straight or branched, and may have a substituent.

The cycloalkyl group of $R_2$ may be monocyclic or polycyclic, and may have a substituent.

The aryl group of $R_2$ may be monocyclic or polycyclic, and may have a substituent. The aryl group preferably has 6 to 18 carbon atoms, and examples thereof may include a phenyl group, a 1-naphthyl group, a 2-naphthyl group, a 4-methylphenyl group, a 4-methoxyphenyl group, and a 4-biphenyl group.

The aralkyl group of $R_2$ may be monocyclic or polycyclic, and may have a substituent. The aralkyl group preferably has 7 to 19 carbon atoms, and examples thereof may include a benzyl group, a 1-naphthylmethyl group, a 2-naphthylmethyl group, and an α-methylbenzyl group.

$R_2$ is preferably an alkyl group, more preferably has 1 to 10 carbon atoms, and still more preferably has 1 to 5 carbon atoms, and examples thereof may include a methyl group and an ethyl group.

R represents an atom group that is required to form an alicylic structure along with carbon atom. R preferably forms a monocyclic alicylic structure, which preferably has 3 to 7 carbon atoms and more preferably has 5 or 6 carbon atoms.

$R_3$ is preferably a hydrogen atom or a methyl group, and more preferably a methyl group.

The alkyl group of $R_4$, $R_5$ and $R_6$ may be straight or branched, and may have a substituent. The alkyl group may be preferably a methyl group, an ethyl group, an n-propyl group, an isopropyl group, an n-butyl group, an isobutyl group, a t-butyl group and the like, and the alkyl group having 1 to 4 carbon atoms is preferred.

The cycloalkyl group of $R_4$, $R_5$ and $R_6$ may be monocyclic or polycyclic, and may have a substituent. The cycloalkyl group may be preferably a monocyclic cycloalkyl group such as a cyclopentyl group and a cyclohexyl group, or a polycyclic cycloalkyl group such as a norbornyl group, a tetracyclodecanyl group, a tetracyclododecanyl group and an adamantyl group.

The aryl group of $R_4$, $R_5$ and $R_6$ may be monocyclic or polycyclic, and may have a substituent. The aryl group is preferably an aryl group having 6 to 18 carbon atoms, such as a phenyl group, a 1-naphthyl group, a 2-naphthyl group, a 4-methylphenyl group, a 4-methoxyphenyl group, and a 4-biphenyl group.

The aralkyl group of $R_4$, $R_5$ and $R_6$ may be monocyclic or polycyclic, and may have a substituent. The aralkyl group is preferably an aralkyl group having 7 to 19 carbon atoms, such as a benzyl group, a 1-naphthylmethyl group, a 2-naphthylmethyl group, and an α-methylbenzyl group.

When the repeating unit (R1) has a group capable of decomposing by the action of an acid to generate a carboxyl group, resolution and sensitivity are further improved. For this reason, the repeating unit represented by the following Formula (II-1) is more preferred.

(II-1)

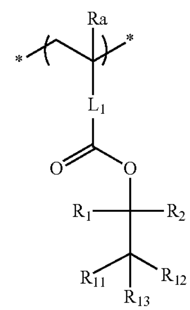

In Formula (II-1),

Each of $R_1$ and $R_2$ independently represents an alkyl group, each of $R_{11}$ and $R_{12}$ independently represents an alkyl group, and $R_{13}$ represents a hydrogen atom or an alkyl group. $R_{11}$ and $R_{12}$ may combine with each other to form a ring, and $R_{11}$ and $R_{13}$ may combine with each other to form a ring.

Ra represents a hydrogen atom, an alkyl group, a cyano group or a halogen atom, and $L_1$ represents a single bond or a divalent linking group.

In Formula (II-1), the alkyl group of $R_1$, $R_2$ and $R_{11}$ to $R_{13}$ is preferably an alkyl group having 1 to 10 carbon atoms, such as a methyl group, an ethyl group, a propyl group, an isopropyl group, an n-butyl group, a sec-butyl group, a t-butyl group, a neopentyl group, a hexyl group, a 2-ethylhexyl group, an octyl group and a dodecyl group.

As the alkyl group of $R_1$ and $R_2$, it is more preferred that the alkyl group has 2 to 10 carbon atoms and it is still more preferred that both $R_1$ and $R_2$ are an ethyl group from the viewpoint of achieving the effect of the present invention more reliably.

As the alkyl group of $R_{11}$ and $R_{12}$, it is more preferred that the alkyl group has 1 to 4 carbon atoms, it is still more preferred that $R_{11}$ and $R_{12}$ are the methyl group or the ethyl group, and it is particularly preferred that $R_{11}$ and $R_{12}$ are the methyl group.

$R_{13}$ is more preferably the hydrogen atom or the methyl group.

It is particularly preferred that $R_{11}$ and $R_{12}$ are connected to each other to form an alkylene group and thus form a ring.

$R_{11}$ and $R_{13}$ may be connected to each other to form an alkylene group and thus form a ring.

As the ring formed by connecting $R_{11}$ and $R_{12}$ to each other, a 3- to 8-membered ring is preferred and a 5- or 6-membered ring is more preferred.

As the ring formed by connecting $R_{11}$ and $R_{13}$ to each other, a 3 to 8-membered ring is preferred and a 5- or 6-membered ring is more preferred.

It is preferred that $R_{11}$ and $R_{13}$ are connected to each other to form the ring when $R_1$ and $R_{12}$ are connected to each other to form the ring.

The ring formed by connecting $R_{11}$ and $R_{12}$ (or $R_{11}$ and $R_{13}$) to each other is more preferably an alicyclic group that will be described later as X of Formula (1-1).

The ring formed by connecting the alkyl group as $R_1$, $R_2$, $R_{11}$ to $R_{13}$ with $R_{11}$ and $R_{12}$ (or $R_{11}$ and $R_{13}$) may further have a substituent.

Examples of the substituent included in the ring formed by connecting the alkyl group as $R_1$, $R_2$, $R_{11}$ to $R_{13}$ with $R_{11}$ and $R_{12}$ (or $R_{11}$ and $R_{13}$) may include a cycloalkyl group, an aryl group, an amino group, a hydroxy group, a carboxyl group, a halogen atom, an alkoxy group, an aralkyloxy group, a thioether group, an acyl group, an acyloxy group, an alkoxy carbonyl group, a cyano group, a nitro group and the like. The substituents may combine with each other to form a ring. Examples of the ring formed by combining the substituents with each other may include a cycloalkyl group or a phenyl group having 3 to 10 carbon atoms.

The alkyl group for Ra may have a substituent, and the alkyl group having 1 to 4 carbon atoms is preferred.

Preferred examples of the substituent that may be included in the alkyl group of Ra may include a hydroxyl group and a halogen atom.

Examples of the halogen atom of Ra may include a fluorine atom, a chlorine atom, a bromine atom and an oxo atom.

As Ra, a hydrogen atom, a methyl group, a hydroxymethyl group, and a perfluoroalkyl group (for example, a trifluoromethyl group) having 1 to 4 carbon atoms are preferred. The methyl group is particularly preferred because it enhances glass transition temperature (Tg) of the resin (A) and in addition, enhances resolution and a space width roughness. Meanwhile, if $L_1$ is the phenylene group, it is also preferred that Ra is a hydrogen atom.

Examples of the divalent linking group represented by $L_1$ may include an alkylene group, a divalent aromatic ring group, —COO-$L_{11}$-, —O-$L_{11}$-, and a group formed by combining two or more of them with each other. Here, $L_{11}$ represents an alkylene group, a cycloalkylene group, a divalent aromatic ring group, and a group obtained by combining the alkylene group with the divalent aromatic ring.

The alkylene group for $L_1$ and $L_{11}$ is an alkylene group having 1 to 8 carbon atoms, such as a methylene group, an ethylene group, a propylene group, a butylene group, a hexylene group and an octylene group. An alkylene group having 1 to 4 carbon atoms is more preferred, and an alkylene group having 1 or 2 carbon atoms is more preferred.

As the cycloalkylene group for $L_{11}$, a cycloalkylene group having 3 to 20 carbon atoms is preferred. Examples thereof may include a cyclopropylene group, a cyclobutylene group, a cyclopentylene group, a cyclohexylene group, a cycloheptylene group, a cyclooctylene group, a norbonylene group or an adamantylene group.

In the cycloalkylene group for $L_{11}$, carbon (carbon contributing to form a ring) constituting the ring may be carbonyl carbon or a heteroatom such as an oxygen atom, and may form a lactone ring by having an ester bond.

As the divalent aromatic ring group for $L_1$ and $L_{11}$, a phenylene group such as a 1,4-phenylene group, a 1,3-phenylene group and a 1,2-phenylene group, and a 1,4-naphthylene group are preferred, and the 1,4-phenylene group is more preferred.

$L_1$ is preferably a single bond, a divalent aromatic ring group, a divalent group having a norbonylene group or a divalent group having an adamantylene group, and is particularly preferably the single bond.

Although specific preferred examples as the divalent linking group for $L_1$ will be exemplified below, the present invention is not limited thereto.

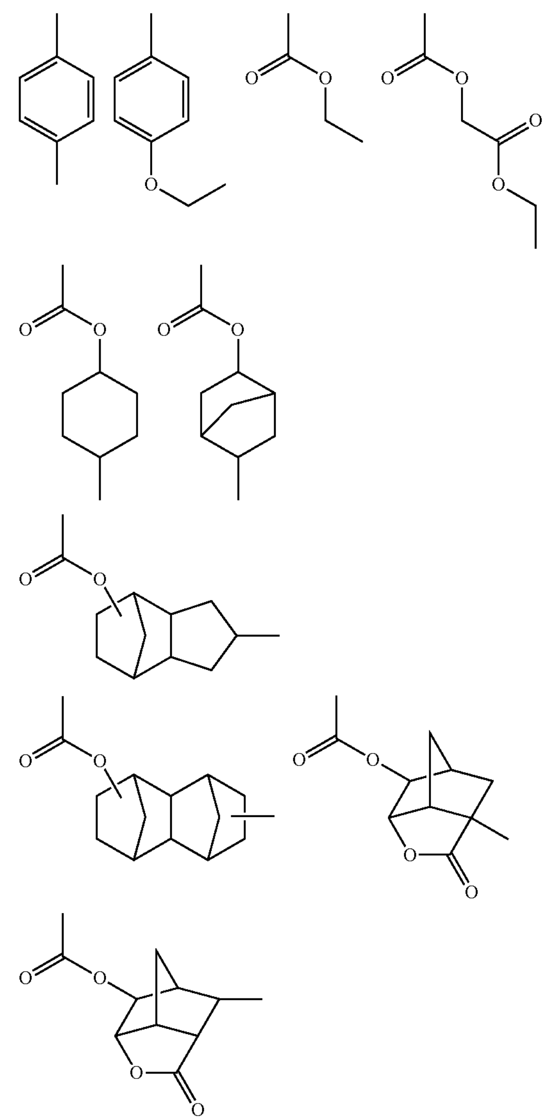

In order to achieve higher contrast (a high y value) and to establish high resolution, high performance of decreasing film reduction and high sensitivity, the repeating unit represented by Formula (II-1) is preferably a repeating unit represented by the following Formula (1-1).

(1-1)

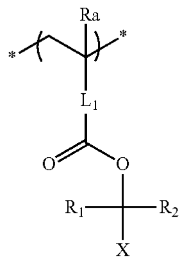

In Formula (1-1),

X denotes an alicyclic group.

$R_1$, $R_2$, Ra and $L_1$ have the same meaning as $R_1$, $R_2$, Ra and $L_1$ in Formula (II-1), respectively. Specific examples and preferred examples thereof are the same as those of $R_1$, $R_2$, Ra and $L_1$ in Formula (II-1).

An alicyclic group as X may be a monocyclic, polycyclic or bridge type group, and is preferably an alicyclic group having 3 to 25 carbon atoms.

Further, the alicyclic group may have a substituent. Examples of the substituent may include the alkyl group as $R_1$, $R_2$, $R_{11}$ to $R_{13}$, a substituent that is the same as the aforementioned substituent which may have the ring formed by connecting $R_{11}$ and $R_{12}$ (or $R_{11}$ and $R_{13}$) to each other, and an alkyl group (a methyl group, an ethyl group, a propyl group, a butyl group, a perfluoroalkyl group (for example, a trifluoromethyl group), and the like) and the like.

X represents preferably an alicyclic group having 3 to 25 carbon atoms, more preferably an alicyclic group having 5 to 20 carbon atoms, and particularly preferably a cycloalkyl group having 5 to 15 carbon atoms.

Further, X is preferably an alicyclic group of a 3- to 8-membered ring or a condensed ring group thereof, and is more preferably a 5- or 6-membered ring or a condensed ring group thereof Hereinafter, structural examples of the alicylic group as X will be shown.

(1)

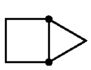

(2)

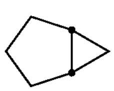

(3)

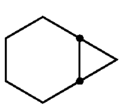

(4)

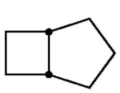

(5)

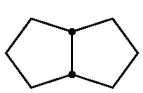

(6)

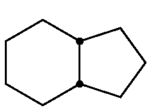

-continued (7)

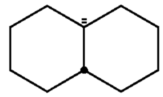

(8)

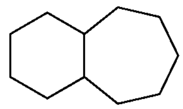

(9)

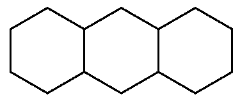

(10)

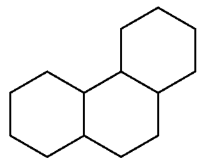

(11)

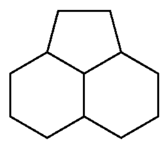

(12)

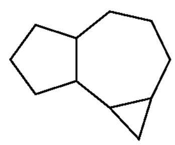

(13)

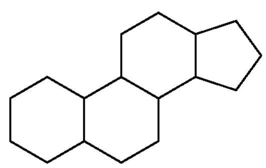

(14)

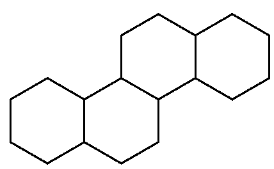

(15)

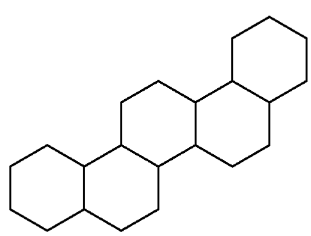

(16)

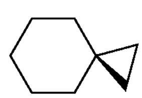

(17)

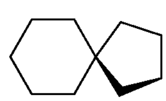

-continued
(18)
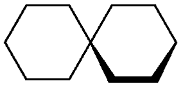
(19)
(20)
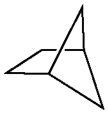
(21)
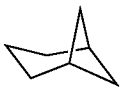
(22)
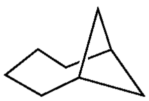
(23)
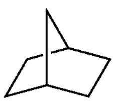
(24)
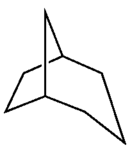
(25)
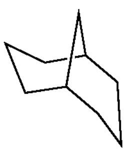
(26)
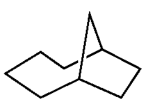
(27)
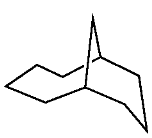
(28)
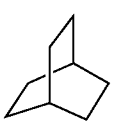
(29)
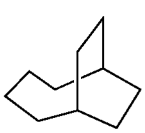
(30)
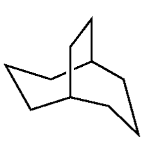
-continued
(31)
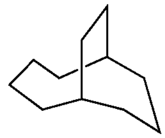
(32)
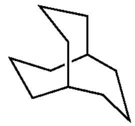
(33)
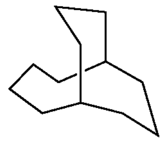
(34)
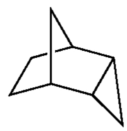
(35)
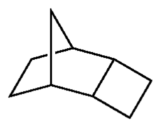
(36)
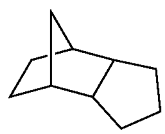
(37)
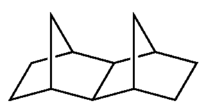
(38)
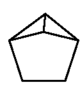
(39)
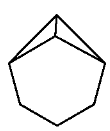
(40)
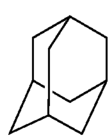
(41)
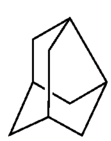
(42)
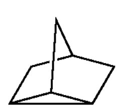

-continued (43)

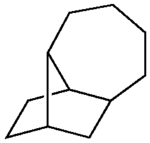

(44)

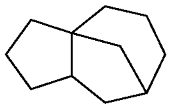

(45)

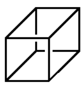

(46)

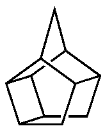

(47)

(48)

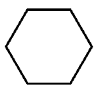

(49)

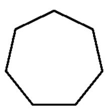

(50)

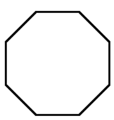

Preferred examples of the alicyclic group may include an adamantyl group, a noradamantyl group, a decaphosphorus residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group. The cyclohexyl group, the cyclopentyl group, the adamantyl group and the norbornyl group are more preferred, the cyclohexyl group and the cyclopentyl group are still more preferred, and the cyclohexyl group is particularly preferred.

Although specific examples of the repeating unit represented by Formula (II-1) or (1-1) will be shown below, the present invention is not limited thereto.

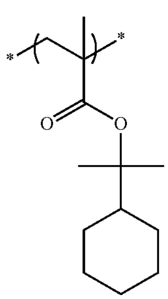

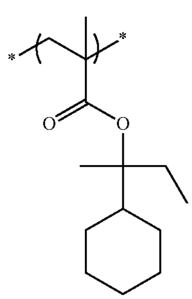

-continued

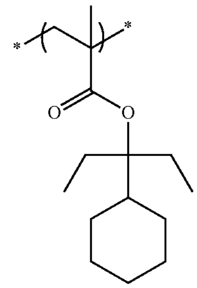

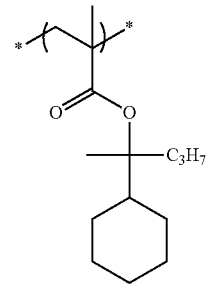

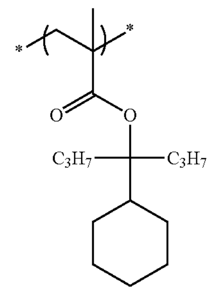

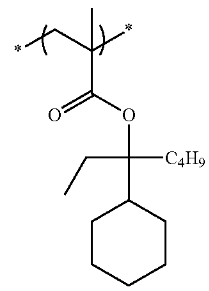

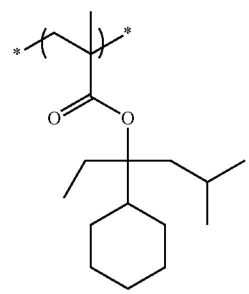

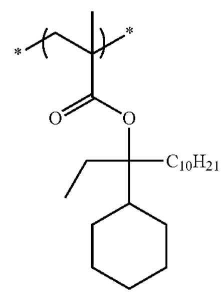

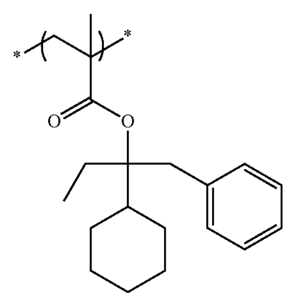

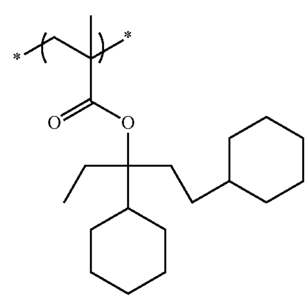

-continued
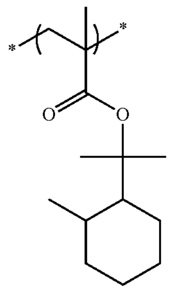
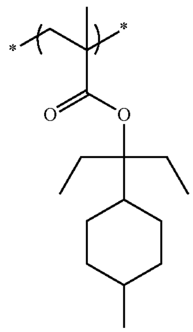
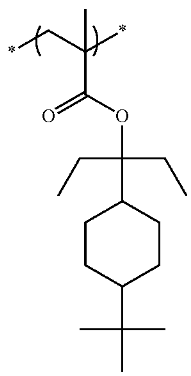
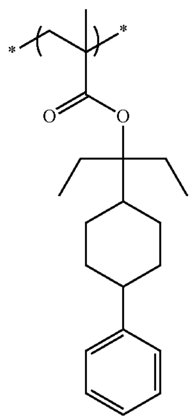
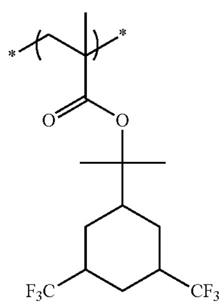
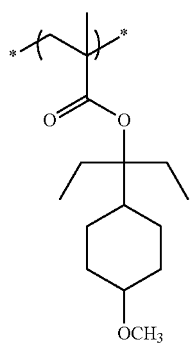
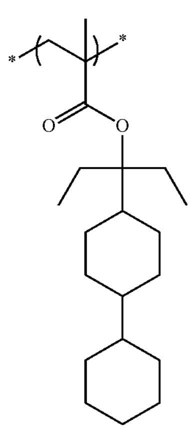
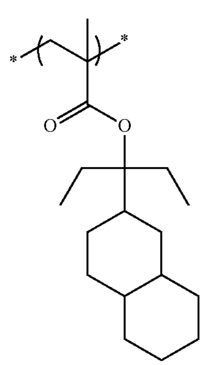
-continued
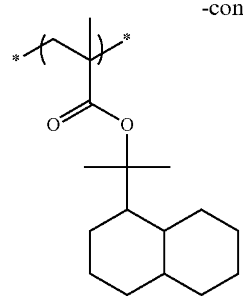
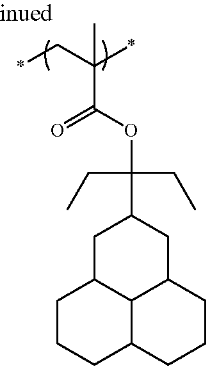
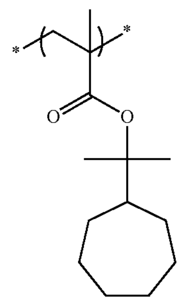
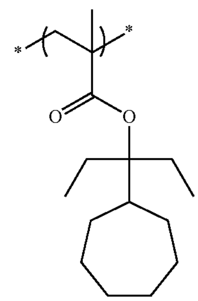
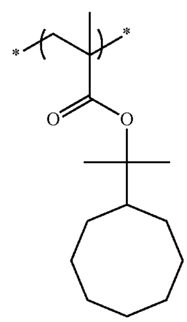
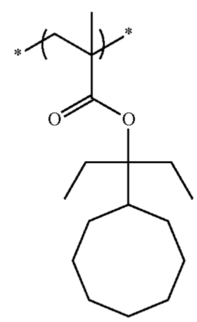
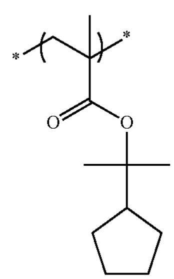
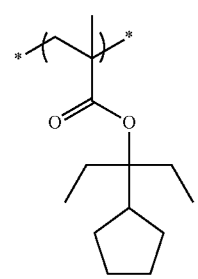
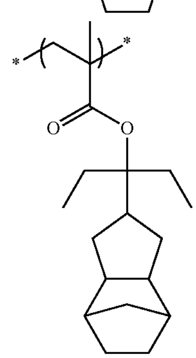
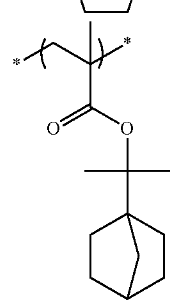

-continued
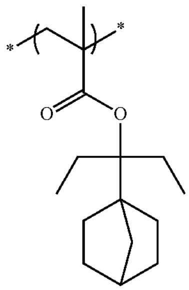
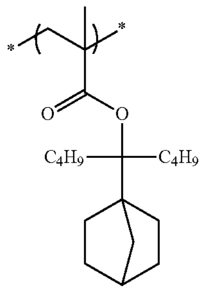
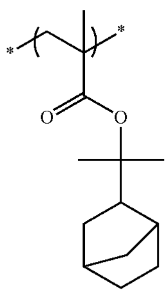
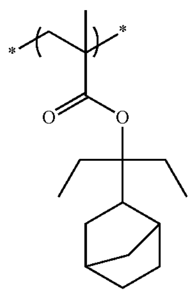
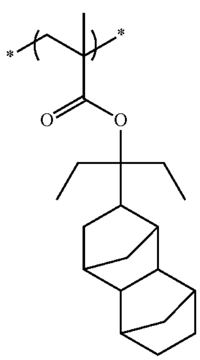
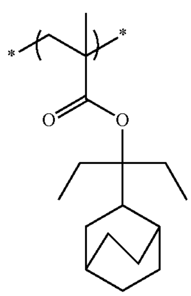
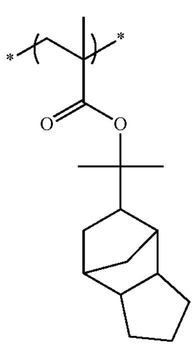
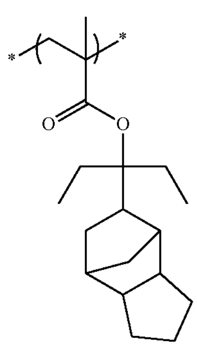
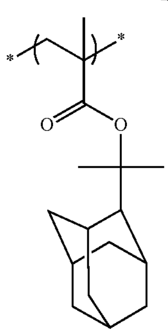
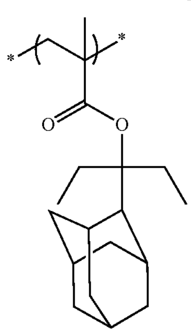
-continued
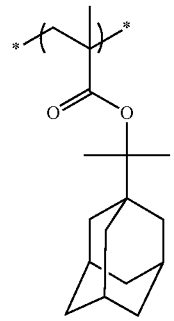
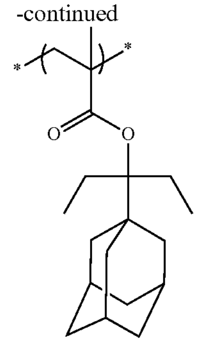
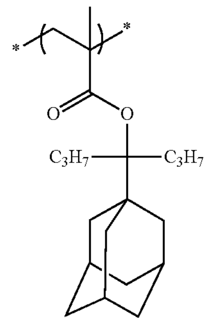
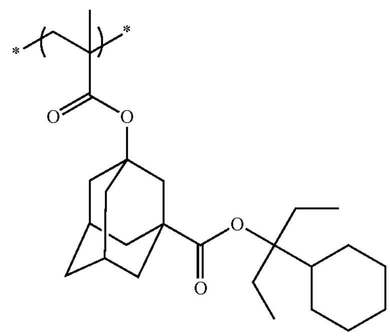
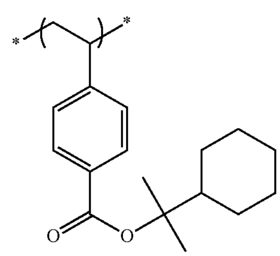
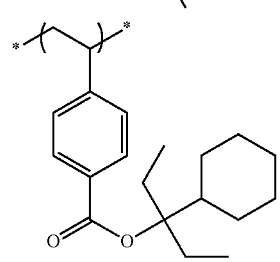
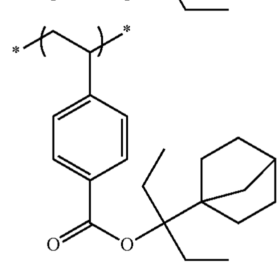

-continued
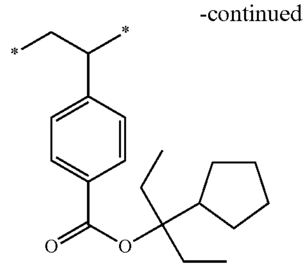
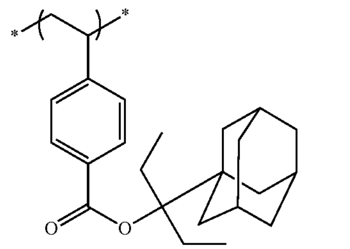
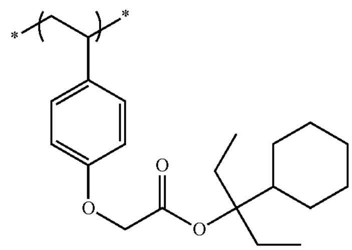
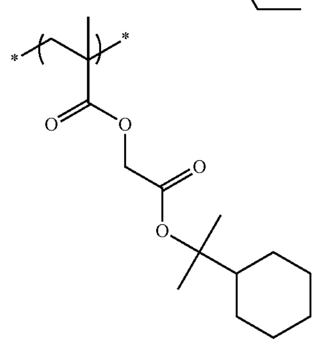
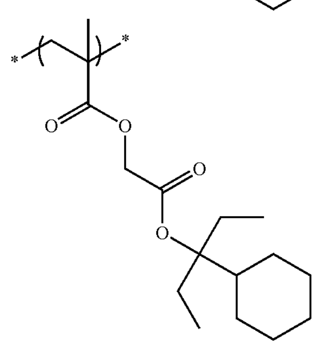
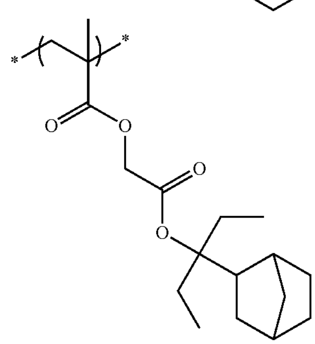
-continued
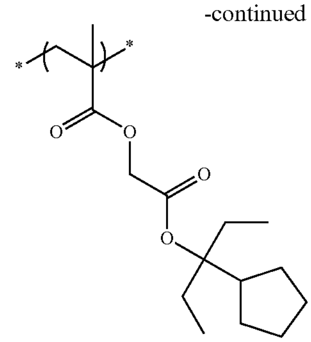
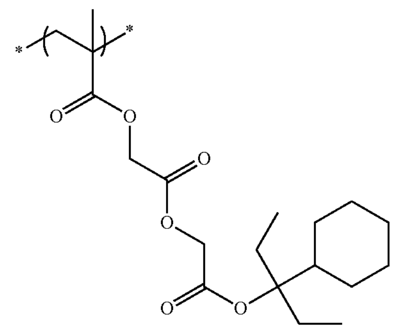
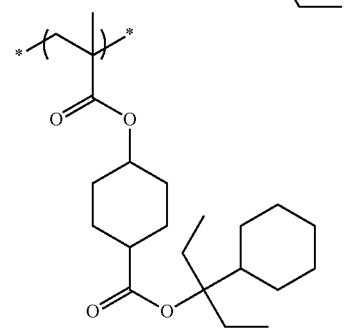
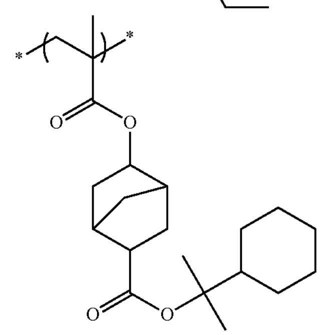
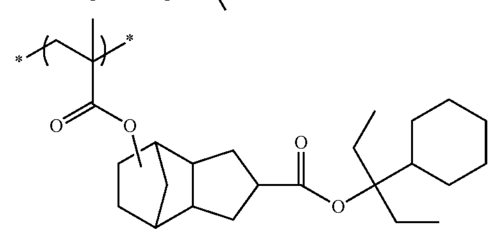
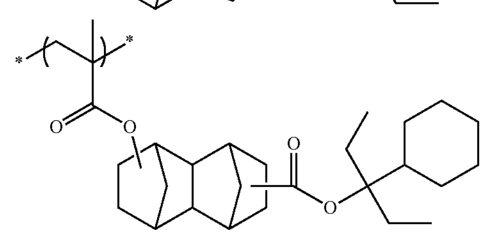

-continued
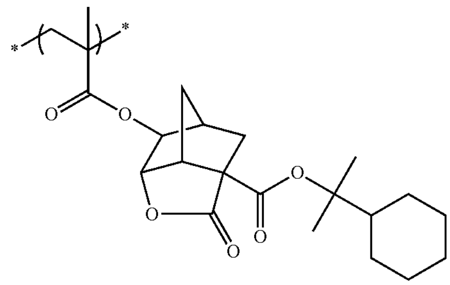
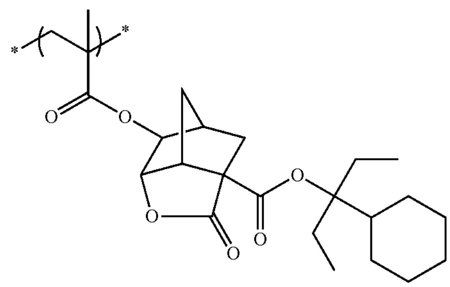
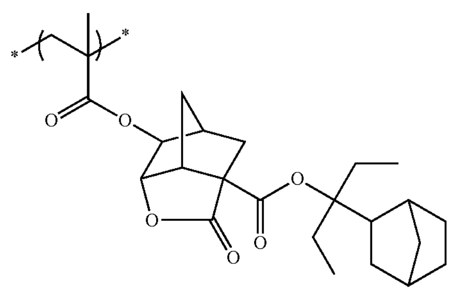
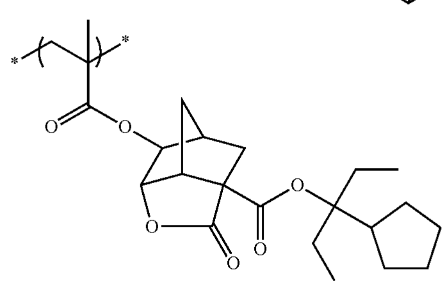
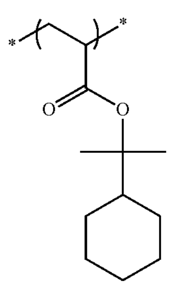
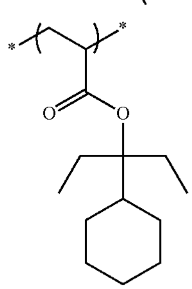
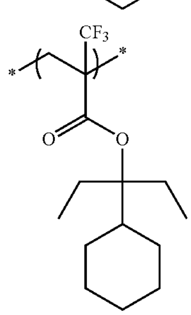
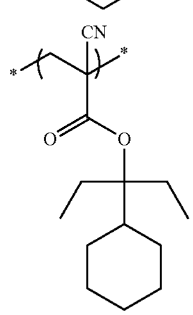
-continued
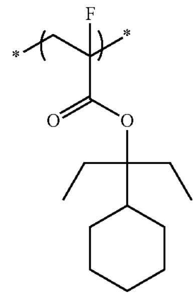
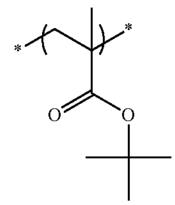
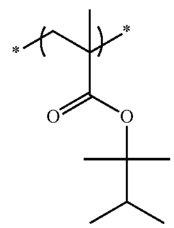
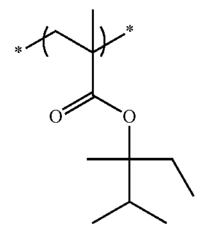
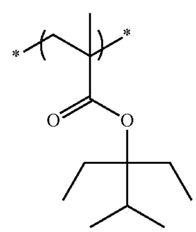
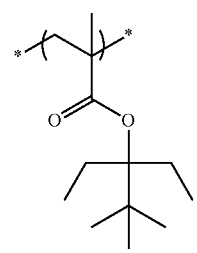
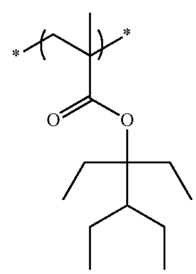
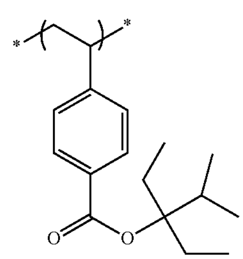
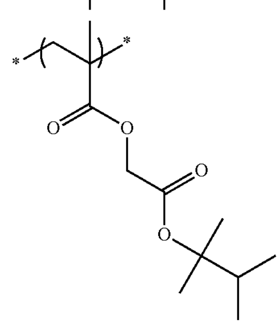
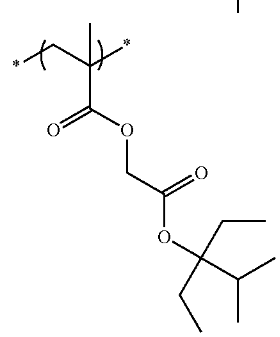

-continued

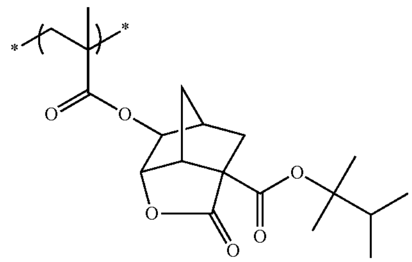

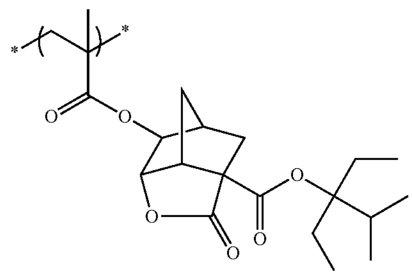

The resin (A) may two or more repeating units (R1). For example, the resin (A) may include, as the repeating unit represented by Formula (AI), at least two kinds of repeating units represented by Formula (I).

If the resin (A) contains the repeating unit (R1), its content rate as the total is as follows: 20 to 90 mol % is preferred, 30 to 80 mol % is more preferred, and 40 to 70 mol % is still more preferred, based on all the repeating units of the resin (A).

Although specific examples of the repeating unit (R1) will be shown below, the present invention is not limited thereto.

Among the specific examples, Rx and $Xa_1$ represent a hydrogen atom, $CH_3$, $CF_3$, or $CH_2OH$. Each of Rxa and Rxb represents an alkyl group having 1 to 4 carbon atoms, an aryl group having 6 to 18 carbon atoms or an aralkyl group having 7 to 19 carbon atoms.

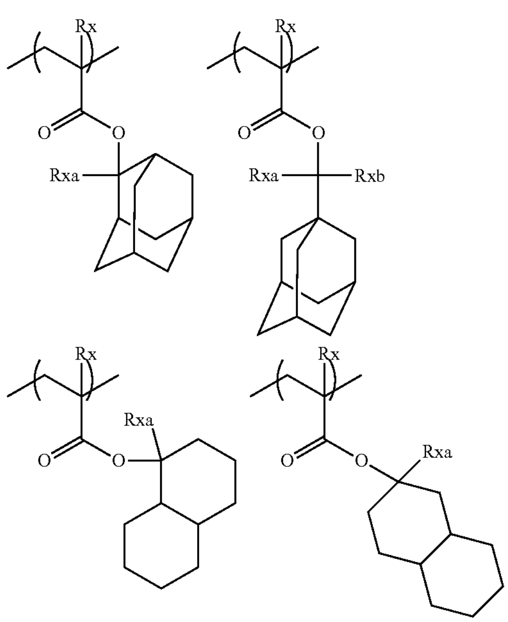

-continued

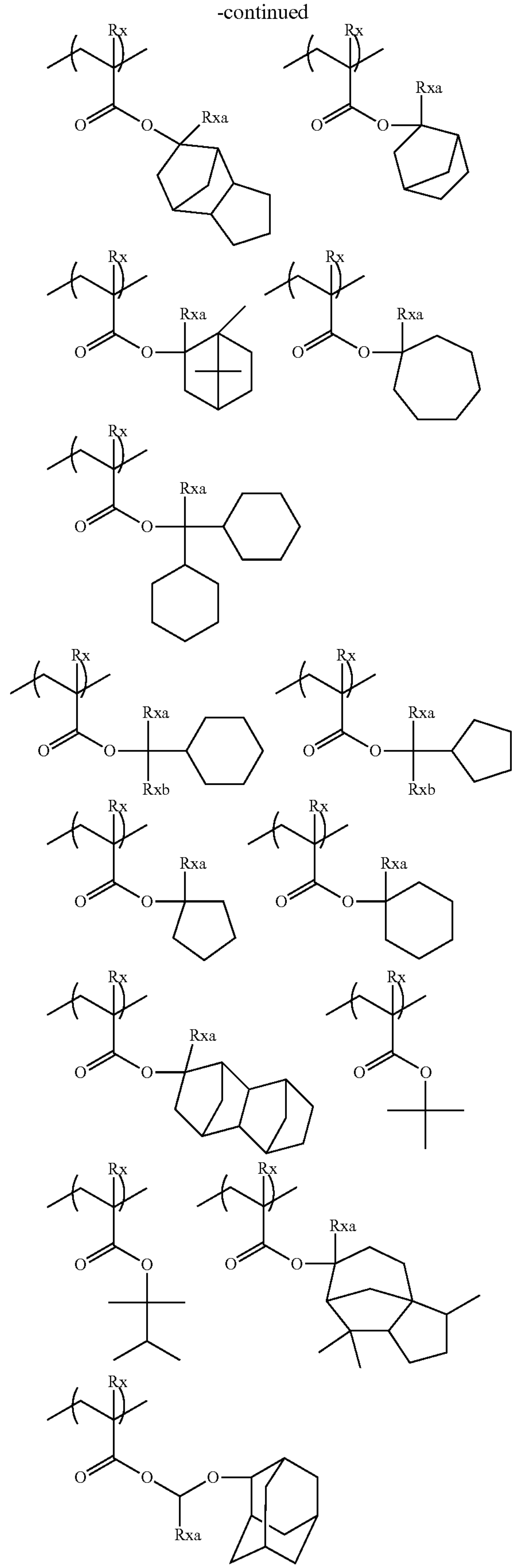

-continued
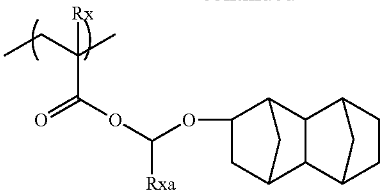
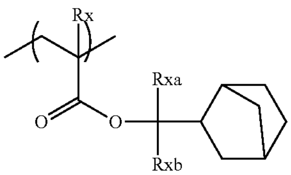
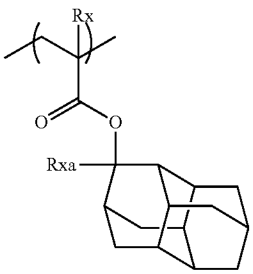
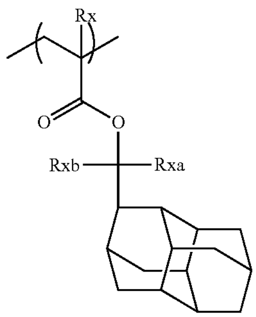
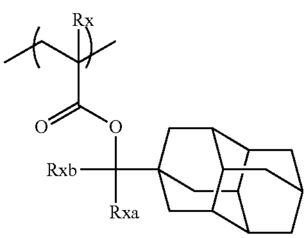
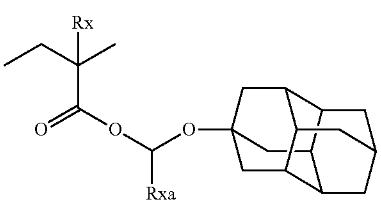
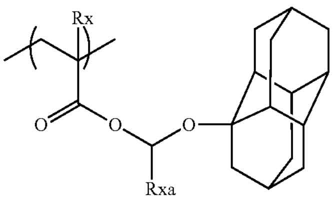
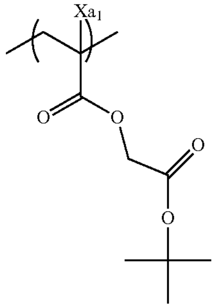
-continued
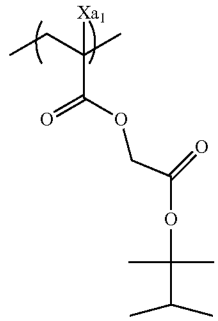
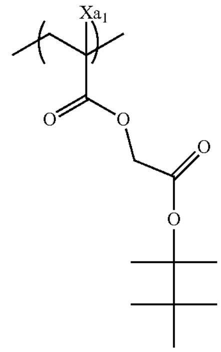
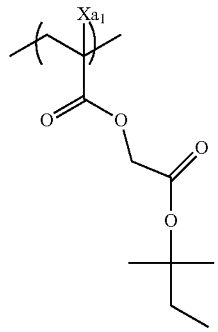
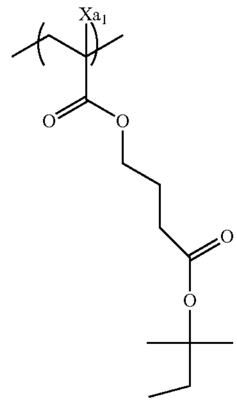
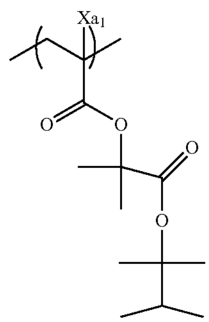
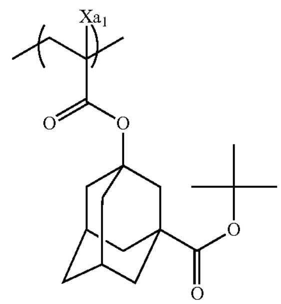
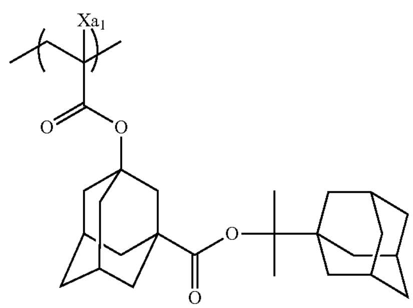
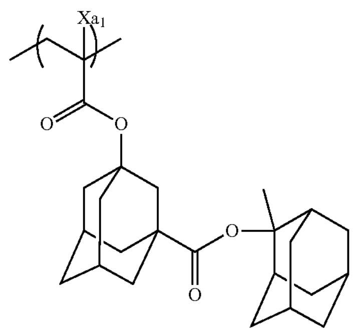

-continued
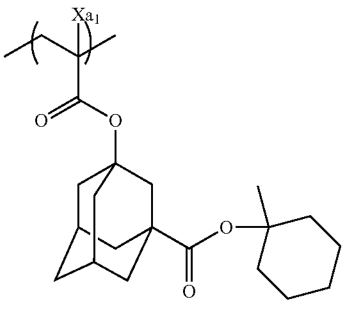
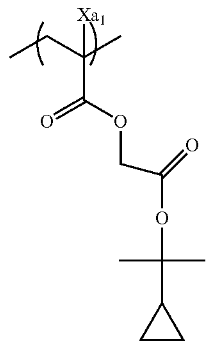
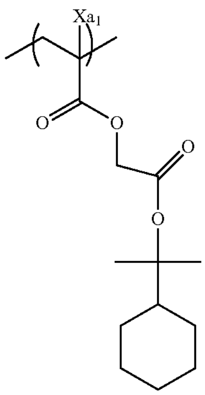
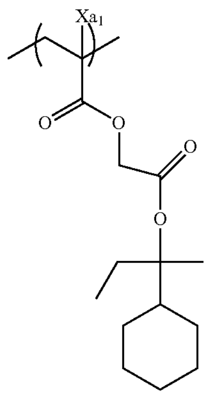
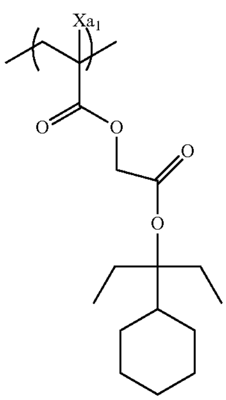
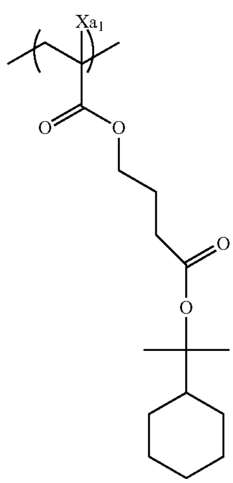
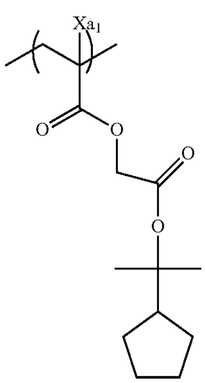
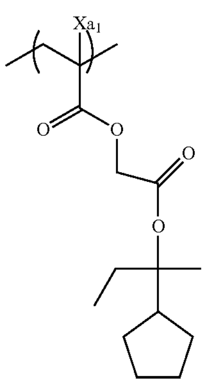
-continued
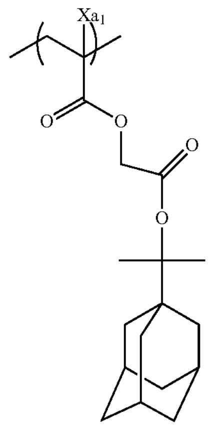
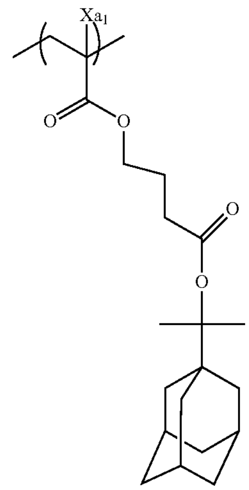
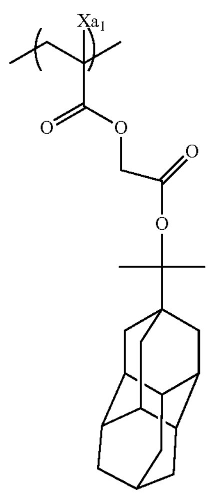
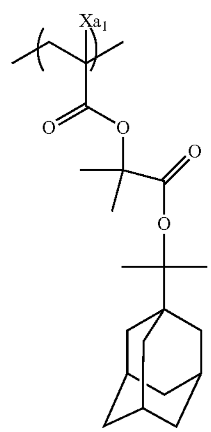
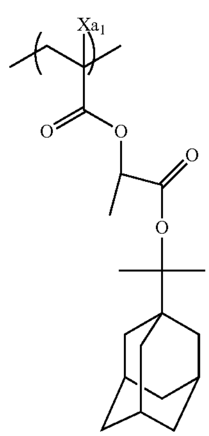
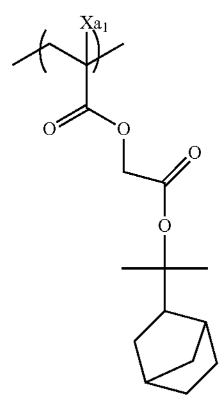

-continued
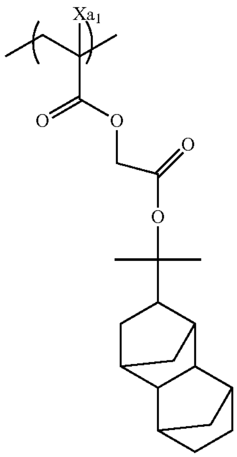
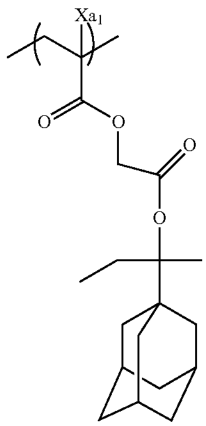
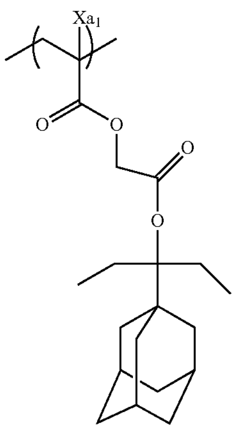
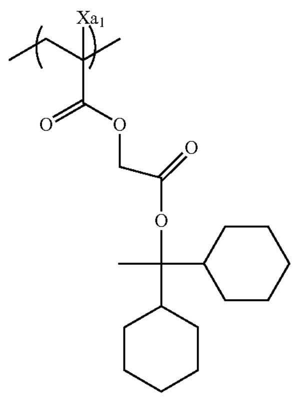
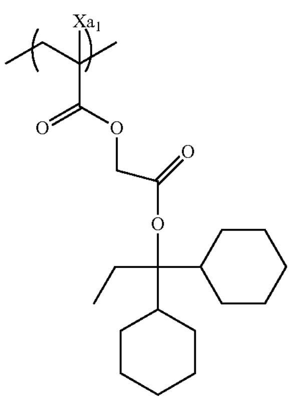
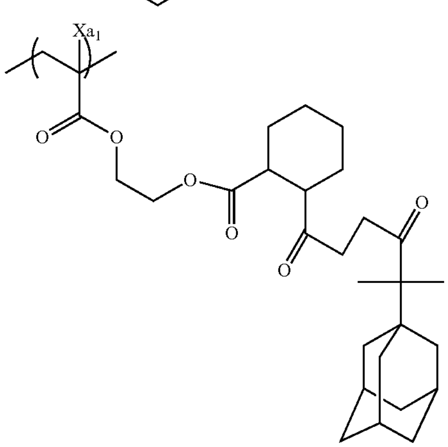
-continued
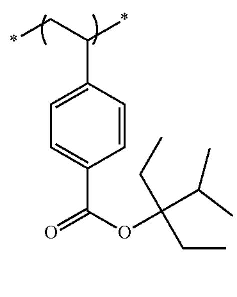
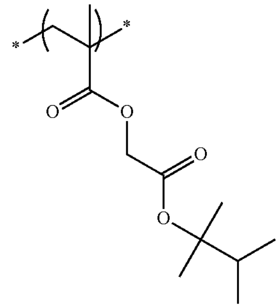
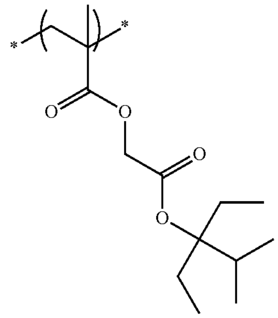
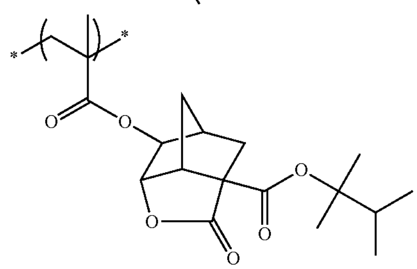
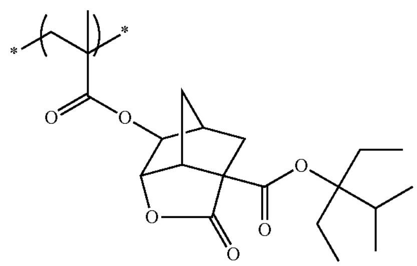
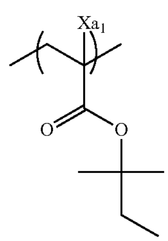
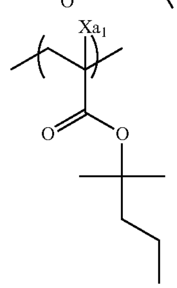
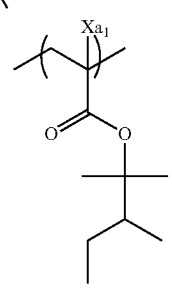
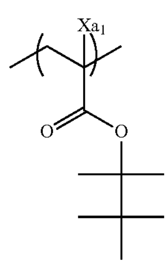
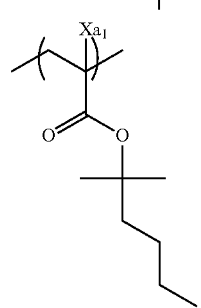
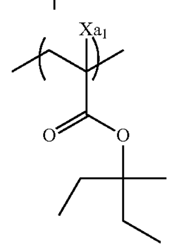

-continued
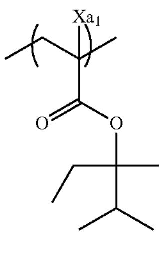
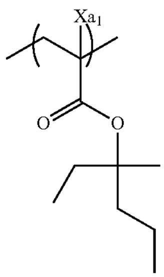
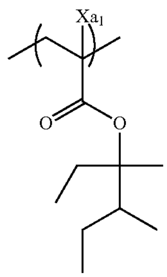
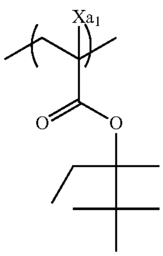
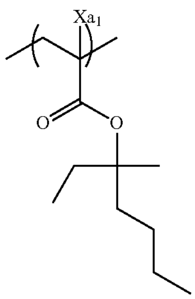
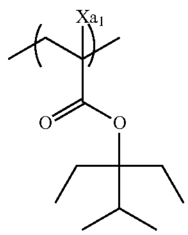
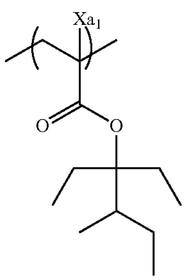
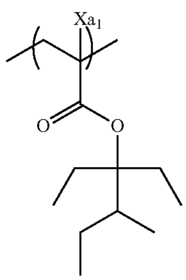
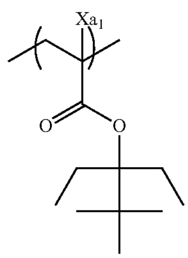
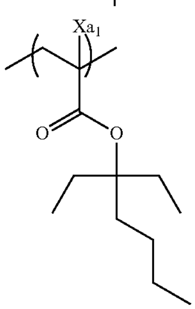
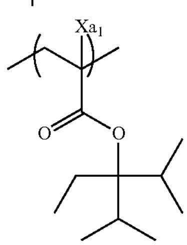
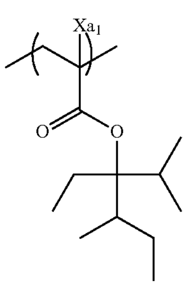
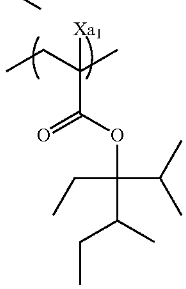
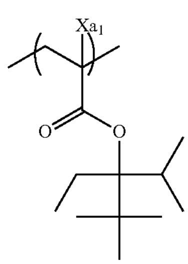
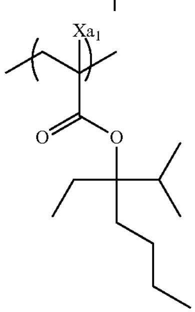
-continued
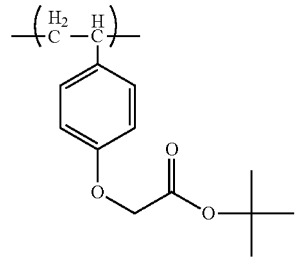
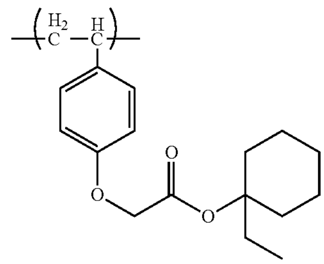
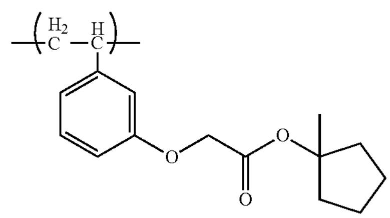
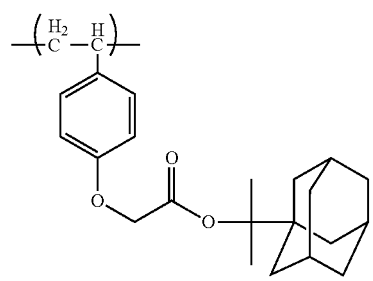
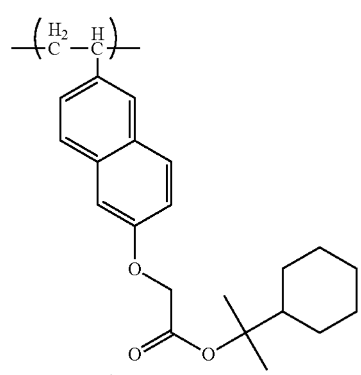
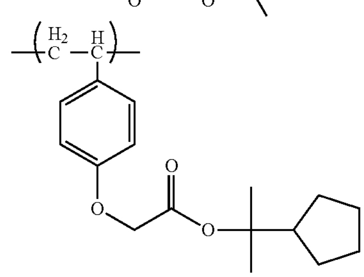

-continued
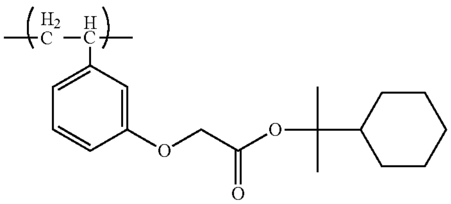
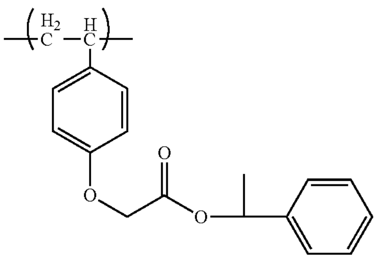
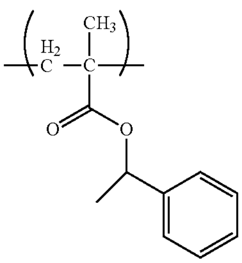
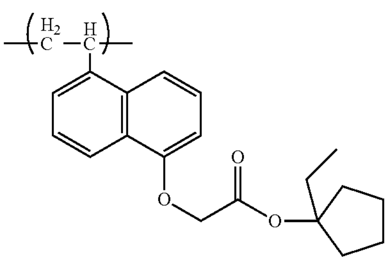
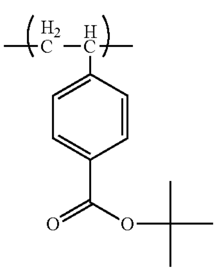
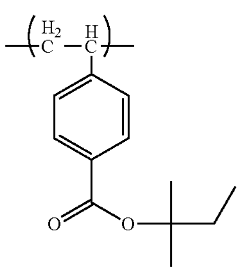
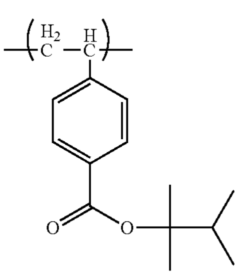
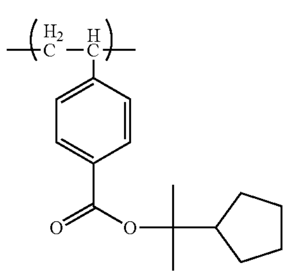
-continued
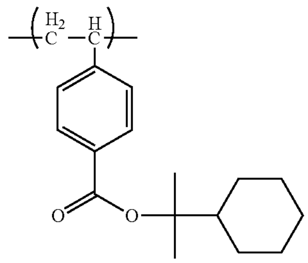
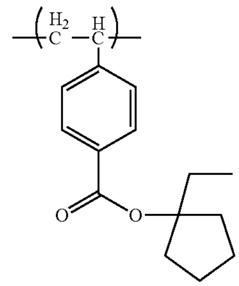
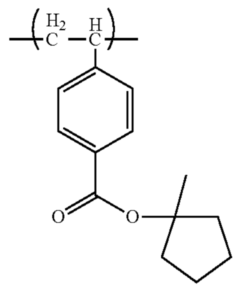
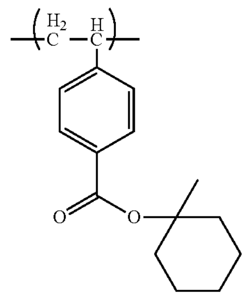
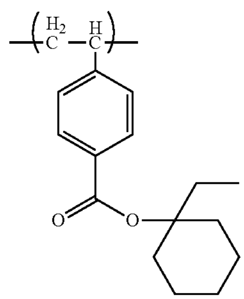
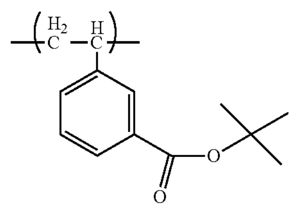
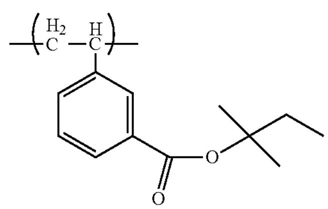
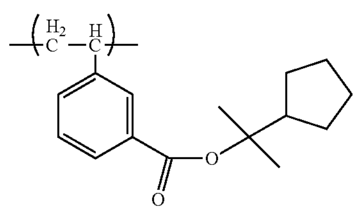
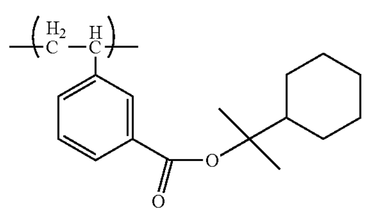
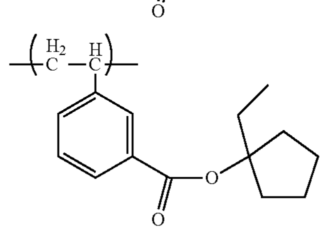

-continued
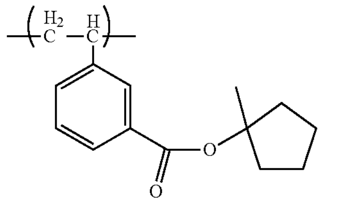
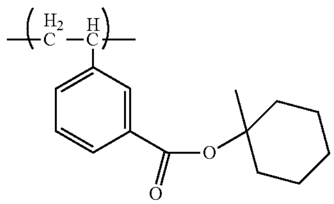
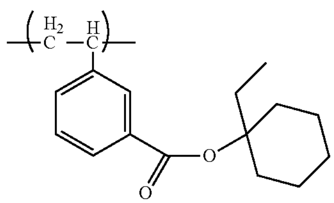
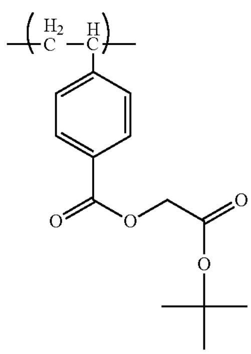
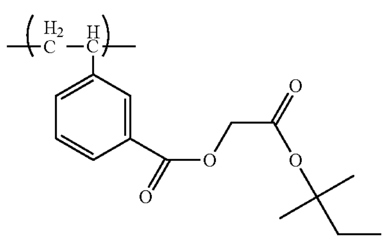
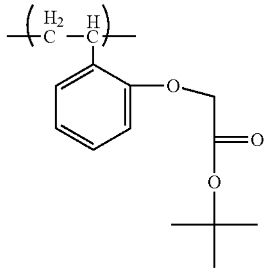
-continued
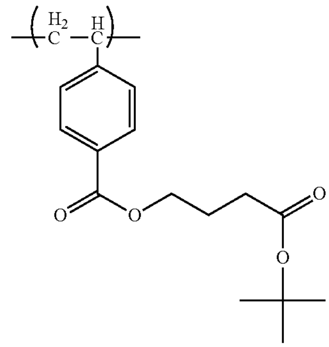
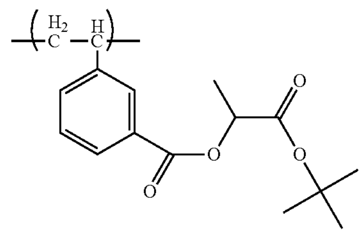
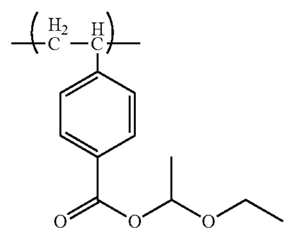
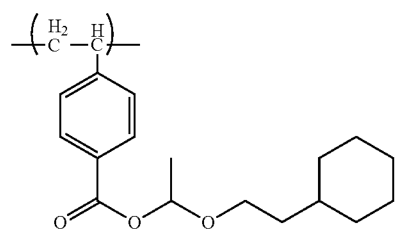
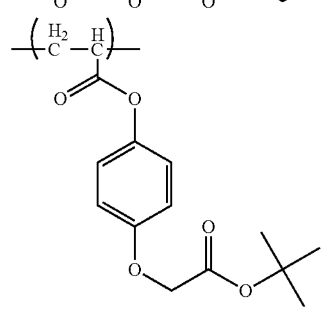
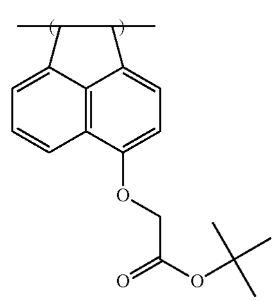

-continued

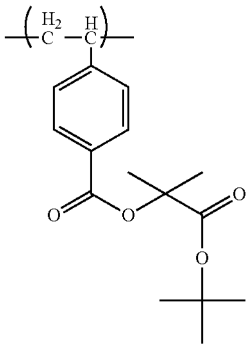

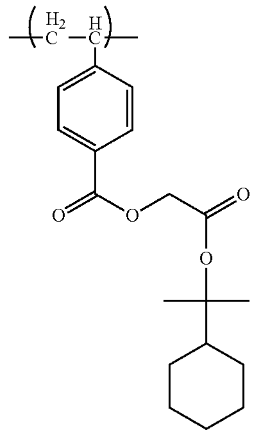

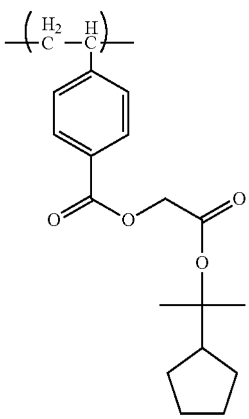

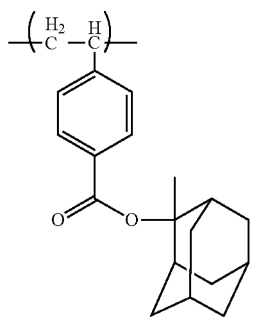

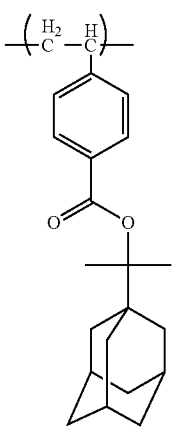

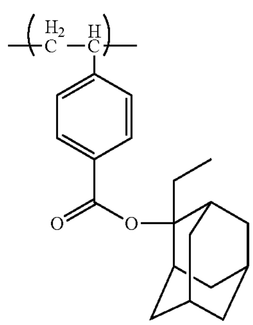

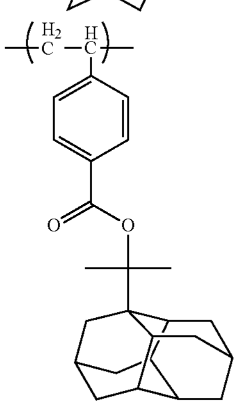

-continued

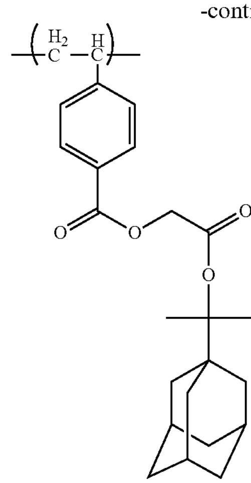

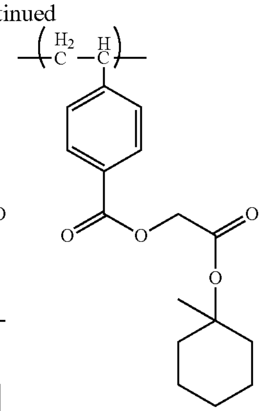

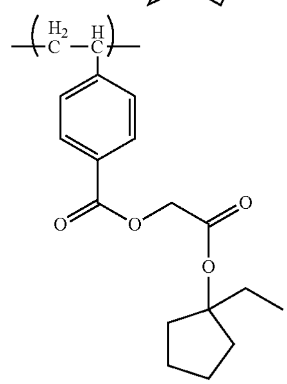

The resin (A) particularly preferably includes a repeating unit represented by the following Formula (1) because it further enhances resolution and sensitivity.

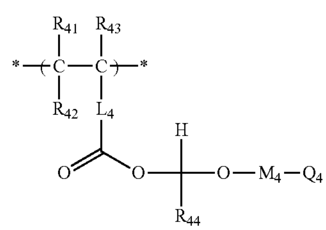

(1)

In Formula (1),

Each of $R_{41}$, $R_{42}$ and $R_{43}$ independently represents a hydrogen atom, an alkyl group, a cycloalkyl group, a halogen atom, a cyano group or an alkoxy carbonyl group. $R_{42}$ and $L_4$ may combine with each other to form a ring. In this case, $R_{42}$ represents the alkylene group. $L_4$ represents a single bond or a divalent linking group, and represents a trivalent linking group in the case of forming the ring with $R_{42}$.

$R_{44}$ represents a hydrogen atom, an alkyl group, a cycloalkyl group, an aryl group, an aralkyl group, an alkoxy group, an acyl group or a heterocyclic group.

$M_4$ represents a single bond or a divalent linking group.

$Q_4$ represents an alkyl group, a cycloalkyl group, an aryl group or a heterocyclic group.

At least two of $Q_4$, $M_4$ and $R_{44}$ may combine with each other to form a ring.

Formula (1) will be described in more detail.

The alkyl group of $R_{41}$ to $R_{43}$ in Formula (1) is preferably an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group or a dodecyl group, which may have a substituent, more preferably an alkyl group having 8 or less carbon atoms, and particularly preferably an alkyl group having 3 or less carbon atoms.

The alkyl group included in the alkoxy carbonyl group is preferably the alkyl group in $R_{41}$ to $R_{43}$.

The cycloalkyl group may be monocyclic or polycyclic. Preferably, the cycloalkyl group may be a monocyclic cycloalkyl group having 3 to 10 carbon atoms, such as a cyclopropyl group, a cyclopentyl group or a cyclohexyl group, which may have a substituent.

Examples of the halogen atom may include a fluorine atom, a chlorine atom, a bromine atom and an iodine atom, and the fluorine atom is particularly preferred.

Further, when $R_{42}$ is the alkylene group and forms a ring with $L_4$, the alkylene group may be preferably an alkylene group having 1 to 8 carbon atoms, such as a methylene group, an ethylene group, a propylene group, a butylene group, a hexylene group or an octylene group. An alkylene group having 1 to 4 carbon atoms is more preferred, and an alkylene group having 1 to 2 carbon atoms is particularly preferred. A ring formed by combining $R_{42}$ and $L_4$ with each other is particularly preferably a 5- or 6-membered ring.

As $R_{41}$ and $R_{43}$ in Formula (1), a hydrogen atom, an alkyl group, and a halogen atom are more preferred, and a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (—F) are particularly preferred. As $R_{42}$, a hydrogen atom, an alkyl group, a halogen atom, an alkylene group (forming a ring with $L_4$) are more preferred, and a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (—F), a methylene group (forming a ring with $L_4$), and an ethylene group (forming a ring with $L_4$) are particularly preferred.

Examples of a divalent linking group represented by $L_4$ may include an alkylene group, a divalent aromatic ring group, —COO-$L_1$-, —O-$L_1$-, and a group obtained by combining two or more of them with each other. Here, $L_1$ represents an alkylene, a cycloalkylene group, a divalent aromatic ring group, and a group obtained by combining the alkylene group with the divalent aromatic ring group.

$L_4$ is preferably a single bond, a group represented by —COO-$L_1$- or a divalent aromatic ring group. $L_1$ is preferably an alkylene group having 1 to 5 carbon atoms, and a methylene group and a propylene group are more preferred. As the divalent aromatic ring group, a 1,4-phenylene group, a 1,3-phenylene group, a 1,2-phenylene group, and a 1,4-naphthylene group are preferred, and the 1,4-phenylene group is more preferred.

As an example of the trivalentlinking group represented by $L_4$ when $L_4$ and $R_{52}$ combine with each other to form a ring, a group obtained by dividing any one hydrogen atom from the aforementioned specific example of the divalent linking group represented by $L_4$ may be appropriately used.

An alkyl group represented by $R_{44}$ may be straight or branched. The alkyl group having 1 to 8 carbon atoms is preferred, and examples thereof may include a methyl group, an ethyl group, a propyl group, an n-butyl group, a sec-butyl group, a hexyl group, an octyl group and the like.

A cycloalkyl group represented by $R_{44}$ may be monocyclic or polycyclic. As the monocyclic cycloalkyl group, a cycloalkyl group having 3 to 10 carbon atoms is preferred and examples thereof may include a cyclopropyl group, a cyclobutyl group, a cyclopentyl group, a cyclohexyl group, a cyclooctyl group and the like. As the polycyclic cycloalkyl group, a cycloalkyl group having 6 to 20 carbon atoms is preferred and examples thereof may include an adamantyl group, a norbornyl group, an isoboronyl group, a canphanyl group, a dicyclopentyl group, an α-pinel group, a tricyclodecanyl group, a tetracyclododecyl group, an androstanyl group and the like. Further, a part of carbon atoms in the cycloalkyl group may be substituted with the heteroatom such as an oxygen atom.

An aryl group represented by $R_{44}$ is preferably an aryl group having 6 to 10 carbon atoms, and examples thereof may include a divalent aromatic ring group having an aryl group such as a phenyl group, a naphthyl group or an anthryl group, and a heterocyclic ring such as thiophene, furan, pyrrole, benzothiophene, benzofuran, benzopyrrole, triazine, imidazole, benzoimidazole, triazole, thiadiazole or thiazole.

An aralkyl group represented by $R_{44}$ is preferably an aralkyl group having 7 to 12 carbon atoms, and examples thereof may include a benzyl group, a phenethyl group, a naphthylmethyl group and the like.

An alkyl-group moiety of the alkoxy group represented by $R_{44}$ is the same as the alkyl group represented by $R_{44}$, and a preferred range thereof is the same as that of the alkyl group represented by $R_{44}$.

An acyl group represented by $R_{44}$ includes an aliphatic acyl group having 1 to 10 carbon atoms, such as a formyl group, an acetyl group, a propionyl group, a butyryl group, an isobutyryl group, a valeryl group, a pivaloyl group, a benzoyl group or a naphthoyl group, and the acetyl group or the benzoyl group is preferred.

Examples of a heterocyclic group represented by $R_{44}$ may include a cycloalkyl group having the aforementioned heteroatom and an aryl group having a heteroatom, and a pyridine ring group or a pyran ring group is preferred.

$R_{44}$ is preferably a straight chain or branched alkyl group having 1 to 8 carbon atoms (specifically, a methyl group, an ethyl group, a propyl group, an i-propyl group, an n-butyl group, a sec-butyl group, a tert-butyl group, a neopentyl group, a hexyl group, a 2-ethylhexyl group, an octyl group), and a cycloalkyl group having 3 to 15 carbon atoms (specifically, a cyclopentyl group, a cyclohexyl group, norbornyl group, an adamantyl group, and the like), and a group having 2 or more carbon atoms is preferred. $R_3$ is more preferably an ethyl group, an i-propyl group, a sec-butyl group, a tert-butyl group, a neopentyl group, a cyclohexyl group, an adamantyl group, a cyclohexylmethyl group or an adamantanemethyl group, and still more preferably a tert-butyl group, a sec-butyl group, a neopentyl group, a cyclohexylmethyl group or an adamantanemethyl group.

A divalent linking group represented by $M_4$ is an alkylene group (for example, a methylene group, an ethylene group, a propylene group, a butylene group, a hexylene group, an octylene group, and the like), a cycloalkylene group (for example, a cyclopentylene group, a cyclohexylene group, an adamantylene group, and the like), an alkenylene group (for example, an ethylene group, a prophenylene group, a butenylene group, and the like), a divalent aromatic ring group (for example, a phenylene group, a tolylene group, a naphthylene group, and the like), —S—, —O—, —CO—, —$SO_2$—, —$N(R_0)$—, and a divalent linking group obtained by combining a plurality of them with each other, for example. $R_0$ is a hydrogen atom or an alkyl group (for example, an alkyl group having 1 to 8 carbon atoms, specifically, a methyl group, an ethyl group, a propyl group, an n-butyl group, a sec-butyl group, a hexyl group, an octyl group, and the like).

An alkyl group represented by $Q_4$ is, for example, an alkyl group having 1 to 8 carbon atoms, and specific preferred examples thereof may include a methyl group, an ethyl group, a propyl group, an n-butyl group, a sec-butyl group, a hexyl group, and an octyl group.

A cycloalkyl group represented by $Q_4$ is, for example, a cycloalkyl group having 3 to 15 carbon atoms, and specific preferred examples thereof may include a cyclopentyl group, a cyclohexyl group, a norbornyl group, an adamantyl group, and the like.

An aryl group represented by $Q_4$ is, for example, an aryl group having 6 to 15 carbon atoms, and specific preferred examples thereof may include a phenyl group, a tolyl group, a naphthyl group, an anthryl group, and the like.

Examples of a heterocyclic group represented by $Q_4$ may include a group having a heterocyclic ring structure such as thiirane, cyclothiorane, thiophene, furan, pyrrole, benzothiophene, benzofuran, benzopyrrole, triazine, imidazole, benzoimidazole, triazole, thiadiazole, thiazole or pyrrolidone, and are not limited thereto as long as they are a structure (a ring formed by carbon and a heteroatom, or a ring formed by a heteroatom) that is generally referred to as a heterocyclic ring.

Example of a ring formed by combining at least two of $Q_4$, $M_4$ and $R_4$ with each other may include a ring that is obtained by combining at least two of Q, M and $L_1$ with each other to form a propylene group or a butylene group, for example, and thus form a 5- or 6-membered ring containing an oxygen atom.

Preferred examples of the substituent of each aforementioned group may include an alkyl group, a cycloalkyl group, an aryl group, an amino group, an amide group, an ureide group, an urethane group, a hydroxyl group, a carboxyl group, a halogen atom, an alkoxy group, a thioether group, an acyl group, an acyloxy group, an alkoxy carbonyl group, a cyano group, a nitro group and the like, and the substituent preferably has 8 or less carbon atoms.

The resin (A) preferably has a repeating unit represented by Formula (II-1) or Formula (1).

Although specific examples of the repeating unit represented by Formula (1) will be shown below, the present invention is not limited thereto.

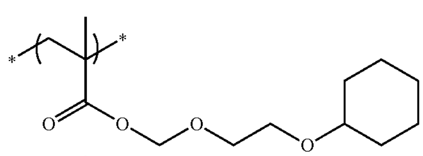

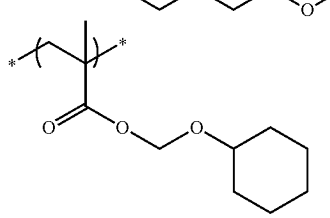

-continued

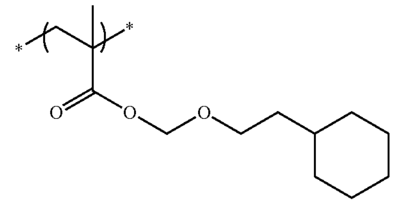

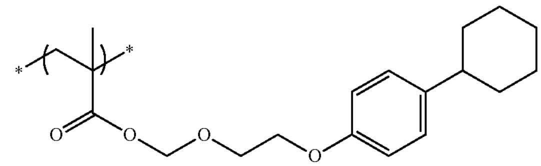

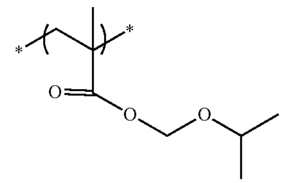

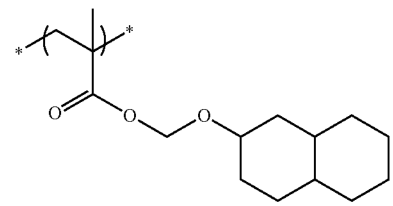

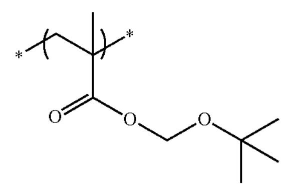

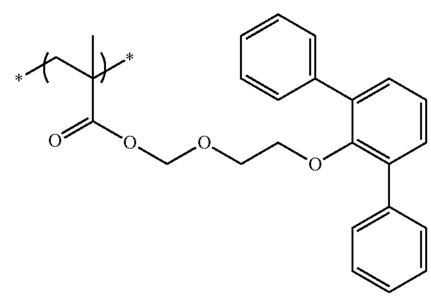

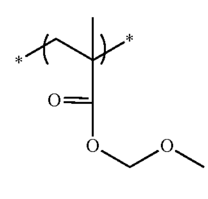

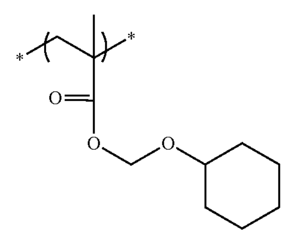

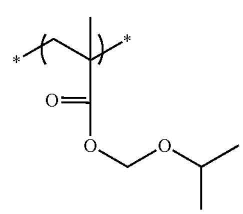

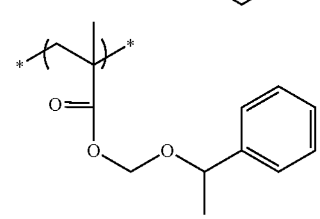

-continued
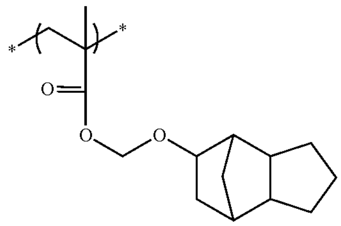
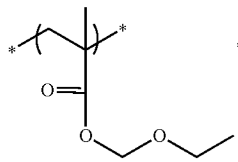
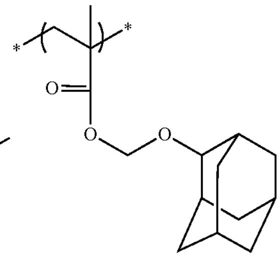
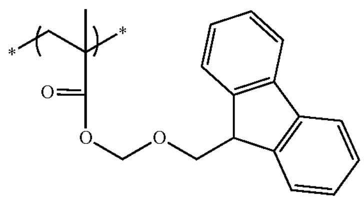
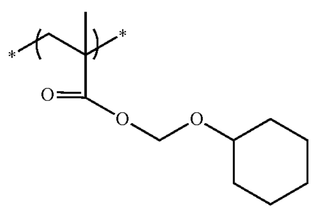
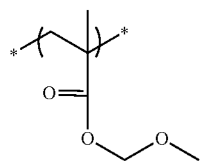
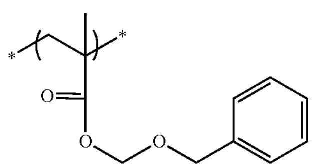
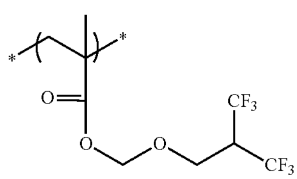
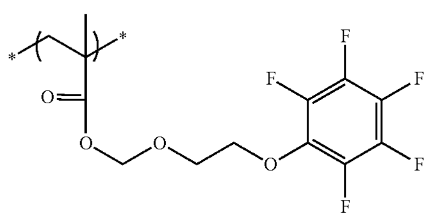
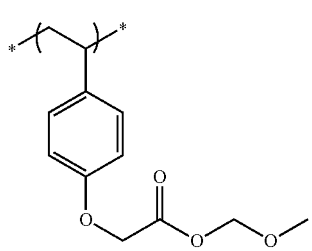
-continued
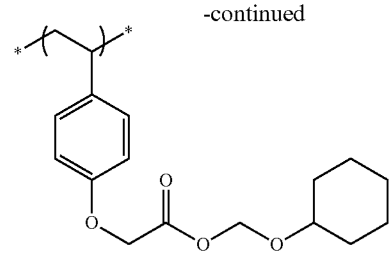
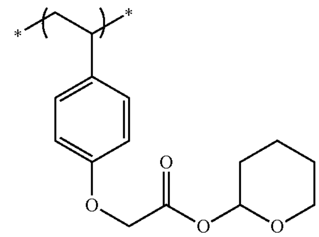
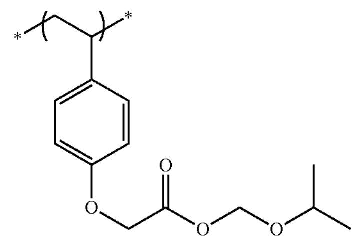
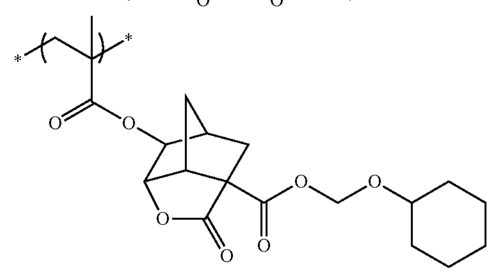
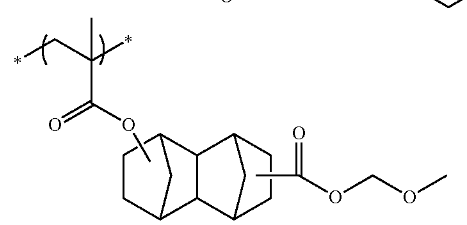
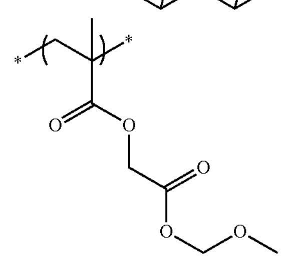
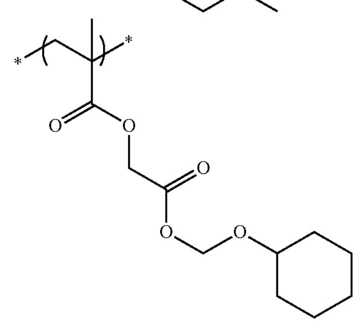

-continued
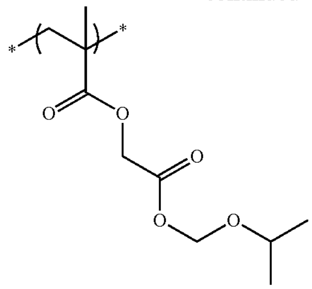
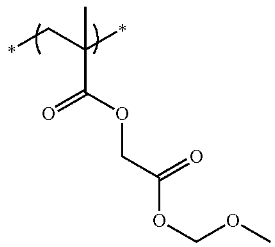
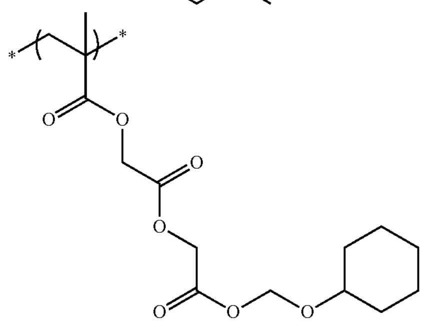
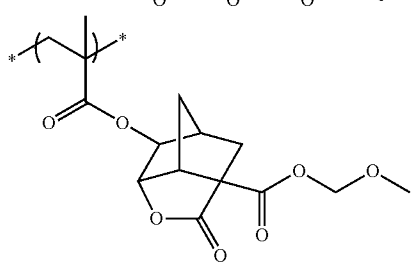
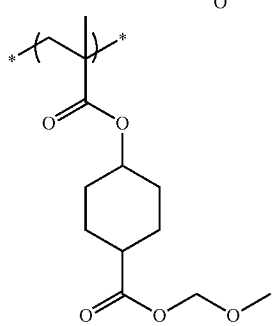
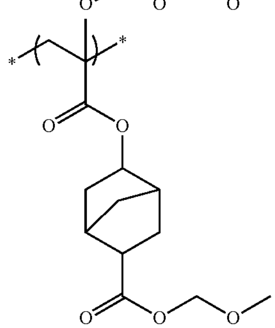
-continued
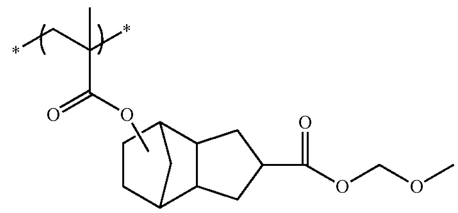
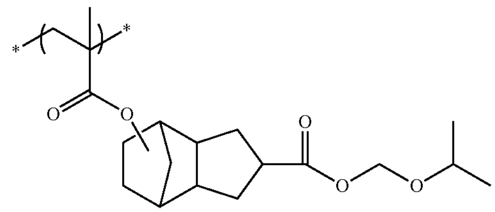
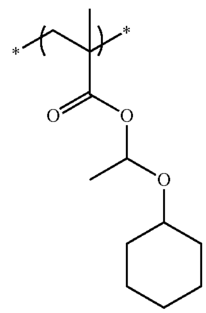
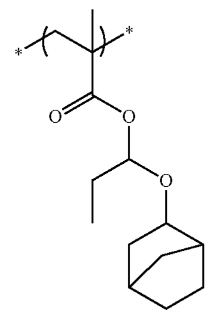
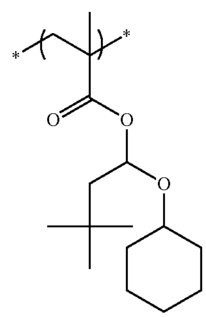
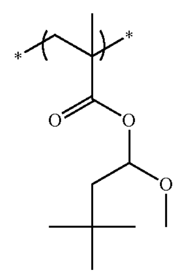
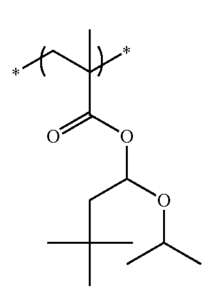
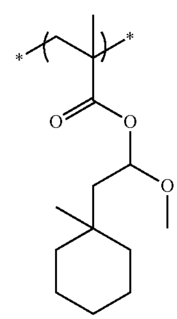
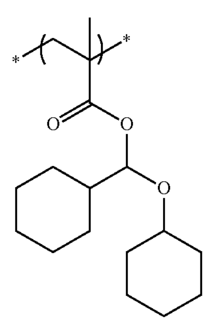
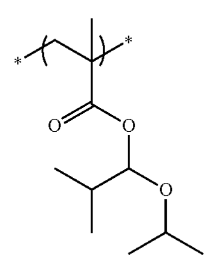

-continued

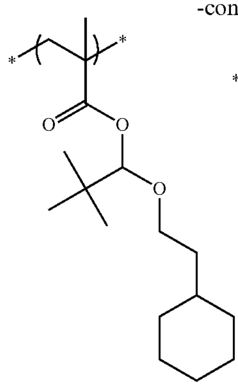

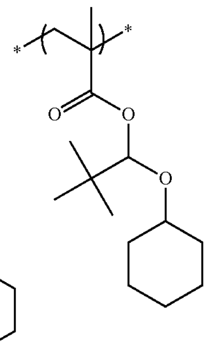

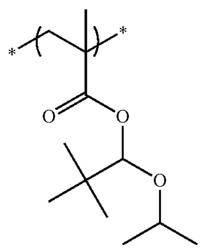

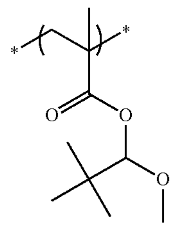

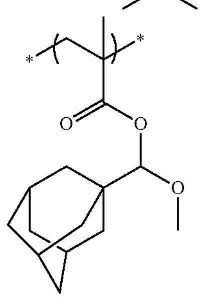

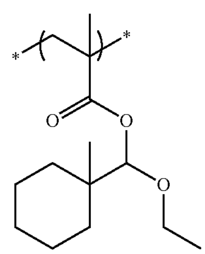

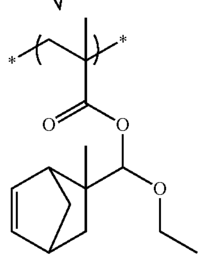

Further, the resin (A) may include, as the repeating unit ($R_1$), a repeating unit represented by the following Formula (BZ).

(BZ)

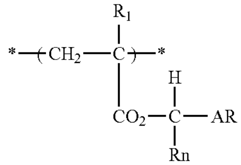

In Formula (BZ), AR represents an aryl group. Rn represents an alkyl group, a cycloalkyl group or an aryl group. Rn and AR may combine with each other to form a non-aromatic ring.

$R_1$ represents a hydrogen atom, an alkyl group, a cycloalkyl group, a halogen atom, a cyano group or an alkyloxycarbonyl group.

The description of the repeating unit represented by Formula (BZ) (the description of each group, specific examples of the repeating unit represented by Formula (BZ), and the like) may refer to the description of the repeating unit represented by Formula (BZ) described in paragraphs 0101 to 0131 of Patent Laid-Open Publication No. 2012-208447, the contents of which are incorporated herein by reference.

<Repeating Unit (R2)>

A repeating unit (R2) has a group capable of decomposing by the action of an acid to generate a phenolic hydroxyl group. For example, the repeating unit (R2) is represented by the following Formula (VI).

(VI)

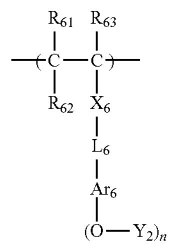

In Formula (VI),

Each of $R_{61}$, $R_{62}$ and $R_{63}$ independently represents a hydrogen atom, an alkyl group, a cycloalkyl group, a halogen atom, a cyano group, or an alkoxy carbonyl group. Only $R_{62}$ and $Ar_6$ may combine with each other to form a ring. In this case, $R_{62}$ represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents a (n+1)-valent aromatic ring group, and represents a (n+2)-valent aromatic ring group when it combines with $R_{62}$ to form a ring.

If n≥2, each $Y_2$ independently represents a hydrogen atom or a group capable of leaving by the action of an acid. Only at least one of $Y_2$ represents the group capable of leaving by the action of an acid.

n represents an integer of 1 to 4.

A Formula (VI) will be described in more detail.

An alkyl group of $R_{61}$ to $R_{63}$ in Formula (VI) is preferably an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group or a dodecyl group, which may have a substituent, and more preferably an alkyl group having 8 or less carbon atoms.

An alkyl group included in the alkoxy carbonyl group is preferably the same as the alkyl group in $R_{61}$ to $R_{63}$.

A cycloalkyl group may be monocyclic or polycyclic, and is preferably a monocyclic cycloalkyl group having 3 to 8 carbon atoms, such as a cyclopropyl group, a cyclopentyl group or a cyclohexyl group, which may have a substituent.

Examples of a halogen atom may include a fluorine atom, a chlorine atom, a bromine atom and an iodine atom, and the fluorine atom is more preferred.

When $R_{62}$ represents an alkylene group, the alkylene group is preferably a group having 1 to 8 carbon atoms, such as a methylene group, an ethylene group, a propylene group, a butylene group, a hexylene group or an octylene group, which may have a substituent.

The alkyl group of $R_{64}$ in —$CONR_{64}$— ($R_{64}$ represents a hydrogen atom or an alkyl group) represented by $X_6$ is the same as the alkyl group of $R_{61}$ to $R_{63}$.

$X_6$ is preferably a single bond, —COO—, and —CONH—, and more preferably the single bond, and —COO—.

The alkylene group in L6 is preferably a group having 1 to 8 carbon atoms, such as a methylene group, an ethylene group, a propylene group, a butylene group, a hexylene group, or an octylene group, which may have a substituent. A ring formed by combining $R_{62}$ with $L_6$ is particularly preferably a 5- or 6-membered ring.

$Ar_6$ represents a (n+1)-valent aromatic ring group. When n is 1, the divalent aromatic ring group may have a substituent, and preferred examples of the divalent aromatic ring group may include a divalent aromatic ring group including an arylene group having 6 to 18 carbon atoms, such as a phenylene group, a tolylene group or a naphthylene group, or a heterocyclic ring such as thiophene, furan, pyrrole, benzothiophene, benzofuran, benzopyrrole, triazine, imidazole, benzoimidazole, triazole, thiadiazole or thiazole.

When n is an integer of 2 or more, a specific example of the (n+1)-valent aromatic ring group may appropriately include a group obtained by dividing any (n−1) hydrogen atoms from the aforementioned specific example of the divalent aromatic ring group.

The (n+1)-valent aromatic ring group may further have a substituent.

Examples of the substituent that may be included in the alkyl group, the cycloalkyl group, the alkoxy carbonyl group, the alkylene group and the (n+1)-valent aromatic ring group include the specific examples of the substituent that may be included in each group represented by $R_{51}$ to $R_{53}$ in Formula (V).

N is preferably 1 or 2, and more preferably 1.

Each of n $Y_2$ independently represents a hydrogen atom or a group capable of leaving by the action of an acid. Only at least one of n $Y_2$ represents the group capable of leaving by the action of an acid.

Examples of the group of $Y_2$ capable of leaving by the action of an acid may include —$C(R_{36})(R_{37})(R_{38})$, —C(=O)—O—$C(R_{36})(R_{37})(R_{38})$, —$C(R_{01})(R_{02})(OR_{39})$, —$C(R_{01})(R_{02})$—C(=O)—O—$C(R_{36})(R_{37})(R_{38})$, —CH($R_{36}$)(Ar) and the like.

In the formula, each of $R_{36}$ to $R_{39}$ independently represents an alkyl group, a cycloalkyl group, a monovalent aromatic ring group, a group obtained by combining the alkylene group with the monovalent aromatic ring group, or an alkenyl group. $R_{36}$ and $R_{37}$ may combine with each other to form a ring.

Each of $R_{01}$ and $R_{02}$ independently represents a hydrogen atom, an alkyl group, a cycloalkyl group, a monovalent aromatic ring group, a group obtained by combining the alkylene group with the monovalent aromatic ring group, or an alkenyl group.

Ar represents a monovalent aromatic ring group.

The alkyl group of $R_{36}$ to $R_{39}$, $R_{01}$ and $R_{02}$ is preferably an alkyl group having 1 to 8 carbon atoms, and examples thereof may include a methyl group, an ethyl group, a propyl group, an n-butyl group, a sec-butyl group, a hexyl group, a octyl group and the like.

The cycloalkyl group of $R_{36}$ to $R_{39}$, $R_{01}$ and $R_{02}$ may be monocyclic or polycyclic. The monocyclic group is preferably a cycloalkyl group having 3 to 8 carbon atoms, and examples thereof may include a cyclopropyl group, a cyclobutyl group, a cyclopentyl group, a cyclohexyl group, a cyclooctyl group and the like. The polycyclic group is preferably a cycloalkyl group having 6 to 20 carbon atoms, and examples thereof may include an adamantyl group, a norbornyl group, an isoboronyl group, a canphanyl group, a dicyclopentyl group, an α-pinel group, a tricyclodecanyl group, a tetracyclododecyl group, an androstanyl group and the like. Further, a part of carbon atoms in the cycloalkyl group may be substituted with the heteroatom such as an oxygen atom.

The monovalent aromatic ring group of $R_{36}$ to $R_{39}$, $R_{01}$ and $R_{02}$ and Ar is preferably a monovalent aromatic ring group having 6 to 10 carbon atoms, and examples thereof may include a divalent aromatic ring group having an aryl group such as a phenyl group, a naphthyl group or an anthryl group, and a heterocyclic ring such as thiophene, furan, pyrrole, benzothiophene, benzofuran, benzopyrrole, triazine, imidazole, benzoimidazole, triazole, thiadiazole or thiazole.

A group obtained by combining the alkylene group of $R_{36}$ to $R_{39}$, $R_{01}$ and $R_{02}$ with the monovalent aromatic ring group is preferably an aralkyl group having 7 to 12 carbon atoms, and examples thereof may include a benzyl group, a phenethyl group, a naphthylmethyl group and the like.

The alkenyl group of $R_{36}$ to $R_{39}$, $R_{01}$ and $R_{02}$ is preferably an alkenyl group having 2 to 8 carbon atoms, and examples thereof may include a vinyl group, an allyl group, a butenyl group, a cyclohexenyl group and the like.

A ring formed by combining $R_{36}$ and $R_{37}$ with each other may be monocyclic or polycyclic. The monocyclic ring is preferably a cycloalkyl structure having 3 to 8 carbon atoms, and examples thereof may include a cyclopropane structure, a cyclobutane structure, a cyclopentane structure, a cyclohexane structure, a cycloheptane structure, a cyclooctane structure and the like. The polycyclic ring is preferably a cycloalkyl structure having 6 to 20 carbon atoms, and examples thereof may include an adamantane structure, a norbornanestructure, a dicyclopentane structure, a tricyclodecane structure, a tetracyclododecane structure and the like. Further, a part of carbon atoms in the cycloalkyl structure may be substituted with the heteroatom such as an oxygen atom.

Each group of $R_{36}$ to $R_{39}$, $R_{01}$ and $R_{02}$ may have a substituent, and preferred examples thereof an alkyl group, a cycloalkyl group, an aryl group, an amino group, an amide group, an ureide group, an urethane group, a hydroxyl group, a carboxyl group, a halogen atom, an alkoxy group, a thioether group, an acyl group, an acyloxy group, an alkoxy carbonyl group, a cyano group, a nitro group and the like, and the substituent preferably has 8 or less carbon atoms.

$Y_2$ that is a group capable of leaving by the action of an acid more preferably has a structure represented by the following Formula (VI-A).

(VI-A)

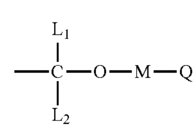

Here, each of $L_1$ and $L_2$ independently represents a hydrogen atom, an alkyl group, a cycloalkyl group, a monovalent aromatic ring group, or a group obtained by combining an alkylene group with the monovalent aromatic ring group.

M represents a single bond or a divalent linking group.

Q represents an alkyl group, a cycloalkyl group that may include the heteroatom, a monovalent aromatic ring group that may include the heteroatom, an amino group, an ammonium group, a mercapto group, a cyano group or an aldehyde group.

At least two of Q, M and $L_1$ may combine with each other to form a ring (preferably, a 5- or 6-membered ring).

Preferred examples of the alkyl group as $L_1$ and $L_2$ may include an alkyl group having 1 to 8 carbon atoms, and specific examples thereof may include a methyl group, an ethyl group, a propyl group, an n-butyl group, a sec-butyl group, a hexyl group and an octyl group.

Preferred examples of the cycloalkyl group as $L_1$ and $L_2$ include a cycloalkyl group having 3 to 15 carbon atoms, and specific examples thereof may include a cyclopentyl group, a cyclohexyl group, a norbornyl group, an adamantyl group and the like.

Preferred examples of the monovalent aromatic ring group as $L_1$ and $L_2$ may include an aryl group having 6 to 15 carbon atoms, and specific examples thereof may include a phenyl group, a tolyl group, a naphthyl group, an anthryl group and the like.

Examples of the group obtained by combining the alkylene group with the monovalent aromatic ring group as $L_1$ and $L_2$ may include an aralkyl group having 6 to 20 carbon atoms such as a benzyl group or a phenethyl group.

Examples of the divalent linking group as M may include an alkylene group (for example, a methylene group, an ethylene group, a propylene group, a butylene group, a hexylene group, an octylene group, and the like), a cycloalkylene group (for example, a cyclopentylene group, a cyclohexylene group, an adamantylene group, and the like), an alkenylene group (for example, an ethylene group, a prophenylene group, a butenylene group, and the like), a divalent aromatic ring group (for example, a phenylene group, a tolylene group, a naphthylene group, and the like), —S—, —O—, —CO—, —$SO_2$—, —$N(R_0)$—, and a divalent linking group obtained by combining a plurality of them. $R_0$ is a hydrogen atom or an alkyl group (for example, an alkyl group having 1 to 8 carbon atoms, and specifically a methyl group, an ethyl group, a propyl group, an n-butyl group, a sec-butyl group, a hexyl group, an octyl group, and the like).

The alkyl group as Q is the same as each group of $L_1$ and $L_2$.

In the cycloalkyl group that may include the heteroatom and the monovalent aromatic ring group that may include the heteroatom as Q, the aliphatic hydrocarbon ring group that has no heteroatom and the monovalent aromatic ring group that has no heteroatom may be the cycloalkyl group and the monovalent aromatic ring group as $L_1$ and $L_2$, and carbon atoms are preferably 3 to 15.

Examples of the cycloalkyl group having the heteroatom and the monovalent aromatic ring group having the heteroatom may include a group having a heterocyclic structure such as thiirane, cyclothiorane, thiophene, furan, pyrrole, benzothiophene, benzofuran, benzopyrrole, triazine, imidazole, benzoimidazole, triazole, thiadiazole, thiazole or pyrrolidone, and are not limited thereto as long as they are a structure (a ring formed by carbon and a heteroatom, or a ring formed by a heteroatom) generally referred to as a heterocyclic ring.

As a ring that may be formed by combining at least two of Q, M and $L_1$ with each other, at least two of Q, M and $L_1$ may combine with each other to form a propylene group and a butylene group and thereby form a 5- or 6-membered ring containing an oxygen atom.

Each group represented by $L_1$, $L_2$, M and Q in Formula (VI-A) may have a substituent, which is the same as the substituent that may be included in $R_{36}$ to $R_{39}$, $R_{01}$, $R_{02}$, and Ar. The substituent preferably has 8 or less carbon atoms.

As the group represented by -M-Q, a group having 1 to 30 carbon atoms is preferred, and a group having 5 to 20 carbon atoms is more preferred.

Hereinafter, although the specific example of the repeating unit is represented by Formula (VI) as the preferred specific example of the repeating unit (R2), the present invention is not limited thereto.

(VI-1)

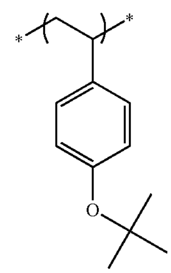

(VI-2)

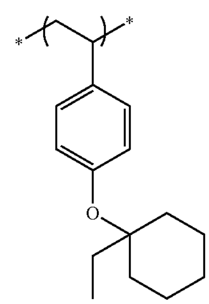

(VI-3)

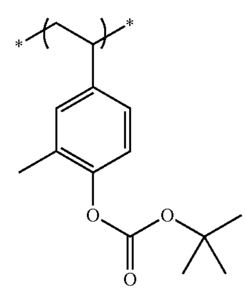

(VI-4)

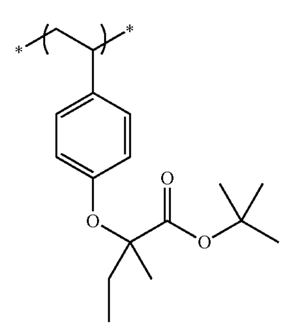

-continued
(VI-5)
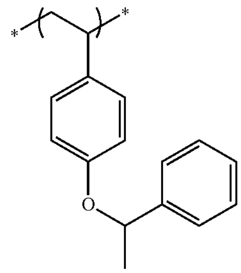
(VI-6)
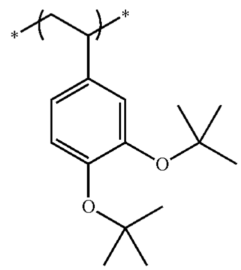
(VI-7)
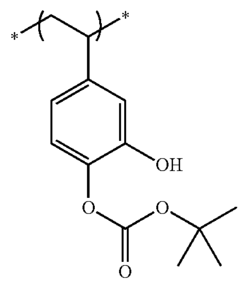
(VI-8)
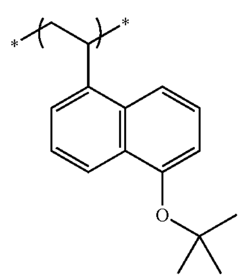
(VI-9)
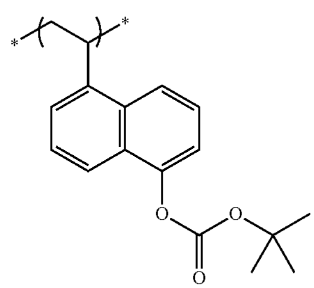
-continued
(VI-10)
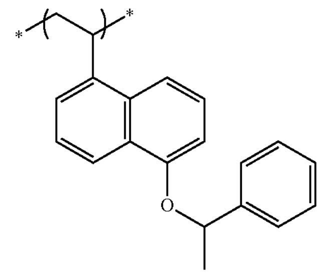
(VI-11)
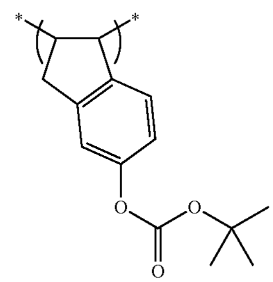
(VI-12)
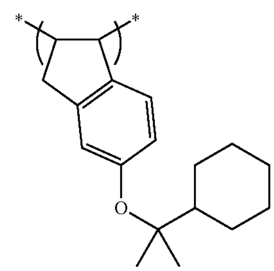
(VI-13)
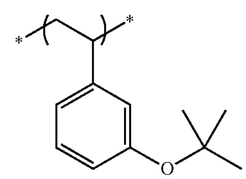
(VI-14)
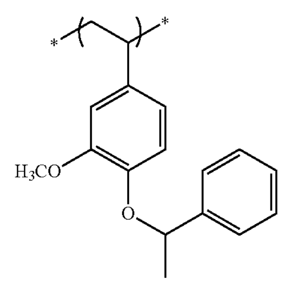
(VI-15)
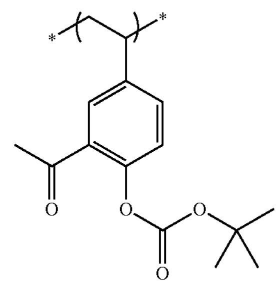

-continued
(VI-16)
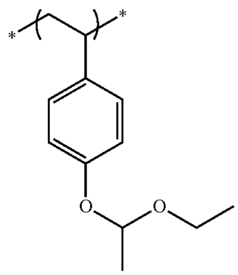
(VI-17)
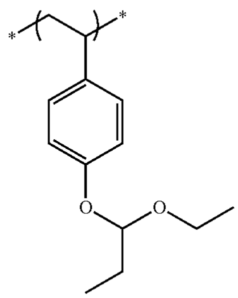
(VI-18)
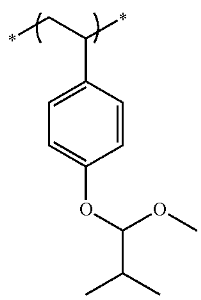
(VI-19)
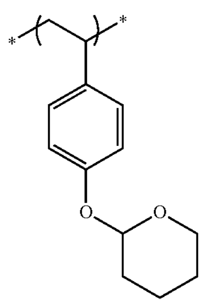
(VI-20)
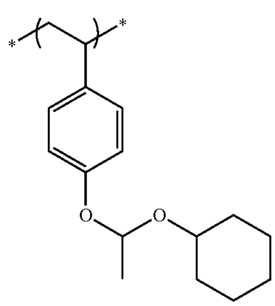
-continued
(VI-21)
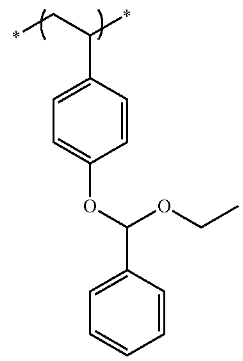
(VI-22)
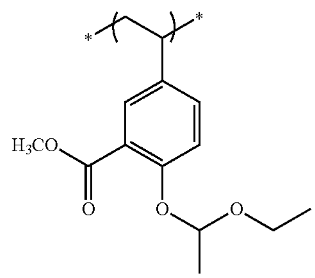
(VI-23)
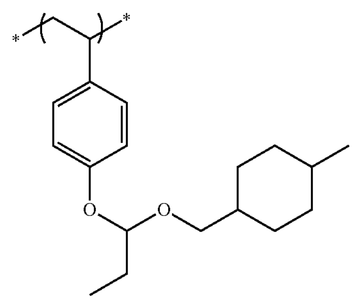
(VI-24)
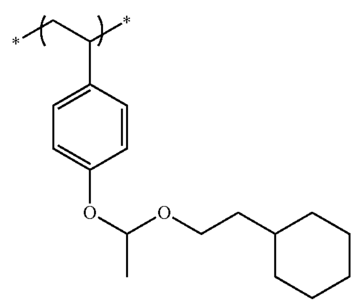
(VI-25)
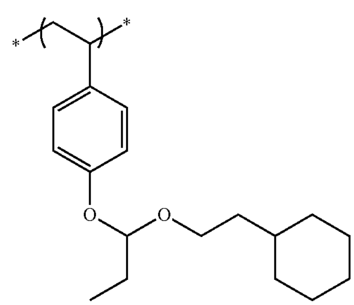

-continued
(VI-26)
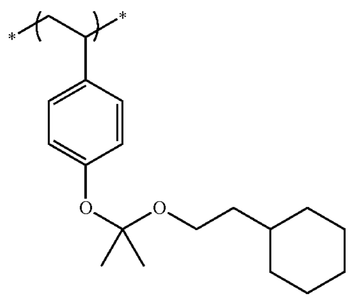
(VI-27)
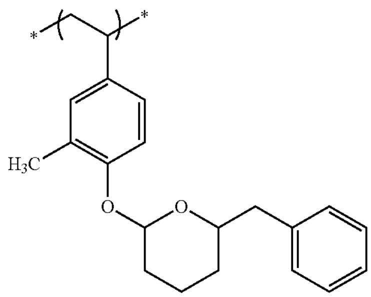
(VI-28)
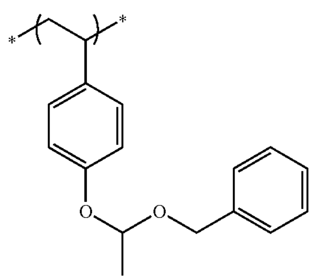
(VI-29)
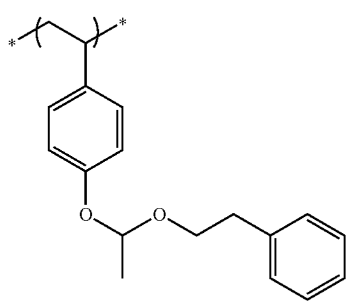
(VI-30)
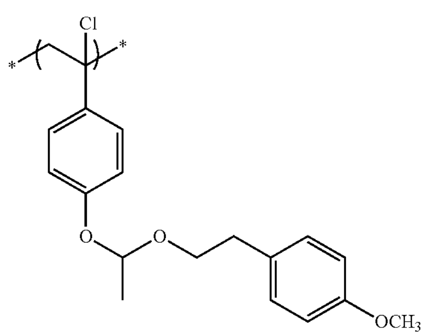
-continued
(VI-31)
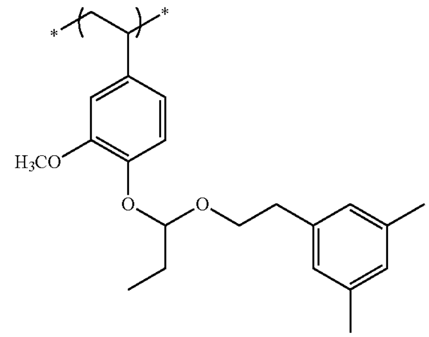
(VI-32)
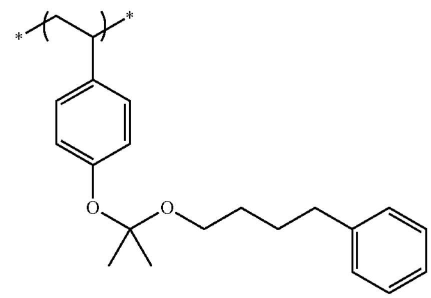
(VI-33)
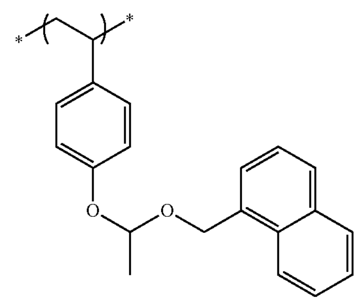
(VI-34)
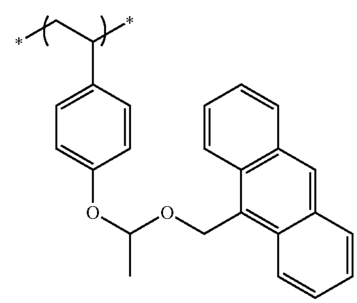
(VI-35)
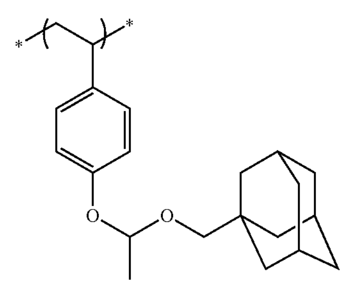

-continued
(VI-60)
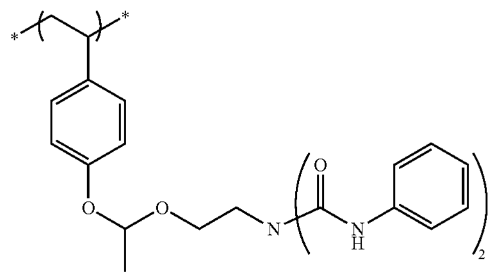
(VI-61)
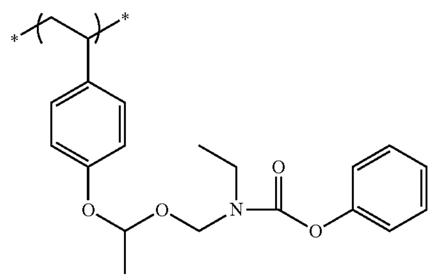
(VI-62)
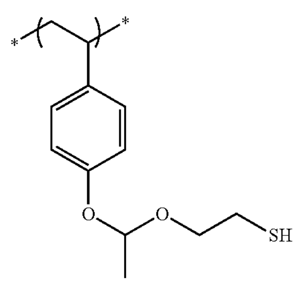
(VI-63)
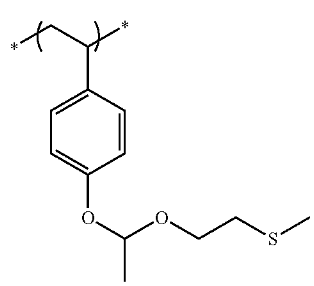
(VI-64)
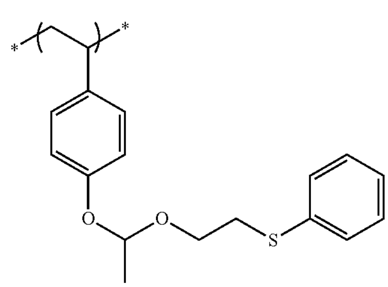
-continued
(VI-65)
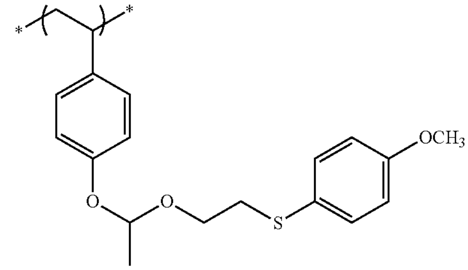
(VI-66)
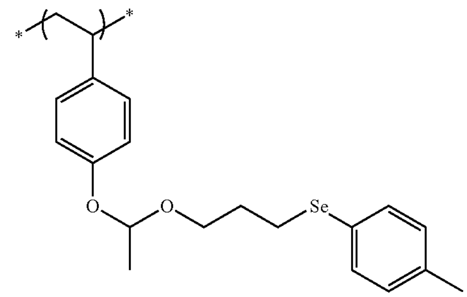
(VI-67)
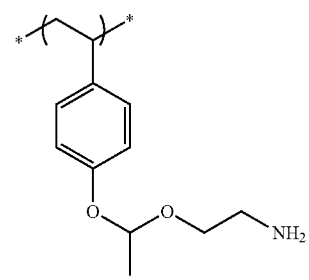
(VI-68)
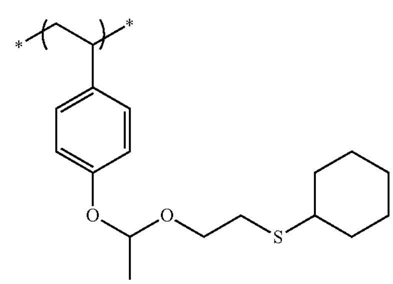
(VI-69)
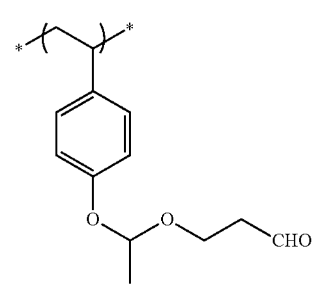

-continued
(VI-70)
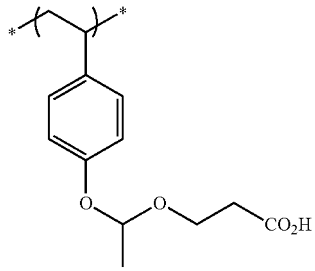
(VI-71)
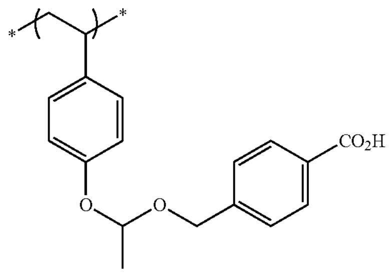
(VI-72)
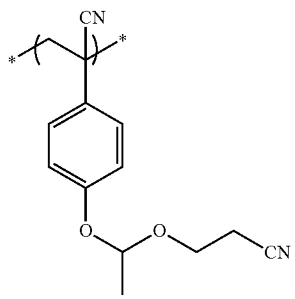
(VI-73)
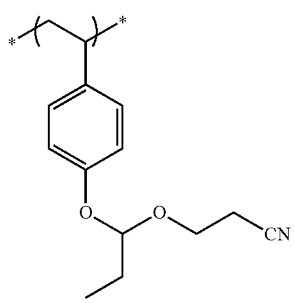
(VI-74)
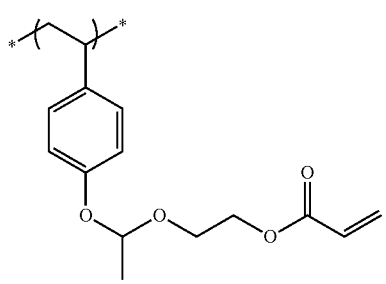
-continued
(VI-75)
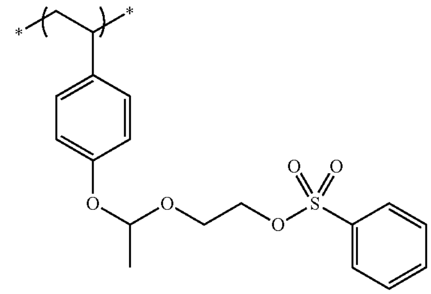
(VI-76)
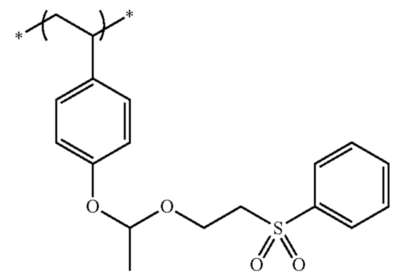
(VI-77)
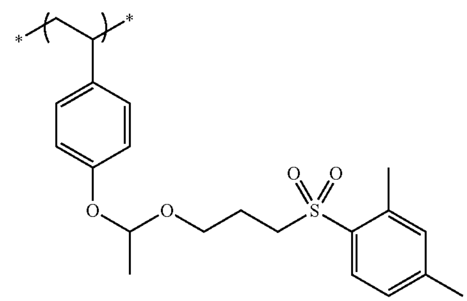
(VI-78)
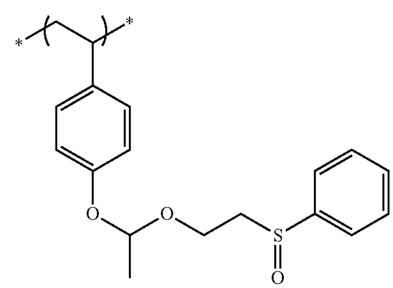
(VI-79)
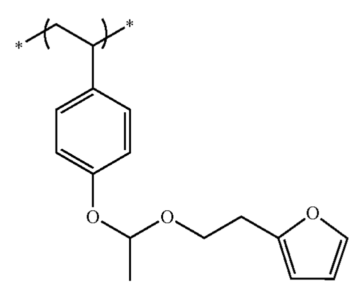

-continued
(VI-80)
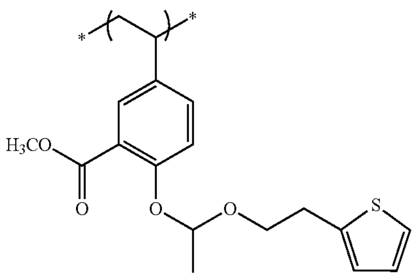
(VI-81)
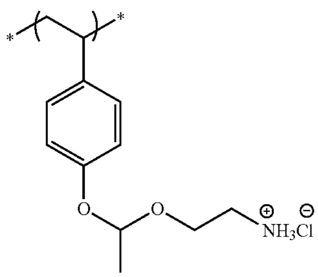
(VI-82)
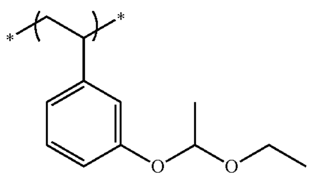
(VI-83)
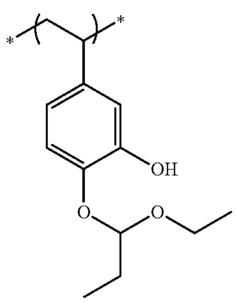
(VI-84)
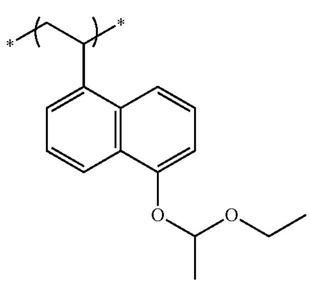
(VI-85)
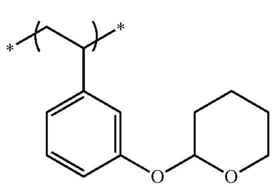
-continued
(VI-86)
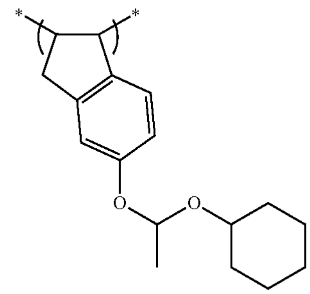
(VI-87)
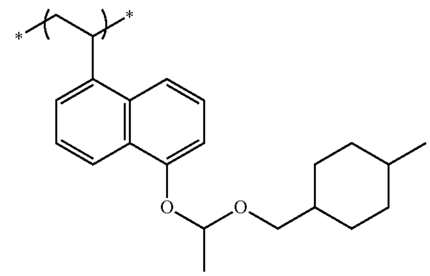
(VI-88)
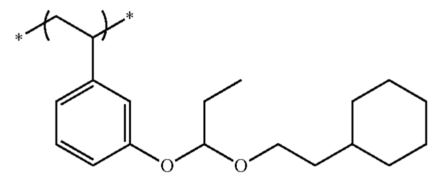
(VI-89)
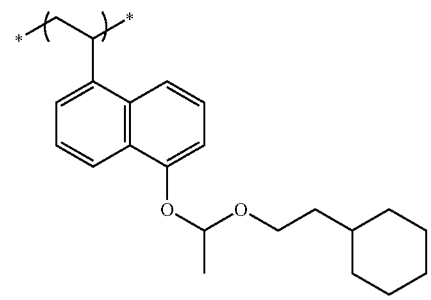
(VI-90)
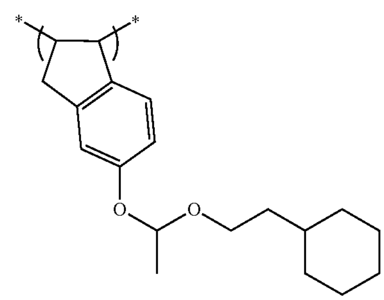
(VI-91)
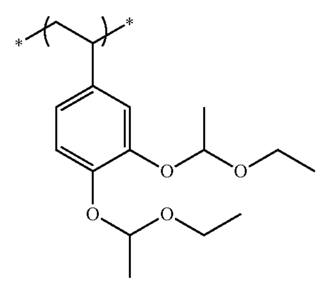

-continued
(VI-92)
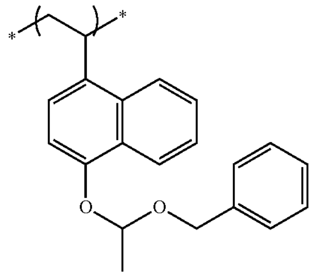
(VI-93)
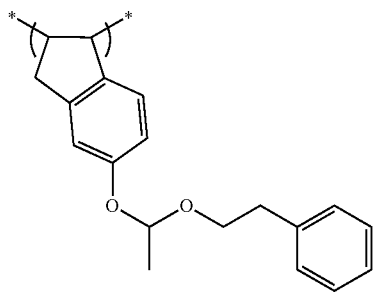
(VI-94)
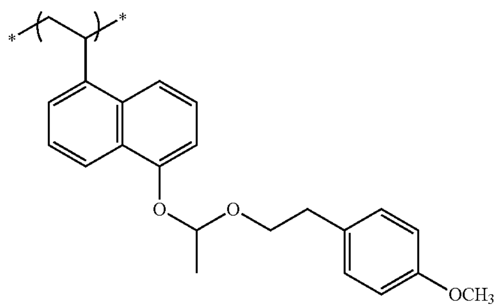
(VI-95)
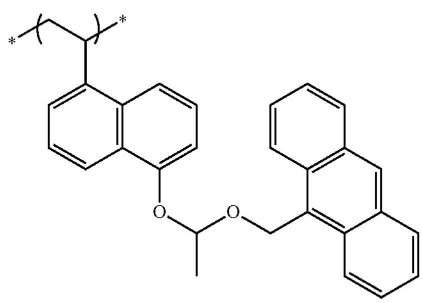
(VI-96)
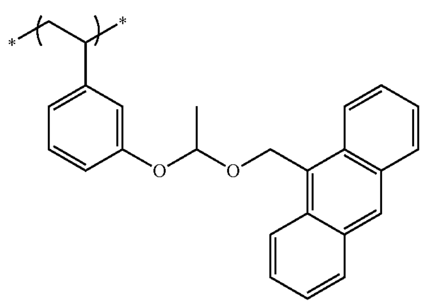
-continued
(VI-97)
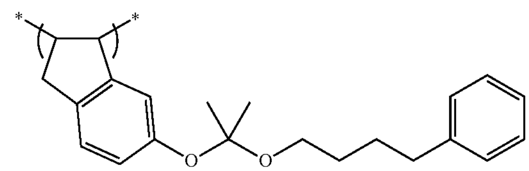
(VI-98)
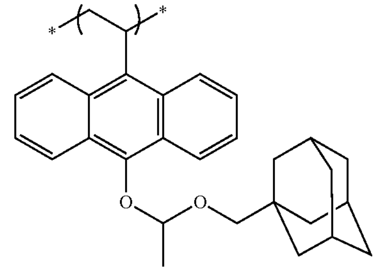
(VI-99)
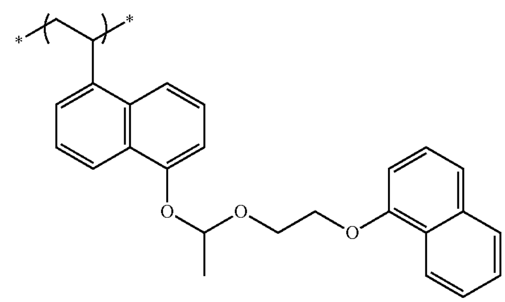
(VI-100)
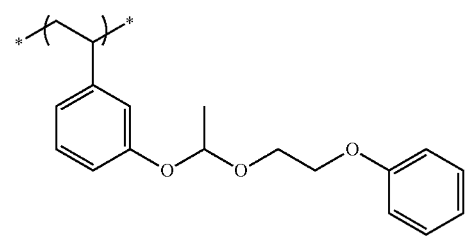
(VI-101)
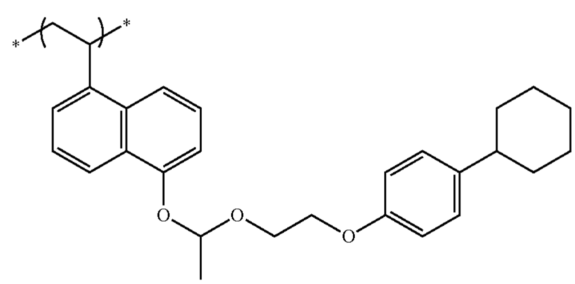
(VI-102)
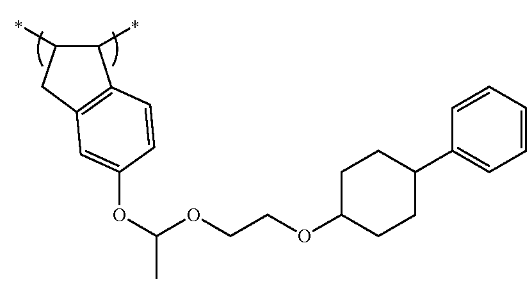

-continued
(VI-103)
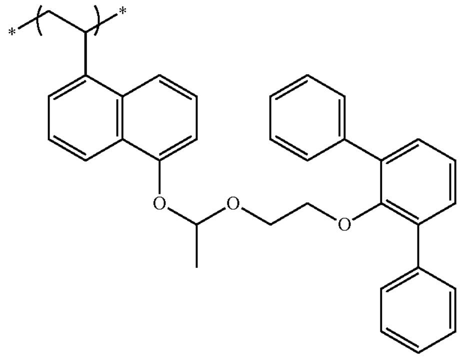
(VI-104)
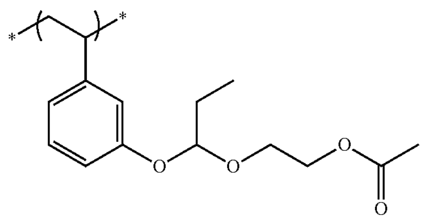
(VI-105)
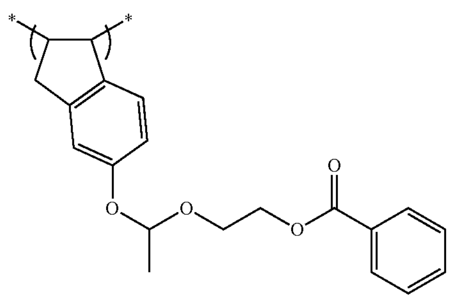
(VI-106)
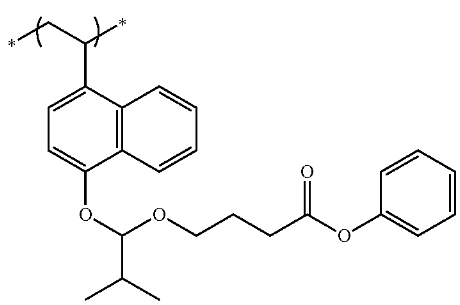
(VI-107)
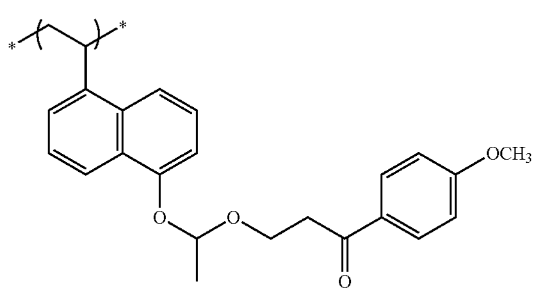
-continued
(VI-108)
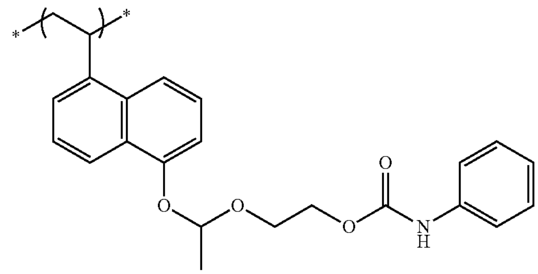
(VI-109)
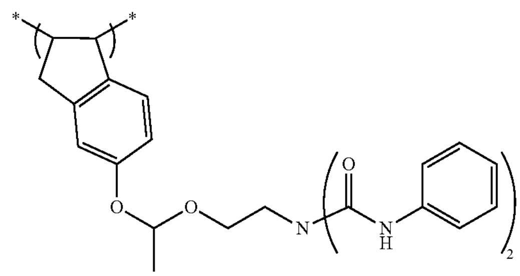
(VI-110)
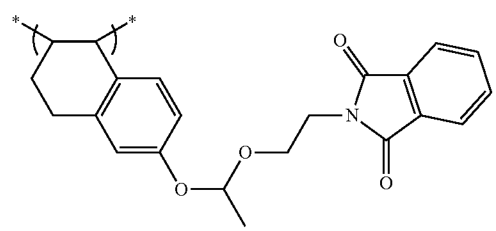
(VI-111)
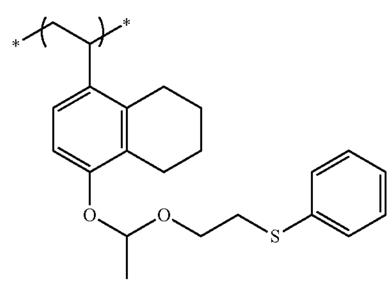
(VI-112)
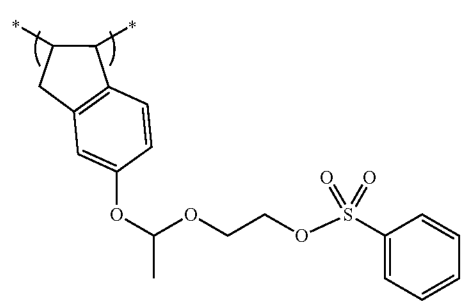

-continued
(VI-113)
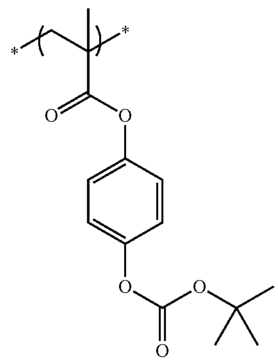
(VI-114)
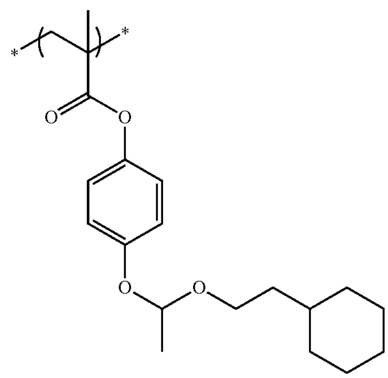
(VI-115)
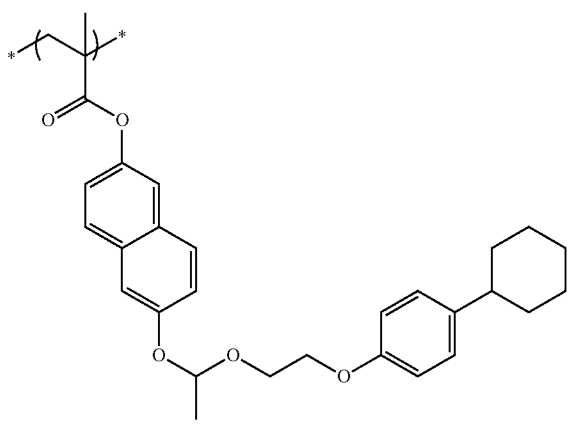
(VI-116)
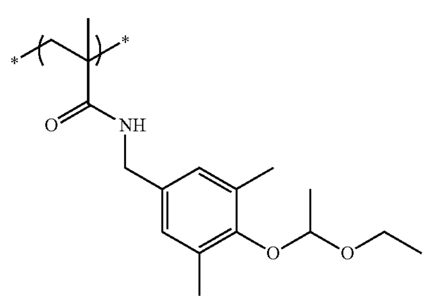
-continued
(VI-117)
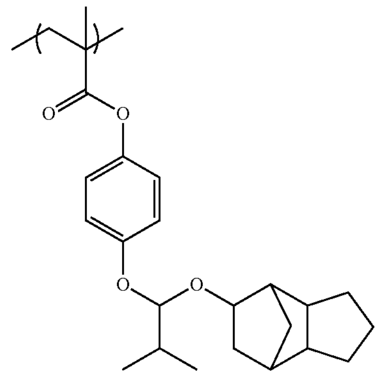
(VI-118)
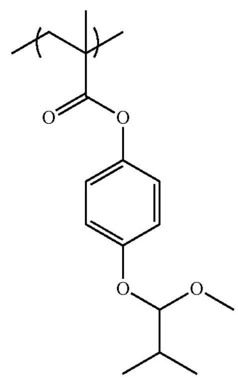
(VI-119)
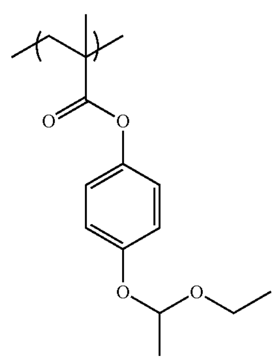
(VI-120)
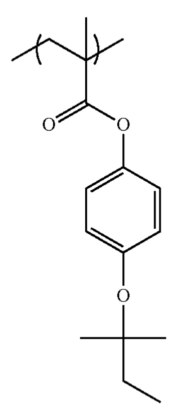

-continued
(VI-121)
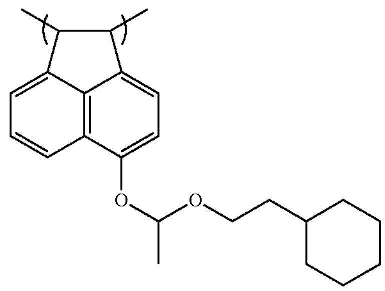
(VI-122)
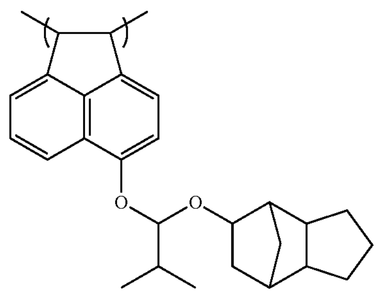
(VI-123)
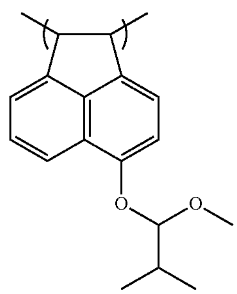
(VI-124)
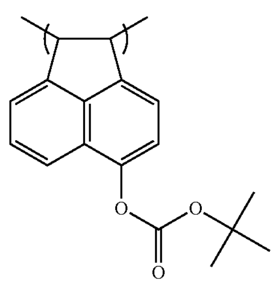
(VI-125)
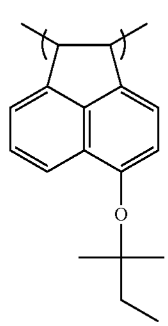
-continued
(VI-126)
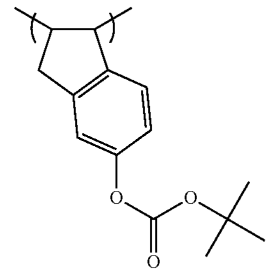
(VI-127)
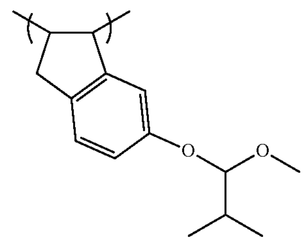
(VI-128)
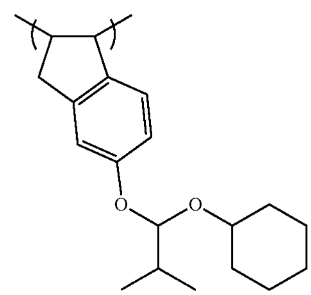
(VI-129)
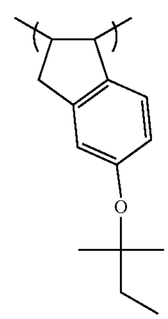
(VI-130)
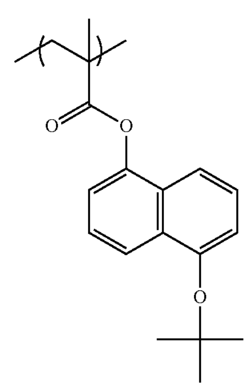

-continued (VI-131)

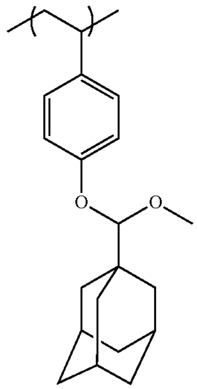

(VI-132)

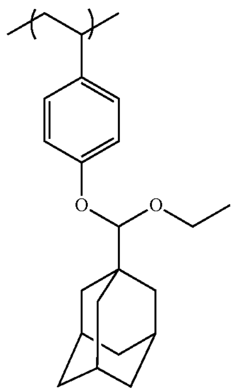

(VI-133)

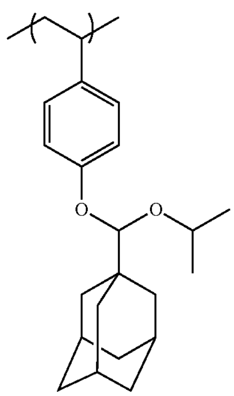

(VI-134)

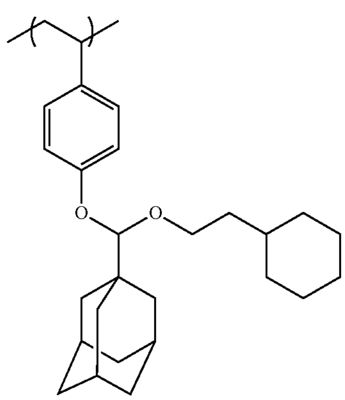

If the resin (A) includes the repeating unit (R1), its content rate as the total is as follows: 10 to 70 mol % is preferred, 15 to 60 mol % is more preferred, and 20 to 50 mol % is still more preferred, based on all the repeating units of the resin (A).

<Repeating Unit (R3)>

A repeating unit (R3) is a repeating unit capable of decomposing by the action of an acid to generate an alcoholic hydroxy group. When the resin (A) includes such a repeating unit, a polar change of the resin (A) resulting from the decomposition of the acid-decomposable group is increased, and a dissolution contrast for an organic-based developer is further enhanced. Further, in this case, it is possible to further suppress a reduction in film thickness in a post exposure bake (PEB) process. In addition, in this case, the use of either of the alkali developer or the organic-based developer makes it possible to further enhance the resolution.

Further, the alcoholic hydroxy group generated from the aforementioned group due to the decomposition by the action of an acid has, for example, a pKa of 12 or more, and has typically the pKa of 12 to 20. If the pKa is excessively small, the stability of a composition containing the resin (A) is deteriorated, and thereby a change in resist performance may increase over time. Further, a term "pKa" used herein is defined as a value calculated under initial setting conditions which are not customized, using an "ACD/pKaDB" available from Fujitsu Limited.

The repeating unit (R3) preferably includes two or more groups capable of decomposing by the action of an acid to generate the alcoholic hydroxy group. This can further enhance the dissolution contrast for the organic-based developer.

The repeating unit (R3) is preferably represented by at least one formula selected from a group consisting of the following Formula (I-1) to (I-10). This repeating unit is more preferably represented by at least one formula selected from a group consisting of the following Formula (I-1) to (I-3), and still more preferably represented by the following Formula (I-1).

(I-1)

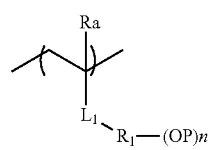

(I-2)

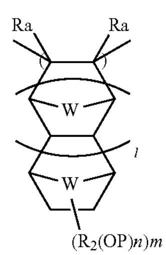

(I-3)

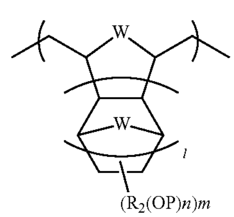

-continued (I-4)

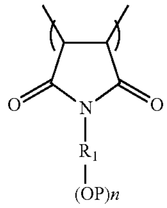

(I-5)

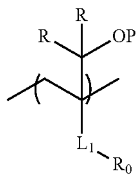

(I-6)

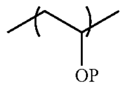

(I-7)

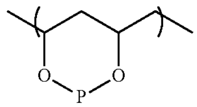

(I-8)

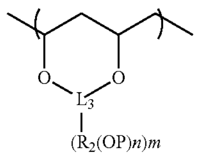

(I-9)

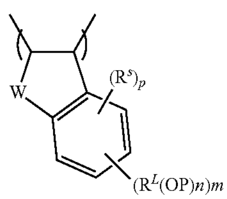

(I-10)

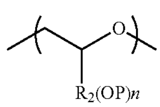

In the formulas,

Each Ra independently represents a hydrogen atom, an alkyl group or a group represented by —$CH_2$—O—$Ra_2$. Here, $R_{a2}$ represents a hydrogen atom, an alkyl group or an acyl group.

$R_1$ represents a (n+1)-valent organic group.

If m≥2, each $R_2$ independently represents a single bond or a (n+1)-valent organic group.

Each OP independently represents a group capable of decomposing by the action of an acid to generate the alcoholic hydroxy group. If n≥2 and/or m≥2, two or more OP's may combine with each other to form a ring.

W represents a methylene group, an oxygen atom or a sulfur atom.

n and m represent an integer of 1 or more. Further, when $R_2$ in Formula (I-2), (I-3) or (I-8) represents a single bond, n is 1.

l represents an integer of 0 or more.

$L_1$ represents a linking group represented by —COO—, —OCO—, —CONH—, —O—, —Ar—, —$SO_3$— or —$SO_2$NH—. Here, Ar represents a divalent aromatic ring group.

Each R independently represents a hydrogen atom or an alkyl group.

$R_0$ represents a hydrogen atom or an organic group.

$L_3$ represents a (m+2)-valent linking group.

If m≥2, each RL independently represents a (n+1)-valent linking group.

If p≥2, each RS independently represents a substituent. If p≥2, a plurality of RS may combine with each other to form a ring.

p represents an integer of 0 to 3.

Ra represents a hydrogen atom, an alkyl group or a group represented by —$CH_2$—O—$Ra_2$. Ra is preferably a hydrogen atom or an alkyl group having 1 to 10 carbon atoms, and more preferably a hydrogen atom or a methyl group.

W represents a methylene group, an oxygen atom or a sulfur atom. W is preferably the methylene group or the oxygen atom.

$R_1$ represents a (n+1)-valent organic group. $R_1$ is preferably a nonaromatic hydrocarbon group. In this case, $R_1$ may be a chained hydrocarbon group or an alicyclic hydrocarbon group. $R_1$ is more preferably an alicyclic hydrocarbon group.

$R_2$ represents a single bond or a (n+1)-valent organic group. $R_2$ is preferably the single bond or a nonaromatic hydrocarbon group. In this case, $R_2$ may be a chained hydrocarbon group or an alicyclic hydrocarbon group.

If $R_1$ and/or $R_2$ is the chained hydrocarbon group, the chained hydrocarbon group may be straight or branched. Further, the chained hydrocarbon group preferably has 1 to 8 carbon atoms. If $R_1$ and/or $R_2$ is an alkylene group, for example, $R_1$ and/or $R_2$ is preferably a methylene group, an ethylene group, an n-propylene group, an isopropylene group, an n-butylene group, an isobutylene group or a sec-butylene group.

If $R_1$ and/or $R_2$ is an alicyclic hydrocarbon group, the alicyclic hydrocarbon group may be monocyclic or polycyclic. The alicyclic hydrocarbon group has a monocyclo structure, a bicycle structure, a tricyclo structure or a tetracyclo structure, for example. The alicyclic hydrocarbon group usually has 5 or more carbon atoms, preferably 6 to 30 carbon atoms, more preferably 7 to 25 carbon atoms.

Examples of this alicyclic hydrocarbon group may include groups having partial structures that will be listed below. Each partial structure may have a substituent. Further, the methylene group (—$CH_2$—) in each partial structure may be substituted with an oxygen atom (—O—), a sulfur atom (—S—), a carbonyl group [—C(═O)—], a sulfonyl group [—S(═O)$_2$—], a sufinyl group [—S(═O)—], or an imino group [—N(R)—] (R is a hydrogen atom or an alkyl group).

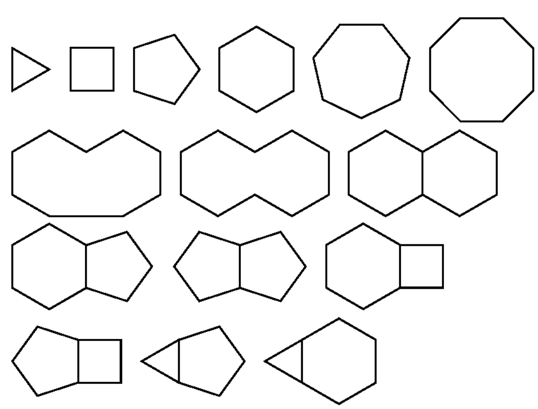

-continued

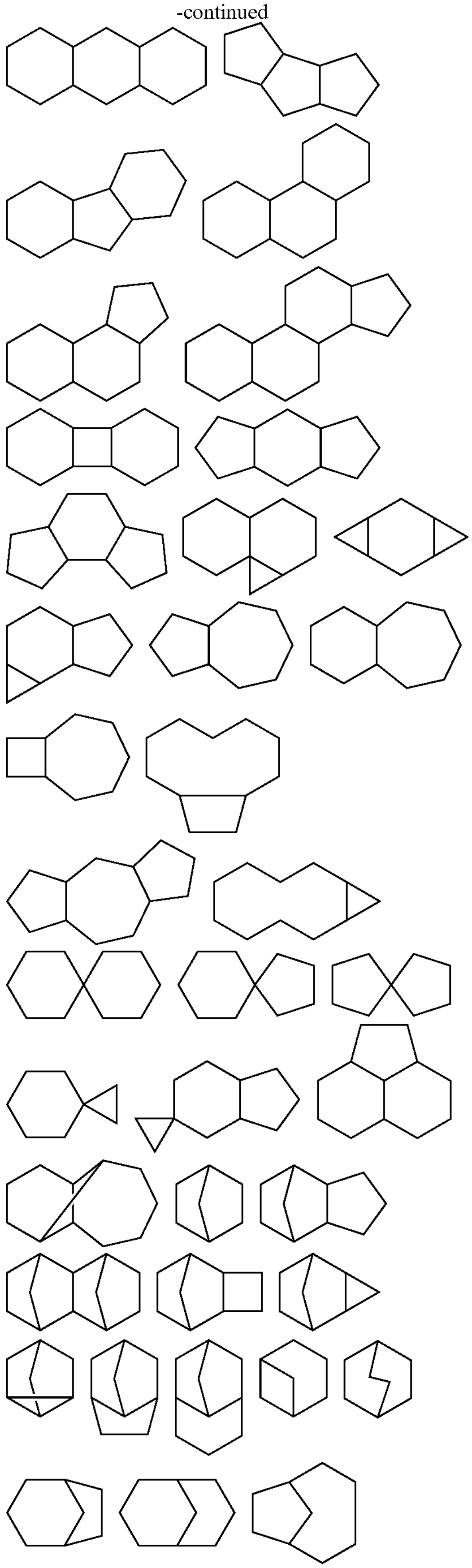

-continued

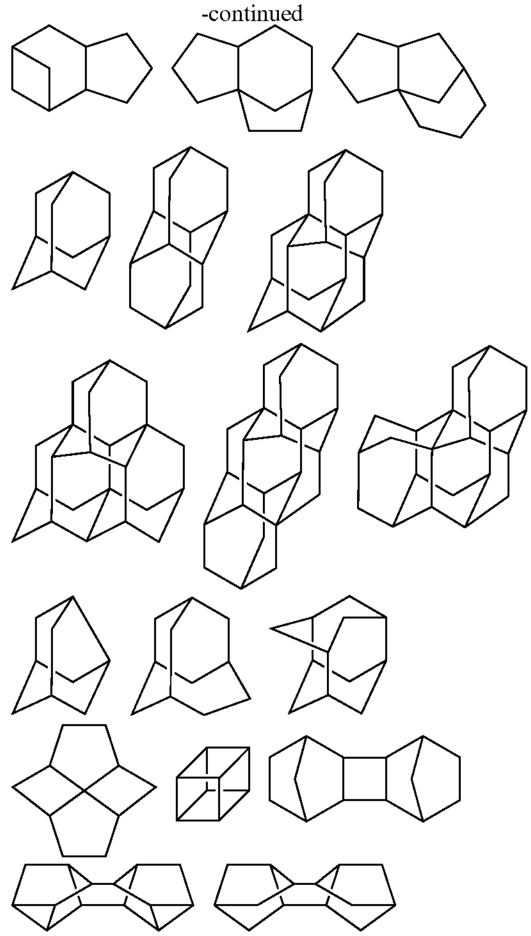

If $R_1$ and/or $R_2$ is a cycloalkylene group, for example, $R_1$ and/or $R_2$ is preferably an adamantylene group, a noradamantylene group, a decahydronaphthylene group, a tricycledecanylene group, a tetracyclododecanylene group, a norbonylene group, a cyclopentylene group, a cyclohexylene group, a cycloheptylene group, a cyclooctylene group, a cyclodecanylene group, or a cyclododecanylene group, and more preferably an adamantylene group, a norbonylene group, a cyclohexylene group, a cyclopentylene group, tetracyclododecanylene group or tricyclodecanylene group.

The nonaromatic hydrocarbon group of $R_1$ and/or $R_2$ may have a substituent. Examples of the substituent may include an alkyl group having 1 to 4 carbon atoms, a halogen atom, a hydroxy group, an alkoxy group having 1 to 4 carbon atoms, a carboxyl group, and an alkoxy carbonyl group having 2 to 6 carbon atoms. The alkyl group, the alkoxy group and the alkoxy carbonyl group may have a substituent. Examples of the substituent may include a hydroxy group, a halogen atom, and an alkoxy group.

$L_1$ represents a linking group represented by —COO—, —OCO—, —CONH—, —O—, —Ar—, $—SO_3—$ or $—SO_2NH—$. Here, Ar represents a divalent aromatic ring group. $L_1$ is preferably a linking group represented by —COO—, —CONH— or —Ar—, and more preferably a linking group represented by —COO— or —CONH—.

R represents a hydrogen atom or an alkyl group. The alkyl group may be straight or branched. The alkyl group has preferably 1 to 6 carbon atoms, and more preferably 1 to 3 carbon atoms. R is preferably a hydrogen atom or a methyl group, and more preferably the hydrogen atom.

$R_0$ represents a hydrogen atom or an organic group. Examples of the organic group may include an alkyl group, a cycloalkyl group, an aryl group, an alkynyl group, and an alkenyl group. $R_0$ is preferably a hydrogen atom or an alkyl group, and more preferably the hydrogen atom or the methyl group.

$L_3$ represents a (m+2)-valent linking group. That is, $L_3$ represents a 3- or more-valent linking group. Examples of the linking group may include a corresponding group that will be described later in specific examples.

RL represents a (n+1)-valent linking group. That is, RL represents a 2- or more-valent linking group. Examples of the linking group may include an alkylene group, a cycloalkylene group and a corresponding group that will be described later in specific examples. RL may combine another RL or the following RS to form a ring structure.

RS represents a substituent. Examples of the substituent may include an alkyl group, an alkenyl group, an alkynyl group, an aryl group, an alkoxy group, an acyloxy group, an alkoxy carbonyl group, and a halogen atom.

n is an integer of 1 or more. n is preferably an integer of 1 to 3, and more preferably 1 or 2. Further, if n is set to 2 or more, it is possible to further enhance the dissolution contrast for the organic-based developer. Thus, this can further enhance limiting resolution and roughness.

m is an integer of 1 or more. m is preferably an integer of 1 to 3, and more preferably 1 or 2.

l is an integer of 0 or more. l is preferably 0 or 1.

p is an integer of 0 to 3.

Hereinafter, the specific examples of the repeating unit capable of decomposing by the action of an acid to generate an alcoholic hydroxy group will be shown. Further, among the specific examples, Ra and OP have the same meaning as those of Formula (I-1) to (I-3) respectively. Further, when a plurality of OP's combines with each other to form a ring, a corresponding ring structure is denoted by "O—P—O" for the convenience of description.

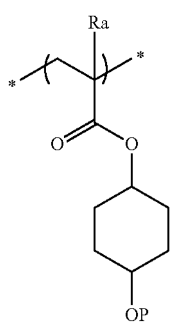
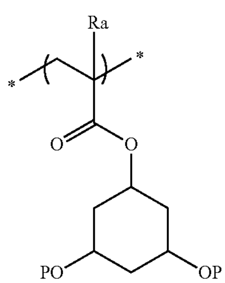
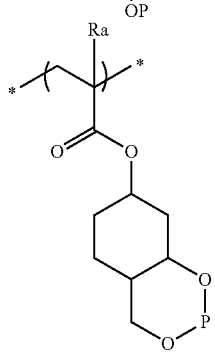
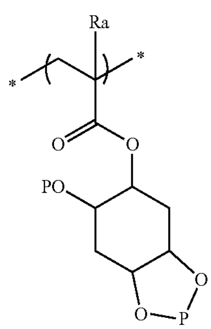

-continued

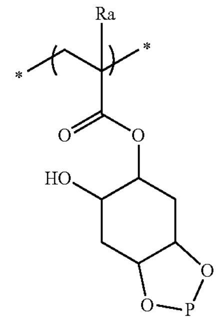
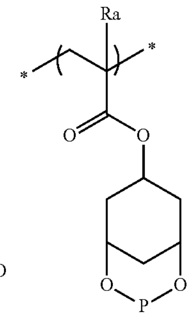
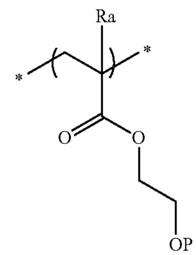
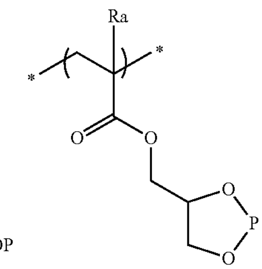
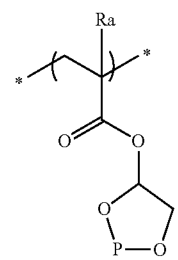
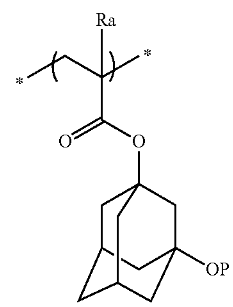
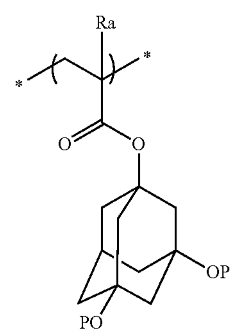
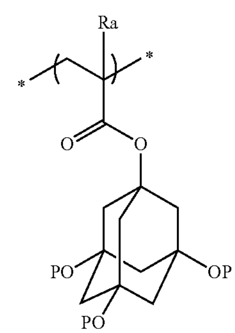
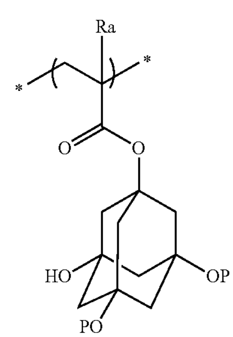
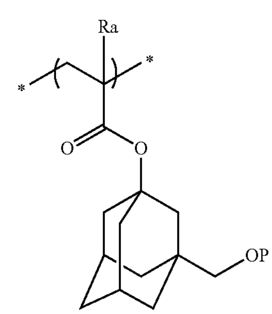

-continued

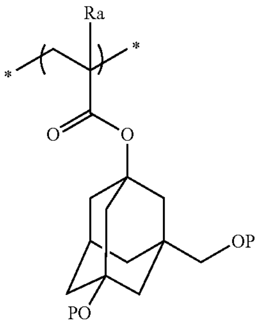
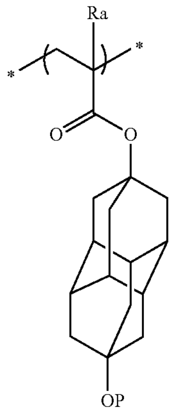
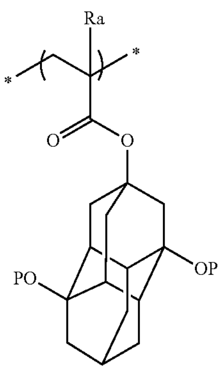
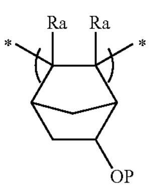
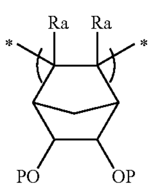
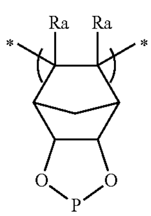
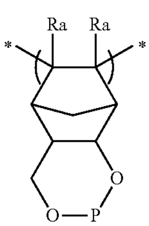
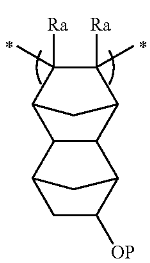
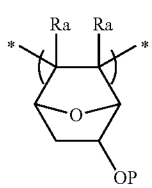
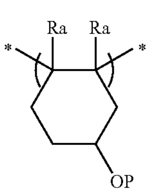
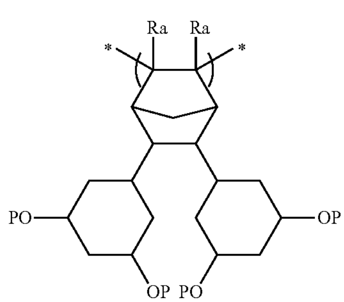

-continued

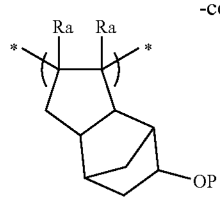
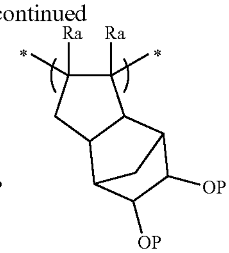
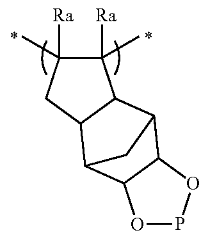
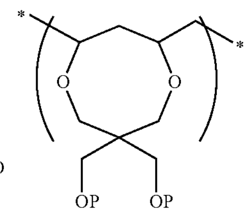
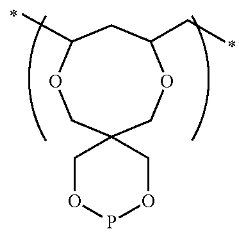

The group capable of decomposing by the action of an acid to generate the alcoholic hydroxy group is preferably represented by at least one formula selected from a group consisting of the following Formulas (II-1) to (II-4).

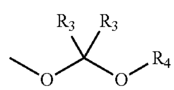
(II-1)

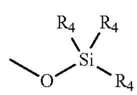
(II-2)

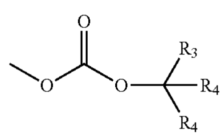
(II-3)

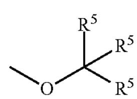
(II-4)

In the formulas,

Each $R_3$ independently represents a hydrogen atom or a monovalent organic group. $R_3$ may combine with another one to form a ring.

Each $R_4$ independently represents a monovalent organic group. $R_4$ may combine with another one to form a ring. $R_3$ and $R_4$ may combine with each other to form a ring.

Each $R_5$ independently represents a hydrogen atom, an alkyl group, a cycloalkyl group, an aryl group, an alkenyl group, or an alkynyl group. At least two of $R_5$ may combine with each other to form a ring. If one or two of only three $R_5$ is or are a hydrogen atom, at least one of the remaining $R_5$ represents an aryl group, an alkenyl group, or an alkynyl group.

The group capable of decomposing by the action of an acid to generate the alcoholic hydroxy group is preferably represented by at least one formula selected from a group consisting of the following Formulas (II-5) to (II-9).

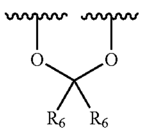
(II-5)

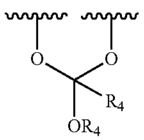
(II-6)

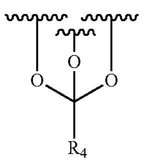
(II-7)

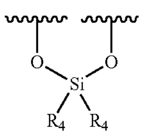
(II-8)

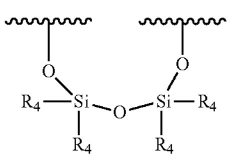
(II-9)

In the formulas, $R_4$ has the same meaning as that of Formulas (II-1) to (II-3).

Each $R_6$ independently represents a hydrogen atom or a monovalent organic group. $R_6$ may combine with another $R_6$ to form a ring.

The group capable of decomposing by the action of an acid to generate the alcoholic hydroxy group is more preferably represented by at least one formula selected from a group consisting of Formulas (II-1) to (II-3), and still more preferably represented by Formula (II-1) or (II-3), and particularly preferably represented by Formula (II-1).

As described above, $R_3$ represents a hydrogen atom or a monovalent organic group. $R_3$ is preferably the hydrogen atom, an alkyl group or a cycloalkyl group, and more preferably the hydrogen atom or the alkyl group.

The alkyl group of $R_3$ may be straight or branched. The alkyl group of $R_3$ has preferably 1 to 10 carbon atoms, and more preferably 1 to 3 carbon atoms. Examples of the alkyl group of $R_3$ may include a methyl group, an ethyl group, an n-propyl group, an isopropyl group, and a n-butyl group.

The cycloalkyl group of $R_3$ may be monocyclic or polycyclic. The cycloalkyl group of $R_3$ preferably includes 3 to 10 carbon atoms, and more preferably includes 4 to 8 carbon atoms. Examples of the cycloalkyl group of $R_3$ may include a cyclopropyl group, a cyclobutyl group, a cyclopentyl group, a cyclohexyl group, a norbornyl group, and an adamantyl group.

Further, in Formula (II-1), at least one part of $R_3$ is preferably a monovalent organic group. The adoption of such a configuration can achieve particularly high sensitivity.

$R_4$ represents a monovalent organic group. $R_4$ is preferably an alkyl group or cycloalkyl group, and more preferably the alkyl group. The alkyl group and the cycloalkyl group may have a substituent.

It is preferred that the alkyl group of $R_4$ has no substituent or has one or more aryl groups and/or one or more silyl groups as the substituent. The unsubstituted alkyl group preferably has 1 to 20 carbon atoms. An alkyl-group moiety of the alkyl group substituted with one or more aryl groups preferably has 1 to 25 carbon atoms. An alkyl-group moiety of the alkyl group substituted with one or more silyl groups preferably has 1 to 30 carbon atoms. Further, when the cycloalkyl group of $R_4$ has no substituent, it preferably has 3 to 20 carbon atoms.

$R_5$ represents a hydrogen atom, an alkyl group, a cycloalkyl group, an aryl group, an alkenyl group, or an alkynyl group. If one or two of only three $R_5$ is or are a hydrogen atom, at least one of the remaining $R_5$ represents an aryl group, an alkenyl group, or an alkynyl group. $R_5$ is preferably the hydrogen atom or the alkyl group. The alkyl group may have or may not have a substituent. If the alkyl group has no substituent, it has preferably 1 to 6 carbon atoms, and preferably 1 to 3 carbon atoms.

As described above, $R_6$ represents a hydrogen atom or a monovalent organic group. $R_6$ is preferably the hydrogen atom, an alkyl group or a cycloalkyl group, more preferably the hydrogen atom or the alkyl group, and still more preferably the hydrogen atom or an alkyl group having no substituent. $R_6$ is preferably the hydrogen atom or an alkyl group having 1 to 10 carbon atoms, and more preferably the hydrogen atom or an alkyl group having 1 to 10 carbon atoms and having no substituent.

Further, examples of the alkyl group and the cycloalkyl group of $R_4$, $R_5$ and $R_6$ are the same as those of $R_3$ which have been described above.

Hereinafter, specific examples of the group capable of decomposing by the action of an acid to generate the alcoholic hydroxy group will be shown.

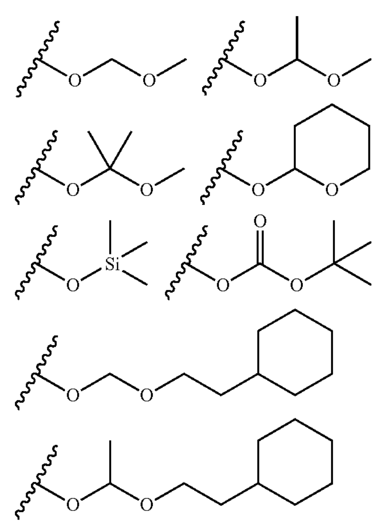

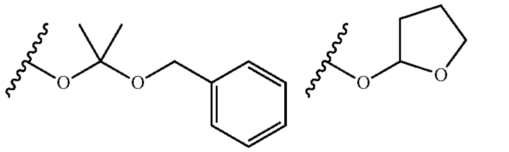
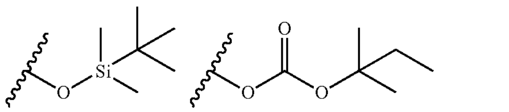
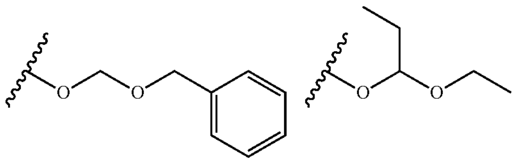
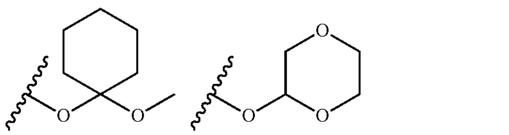
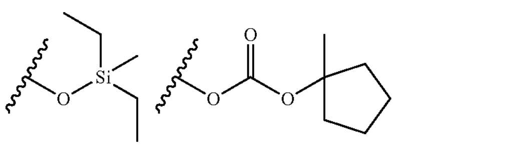
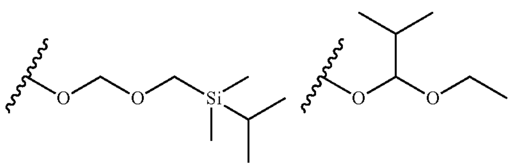
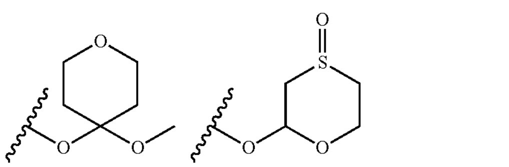
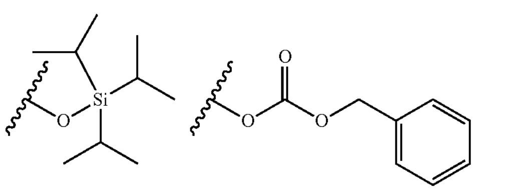
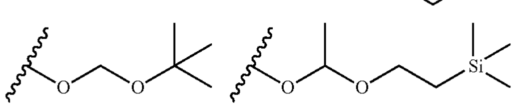
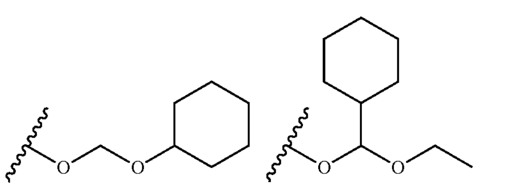
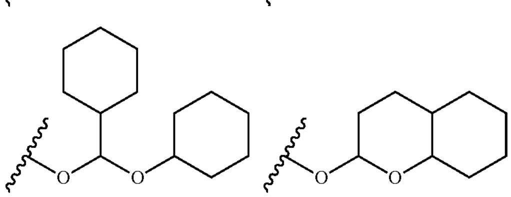
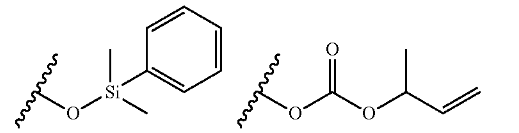
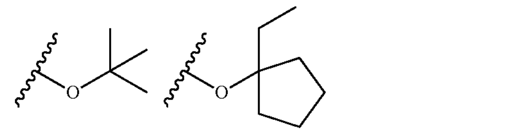
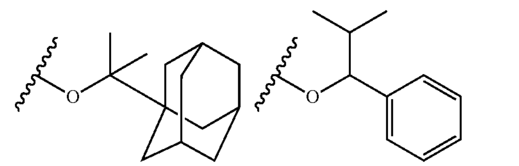
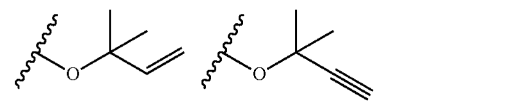
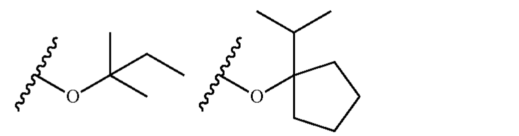
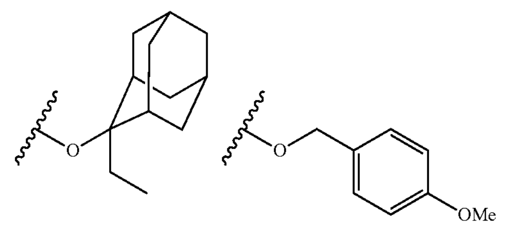
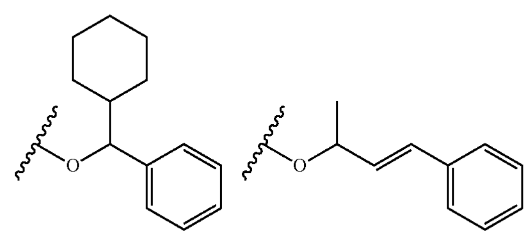
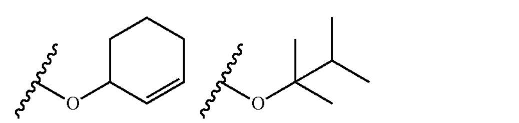
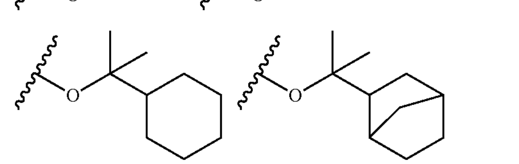
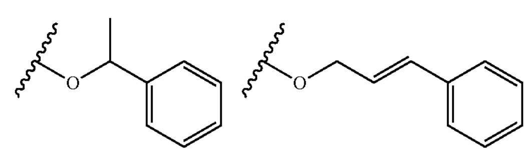
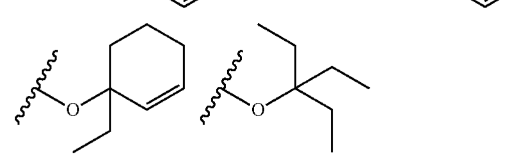

-continued
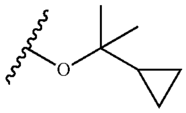
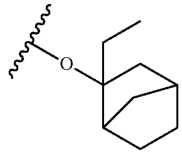
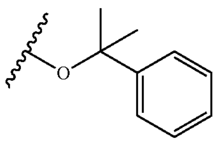
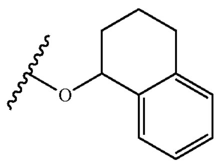
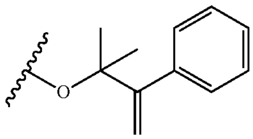
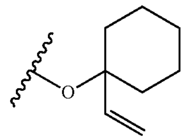
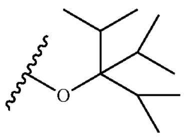
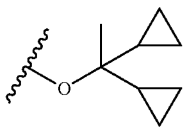
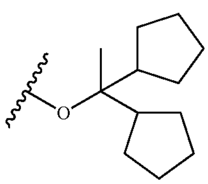
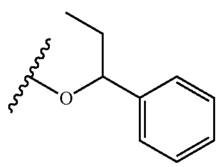
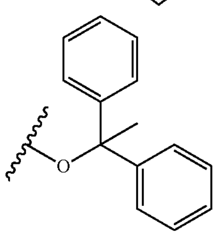
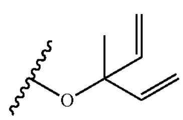
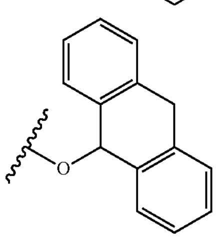
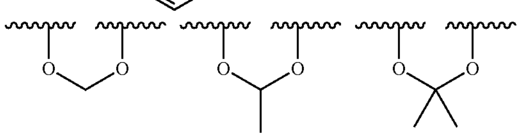
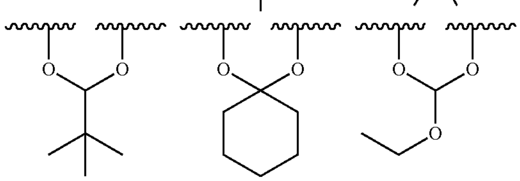
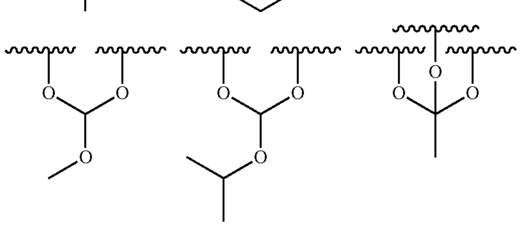
-continued
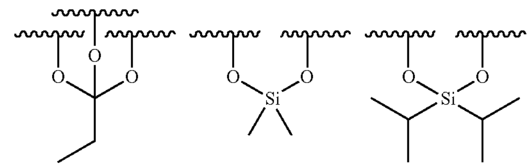
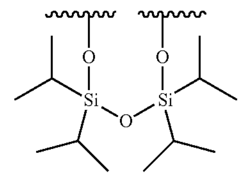
Specific examples of the repeating unit having the group capable of decomposing by the action of an acid to generate the alcoholic hydroxy group will be shown below. In the following specific examples, Xa1 represents a hydrogen atom, $CH_3$, $CF_3$, or $CH_2OH$.
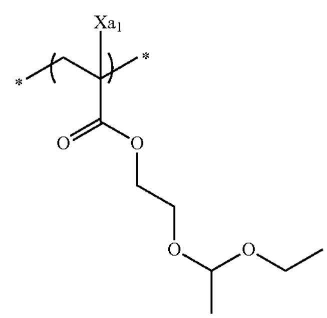
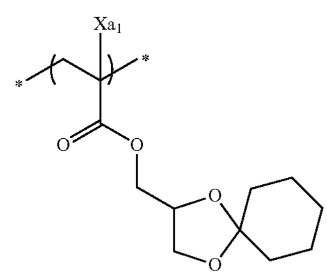
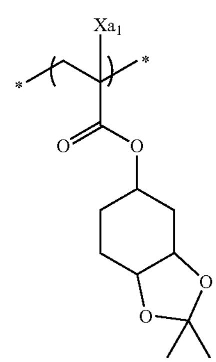
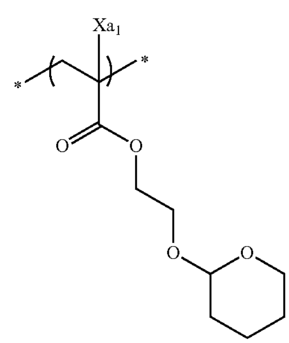

-continued
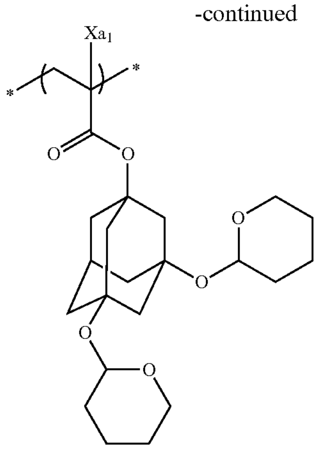
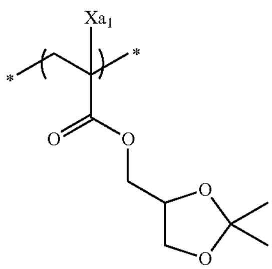
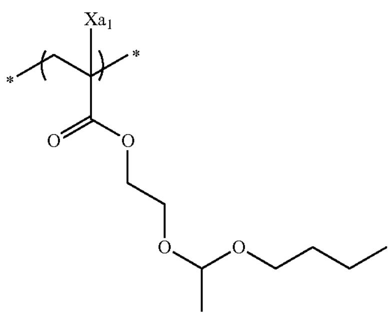
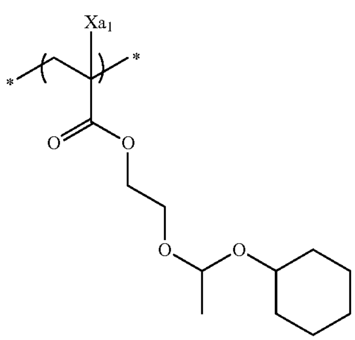
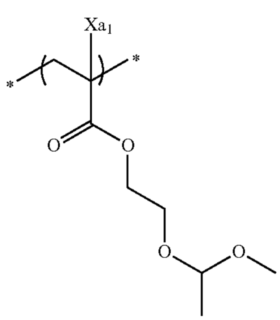
-continued
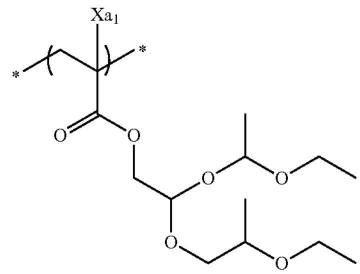
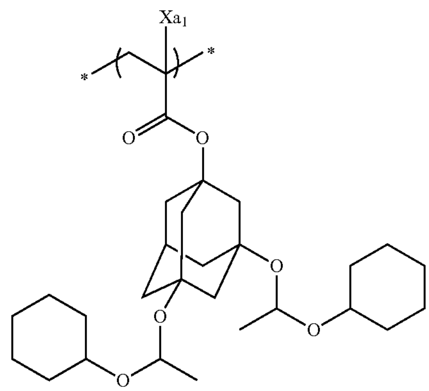
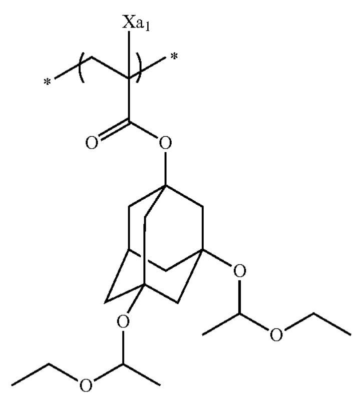
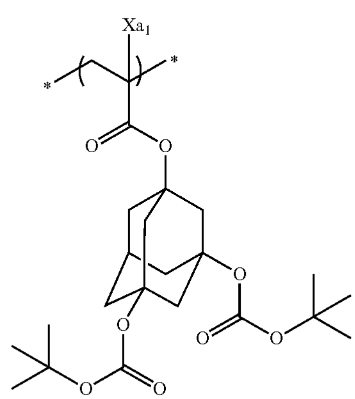

-continued

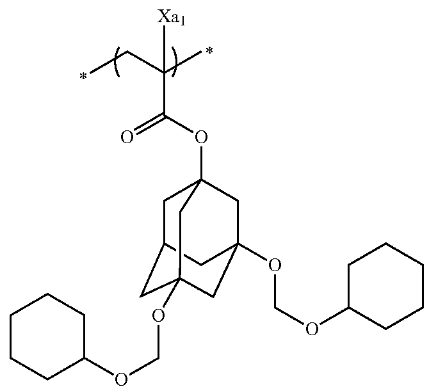

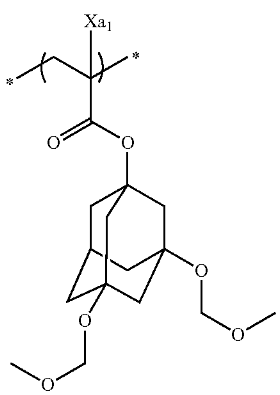

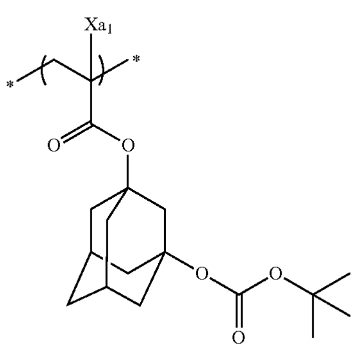

The resin (A) may have two or more repeating units (R3) each having a group capable of decomposing by the action of an acid to generate the alcoholic hydroxy group. The adoption of such a configuration enables reactivity and/or developability to be finely adjusted, thereby facilitating optimization of all the performances.

If the resin (A) contains the repeating unit (R3), its content as the total is as follows: 10 to 90 mol % is preferred, 30 to 90 mol % is more preferred, and 50 to 80 mol % is still more preferred, based on all the repeating units of the resin (A).

Specific examples of a repeating unit having other acid-decomposable groups may include the following repeating unit.

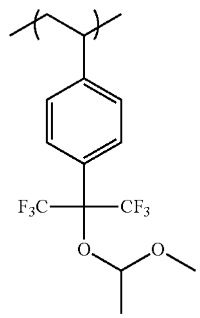

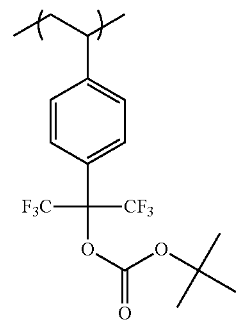

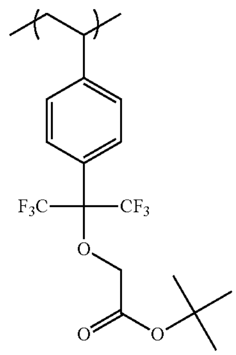

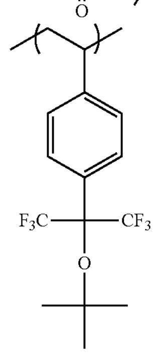

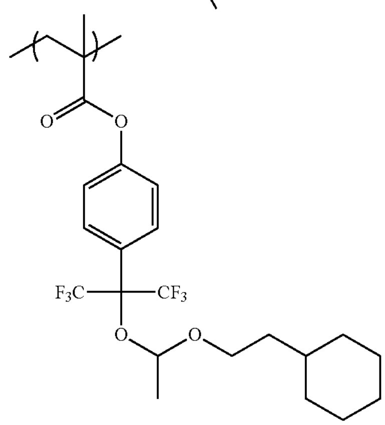

The content of the repeating unit having the acid-decomposable group is preferably within a range of 10 mol % to 90 mol %, more preferably within a range of 20 mol % to 80 mol %, and still more preferably within a range of 30 mol % to 70 mol %, based on all the repeating units of the resin (A).

[3] Other Types of Repeating Units

The resin (A) may include other types of repeating units. Examples of the repeating units may include the following repeating units (3A), (3B) and (3C).

(3A) Repeating Unit having Polar Group

The resin (A) may include a repeating unit (3A) having a polar group. This can further enhance the sensitivity of a composition containing the resin (A), for example.

Examples of the "polar group" that may be contained in the repeating unit (3A) may include the following (1) to (4). Further, hereinafter, the term "electronegativity" means a value by Pauling.

(1) A functional group including a structure obtained by combining an oxygen atom with an atom that is 1.1 or more in electronegativity difference from the oxygen atom, via a single bond.

Examples of such a polar group may include a group having a structure represented by O—H such as a hydroxy group.

(2) A functional group including a structure obtained by combining a nitrogen atom with an atom that is 0.6 or more in electronegativity difference from the nitrogen atom, via a single bond.

Examples of such a polar group may include a group having a structure represented by N—H such as an amino group.

(3) A functional group including a structure obtained by combining by two atoms that have the electronegativity difference of 0.5 or more, via a double bond or a triple bond.

Examples of such a polar group may include a group having a structure represented by C≡N, C═O, N═O, S═O or C═N.

(4) Functional Group Having Ionic Moiety

Examples of such a polar group may include a group having a moiety represented by $N^+$ or $S^+$.

The "polar group" that may include the repeating unit (3A) is at least one selected from a group consisting of (I) a hydroxy group, (II) a cyano group, (III) a lactone group, (IV) a carboxyl acid group or a sulfonate group, (V) an amide group, a sulfonamide group or a group corresponding to a derivative thereof, (VI) an ammonium group or a sulfonium group, and a group obtained by combining two or more of them together.

This polar group is particularly preferably a group including an alcoholic hydroxy group, a cyano group, a lactone group, or a cyanolactone structure.

If the resin (A) further contains the repeating unit having the alcoholic hydroxy group, it can further enhance the exposure latitude (EL) of a composition including the resin (A).

If the resin (A) further contains the repeating unit having the cyano group, it can further enhance the sensitivity of a composition including the resin (A).

If the resin (A) further contains the repeating unit having the lactone group, it can further enhance the dissolution contrast for the organic-based developer. Further, this makes it possible to further enhance the dry etching resistance, coatability, and adhesion to a substrate of the composition including the resin (A).

If the resin (A) further contains the repeating unit having a group including a lactone structure having the cyano group, it can further enhance the dissolution contrast for the organic-based developer. Moreover, this makes it possible to further enhance the sensitivity, the dry etching resistance, the coatability, and the adhesion to a substrate of the composition including the resin (A). In addition, this enables a single repeating unit to perform a function attributable to each of the cyano group and the lactone group, thus further increasing the design freedom of the resin (A).

Hereinafter, specific examples of the structure including the "polar group" will be shown. In the following specific examples, $X^-$ represents a counter anion.

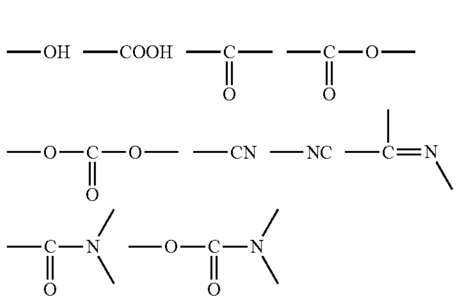

-continued

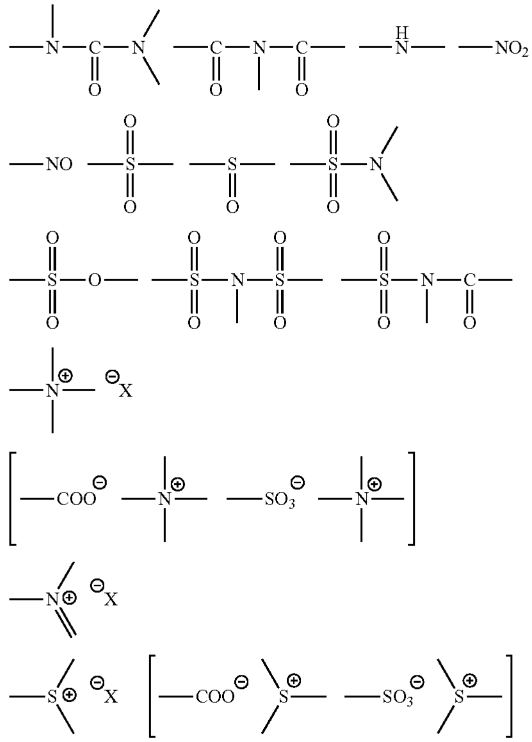

Preferred examples of the repeating unit (3A) may include a group obtained by substituting the "group capable of decomposing by the action of an acid to generate the alcoholic hydroxy group" in the repeating unit (R2) with the "alcoholic hydroxy group".

The repeating unit (3A) preferably has a structure that substitutes the "OP" with "OH" in each of Formulas (I-1) to (I-10). That is, this repeating unit is preferably represented by at least one formula selected from a group consisting of the following Formulas (I-1H) to (I-10H). In particular, this repeating unit (3A) is more preferably represented by at least one formula selected from a group consisting of the following Formulas (I-1H) to (I-3H), and still more preferably represented by the following Formula (I-1H).

(I-1)

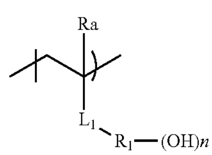

(I-2)

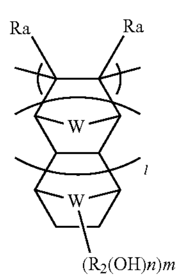

-continued (I-3)

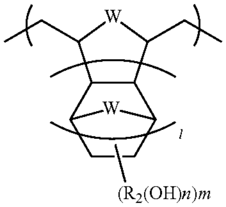

(I-4)

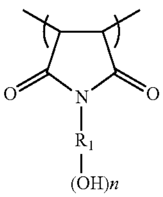

(I-5)

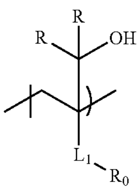

(I-6)

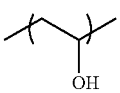

(I-7)

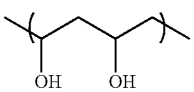

(I-8)

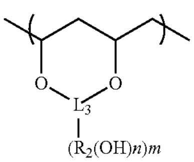

(I-9)

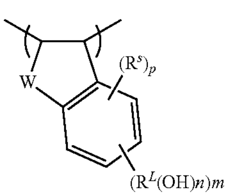

(I-10)

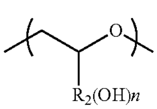

In the formulas,

Ra, $R_1$, $R_2$, W, n, m, l, $L_1$, R, $R_0$, $L_3$, RL, RS and p have the same meaning as those of Formula (I-1) to (I-10).

If the repeating unit having a group capable of decomposing by the action of an acid to generate the alcoholic hydroxy group and the repeating unit represented by at least one formula selected from the group consisting of Formulas (I-1H) to (I-10H) are used jointly, for example, the oxygen diffusion is suppress by the alcoholic hydroxy group and the sensitivity is increased by the group capable of decomposing by the action of an acid to generate the alcoholic hydroxy group, with the result that it is possible to improve the exposure latitude (EL) without deteriorating other performances.

In the repeating unit (R2), the content rate of the repeating unit (A) that substitutes "the group capable of decomposing by the action of an acid to generate the alcoholic hydroxy group" with the "alcoholic hydroxy group" is preferably 5 to 99 mol %, more preferably 10 to 90 mol %, and still more preferably 20 to 80 mol %, based on all the repeating units of the resin (A).

Hereinafter, specific examples of the repeating unit represented by any one of Formulas (I-1H) to (I-10H) will be shown. Further, in the specific examples, Ra has the same meaning as that of Formulas (I-1H) to (I-10H).

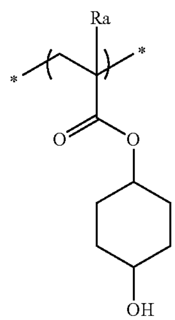

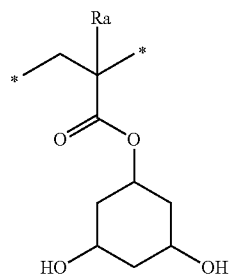

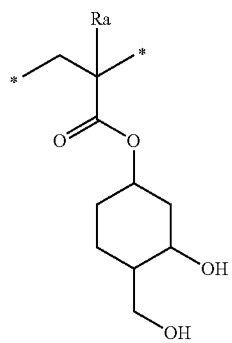

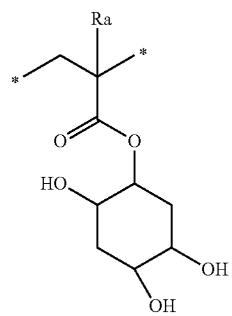

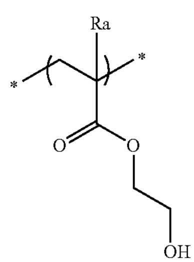

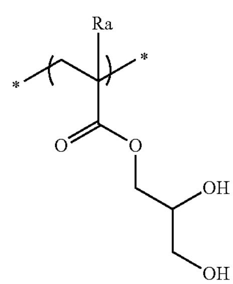

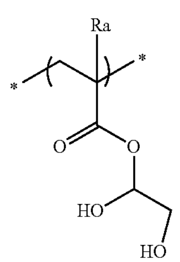

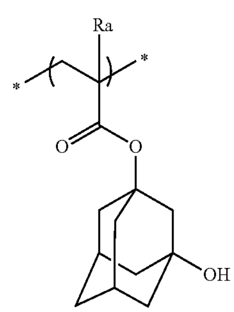

-continued

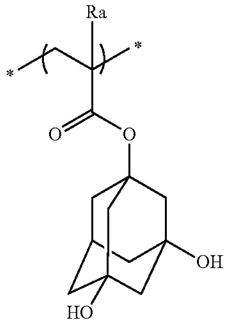
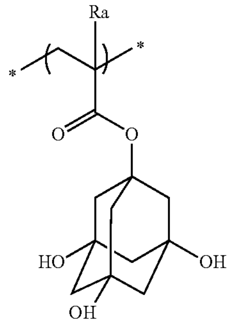
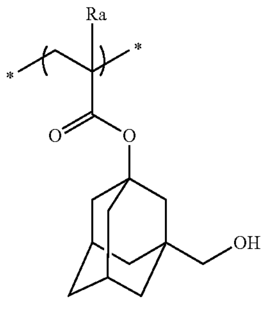
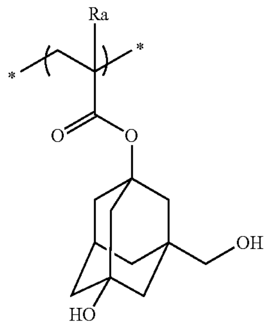
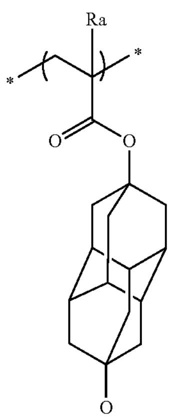
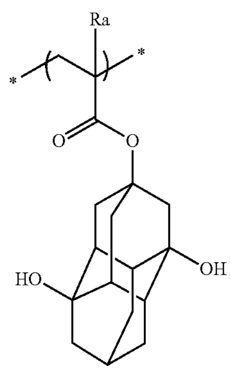
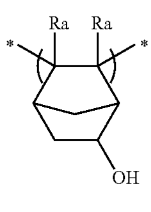
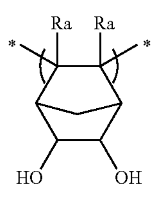
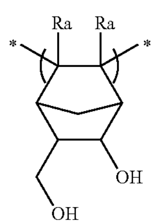
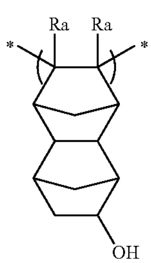
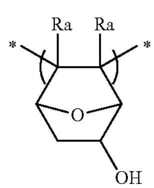
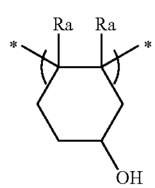

-continued

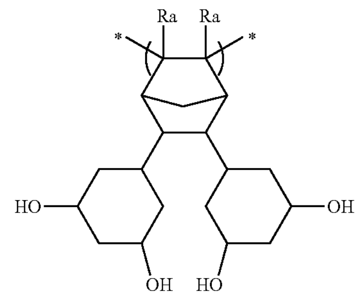
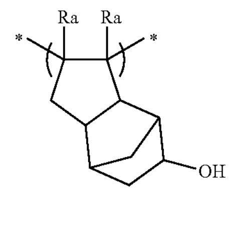
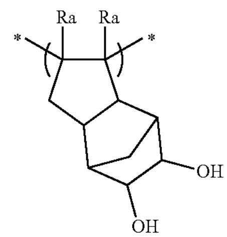
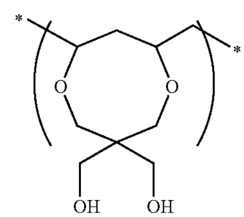

Another preferred example of the repeating unit (3A) may include a repeating unit having a hydroxy group or a cyano group. Thereby, adhesion to a substrate, and affinity for a developer are enhanced.

The repeating unit having the hydroxy group or the cyano group is preferably a repeating unit having an alicylic hydrocarbon structure substituted with the hydroxy group or the cyano group, and preferably has no acid-decomposable group. In the alicylic hydrocarbon structure substituted with the hydroxy group or the cyano group, as the alicylic hydrocarbon structure, an adamantyl group, a diadamantyl group, and a norbornane group are preferred. As the preferred alicylic hydrocarbon structure substituted with the hydroxy group or the cyano group, a partial structure represented by the following Formulas (VIIa) to (VIId) is preferred.

(VIIIa)

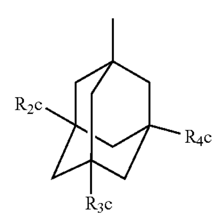

-continued (VIIIb)

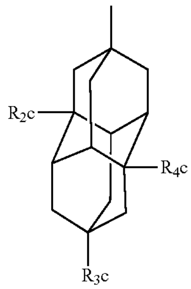

(VIIIc)

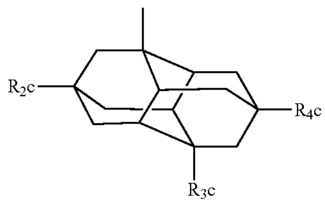

(VIIId)

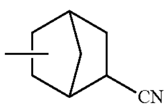

In Formulas (VIIa) to (VIIc),

Each of $R_{2c}$ to $R_{4c}$ independently represents a hydrogen atom, a hydroxy group or a cyano group. At least one of $R_{2c}$ to $R_{4c}$ represents the hydroxy group or the cyano group. Preferably, one or two of $R_{2c}$ to $R_{4c}$ are the hydroxy group while the remainder is the hydrogen atom. In Formula (VIIa), it is more preferred that two of $R_{2c}$ to $R_{4c}$ are the hydroxy group and the remainder is the hydrogen atom.

Examples of the repeating unit having the partial structure represented by Formulas (VIIa) to (VIId) include a repeating unit represented by the following Formulas (AIIa) to (AIId).

(AIIa)

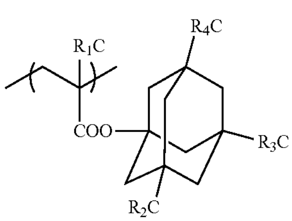

(AIIb)

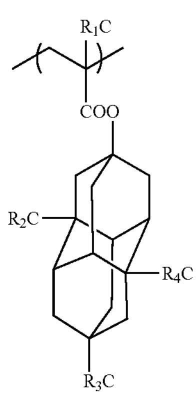

-continued (AIIc)

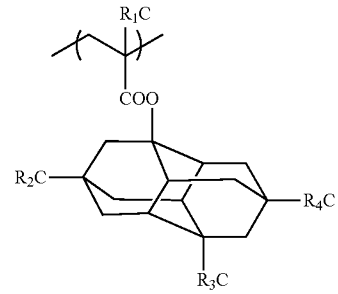

(AIId)

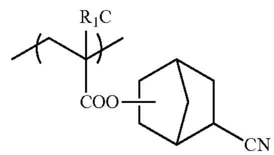

In Formulas (AIIa) to (AIId), $R_{1c}$ represents a hydrogen atom, a methyl group, a trifluoromethyl group or a hydroxymethyl group.

$R_{2c}$ to $R_{4c}$ have the same meaning as $R_{2c}$ to $R_{4c}$ of Formulas (VIIa) to (VIIc).

The content rate of the repeating unit having a hydroxy group or a cyano group, is preferably 5 to 70 mol %, more preferably 5 to 60 mol %, and still more preferably 10 to 50 mol %, based on all the repeating units of the resin (A).

Specific examples of the repeating unit having the hydroxy group or the cyano group will be shown below, but the present invention is not limited thereto.

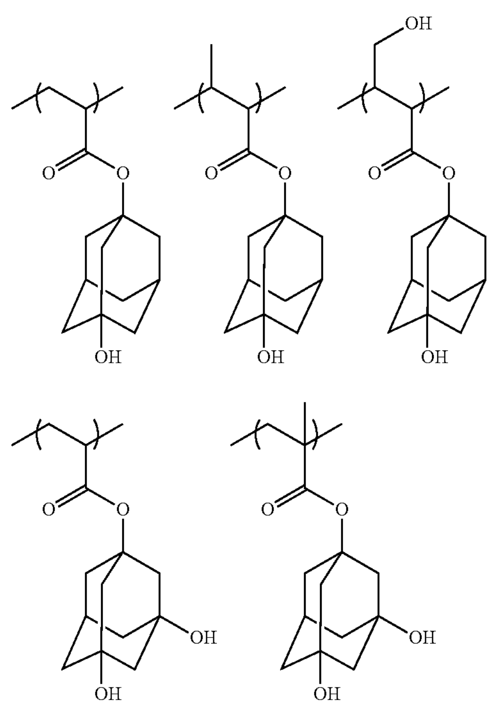

-continued

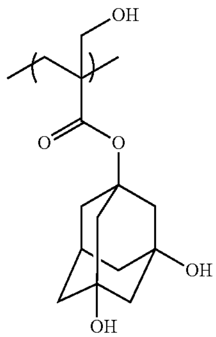

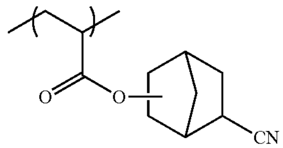

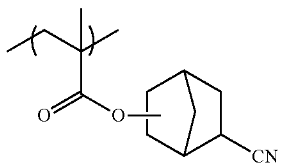

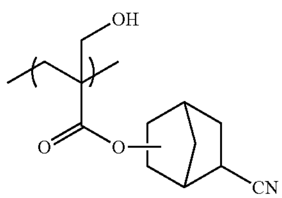

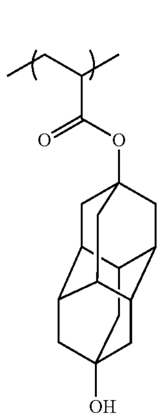

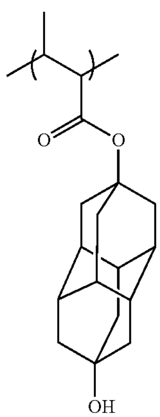

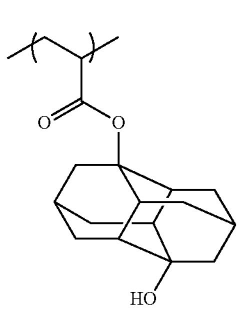

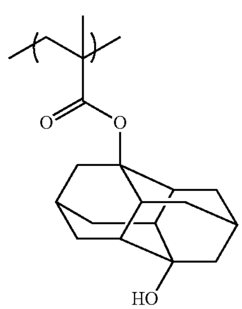

Another preferred example of the repeating unit (3A) includes a repeating unit having a lactone structure.

As an example of the repeating unit having the lactone structure, a repeating unit represented by the following Formula (AII) is more preferred.

(AII)

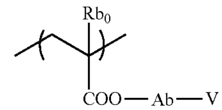

In Formula (AII), $Rb_0$ represents an alkyl group (preferably having 1 to 4 carbon atoms) that may have a hydrogen atom, a halogen atom or a substituent.

Preferred examples of the substituent that may be contained in the alkyl group of $Rb_0$ may include a hydroxyl group and a halogen atom. Examples of the halogen atom of $Rb_0$ may include a fluorine atom, a chlorine atom, a bromine atom, and an oxo atom. As $Rb_0$, the hydrogen atom, the methyl group, the hydroxymethyl group and the trifluoromethyl group are preferred, and the hydrogen atom and the methyl group are particularly preferred.

Ab represents a single bond, an alkylene group, a divalent linking group having a monocyclic or polycyclic cycloalkyl structure, an ether bond, an ester bond, a carbonyl group, or a divalent linking group obtained by combining them with each other. Ab is preferably the single bond and the divalent linking group represented by $-Ab_1-CO_2-$.

$Ab_1$ is a straight or branched alkylene group, a monocyclic or polycyclic cycloalkylene group, and is preferably a methylene group, an ethylene group, a cyclohexylene group, an adamantylene group and a norbonylene group.

V represents a group having a lactone structure.

As the group having the lactone structure, any group may be used as long as it has the lactone structure. However, a lactone structure having a 5- to 7-membered ring is preferred, and a group in which another ring structure is condensed to a lactone structure having a 5- to 7-membered ring in the form of forming a bicyclo structure or a spiro structure is preferred. It is more preferred that the group has a repeating unit having a lactone structure represented by any one of the following Formulas (LC1-1) to (LC1-17). Further, the lactone structure may be bonded directly to the main chain. A preferred lactone structure is (LC1-1), (LC1-4), (LC1-5), (LC1-6), (LC1-8), (LC1-13) and (LC1-14).

LC1-1

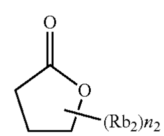

LC1-2

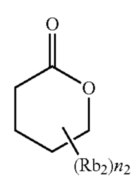

LC1-3

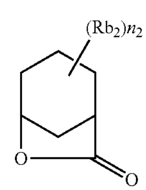

-continued

LC1-4

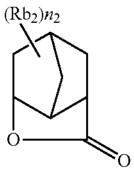

LC1-5

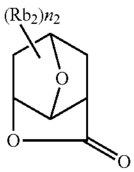

LC1-6

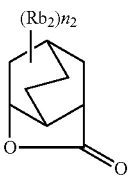

LC1-7

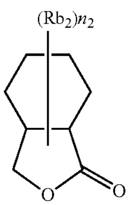

LC1-8

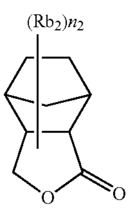

LC1-9

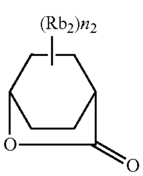

LC1-10

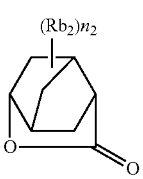

LC1-11

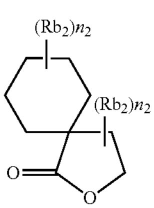

-continued

LC1-12

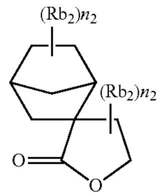

LC1-13

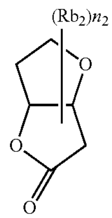

LC1-14

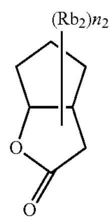

LC1-15

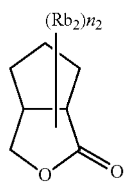

LC1-16

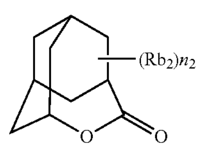

LC1-17

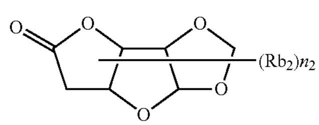

The lactone structure moiety may or may not have a substituent ($Rb_2$). Preferred examples of the substituent ($Rb_2$) may include an alkyl group having 1 to 8 carbon atoms, a monovalent cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, an acid-decomposable group and the like. An alkyl group having 1 to 4 carbon atoms, a cyano group and an acid-decomposable group are more preferred. $n_2$ represents an integer of 0 to 4. When $n_2$ is 2 or more, substituents ($Rb_2$) may be same as or different, and a plurality of substituents ($Rb_2$) may combine with each other to form a ring.

The repeating unit having a lactone group usually has an optical isomer, and any optical isomer may be used. In addition, one kind of optical isomer may be used alone, or a plurality of optical isomers may be used in mixtures. When one kind of optical isomer is mainly used, the optical purity (ee) thereof is preferably 90% or more, and more preferably 95% or more.

The resin (A) may or may not contain a repeating unit having a lactone structure, but when the resin (A) contains the repeating unit having a lactone structure, the content of the repeating unit in the resin (A) is in a range of preferably 1 to 70 mol %, more preferably 3 to 65 mol %, and still more preferably 5 to 60 mol %, based on all the repeating units.

Hereinafter, specific examples of the repeating unit having a lactone structure in the resin (A) will be shown, but the present is not limited thereto. In the formula, Rx represents H, $CH_3$, $CH_2OH$ or $CF_3$.

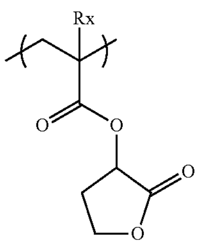
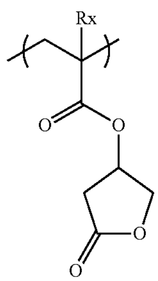
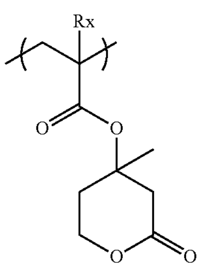
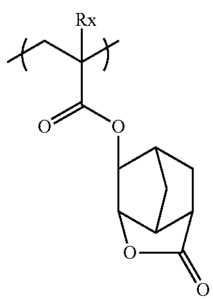
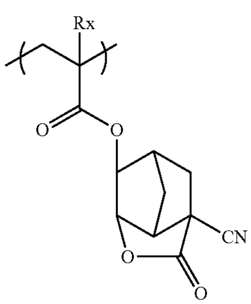
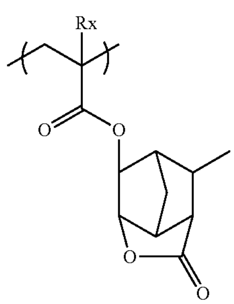
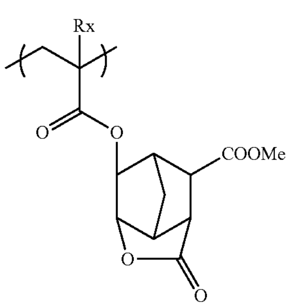
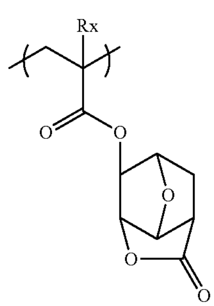

-continued

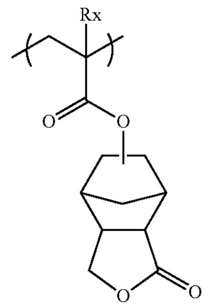
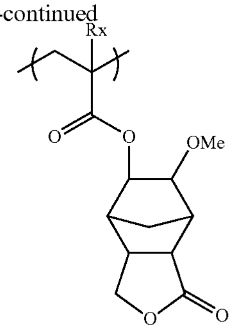
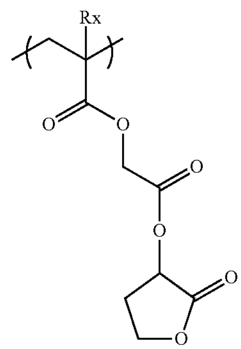
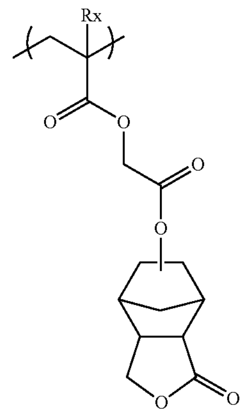
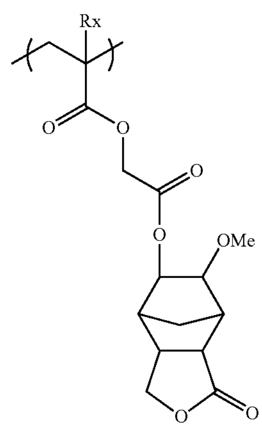
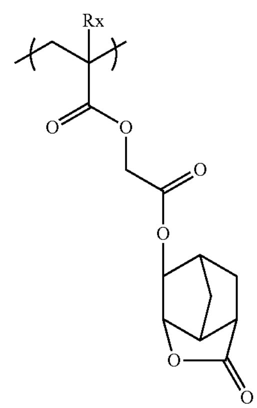
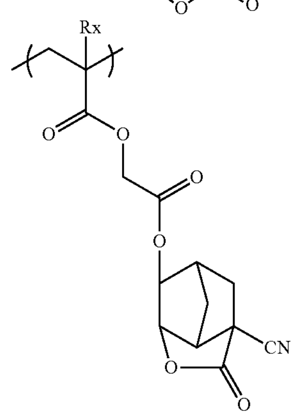

Other preferred examples of the repeating unit (3A) may include a group having an acidic group, such as a phenolic hydroxyl group, a carboxyl acid group, a sulfonate group, a fluorinated alcohol group (for example, a hexafluoroisopropanol group), a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, a tris(alkylsulfonyl)methylene group and the like. This repeating unit (3A) more preferably has a carboxyl group, and, as suitable examples, includes a repeating unit derived from methacrylic acid, a repeating unit derived from acrylic acid, a repeating unit having a carboxyl group via a linking group, or a repeating unit that will be shown below.

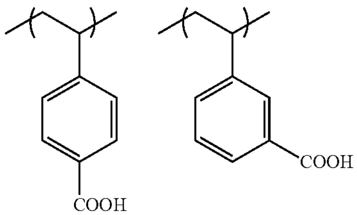

By containing the repeating unit having the aforementioned group, the resolution increases in the usage of contact holes. As for the repeating unit (3A), a repeating unit in which the aforementioned group is directly bonded to the main chain of the resin (A), such as a repeating unit by acrylic acid or methacrylic acid, or a repeating unit in which the aforementioned group is bonded to the main chain of the resin (A) through a linking group, and a repeating unit in which the aforementioned group is introduced into the end of the polymer chain by using a polymerization initiator or a chain transfer agent each having the aforementioned group at the time of polymerization are all preferred. The linking group may have a monocyclic or polycyclic cyclic hydrocarbon structure. A repeating unit derived from acrylic acid or methacrylic acid is particularly preferred.

Specific examples of the repeating unit having the aforementioned group will be shown below, but the present invention is not limited thereto.

In the specific examples, Rx represents H, $CH_3$, $CH_2OH$ or $CF_3$.

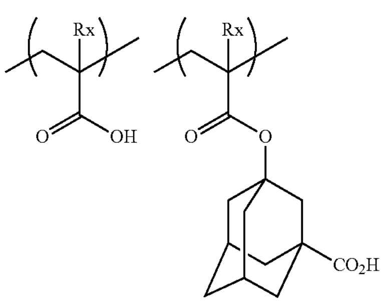

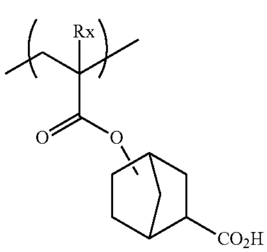

-continued

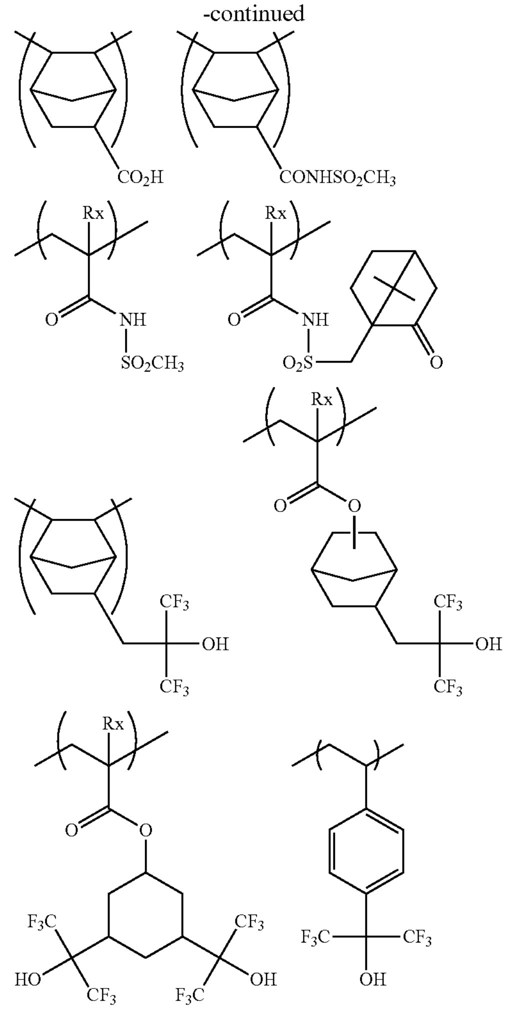

Further, examples of the repeating unit having a phenolic hydroxyl group may include a repeating unit represented by the following Formula (I).

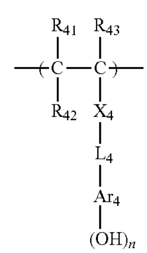

(I)

In the formula,

Each of $R_{41}$, $R_{42}$ and $R_{43}$ independently represents a hydrogen atom, an alkyl group, a halogen atom, a cyano group or an alkoxy carbonyl group. $R_{42}$ and $Ar_4$ may combine with each other to form a ring. In this case, $R_{42}$ represents a single bond or an alkylene group.

$X_4$ represents a single bond, —COO—, or —$CONR_{64}$—, and $R_{64}$ represents a hydrogen atom or an alkyl group.

$L_4$ represents a single bond or an alkylene group.

$Ar_4$ represents a (n+1)-valent aromatic ring group, and represents a (n+2)-valent aromatic ring group when $Ar_4$ combines with $R_{42}$ to form a ring.

n represents an integer of 1 to 4.

Specific examples of the alkyl group, the cycloalkyl group, the halogen atom, the alkoxy carbonyl group, and the substituent thereof of $R_{41}$, $R_{42}$ and $R_{43}$ in Formula (I) are the same as the specific examples described for respective groups represented by $R_{51}$, $R_{52}$ and $R_{53}$ in Formula (V).

$Ar_4$ represents a (n+1)-valent aromatic ring group. When n is 1, the divalent aromatic ring group may have a substituent. Preferred examples thereof may include an arylene group having 6 to 18 carbon atoms, such as a phenylene group, a tolylene group, a naphthylene group or an anthracenylene group, or an aromatic ring group including a heterocyclic ring, such as thiophene, furan, pyrrole, benzothiophene, benzofuran, benzopyrrole, triazine, imidazole, benzoimidazole, triazole, thiadiazole or thiazole.

When n is an integer of 2 or more, as a specific example of the (n+1)-valent aromatic ring group, a group obtained by dividing any (n−1) hydrogen atoms from the specific example of the divalent aromatic ring group may be suitably used.

The (n+1)-valent aromatic ring group may further have a substituent.

The substituent, contained in the alkyl group, the cycloalkyl group, the alkoxy carbonyl group, the alkylene group and the (n+1)-valent aromatic ring group, includes an alkyl group, an alkoxy group such as a methoxy group, an ethoxy group, a hydroxyethoxy group, a propoxy group, a hydroxypropoxy group or a butoxy group, and an aryl group such as a phenyl group, which have been described as the example for $R_{51}$ to $R_{53}$ in Formula (V).

The alkyl group of $R_{64}$ in —CONR$_{64}$— ($R_{64}$ represents a hydrogen atom and an alkyl group) represented by $X_4$ is the same as the alkyl group of $R_{61}$ to $R_{63}$.

$X_4$ is preferably a single bond, —COO— and —CONH—, and more preferably the single bond and —COO—.

Examples of the alkylene group in $L_4$ may preferably include a group having 1 to 8 carbon atoms, such as a methylene group, an ethylene group, a propylene group, a butylene group, a hexylene group or an octylene group, which may have a substituent.

As $Ar_4$, an aromatic ring group of 6 to 18 carbon atoms that may have a substituent is more preferred, and a benzene ring group, a naphthalene ring group and a biphenylene ring group are particularly preferred.

The repeating unit (b) preferably has a hydroxystyrene structure. That is, $Ar_4$ is preferably a benzene ring group.

The resin (A) of the present invention preferably has a repeating unit represented by Formula (I). In this case, particularly, both $X_4$ and $L_4$ are more preferably a single bond.

Although specific examples of the repeating unit represented by Formula (I) will be shown below, the present invention is not limited thereto. In the formula, a represents 1 or 2.

(B-1)

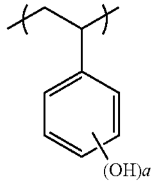

-continued (B-2)

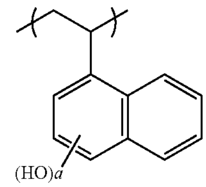

(B-3)

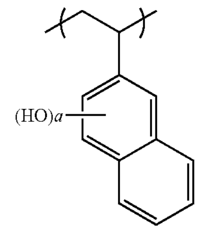

(B-4)

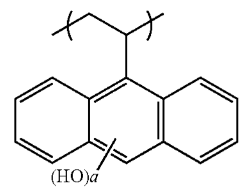

(B-5)

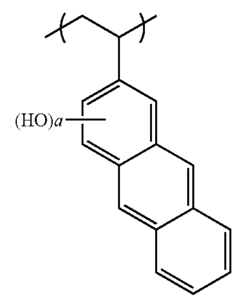

(B-6)

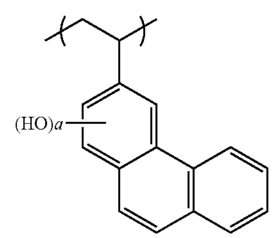

(B-7)

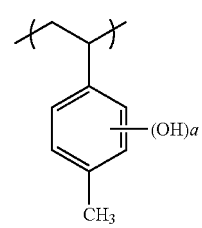

(B-8)

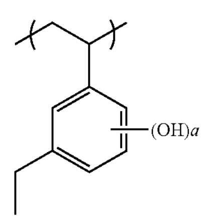

-continued
(B-9)
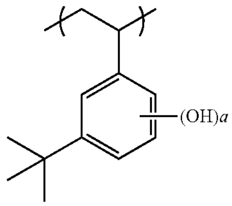
(B-10)
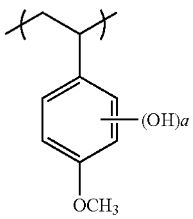
(B-11)
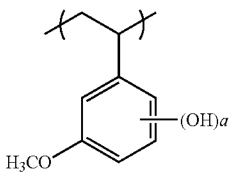
(B-12)
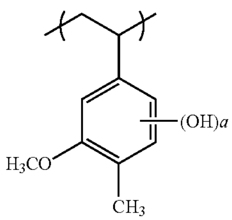
(B-13)
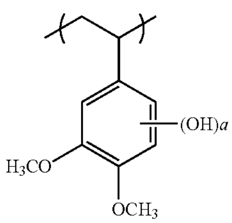
(B-14)
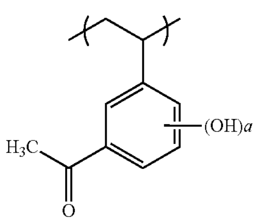
(B-15)
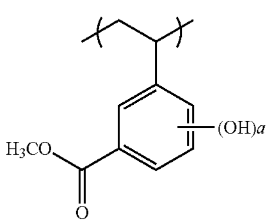
-continued
(B-16)
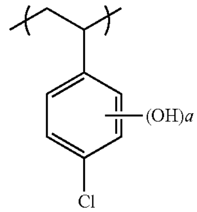
(B-17)
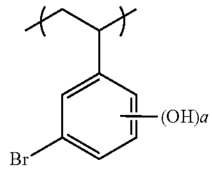
(B18)
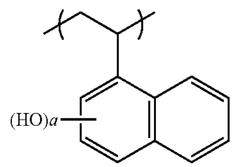
(B-19)
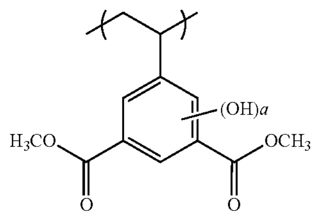
(B-20)
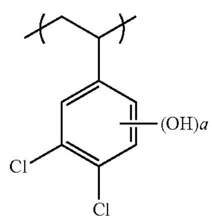
(B-21)
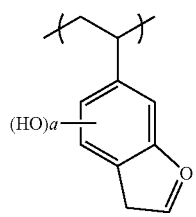
(B-22)
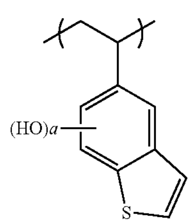
(B-23)
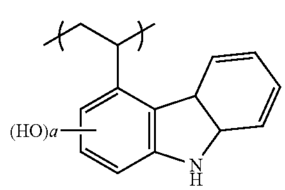

-continued (B-24)

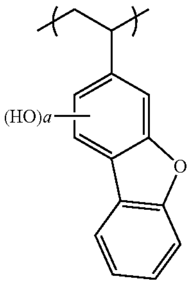

(B-25)

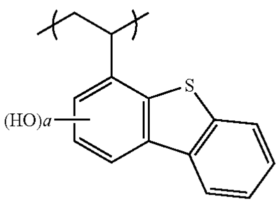

(B-26)

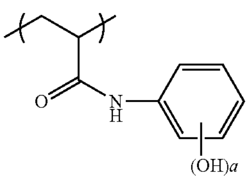

(B-27)

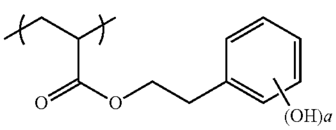

(B-28)

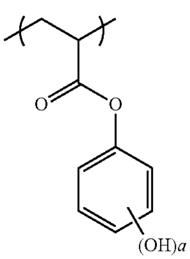

(B-29)

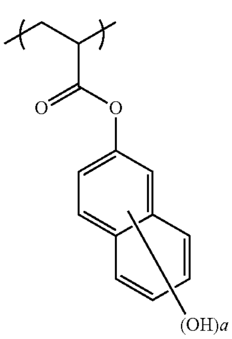

-continued (B-30)

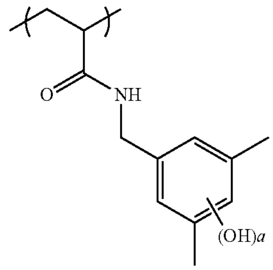

The resin (A) may include two or more repeating units (I).

The resin (A) may or may not contain the repeating unit (I). In the case of containing the repeating unit (I), the content rate of the repeating unit (I) is preferably 10 to 70 mol %, more preferably 15 to 50 mol %, and still more preferably 20 to 40 mol %, based on all the repeating units of the resin (A).

(3B) Repeating Unit that has an Alicyclic Hydrocarbon Structure Having No Polar Group and does not Exhibit Acid Decomposability The resin (A) may further include a repeating unit (3B) that has the alicyclic hydrocarbon structure having no polar group and does not exhibit acid decomposability. Examples of the repeating unit (3B) may include a repeating unit represented by Formula (IV).

(IV)

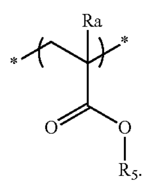

In Formula (IV), $R_5$ has at least one cyclic structure, and represents a hydrocarbon group that has no both a hydroxyl group and a cyano group.

Ra represents a hydrogen atom, an alkyl group or a —$CH_2$—O—$Ra_2$ group. In the formula, $Ra_2$ represents a hydrogen atom, an alkyl group or an acyl group. Ra is preferably a hydrogen atom, a methyl group, a hydroxymethyl group, and a trifluoromethyl group and particularly preferably a hydrogen atom and a methyl group.

The cyclic structure of $R_5$ includes a monocyclic hydrocarbon group and a polycyclic hydrocarbon group. Examples of the monocyclic hydrocarbon group may include a cycloalkyl group having 3 to 12 carbon atoms, such as a cyclopentyl group, a cyclohexyl group, a cycloheptyl group or a cyclooctyl group, and a cycloalkenyl group having 3 to 12 carbon atoms, such as a cyclohexenyl group. The monocyclic hydrocarbon group is preferably a monocyclic hydrocarbon group having 3 to 7 carbon atoms, and more preferably a cyclopentyl group and a cyclohexyl group.

The polycyclic hydrocarbon group includes a ring-aggregated hydrocarbon group and a crosslinked cyclic hydrocarbon group, and examples of the ring-aggregated hydrocarbon group may include a bicyclohexyl group, a perhydronaphthalenyl group and the like. Examples of the crosslinked cyclic hydrocarbon ring may include a bicyclic hydrocarbon ring group such as a pinnae ring, a bornane ring, a norpinane ring, a norbornane ring and a bicyclooctane ring (a bicyclo[2.2.2]octane ring, a bicyclo[3.2.1]octane ring and the like), a tricyclic hydrocarbon ring such as a homobrendane ring, an adamantine ring, a tricyclo[5.2.1.$0^{2,6}$]decane ring and a tricyclo[4.3.1.$1^{2,5}$]undecane ring, a tetracyclic hydrocarbon ring such as a tetracyclo[4.4.0.$1^{2,5}$.$1^{7,10}$]dodecane ring and a perhydro-1,4-methano-5,8-methanonaphthalene ring, and the like. Furthermore, the crosslinked cyclic hydrocarbon ring also includes a condensed cyclic hydrocarbon ring, for example, a condensed ring in which a plurality of 5 to 8-membered cycloalkane rings such as a perhydronaphthalene (decalin) ring, a perhydroanthracene ring, a perhydrophenanthrene ring, a perhydroacenaphthene ring, a perhydrofluorene ring, a perhydroindene ring, and a perhydrophenalene ring is condensed.

Preferred examples of the crosslinked cyclic hydrocarbon ring may include a norbornyl group, an adamantyl ring, a bicyclooctanyl group, a tricyclo[5.2.1.$0^{2,6}$]decanyl group and the like. More preferred examples of the crosslinked cyclic hydrocarbon ring may include a norbornyl group and an adamantyl ring.

The alicyclic hydrocarbon group may have a substituent, and preferred examples thereof may include a halogen atom, an alkyl group, a hydroxyl group protected by a protecting group, an amino group protected by a protecting group and the like. Preferred examples of the halogen atom may include a bromine atom, a chlorine atom and a fluorine atom, and preferred examples of the alkyl group may include a methyl group, an ethyl group, a butyl group and a t-butyl group. The alkyl group may further have a substituent, and examples of the substituent may include a halogen atom, an alkyl group, a hydroxyl group protected by a protecting group and an amino group protected by a protecting group.

Examples of the protecting group may include an alkyl group, a cycloalkyl group, an aralkyl group, a substituted methyl group, a substituted ethyl group, an alkoxy carbonyl group, and an aralkyloxycarbonyl group. Preferred examples of the alkyl group may include an alkyl group having 1 to 4 carbon atoms, preferred examples of the substituted methyl group may include a methoxymethyl group, a methoxythiomethyl group, a benzyloxymethyl group, a t-butoxymethyl group and a 2-methoxyethoxymethyl group, preferred examples of the substituted ethyl group may include a 1-ethoxy ethyl group and a 1-methyl-1-methoxyethyl group, and preferred examples of the acyl group may include an aliphatic acyl group having 1 to 6 carbon atoms, such as a formyl group, an acetyl group, a propionyl group, a butyryl group, an isobutyryl group, a valeryl group and a pivaloyl group, and preferred examples of the alkoxy carbonyl group may include an alkoxy carbonyl group having 1 to 4 carbon atoms.

The resin (A) may or may not contain a repeating unit (3B). If the resin (A) contains the repeating unit (3B), the content rate of the repeating unit (3B) is preferably 1 to 40 mol %, and more preferably 1 to 20 mol %, based on all the repeating units of the resin (A).

Specific examples of the repeating unit (3B) will be described below, but the present invention is not limited thereto. In the formula, Ra represents H, $CH_3$, $CH_2OH$ or $CF_3$.

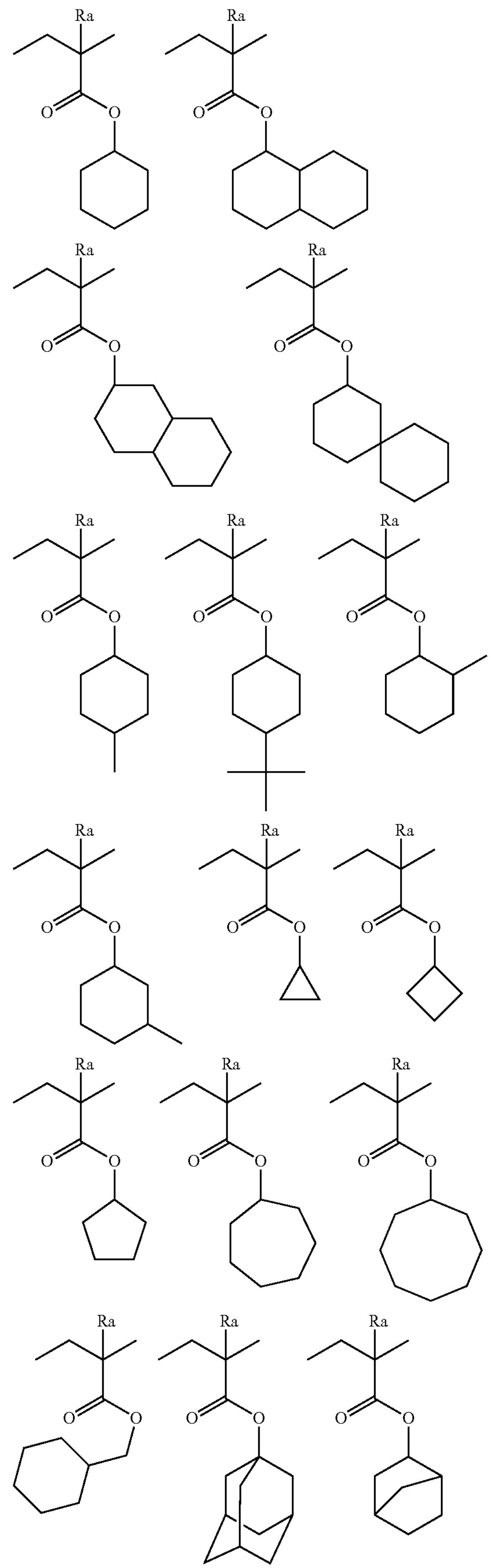

-continued

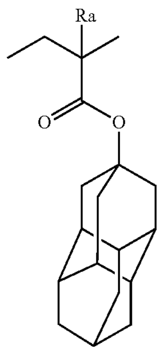

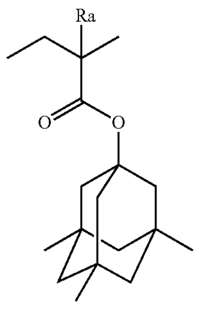

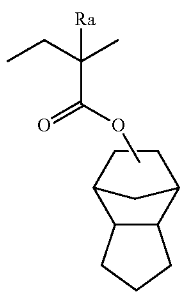

(3C) Other Types of Repeating Units

The resin (A) may have, in addition to the above-described repeating structural unit, various repeating structural units for the purpose of controlling the dry etching resistance, suitability for a standard developer, adhesion to a substrate, a resist profile, internal filtering properties by the absorption of out-of-band light (light leakage occurring in an ultraviolet range having a wavelength from 100 to 400 nm) of EUV light (hereinafter referred to as the internal filtering properties), and resolution, heat resistance, sensitivity and the like, which are properties generally required for the resist.

Examples of the repeating unit may include a compound having one addition-polymerizable unsaturated bond selected from acrylic acid esters, methacrylic acid esters, acrylamides, methacrylamides, allyl compounds, vinyl ethers, vinyl esters and the like.

Further, examples of another repeating unit (3C) may include a repeating unit having an aromatic ring (but, this repeating unit is different from the repeating unit (R), the repeating unit having the acid-decomposable group, and the repeating unit (3A)).

The resin (A) may or may not contain another repeating unit (3C). If the resin (A) contains the repeating unit (3C), the content rate of the repeating unit (3C) is preferably 10 to 50 mol %, and more preferably 1 to 40 mol %, based on all the repeating units of the resin (A).

Specific examples of the repeating unit (3C) will be described below, but the present invention is not limited thereto. In the formula, Ra represents H, $CH_3$, $CH_2OH$ or $CF_3$.

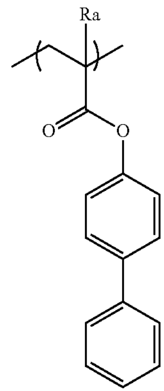

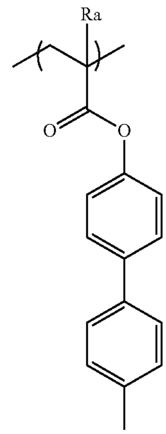

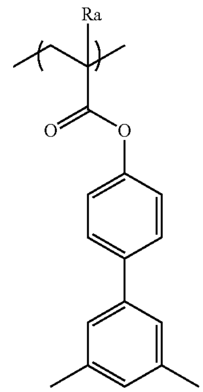

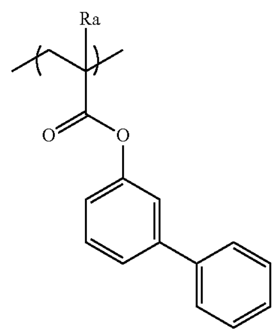

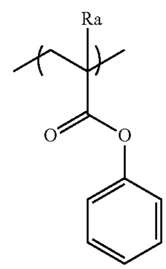

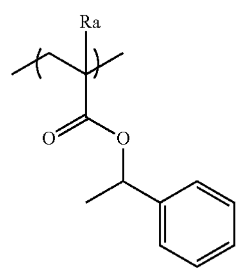

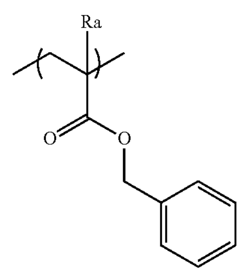

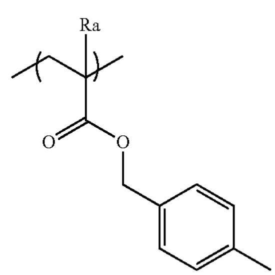

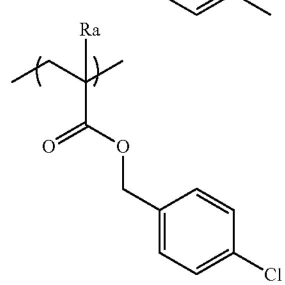

-continued

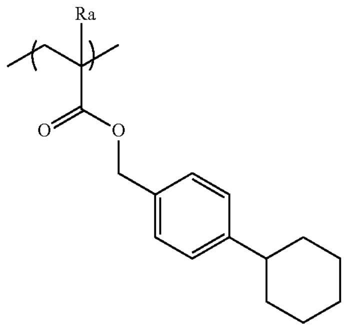

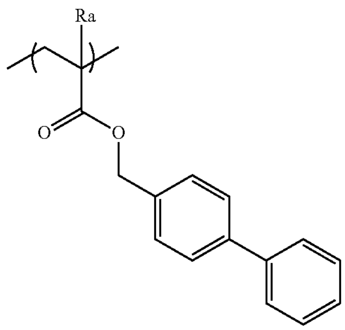

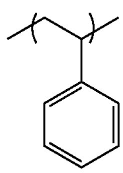

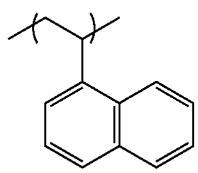

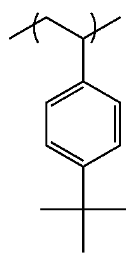

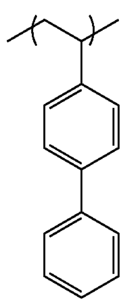

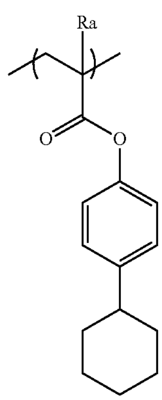

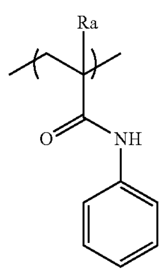

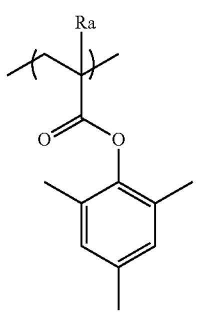

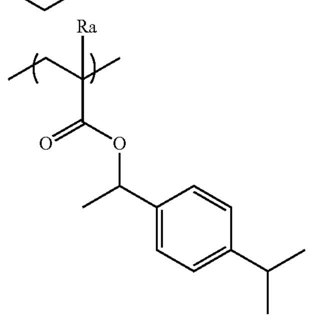

-continued

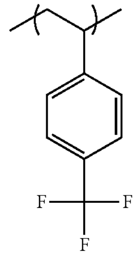

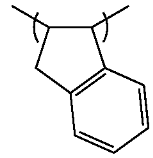

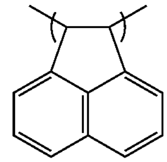

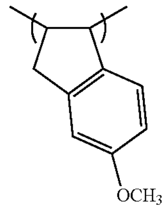

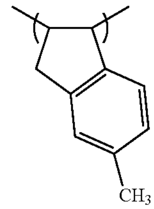

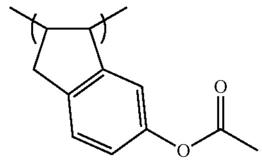

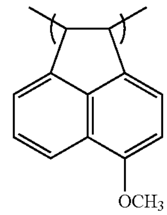

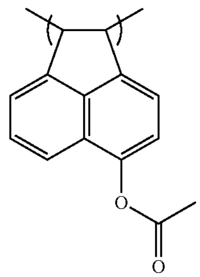

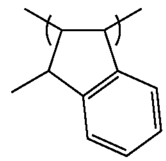

Accordingly, the performance required for the resin (A) used in the composition according to the present invention, particularly (1) solubility for a coating solvent, (2) film-forming property (glass transition temperature), (3) developability for an organic solvent, (4) film reduction (selection of a hydrophilic, hydrophobic or polar group)

(5) adhesion of unexposed portion to the substrate, (6) dry etching resistance, (7) internal filtering properties and the like may be finely adjusted.

Other than these, an addition-polymerizable unsaturated compound that is copolymerizable with the monomers corresponding to the above-described various repeating structural units may be copolymerized.

Further, in the resin (A), the molar ratio of respective repeating structural units contained is appropriately set in order to control dry etching resistance, suitability for a standard developer, adhesion to a substrate, a pattern shape, internal filtering properties, resolution, heat resistance, sensitivity and the like of the composition.

In the exposure using an electron beam or extreme-ultraviolet light, the exposed portion should sufficiently emit secondary electrons to provide high sensitivity. To this end, the resin (A) is preferably resin having a repeating unit with an aromatic ring. Moreover, as for the EUV exposure, the above-described out-of-band light impairs the surface roughness of the resist film, thus causing a reduction in resolution or a deterioration in film reduction due to a bridge pattern or the disconnection of a pattern. Thus, in view of high resolution and performance of decrease in film reduction, it is preferred the resin having the aromatic ring functioning as the internal filter is used to absorb the out-of-band light. In view of this, the repeating unit having aromatic rings other than the repeating unit (R) in the resin (A) is preferably 5 to 100 mol % and more preferably 10 to 100 mol %, with respect to all the repeating units except the repeating unit (R).

The resin (A) of the present invention may be synthesized by a typical method (for example, radical polymerization). Examples of a general synthesis method may include a batch polymerization method of dissolving monomer species and an initiator in a solvent and heating the solution to perform the polymerization, a dropping polymerization method of adding dropwise a solution containing monomer species and an initiator to a heated solvent over 1 to 10 hours, and the like, and the dropping polymerization method is preferred. Examples of a reaction solvent may include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which will be described below, such as propylene glycol monomethyl ether acetate, propylene glycol monomethyl ether, and cyclohexanone. The polymerization is more preferably performed by using the same solvent as the solvent used in the composition of the present invention. Accordingly, generation of particles during storage may be suppressed. The polymerization reaction is preferably performed under an inert gas atmosphere such as nitrogen and argon. As for the polymerization initiator, the polymerization is initiated by using a commercially available radical initiator (azo-based initiator, peroxide and the like). The radical initiator is preferably an azo-based initiator, and an azo-based initiator having an ester group, a cyano group or a carboxyl group is preferred. Preferred examples of the initiator may include azobisisobutyronitrile, azobisdimethylvaleronitrile, dimethyl 2,2'-azobis(2-methylpropionate) and the like. The initiator is added additionally or in parts, if desired, and after the completion of reaction, the reaction product is poured in a solvent, and a desired polymer is recovered by a powder or solid recovery method, and the like. The reaction concentration is 5 to 50% by mass, and preferably 10 to 30% by mass. The reaction temperature is usually 10° C. to 150° C., preferably 30° C. to 120° C., and more preferably 60° C. to 100° C.

The weight average molecular weight of resin is preferably 1,000 to 200,000, more preferably 2,000 to 20,000, still more preferably 3,000 to 15,000, and particularly preferably 3,000 to 10,000, in terms of polystyrene by the GPC method. By setting the weight average molecular weight within 1,000 to 200,000, it is possible to prevent the heat resistance or dry etching resistance from deteriorating and prevent the film-forming property from deteriorating due to impaired developability or increased viscosity. The weight average molecular weight (Mw), the number average molecular weight (Mn), and the polydispersity (Mw/Mn) of the resin is defined as a value converted in terms of polystyrene by GPC measurement (solvent: tetrahydrofuran, column: TSK gel Multipore HXL-M manufactured by TOSOH CORPORATION, column temperature: 40° C., flow velocity: 1.0 mL/min, detector: RI).

The polydispersity (molecular weight distribution) is usually in a range of 1.0 to 3.0, preferably 1.0 to 2.6, and more preferably 1.0 to 2.0. Generally, the smaller the molecular weight distribution is, the better the resolution, resist shape and roughness are.

The resin may be used either alone or in combination of a plurality thereof. In an aspect of the present invention, the blending ratio of resin (P) in the total composition is preferably 30 to 99.5% by mass, and more preferably 60 to 95% by mass, based on the total solid content of the composition.

Further, resins other than the above-described resin may be used in combination without negatively affecting the present invention. For example, resin (hydrophobic resin that will be described below is excluded) having no repeating unit (R) may be used in combination with the resin having the repeating unit (R). In this case, a mass ratio of a total amount of the former to a total amount of the latter is preferably 50/50 or more, and more preferably 70/30 or more. Further, in this case, the resin having no repeating unit (R) typically includes a repeating unit with the above-described acid-decomposable group.

[B] Solvent

The composition according to the present invention contains a solvent. The solvent preferably includes at least one of (S1) propylene glycol monoalkyl ethercarboxylate, and (S2) at least one selected from a group consisting of propylene glycol monoalkyl ether, ester lactate, ester acetate, alkoxy ester propionate, chained ketone, cyclic ketone, lactone, and alkylene carbonate. Also, the solvent may further contain components other than component (S1) and (S2).

The inventors has found that the use of the solvent and the above-described resin in combination enhances the coatability of the composition, and makes it possible to form a pattern having less defects in development. The reason is not necessarily clear, but the inventors think that the solvent has a good balance with the solubility, boiling point, and viscosity of the above-described resin, thus contributing to suppress the non-uniform thickness of a composition film or the generation of a precipitate during spin coating.

The component (S1) is preferably at least one selected from a group consisting of propylene glycol monomethyl ether acetate, propylene glycol monomethyl ether propionate, and propylene glycol monoethyl ether acetate, and the propylene glycol monomethyl ether acetate is particularly preferred.

As the component (S2), the following is preferred.

The propylene glycol monoalkyl ether is preferably propylene glycol monomethyl ether or propylene glycol monoethyl ether.

The ester lactate is preferably ethyl lactate, butyl lactate, or propyl lactate.

The ester acetate is preferably methyl acetate, ethyl acetate, butyl acetate, isobutyl acetate, propyl acetate, isoamyl acetate, methyl formate, ethyl formate, butyl formate, propyl formate, or 3-methoxybutyl acetate.

The alkoxy ester propionate is preferably 3-methoxymethyl propionate (MMP), or 3-ethoxy ethyl propionate (EEP).

The chained ketone is preferably 1-octanone, 2-octanone, 1-nonanone, 2-nonanone, acetone, 4-heptanone, 1-hexanone, 2-hexanone, diisobutyl ketone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, or methyl amyl ketone.

The cyclic ketone is preferably methylcyclohexanone, isophorone, or cyclohexanone.

The lactone is preferably γ-butyrolactone.

The alkylene carbonate is preferably propylene carbonate.

As the component (S2), propylene glycol monomethyl ether, ethyl lactate, 3-ethoxy ethyl propionate, methyl amyl ketone, cyclohexanone, butyl acetate, pentyl acetate, γ-butyrolactone or propylene carbonate is more preferred.

As the component (S2), a component having a flash point (hereinafter referred to as fp) of 37° C. or more is preferred. As such a component (S2), propylene glycol monomethyl ether (fp: 47° C.), ethyl lactate (fp: 53° C.), 3-ethoxy ethyl propionate (fp: 49° C.), methyl amyl ketone (fp: 42° C.), cyclohexanone (fp: 44° C.), pentyl acetate (fp: 45° C.), γ-butyrolactone (fp: 101° C.) or propylene carbonate (fp: 132° C.) is preferred. Among them, the propylene glycol monoethyl ether, the ethyl lactate, the pentyl acetate, or the cyclohexanone are more preferred, and the propylene glycol monoethyl ether or the ethyl lactate are particularly preferred. Here, the "flash point" means a value that is listed in a reagent catalogue of Tokyo Chemical Industry Co., Ltd. or Sigma-Aldrich Corporation.

The solvent preferably contains the component (S1). The solvent substantially consists of only the component (S1), or more preferably is a solvent produced by mixing the component (S1) with another component. In the latter case, the solvent more preferably contains both the component (S1) and the component (S2).

The mass ratio of the component (S1) to the component (S2) is preferably in a range of 100:0 to 15:85, more preferably 100:0 to 40:60, and still more preferably 100:0 to 60:40. That is, the solvent preferably consists of only the component (S1), or contains both the component (S1) and the component (S2), the mass ratio of which is as follows. That is, in the latter case, the mass ratio of the component (S1) to the component (S2) is preferably 15/85 or more, more preferably 40/60 or more, and still more preferably 60/40. Such a configuration enables the defects in development to be further reduced.

Further, when the solvent contains both the component (S1) and the component (S2), the mass ratio of the component (S1) to the component (S2) is set to 99/1 or less, for example.

As described above, the solvent may further include components other than the components (S1) and (S2). In this case, the content of the components other than the components (S1) and (S2) is preferably in a range of 5% by mass to 30% by mass, based on the total amount of the solvent.

The content of the solvent occupied in the composition is set such that the solid concentration in the entire component is preferably in a range of 2 to 30% by mass, and more preferably 3 to 20% by mass. This can further enhance the coatability of the composition.

[C] Acid Generator

The composition according to the present invention may further contain the acid generator as well as the resin. Such an acid generator is typically in the form of a low-molecular compound, namely, is a compound that has a molecular weight of 3,000 or less, preferably 2,000 or less, and more preferably 1,000 or less.

Further, the composition according to the present invention may contain the acid generator, but preferably has no acid generator.

The acid generator is not limited particularly, but examples thereof may include compounds represented by the following Formulas (ZI'), (ZII') or (ZIII').

The acid generator is not limited particularly, but examples thereof may preferably include compounds represented by the following formulas (ZI'), (ZII') or (ZIII').

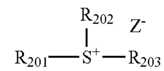

(ZI')

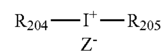

(ZII')

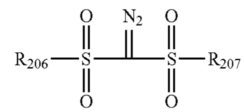

(ZIII')

In Formula (ZI'),

Each of $R_{201}$, $R_{202}$ and $R_{203}$ independently represents an organic group.

The organic group of $R_{201}$, $R_{202}$ and $R_{203}$ generally has 1 to 30 carbon atoms, and preferably 1 to 20 carbon atoms.

Further, two of $R_{201}$ to $R_{203}$ may combine with each other to form a ring structure, and may include an oxygen atom, a sulfur atom, an ester bond, an amide bond and a carbonyl group in a ring. Examples of a group obtained by combining two of $R_{201}$ to $R_{203}$ with each other may include an alkylene group (for example, a butylene group, a pentylene group).

$Z^-$ represents a non-nucleophilic anion.

Examples of $Z^-$ may include a sulfonate anion (an aliphatic sulfonate anion, an aromatic sulfonate anion, a camphorsulfonate anion and the like), a carboxylate anion (an aliphatic carboxylate anion, an aromatic carboxylate anion, an aralkylcarboxylate anion and the like), a sulfonylimide anion, a bis(alkylsulfonyl)imide anion, a tris(alkylsulfonyl) methide anion and the like.

An aliphatic moiety in the aliphatic sulfonate anion and the aliphatic carboxylate anion may be an alkyl group or a cycloalkyl group, and preferred examples thereof may include a straight or branched alkyl group having 1 to 30 carbon atoms and a cycloalkyl group having 3 to 30 carbon atoms.

Examples of the aromatic group in the aromatic sulfonate anion and the aromatic carboxylate anion may preferably include an aryl group having 6 to 14 carbon atoms, such as a phenyl group, a tolyl group and a naphthyl group.

The alkyl group, the cycloalkyl group and the aryl group that have been described above by way of example may have a substituent. Specific examples thereof may include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxy carbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), a cycloalkylary-l.oxyalkyloxy group (preferably having 8 to 20 carbon atoms) and the like. As for the aryl group and the ring structure of each group, the alkyl group (preferably having 1 to 15 carbon atoms) may be used as an example of the substituent.

Preferred examples of the aralkyl group in the aralkylcarboxylate anion may include an aralkyl group having 6 to 12 carbon atoms, such as a benzyl group, a phenethyl group, a naphthylmethyl group, a naphthylethyl group and a naphthylbutyl group.

Examples of the sulfonylimide anion may include a saccharin anion.

The alkyl group in the bis(alkylsulfonyl)imide anion and the tris(alkylsulfonyl)methide anion is preferably an alkyl group having 1 to 5 carbon atoms. Examples of the substituent of the alkyl group may include a halogen atom, an alkyl group substituted with a halogen atom, an alkoxy group, an alkylthio group, an alkyloxysulfonyl group, an aryloxysulfonyl group, a cycloalkylaryloxysulfonyl group and the like, and the alkyl group substituted with the fluorine atom or the fluorine atom is preferred.

Examples of other $Z^-$ may include phosphorus fluoride, boron fluoride, antimony fluoride, and the like.

$Z^-$ is preferably an aliphatic sulfonate anion in which at least an α-position of sulfonic acid is substituted with a fluorine atom, an aromatic sulfonate anion substituted with a fluorine atom or a group having a fluorine atom, a bis(alkylsulfonyl)imide anion in which the alkyl group is substituted with a fluorine atom, or a tris(alkylsulfonyl) methide anion in which the alkyl group is substituted with a fluorine atom. The non-nucleophilic anion is more preferably a perfluoroaliphatic sulfonate anion (still more preferably having 4 to 8 carbon atoms) and a benzenesulfonate anion having a fluorine atom, and still more preferably a nonafluorobutanesulfonate anion, a perfluorooctanesulfonate anion, a pentafluorobenzenesulfonate anion and a 3,5-bis(trifluoromethyl)benzenesulfonate anion.

In view of acid strength, the generated acid preferably has pKa of −1 or less so as to enhance sensitivity.

Examples of the organic group of $R_{201}$, $R_{202}$ and $R_{203}$ may include an aryl group (preferably having 6 to 15 carbon atoms), a straight or branched alkyl group (preferably having 1 to 10 carbon atoms), a cycloalkyl group (preferably having 3 to 15 carbon atoms) and the like.

At least one of $R_{201}$, $R_{202}$ and $R_{203}$ is preferably the aryl group, and all of them are more preferably the aryl group. As the aryl group, a heteroaryl group such as an indole residue and a pyrrole residue is possible, in addition to a phenyl group, a naphthyl group and the like. The aryl group may further include a substituent. Examples of the substituent may include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxy carbonyl group (preferably having 2 to 7 carbon atoms), an acyl group (preferably having 2 to 12 carbon atoms), an alkoxycarbonyloxy group (preferably having 2 to 7 carbon atoms) and the like, but are not limited thereto.

Further, two selected from $R_{201}$, $R_{202}$ and $R_{203}$ may combine with each other through a single bond or a linking group. Examples of the linking group may include an alkylene group (preferably having 1 to 3 carbon atoms), —O—, —S—, —CO—, —$SO_2$— and the like, but are not limited thereto.

When at least one of $R_{201}$, $R_{202}$ and $R_{203}$ is not an aryl group, examples of a preferred structure may include a cationic structure such as compounds of paragraphs [0047] and [0048] of Japanese Patent Application Laid-Open No. 2004-233661 and of paragraphs [0040] to [0046] of Japanese Patent Application Laid-Open No. 2003-35948, compounds represented by Formulas (I-1) to (I-70) in U.S. Patent Laid-Open Publication No. 2003/0224288, and compounds represented by Formulas (IA-1) to (IA-54) and Formulas (IB-1) to (IB-24) in U.S. Patent Laid-Open Publication No. 2003/0077540.

In Formula (ZII') and (ZIII'), each of $R_{204}$ to $R_{207}$ independently represents an aryl group, an alkyl group or a cycloalkyl group.

The aryl group, the alkyl group and the cycloalkyl group of $R_{204}$ to $R_{207}$ are the same as the aryl group, the alkyl group and the cycloalkyl group of $R_{201}$ to $R_{203}$ in the compound (ZI').

The aryl group, the alkyl group and the cycloalkyl group of $R_{204}$ to $R_{207}$ may have a substituent. As this substituent, the substituent that may be included in the aryl group, the alkyl group and the cycloalkyl group of $R_{201}$ to $R_{203}$ in the compound (ZI') may be used.

$Z^-$ represents a non-nucleophilic anion, and examples thereof are the same as those of the non-nucleophilic anion of $Z^-$ in Formula (ZI').

Examples of the acid generator may further include compounds represented by the following Formulas (ZIV'), (ZV') and (ZVI').

(ZIV')

$$Ar_3—SO_2—SO_2—Ar_4$$

(ZV')

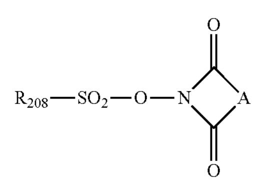

(ZVI')

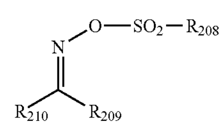

In Formulas (ZIV') to (ZVI'),

Each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Among the acid generators, particularly preferred examples thereof will be described below.

(z1)

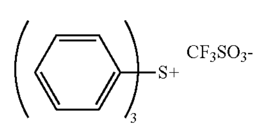

(z2)

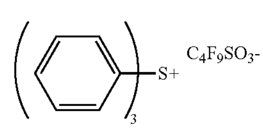

-continued
(z3)
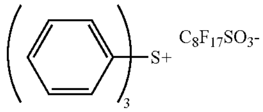
(z4)
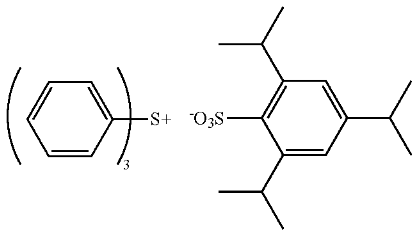
(z5)
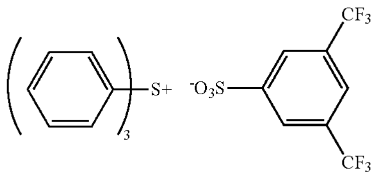
(z6)
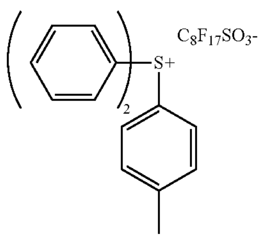
(z7)
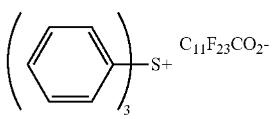
(z8)
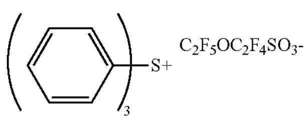
(z9)
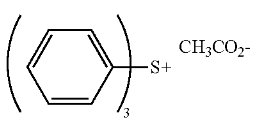
(z10)
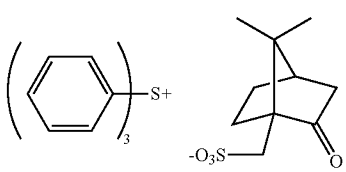
(z11)
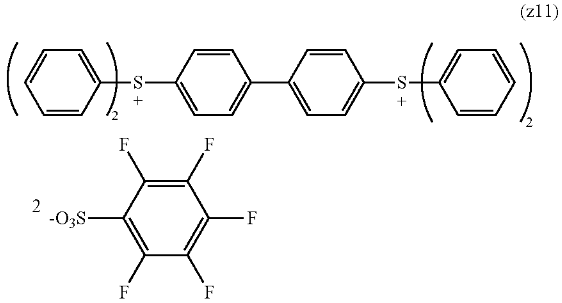
-continued
(z12)
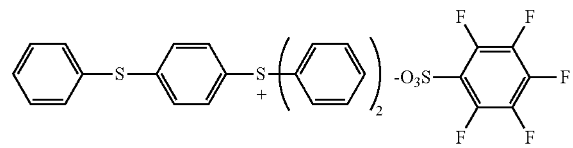
(z13)
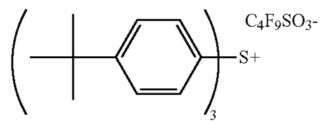
(z14)
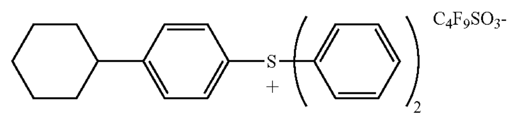
(z15)
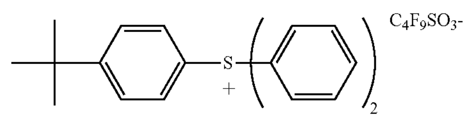
(z16)
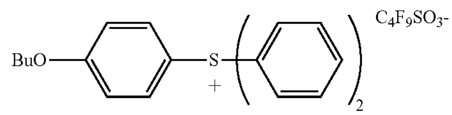
(z17)
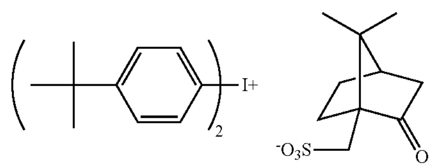
(z18)
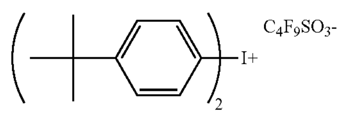
(z19)
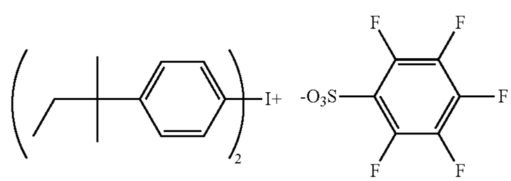
(z20)
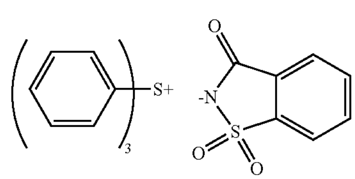
(z21)
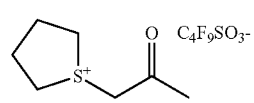
(z22)
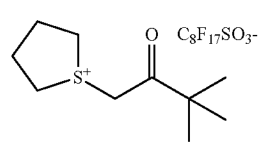

-continued
(z23)
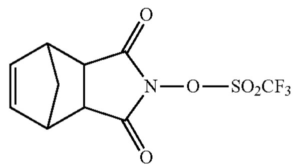
(z24)
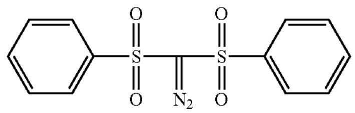
(z25)
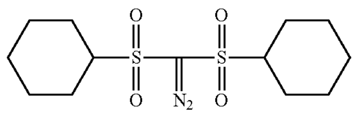
(z26)
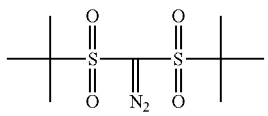
(z27)
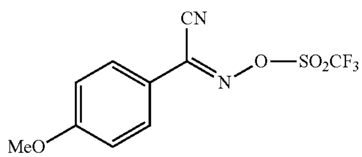
(z28)
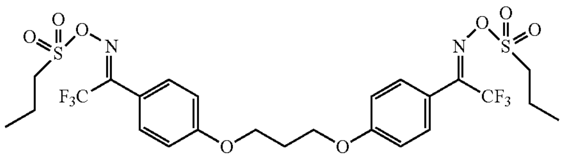
(z-29)
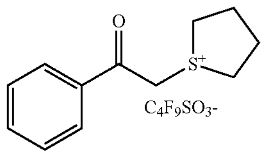
(z30)
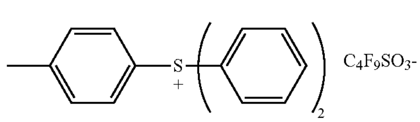
(z31)
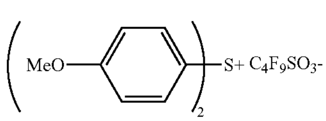
(z32)
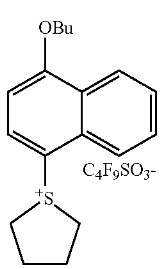
-continued
(z33)
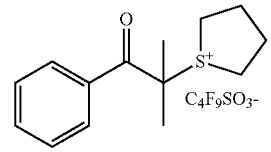
(z34)
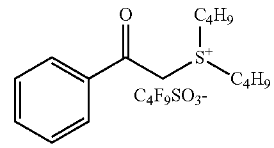
(z35)
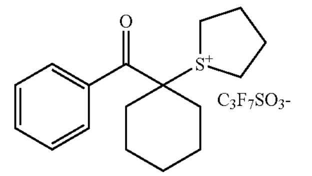
(z36)
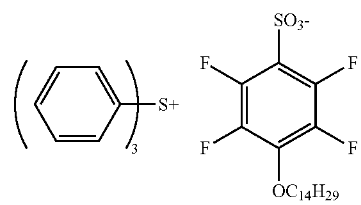
(z37)
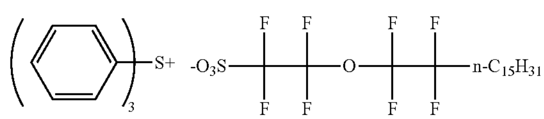
(z38)
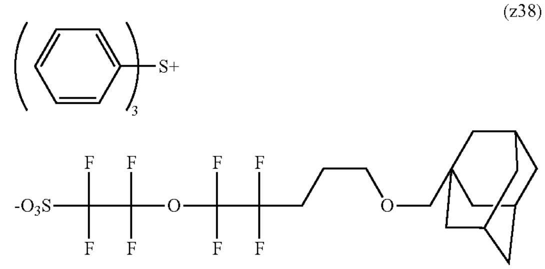
(z39)
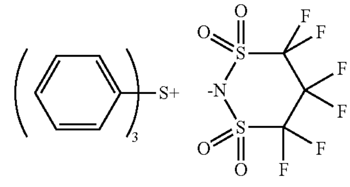
(z40)
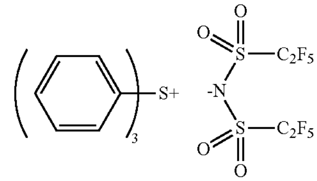

-continued
(z41)
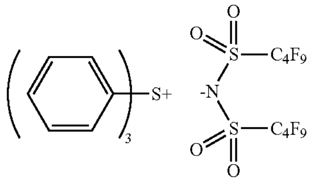
(z42)
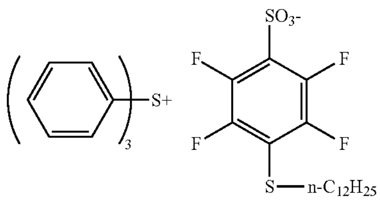
(z43)
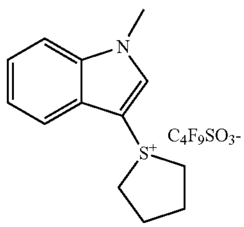
(z44)
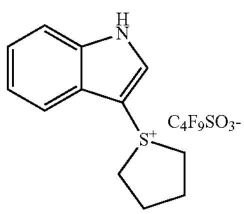
(z45)
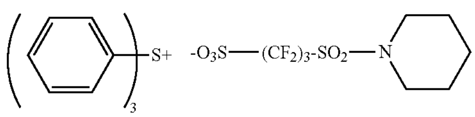
(z46)
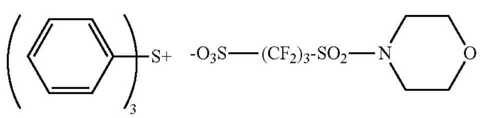
(z47)
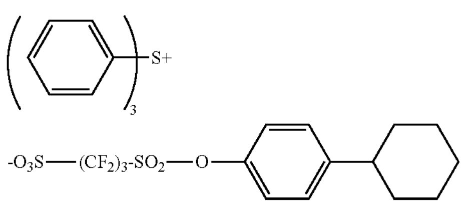
(z48)
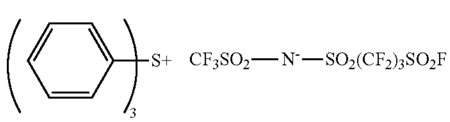
(z49)
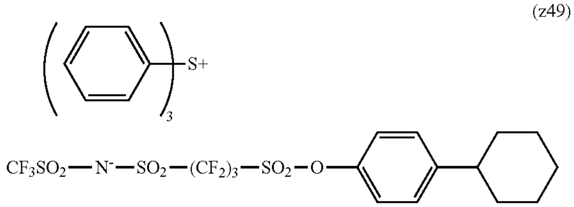
-continued
(z50)
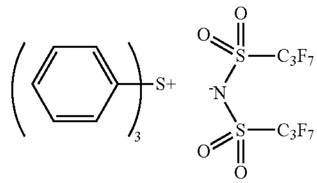
(z51)
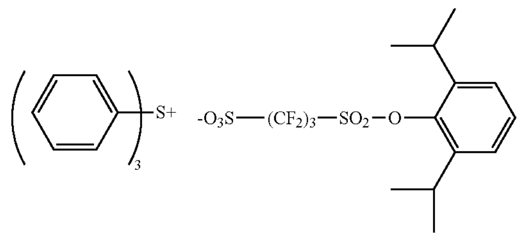
(z52)
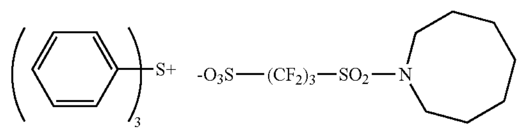
(z53)
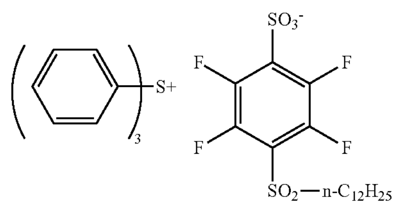
(z54)
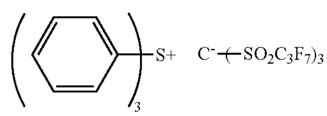
(z55)
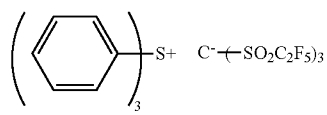
(z56)
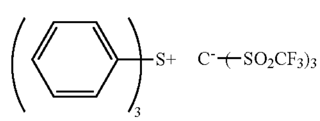
(z57)
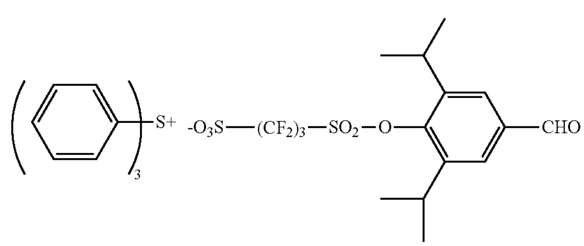
(z58)
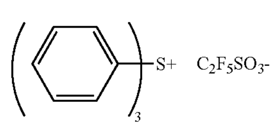

-continued (z59)

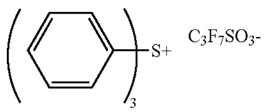

(z60)

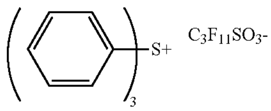

(z61)

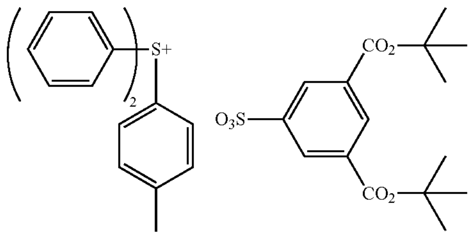

(z62)

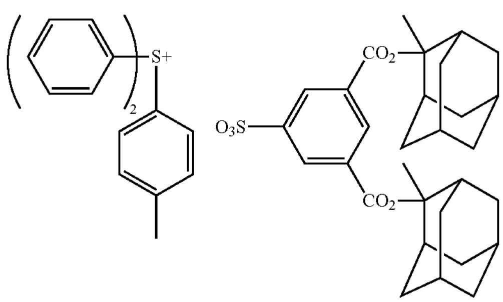

(z63)

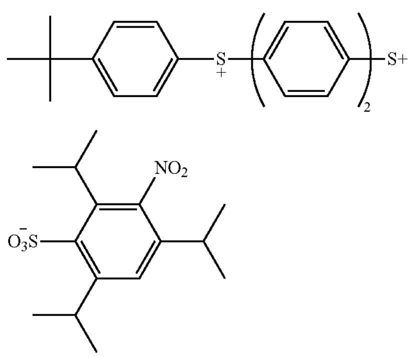

(z64)

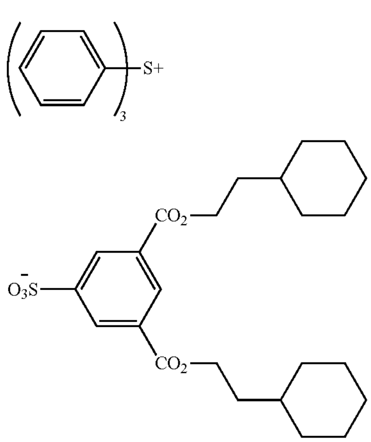

-continued (z65)

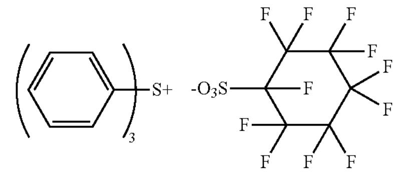

(z66)

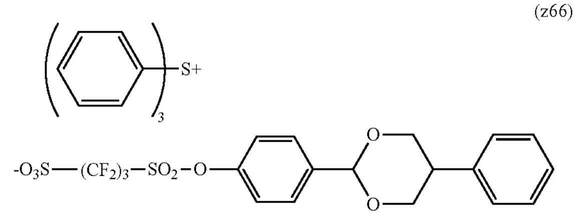

(z67)

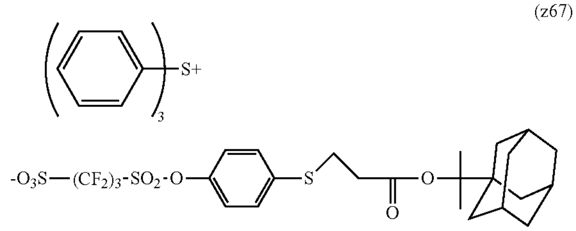

(z68)

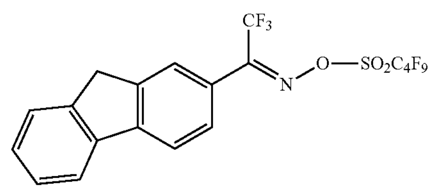

(z69)

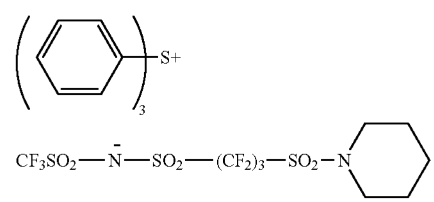

(z70)

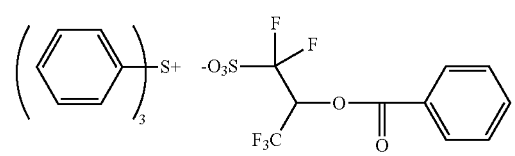

The acid generators are used either alone or in combination of two or more thereof.

The actinic ray-sensitive or radiation-sensitive resin composition used in the present invention may or may not contain the acid generator. If the composition contains the acid generator, the content rate of the acid generator in the acid generator composition is preferably 0.1 to 20% by mass, more preferably 0.5 to 10% by mass, and still more preferably 1 to 7% by mass, based on the total solid content of the composition.

[D] Basic Compound

The actinic ray-sensitive or radiation-sensitive resin composition according to the present invention may further include a basic compound. The basic compound is preferably a compound that is stronger in basicity than phenol. Further, the basic compound is preferably an organic basic compound, and more preferably a nitrogen-containing basic compound.

The nitrogen-containing basic compound that may be used in the invention is not limited particularly, and examples thereof may include compounds of the following classification (1) to (7).

(1) Compound Represented by Formula (BS-1)

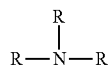

(BS-1)

In Formula (BS-1),

Each R independently represents a hydrogen atom or an organic group. But, at least one of three R is an organic group. The organic group is a straight or branched alkyl group, a monocyclic or polycyclic cycloalkyl group, an aryl group or an aralkyl group.

The carbon number in the alkyl group as R is not particularly limited, but is usually 1 to 20 and preferably 1 to 12.

The carbon number in the cycloalkyl group as R is not particularly limited, but is usually 3 to 20 and preferably 5 to 15.

The carbon number in the aryl group as R is not particularly limited, but is usually 6 to 20 and preferably 6 to 10. Specific examples thereof may include a phenyl group, a naphthyl group and the like.

The carbon number in the aralkyl group as R is not particularly limited, but is usually 7 to 20 and preferably 7 to 11. Specific examples thereof may include a benzyl group and the like.

In the alkyl group, the cycloalkyl group, the aryl group and the aralkyl group as R, a hydrogen atom thereof may be substituted with a substituent. Examples of the substituent may include an alkyl group, a cycloalkyl group, an aryl group, an aralkyl group, a hydroxy group, a carboxyl group, an alkoxy group, an aryloxy group, an alkylcarbonyloxy group, an alkyloxycarbonyl group and the like.

Further, a compound represented by Formula (BS-1) is preferably a compound in which at least two of R are organic groups.

Specific examples of the compound represented by Formula (BS-1) may include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, and 2,4,6-tri(t-butyl)aniline.

Further, preferred examples of a basic compound represented by Formula (BS-1) may include an alkyl group in which at least one R is substituted with a hydroxy group. Specific examples thereof may include triethanolamine and N,N-dihydroxyethylaniline.

Further, the alkyl group as R may have an oxygen atom in an alkyl chain. That is, an oxyalkylene chain may be formed. As the oxyalkylene chain, —$CH_2CH_2O$— is preferred. Specific examples thereof may include tris(methoxyethoxy ethyl)amine and a compound exemplified after the $60^{th}$ line of column 3 in U.S. Pat. No. 6,040,112.

Among the basic compound represented by Formula (BS-1), in particular, examples of the basic compound having the hydroxyl group or the oxygen atom as described above will be described below.

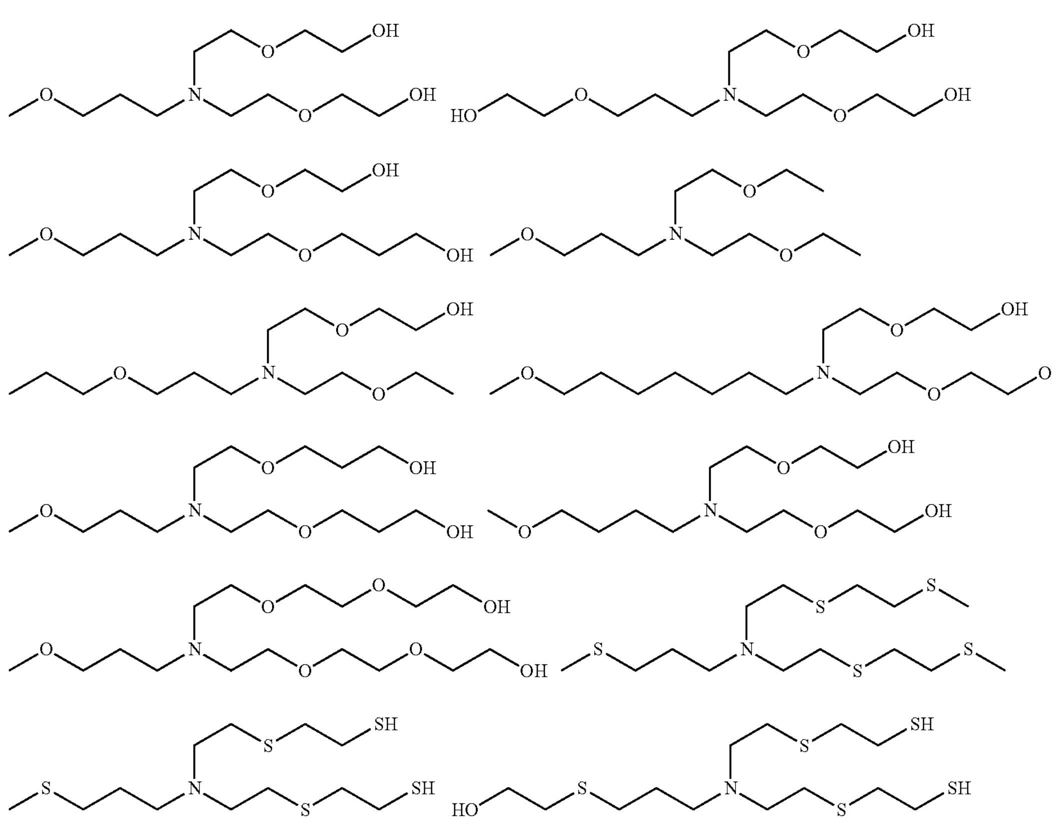

-continued

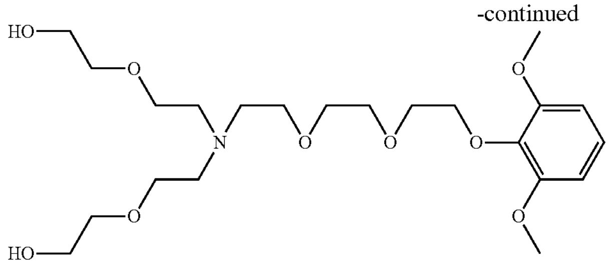

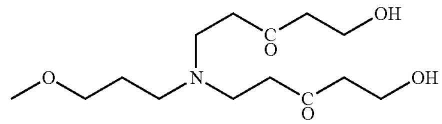

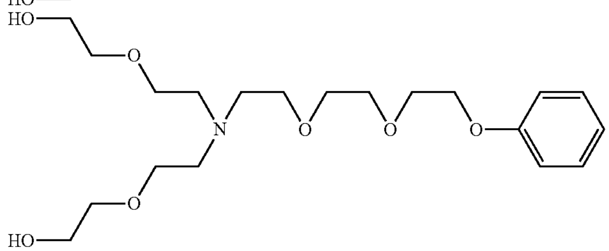

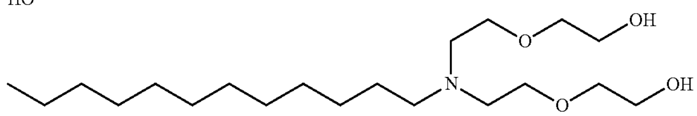

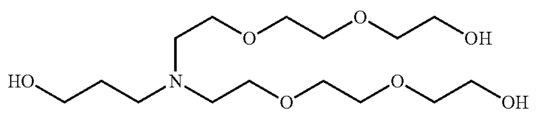

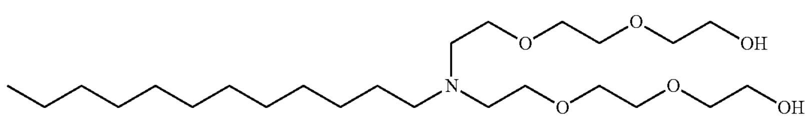

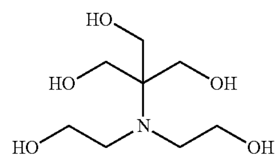

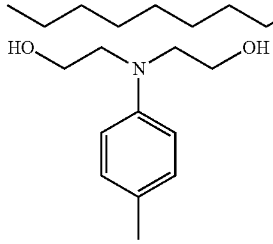

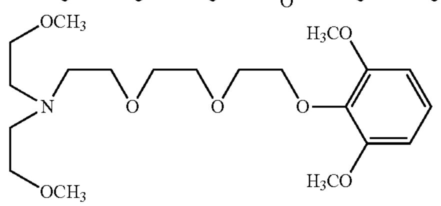

(2) Compound having Nitrogen-Containing Heterocyclic Ring Structure

The nitrogen-containing heterocyclic ring may have or may not have aromaticity. Further, it may have a plurality of nitrogen atoms. In addition, the heterocyclic ring may contain heteroatoms other than nitrogen. Specific examples thereof may include a compound having an imidazole structure (2-phenylbenzoimidazole, 2,4,5-triphenylimidazole and the like), a compound having a piperidine structure [N-hydroxyethylpiperidine and bis(1,2,2,6,6-pentamethyl-4-piperidyl)sebacate and the like], a compound having a pyridine structure (4-dimethylaminopyridine and the like), and a compound having an antipyrine structure (antipyrine, hydroxy antipyrine and the like).

Preferred examples of the compound having the nitrogen-containing heterocyclic ring structure may include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine and aminoalkylmorpholine. They may have a substituent.

Preferred examples of the substituent may include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Particularly preferred examples of the basic compound may include imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6tetramethylpiperidine, 4-piperidinopiperidine, 2-iminopiperidine, 1-(2-aminoethyl)pyrrolidine, pyrazole, 3-amino-5-methyl pyrazole, 5-amino-3-methyl-1-p-tolyl pyrazole, pyrazine, 2-(aminomethyl)-5methylpyrazine, pyrimidine, 2,4-diaminopyrimidine, 4,6-dihydroxypyrimidine, 2-pyrazoline, 3-pyrazoline, N-aminomorpholine and N-(2-amino ethyl)morpholine.

Further, a compound having two or more ring structures is appropriately used. Specific examples thereof may include 1,5-diaza bicyclo[4.3.0]non-5-ene and 1,8-diaza bicyclo [5.4.0]-undec-7-ene.

(3) Amine Compound having Phenoxy Group

The amine compound having the phenoxy group is a compound having an N atom of the alkyl group included in the amine compound and a phenoxy group on an opposite end. The phenoxy group may have a substituent such as an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group.

The compound more preferably has at least one oxyalkylene chain between the phenoxy group and the nitrogen atom. The number of oxyalkylene chains in 1 molecule is preferably 3 to 9 and more preferably 4 to 6. Among the oxyalkylene chains, —$CH_2CH_2O$— is particularly preferred.

Specific examples thereof may include 2-[2-{2-(2,2-dimethoxy-phenoxyethoxy)ethyl}-bis-(2-methoxyethyl)]-amine, and compounds (C1-1) to (C3-3) illustrated in paragraph [0066] of U.S. Patent Laid-Open Publication No. 2007/0224539.

For example, the amine compound having the phenoxy group is obtained by heating to react a primary or secondary amine having the phenoxy group with haloalkylether, adding a strong basic aqueous solution such as sodium hydroxide, potassium hydroxide and tetra alkylammonium thereto, and performing extraction with an organic solvent such as ethyl acetate and chloroform. Further, the amine compound having the phenoxy group may be obtained by heating to react a primary or secondary amine with haloalkylether that has the phenoxy group on an end, adding strong basic aqueous solution such as sodium hydroxide, potassium hydroxide and tetra alkylammonium thereto, and performing extraction with an organic solvent such as ethyl acetate and chloroform.

(4) Ammonium Salt

As the basic compound, an ammonium salt can be appropriately used.

As a cation of the ammonium salt, a tetraalkylammonium cation in which an alkyl group having 1 to 18 carbon atoms is substituted is preferred, and a tetramethylammonium cation, a tetraethylammonium cation, a tetra(n-butyl)ammonium cation, a tetra(n-heptyl)ammonium cation, a tetra(n-octyl)ammonium cation, a dimethylhexadecylammonium cation, a benzyltrimethyl cation and the like are more preferred, and a tetra(n-butyl)ammonium cation is most preferred.

Examples of an anion of the ammonium salt may include hydroxide, carboxylate, halide, sulfonate, borate and phosphate. Among them, hydroxide or carboxylate are particularly preferred.

As the halide, chloride, bromide and iodide are particularly preferred.

As the sulfonate, organic sulfonate having 1 to 20 carbon atoms is particularly preferred. Examples of the organic sulfonate may include alkylsulfonate having 1 to 20 carbon atoms and arylsulfonate.

The alkyl group included in the alkylsulfonate may have a substituent. Examples of the substituent may include a fluorine atom, a chlorine atom, a bromine atom, an alkoxy group, an acyl group and an aryl group. Specific examples of the alkylsulfonate may include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate.

Examples of the aryl group may included in the arylsulfonate may include a phenyl group, a naphthyl group and an anthryl group. The aryl group may have a substituent. As an example of the substituent, a straight chain or branched chain alkyl group having 1 to 6 carbon atoms and a cycloalkyl group having 3 to 6 carbon atoms are preferred. Specifically, for example, methyl, ethyl, n-propyl, isopropyl, n-butyl, i-butyl, t-butyl, n-hexyl and cyclohexyl groups are preferred. Examples of another substituent may include an alkoxy group having 1 to 6 carbon atoms, a halogen atom, cyano, nitro, acyl groups and an acyloxy group.

The carboxylate may be aliphatic carboxylate or aromatic carboxylate, and examples thereof may include acetate, lactate, pyruvate, trifluoroacetate, adamantanecarboxylate, hydroxyadamantanecarboxylate, benzoate, naphthoate, salicylate, phthalate, phenolate and the like, and benzoate, naphthoate, phenolate and the like are particularly preferred and benzoate is most preferred.

In this case, as the ammonium salt, tetra(n-butyl)ammonium benzoate, tetra(n-butyl)ammonium benzoate and the like are preferred.

In the case of the hydroxide, the ammonium salt is particularly preferably tetra alkylammoniumhydroxide having 1 to 8 carbon atoms, such as tetra alkylammonium hydroxide (tetramethylammonium hydroxide and tetraethylammonium hydroxide or tetra-(n-butyl)ammonium hydroxide.

In the composition of the present invention, the blending ratio of the compound (PA) in the total composition is preferably 0.1 to 10% by mass and more preferably 1 to 8% by mass based on the total solid content.

(5) Compound (PA) that has an Acceptor-Property Functional Group for a Proton and Further is Capable of Decomposing Upon Irradiation with an Electron Beam or Extreme-Ultraviolet Light to Generate a Compound that is Decreased or Disappears in the Acceptor Property for the Proton or is Changed from the Proton Acceptor Property into Acidity The composition according to the present invention may further include a compound [hereinafter referred to as a compound (PA)] that is a basic compound, has the acceptor-property functional group for the proton, and further is capable of decomposing upon irradiation with an electron beam or extreme-ultraviolet light to generate a compound that is decreased or disappears in the acceptor property for the proton or is changed from the proton acceptor property into acidity.

The compound (PA) that has the acceptor-property functional group for the proton, and further is capable of decomposing upon irradiation with an electron beam or extreme-ultraviolet light to generate a compound that is decreased or disappears in the acceptor property for the proton or is changed from the proton acceptor property into acidity refers to the description of paragraphs 0379 to 0425 of Japanese Patent Laid-Open Publication No. 2012-32762 (corresponding to paragraphs [0386] to [0435] of U.S. Patent Laid-Open Publication No. 2012/0003590), the contents of which are incorporated herein by reference.

In the composition of the present invention, the blending ratio of the compound (PA) in the total composition is preferably 0.1 to 10% by mass and more preferably 1 to 8% by mass based on the total solid content.

(6) Guanidine Compound

The composition of the present invention may further contain a guanidine compound having a structure represented by the following formula.

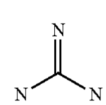

The guanidine compound shows strong basicity because a positive charge of conjugate acid thereof is dispersed and stabilized by 3 nitrogen atoms.

For the basicity of the guanidine compound (A) according to the present invention, pKa of the conjugate acid higher than 6.0 is preferred. pKa of 7.0 to 20.0 is preferred because it shows high neutralization reactivity with acid and is excellent in roughness, and pKa of 8.0 to 16.0 is more preferred.

Such strong basicity suppresses the diffusion of the acid, thus contributing to form an excellent pattern shape.

Further, "pKa" shows pKa in the aqueous solution and is described in chemical handbook (II) (4$^{th}$ revised edition, 1993, The Chemical Society of Japan Maruzen Company, Limited), for example. The lower pKa is, the stronger the acid is. Specifically, pKa in the aqueous solution is measured by measuring an acid dissociation constant at 25° C. using an infinite dilution aqueous solution, and further is obtained by calculation, using the following software package 1, based on the substituent constant of Hammett and values of database of known documents. All the values of pKa described herein show values obtained by calculation using the software package.

Software package1: Advanced Chemistry Development (ACD/Labs) SoftwareV8.14 for Solaris (1994-2007 ACD/Labs).

In the present invention, log P is a value of n-octanol/water distribution coefficient (P), and is an effective parameter that is used to determine hydrophilicity/hydrophobicity for a wide variety of compounds. Generally, it is possible to obtain a distribution coefficient not by experiment but by calculation, and in the present invention, this coefficient shows a value calculated by CSChemDrawUltraVer. 8.0 software package (Crippen's fragmentation method).

Further, log P of the guanidine compound (A) is preferably 10 or less. When log P is 10 or less, this compound can be uniformly contained in the resist film.

In the present invention, log P of the guanidine compound (A) is preferably in a range of 2 to 10, more preferably 3 to 8, and still more preferably 4 to 8.

Further, the guanidine compound (A) of the present invention preferably has no nitrogen atom except the guanidine structure.

Hereinafter, specific examples of the guanidine compound will be described but this invention is not limited thereto.

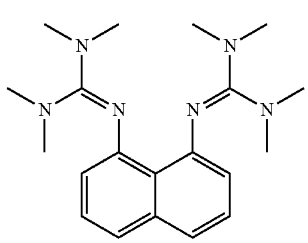

Log P: 4.29

-continued

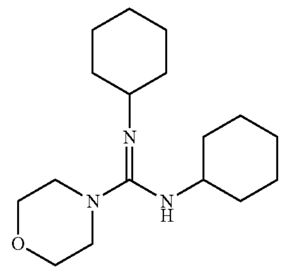

Log P: 3.32

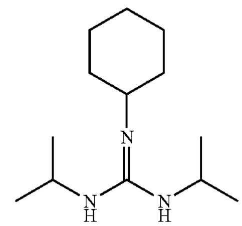

Log P: 3.1

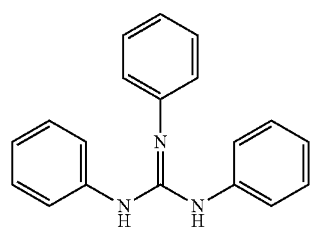

Log P: 5.24

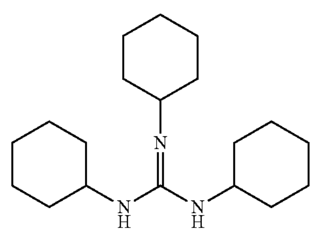

Log P: 4.89

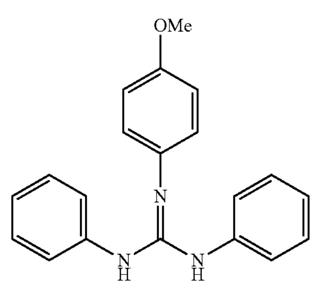

Log P: 5.11

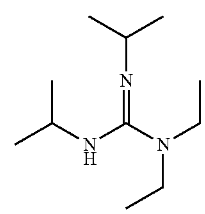

Log P: 2.61

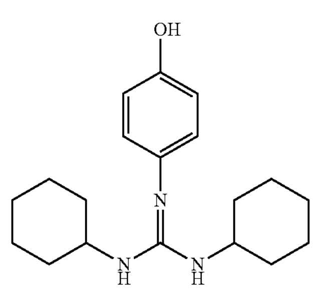

Log P: 4.61

-continued

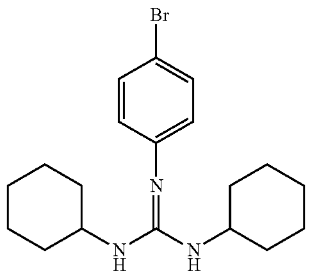

Log P: 5.83

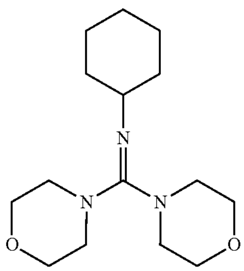

Log P: 1.75

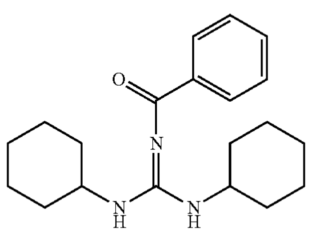

Log P: 4.95

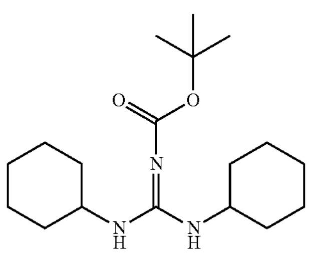

Log P: 4.51

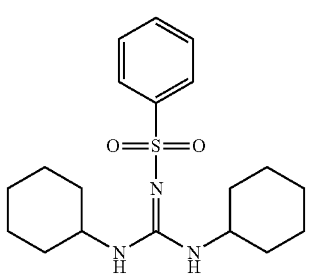

Log P: 4.55

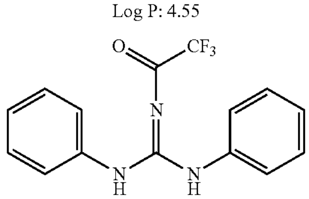

Log P: 4.43

-continued

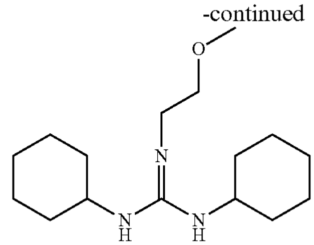

Log P: 3.18

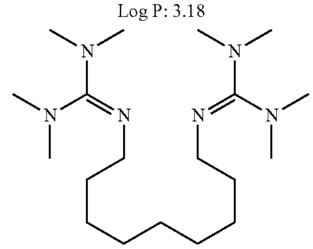

Log P: 4.4

(7) Low-Molecular Compound Having Nitrogen Atom and Group Capable of Leaving by the Action of an Acid The composition, of the present invention has a nitrogen atom, and contains a low-molecular compound (hereinafter referred to as a "low-molecular compound (D)" or a "compound (D)") having the group capable of leaving by the action of an acid. The low-molecular compound (D) preferably has basicity after the group capable of leaving by the action of an acid has left.

The low-molecular compound (D) refers to the description of paragraphs [0324] to [0337] of Japanese Patent Laid-Open Publication No. 2012-133331, the contents of which are incorporated herein by reference.

In the present invention, the low-molecular compound (D) may be used either alone or in combination of two or more thereof Furthermore, a compound synthesized as the example of Japanese Patent Laid-Open Publication No. 2002-363146, a compound described in paragraph 0108 of Japanese Patent Laid-Open Publication No. 2007-298569 and the like may be used as the composition of the present invention.

As the basic compound, a photosensitive basic compound may be used. Examples of the photosensitive basic compound may include compounds described in Japanese Patent Publication No. 2003-524799, J. Photopolym. Sci & Tech. Vol. 8, P. 543-553 (1995) and the like.

The molecular weight of the basic compound is usually 100 to 1,500, preferably 150 to 1,300, and more preferably 200 to 1,000.

The basic compound may be used either alone or in combination of two or more thereof If the composition according to the present invention includes the basic compound, its content is preferably 0.01 to 8.0% by mass, more preferably 0.1 to 5.0% by mass and particularly preferably 0.2 to 4.0% by mass, based on the total solid content of the composition.

[E] Hydrophobic Resin (HR)

The actinic ray-sensitive or radiation-sensitive resin composition of the present invention may have a hydrophobic resin (HR) apart from the resin [A].

It is preferred that the hydrophobic resin (HR) is designed to be unevenly distributed on the surface of the resin film, but unlike a surfactant, the hydrophobic resin (HR) does not need to have a hydrophilic group in the molecule thereof, and may not contribute to the mixing of polar/non-polar materials homogeneously.

The addition of the hydrophobic resin (HR) has the effects of controlling a static/dynamic contact angle of the resist film surface with water and of suppressing out-gas.

Since the hydrophobic resin (HR) is unevenly distributed on the film surface, the hydrophobic resin has preferably one or more of "a fluorine atom", "a silicon atom" and "a $CH_3$ partial structure contained in a side chain moiety of a resin", and more preferably two or more thereof. When the hydrophobic resin (HR) includes the fluorine atom and/or the silicon atom, the fluorine atom and/or the silicon atom in the hydrophobic resin (HR) may be included in the main chain of the resin, and may be included in the side chain thereof.

Further, the hydrophobic resin (HR) preferably contains a group having a fluorine atom, a group having a silicon atom, or a hydrocarbon group having 5 or more carbon atoms. The groups may be included in the main chain of the resin, and may be substituted in the side chain.

When the hydrophobic resin (HR) includes a fluorine atom, the hydrophobic resin (HR) is preferably a resin having an alkyl group having a fluorine atom, a cycloalkyl group having a fluorine atom, or an aryl group having a fluorine atom as a partial structure having a fluorine atom.

The alkyl group (having preferably 1 to 10 carbon atoms, and more preferably 1 to 4 carbon atoms) having a fluorine atom is a straight or branched alkyl group in which at least one hydrogen atom is substituted with a fluorine atom, and may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

The aryl group having a fluorine atom is an aryl group in which at least one hydrogen atom in an aryl group such as a phenyl group and a naphthyl group is substituted with a fluorine atom, and may further have a substituent other than a fluorine atom.

Examples of the repeating unit having the fluorine atom or the silicon atom may include the repeating unit described in paragraph 0519 of U.S. Patent Laid-Open Publication No. 2012/0251948.

Further, as described above, the hydrophobic resin (HR) preferably includes a $CH_3$ partial structure in a side chain moiety.

Here, a $CH_3$ partial structure (hereinafter simply referred to as a "side chain $CH_3$ partial structure") included in the side chain moiety of the hydrophobic resin (HR) includes a $CH_3$ partial structure included in an ethyl group, a propyl group and the like.

Meanwhile, a methyl group (for example, an α-methyl group of the repeating unit having a methacrylic acid structure) directly bonded to the main chain of the hydrophobic resin (HR) slightly contributes to the surface uneven distribution of the hydrophobic resin (HR) due to the effects of the main chain and thus is not included in the $CH_3$ partial structure in the present invention.

More specifically, when the hydrophobic resin (HR) includes a repeating unit derived from a monomer having a polymerizable moiety having a carbon-carbon double bond, such as, for example, a repeating unit represented by the following Formula (M) and when $R_{11}$ to $R_{14}$ are a $CH_3$ "as it is", the $CH_3$ is not included in the $CH_3$ partial structure in the present invention that the side chain moiety has.

Meanwhile, the $CH_3$ partial structure present through any atom from the C—C main chain is assumed to correspond to a $CH_3$ partial structure in the present invention. For example, when $R_{11}$ is an ethyl group ($CH_2CH_3$), $R_{11}$ is assumed to have "one" of the $CH_3$ partial structures in the present invention.

(M)

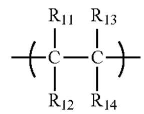

In Formula (M),

Each of $R_{11}$ to $R_{14}$ independently represents a side chain moiety.

Examples of $R_{11}$ to $R_{14}$ in the side chain moiety may include a hydrogen atom, a monovalent organic group and the like.

Examples of the monovalent organic group for $R_{11}$ to $R_{14}$ may include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, an arylaminocarbonyl group and the like, and these groups may further have a substituent.

The hydrophobic resin (HR) is preferably a resin having a repeating unit having a $CH_3$ partial structure at the side chain moiety thereof, and more preferably has at least one repeating unit (x) of a repeating unit represented by the following Formula (II) and a repeating unit represented by the following Formula (III) as the repeating unit.

Hereinafter, the repeating unit represented by Formula (II) will be described in detail.

(II)

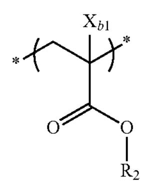

In Formula (II), $X_{b1}$ represents a hydrogen atom, an alkyl group, a cyano group or a halogen atom, and $R_2$ has one or more $CH_3$ partial structures and represents an organic group which is stable against an acid. Here, more specifically, the organic group which is stable against an acid is preferably an organic group which does not have an "acid-decomposable group" described in resin (P).

The alkyl group of $X_{b1}$ is preferably an alkyl group having 1 to 4 carbon atoms, and examples thereof may include a methyl group, an ethyl group, a propyl group, a hydroxymethyl group, a trifluoromethyl group and the like, but a methyl group is preferred.

$X_{b1}$ is preferably a hydrogen atom or a methyl group.

Examples of $R_2$ may include an alkyl group, a cycloalkyl group, an alkenyl group, a cycloalkenyl group, an aryl group and an aralkyl group, which have one or more $CH_3$ partial structures. The aforementioned cycloalkyl group, alkenyl group, cycloalkenyl group, aryl group and aralkyl group may further have an alkyl group as a substituent.

$R_2$ is preferably an alkyl group or an alkyl-substituted cycloalkyl group, which has one or more $CH_3$ partial structures.

The organic group, which is stable against an acid having one or more $CH_3$ partial structures, as $R_2$, preferably has 2 to 10 $CH_3$ partial structures, and more preferably 2 to 8 $CH_3$ partial structures.
Preferred specific examples of the repeating unit represented by Formula (II) will be shown below. Also, the present invention is not limited thereto.
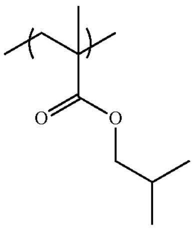
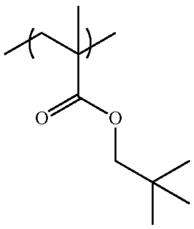
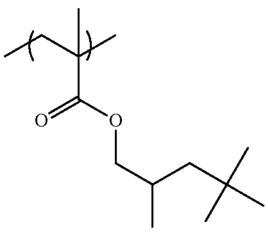
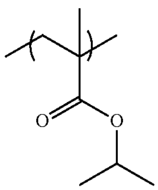
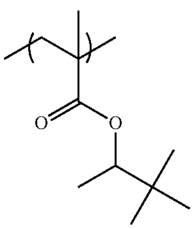
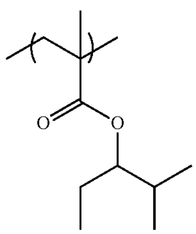
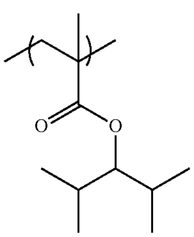
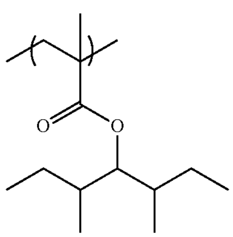
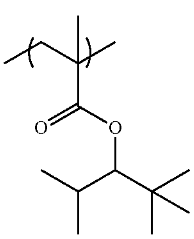
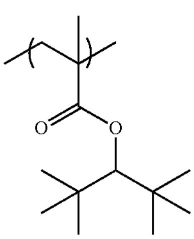
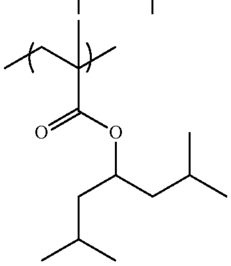
-continued
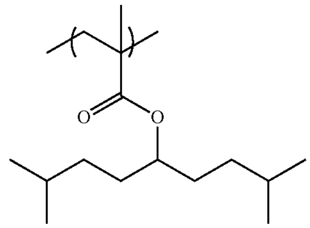
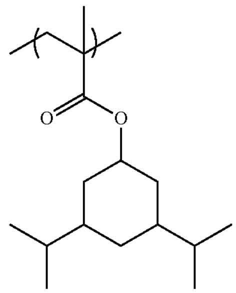
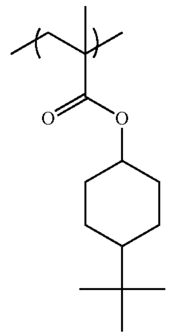
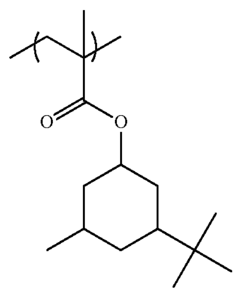
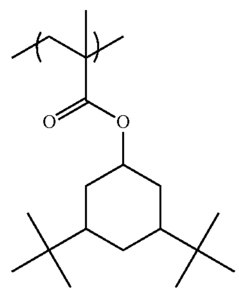
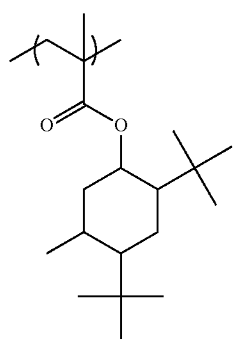
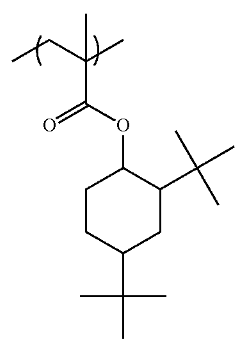
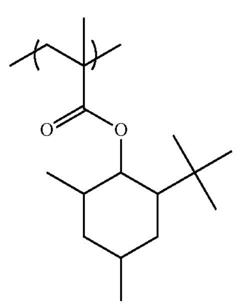
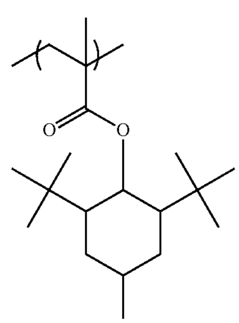

-continued

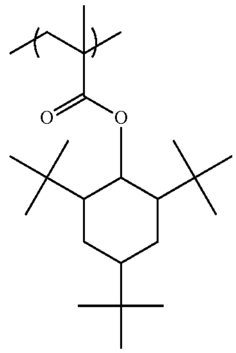

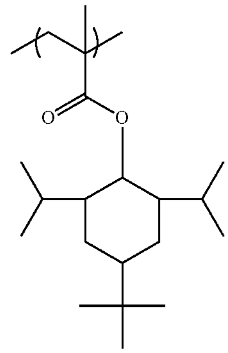

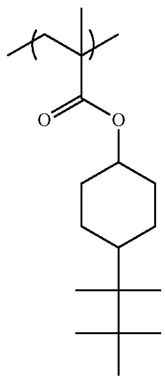

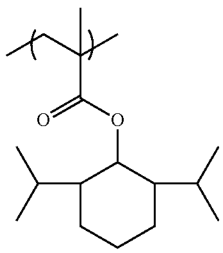

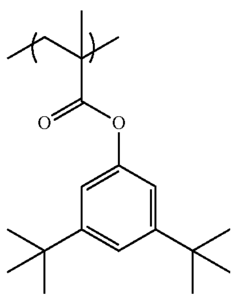

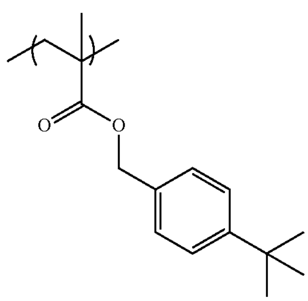

The repeating unit represented by Formula (II) is preferably a repeating unit that is stable against an acid (non-acid-decomposable), and specifically, is preferably a repeating unit having no group capable of decomposing by the action of an acid to generate a polar group.

Hereinafter, the repeating unit represented by Formula (III) will be described in detail.

(III)

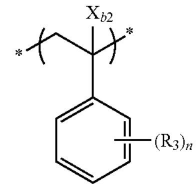

In Formula (III), $X_{b2}$ represents a hydrogen atom, an alkyl group, a cyano group or a halogen atom, $R_3$ represents an organic group which is stable against an acid and has one or more $CH_3$ partial structures, and n represents an integer of 1 to 5.

The alkyl group of $X_{b2}$ is preferably an alkyl group having 1 to 4 carbon atoms, and examples thereof may include a methyl group, an ethyl group, a propyl group, a hydroxymethyl group, a trifluoromethyl group or the like, but a hydrogen atom is preferred.

$X_{b2}$ is preferably a hydrogen atom.

Since $R_3$ is an organic group which is stable against an acid, more specifically, $R_3$ is preferably an organic group which does not have "an acid-decomposable" described in the resin (A).

Examples of $R_3$ may include an alkyl group having one or more $CH_3$ partial structures.

The organic group as $R_3$, which has one or more $CH_3$ partial structures and is stable against an acid, preferably has 1 to 10 $CH_3$ partial structures, more preferably 1 to 8 $CH_3$ partial structures, and still more preferably 1 to 4 $CH_3$ partial structures.

n represents an integer of 1 to 5, more preferably 1 to 3 and still more preferably 1 or 2.

Preferred specific examples of the repeating unit represented by Formula (III) will be shown below. Also, the present invention is not limited thereto.

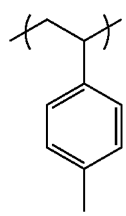

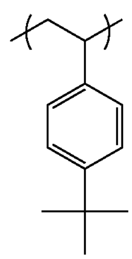

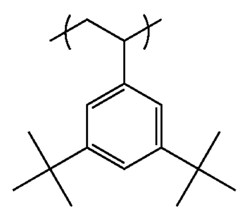

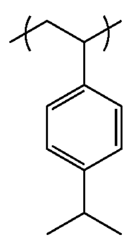

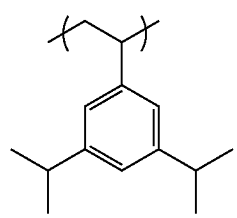

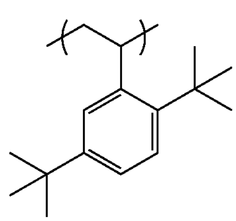

The repeating unit represented by Formula (III) is preferably a repeating unit that is stable against an acid (non-acid-decomposable), and specifically, is preferably a repeating unit having no group capable of decomposing by the action of an acid to generate a polar group.

When the hydrophobic resin (HR) includes a $CH_3$ partial structure in the side chain moiety thereof and particularly has no fluorine atom and silicon atom, a content of at least one repeating unit (x) of the repeating unit represented by Formula (II) and the repeating unit represented by Formula (III) is preferably 90 mol % or more, and more preferably 95 mol % or more, based on all the repeating units of the hydrophobic resin (HR). The content is usually 100 mol % or less based on all the repeating units of the hydrophobic resin (HR).

The hydrophobic resin (HR) contains at least one repeating unit (x) of the repeating unit represented by Formula (II) and the repeating unit represented by Formula (III) in an amount of 90 mol % or more based on all the repeating units of the hydrophobic resin (HR), thereby increasing the surface free energy of the hydrophobic resin (HR). As a result, it is easy for the hydrophobic resin (HR) to be unevenly distributed on the surface of the resist film.

In addition, even when the hydrophobic resin (HR) includes (i) a fluorine atom and/or a silicon atom and even when the hydrophobic resin (HR) includes (ii) a $CH_3$ partial structure in the side chain moiety thereof, the hydrophobic resin (HR) may have at least one group selected from the group of following (x) to (z).

(x) an acid group, (y) a group having a lactone structure, an acid anhydride group or an acid imide group, and (z) a group capable of decomposing by the action of an acid Examples of the acid group (x) may include a phenolic hydroxyl group, a carboxylate group, a fluorinated alcohol group, a sulfonate group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, a tris(alkylsulfonyl)methylene group and the like.

Preferred examples of the acid group may include a fluorinated alcohol group (preferably hexafluoroisopropanol), a sulfonimide group and a bis(alkylcarbonyl)methylene group.

Examples of the repeating unit having the acid group (x) may include a repeating unit, in which the acid group is directly bonded to the main chain of the resin, such as repeating unit by an acrylic acid or a methacrylic acid, a repeating unit in which the acid group is bonded to the main chain of the resin through a linking group or the like, and furthermore, the repeating unit may also be introduced into the end of the polymer chain by using a polymerization initiator or a chain transfer agent each having an acid group at the time of polymerization, and all of these cases are preferred. The repeating unit having the acid group (x) may have at least one of a fluorine atom and a silicon atom.

The content of the repeating unit having the acid group (x) is preferably 1 to 50 mol %, more preferably 3 to 35 mol %, and still more preferably 5 to 20 mol %, based on all the repeating units in the hydrophobic resin (HR).

Specific examples of the repeating unit having the acid group (x) will be shown below, but the present invention is not limited thereto. In the formulas, $R_x$ represents a hydrogen atom, $CH_3$, $CF_3$ or $CH_2OH$.

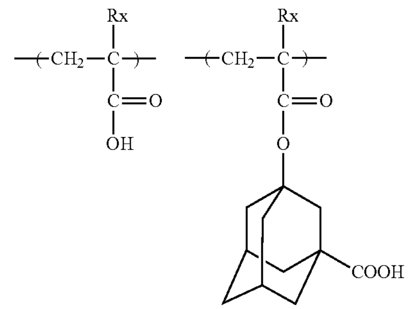
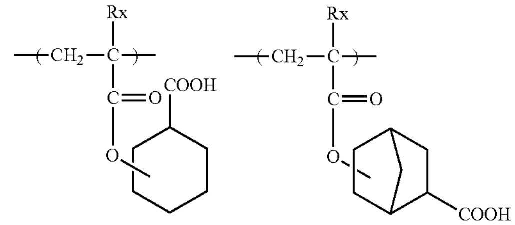
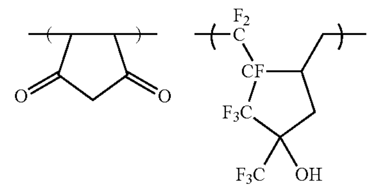
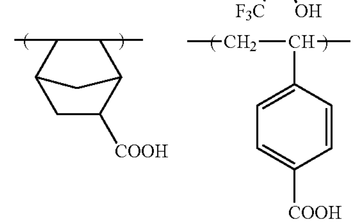
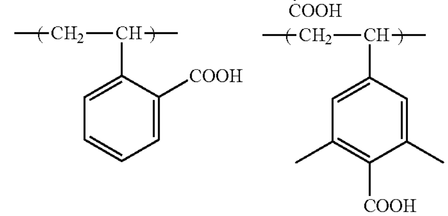
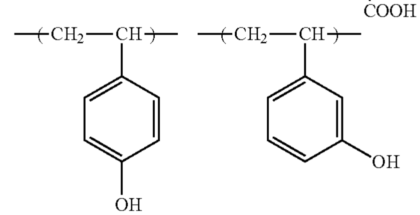
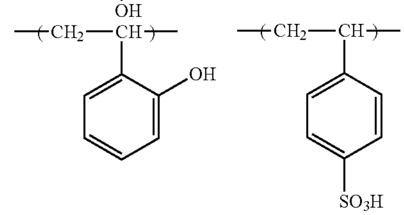
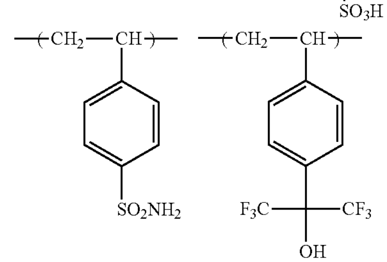

-continued

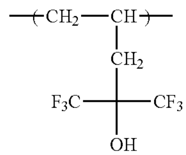
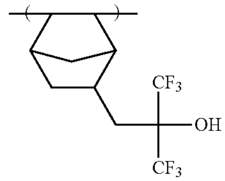
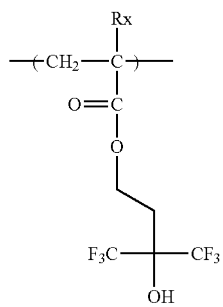
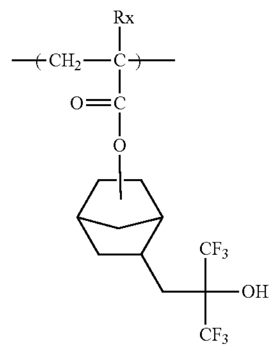
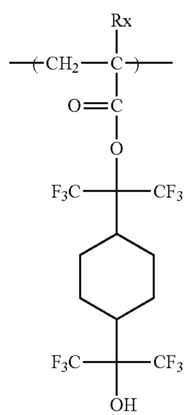
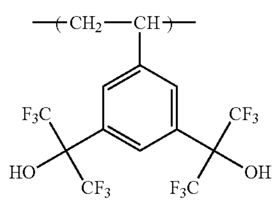
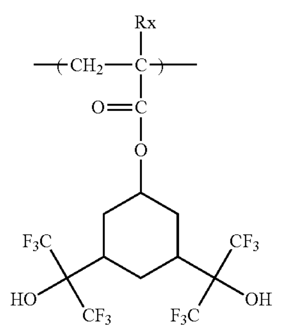
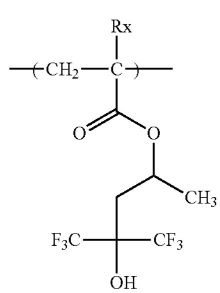
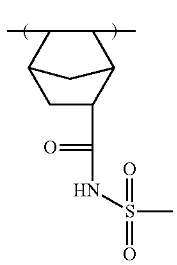

-continued

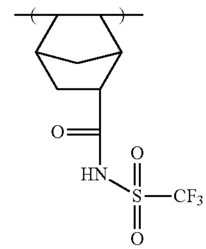
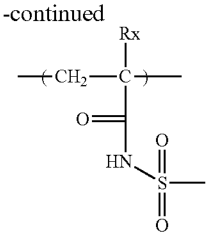
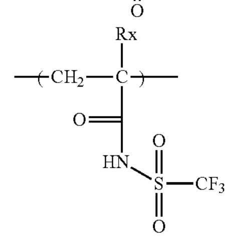
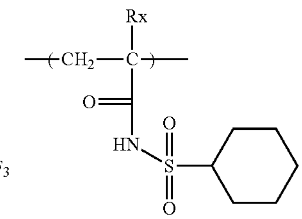
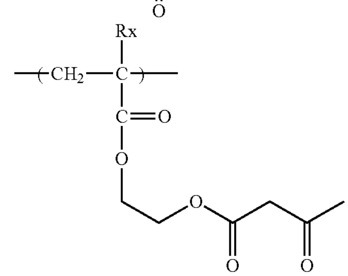
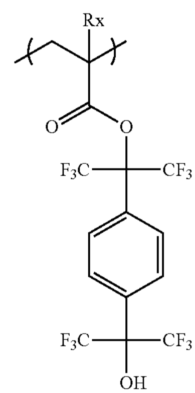
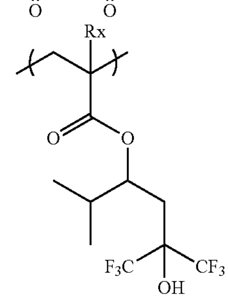
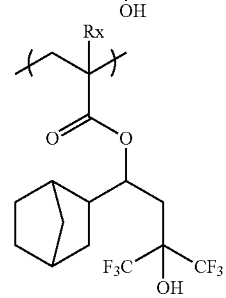

As the group (y) having a lactone structure, the acid anhydride group or the acid imide group, a group having a lactone structure is particularly preferred.

Examples of the repeating unit including these groups may include a repeating unit in which the group is directly bonded to the main chain of the resin, such as a repeating unit by an acrylic acid ester or a methacrylic acid ester. In addition, the repeating unit may be a repeating unit in which the group is bonded to the main chain of the resin through a linking group. Furthermore, the repeating unit may be introduced into the end of the resin by using a polymerization initiator or a chain transfer agent having the group at the time of polymerization.

Examples of the repeating unit having a group having a lactone structure are the same as those of the repeating unit having a lactone structure, which is previously described in the paragraph of the resin (A).

The content of the repeating unit having a group having a lactone structure, an acid anhydride group or an acid imide group is preferably 1 to 100 mol %, more preferably 3 to 98 mol %, and still more preferably 5 to 95 mol %, based on all the repeating units in the hydrophobic resin (HR).

Examples of the repeating unit having a group (z) capable of decomposing by the action of an acid in the hydrophobic resin (HR) are the same as those of the repeating unit having an acid-decomposable group, which is exemplified in the resin (A). The repeating unit having a group (z) capable of decomposing by the action of an acid may have at least one of a fluorine atom and a silicon atom. In the hydrophobic resin (HR), the content of the repeating unit having a group (z) capable of decomposing by the action of an acid is preferably 1 to 80 mol %, more preferably 10 to 80 mol %, and still more preferably 20 to 60 mol %, based on all the repeating units in the hydrophobic resin (HR).

When the hydrophobic resin (HR) has a fluorine atom, the content of the fluorine atom is preferably 5 to 80% by mass, and more preferably 10 to 80% by mass, based on the weight average molecular weight of the hydrophobic resin (HR). Furthermore, the repeating unit including a fluorine atom is preferably 10 to 100 mol %, and more preferably 30 to 100 mol %, based on all the repeating units included in the hydrophobic resin (HR).

When the hydrophobic resin (HR) has a silicon atom, the content of the silicon atom is preferably from 2 to 50% by mass, and more preferably 2 to 30% by mass, based on the weight average molecular weight of the hydrophobic resin (HR). Further, the repeating unit including a silicon atom is preferably 10 to 100 mol %, and more preferably 20 to 100 mol %, based on all the repeating units included in the hydrophobic resin (HR).

Meanwhile, particularly when the hydrophobic resin (FIR) includes a $CH_3$ partial structure in the side chain moiety thereof, the form that the hydrophobic resin (HR) contains substantially no fluorine atom and silicon atom is also preferred, and in this case, specifically, the content of the repeating unit having a fluorine atom or a silicon atom is preferably 5 mol % or less, more preferably 3 mol % or less, and still more preferably 1 mol % or less, based on all the repeating units in the hydrophobic resin (HR), and is ideally 0 mol %, that is, containing no fluorine atom and silicon atom. In addition, it is preferred that the hydrophobic resin (HR) is substantially composed of only a repeating unit composed of only an atom selected from a carbon atom, an oxygen atom, a hydrogen atom, a nitrogen atom and a sulfur atom. More specifically, the repeating unit composed only of an atom selected from a carbon atom, an oxygen atom, a hydrogen atom, a nitrogen atom and a sulfur atom is present in an amount of preferably 95 mol % or more, more preferably 97 mol % or more, still more preferably 99 mol % or more, and ideally 100 mol %, based on all the repeating units of the hydrophobic resin (HR).

The weight average molecular weight of the hydrophobic resin (HR) in terms of standard polystyrene is preferably 1,000 to 100,000, more preferably 1,000 to 50,000, and still more preferably 2,000 to 15,000.

Furthermore, the hydrophobic resin (HR) may be used either alone or in combination of a plurality thereof.

The content of the hydrophobic resin (HR) in the composition is preferably 0.01 to 10% by mass, more preferably from 0.05 to 8% by mass, and still more preferably from 0.1 to 7% by mass, based on the total solid content in the composition of the present invention.

In the hydrophobic resin (HR), it is natural that the content of impurities such as metal is small, and the content of residual monomers or oligomer components is preferably 0.01 to 5% by mass, more preferably 0.01 to 3% by mass, and still more preferably 0.05 to 1% by mass. Accordingly, it is possible to obtain an actinic ray-sensitive or radiation-sensitive resin composition free from extraneous substances in liquid and change in sensitivity and the like with time. Further, from the viewpoint of resolution, resist shape, side wall of resist pattern, roughness and the like, the molecular weight distribution (Mw/Mn, also referred to as polydispersity) is in a range of preferably 1 to 5, more preferably 1 to 3, and still more preferably 1 and 2.

As for the hydrophobic resin (HR), various commercially available products may be used, and resin (D) may be synthesized by a typical method (for example, radical polymerization). Examples of a general synthesis method may include a batch polymerization method of dissolving monomer species and an initiator in a solvent and heating the solution, thereby performing the polymerization, a dropping polymerization method of adding dropwise a solution containing monomer species and an initiator to a heated solvent over 1 to 10 hours, and the like, and a dropping polymerization method is preferred.

The reaction solvent, polymerization initiator, reaction conditions (temperature, concentration and the like) and purification method after reaction are the same as those described in the resin (A), but in the synthesis of the hydrophobic resin (HR), the reaction concentration is preferably 30 to 50% by mass.

Hereinafter, specific examples of the hydrophobic resin (HR) will be shown.

(HR-1)

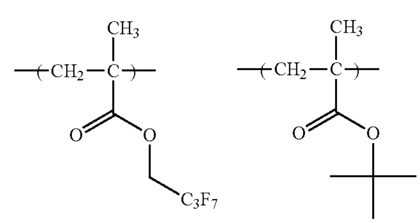

(HR-2)

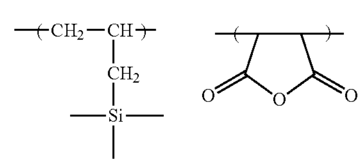

(HR-3)

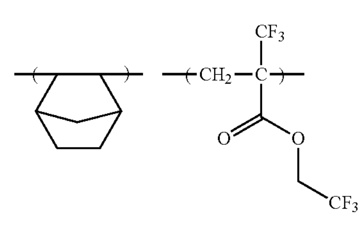

-continued
(HR-4)
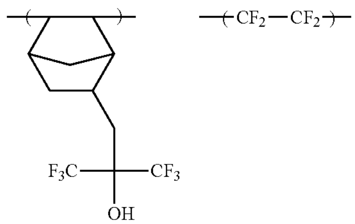
(HR-5)
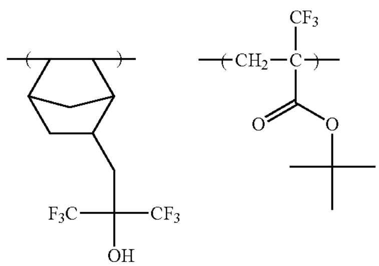
(HR-6)
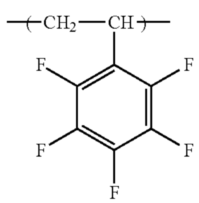
(HR-7)
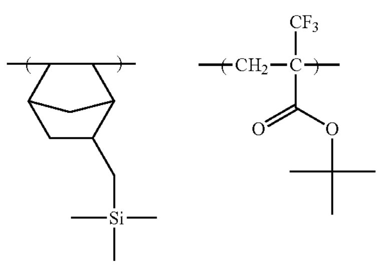
(HR-8)
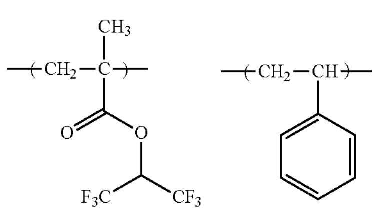
(HR-9)
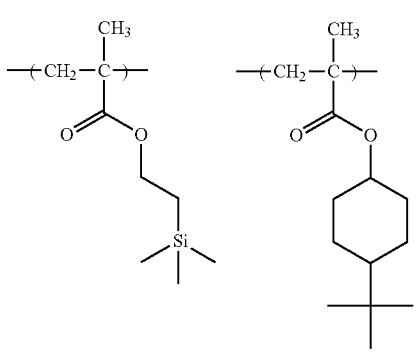
-continued
(HR-10)
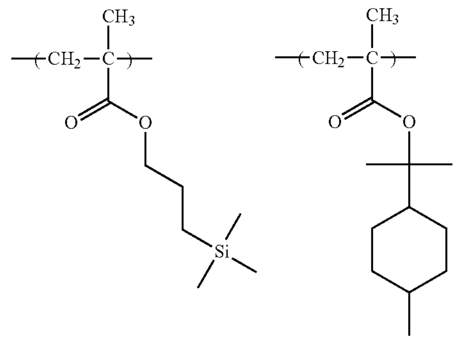
(HR-11)
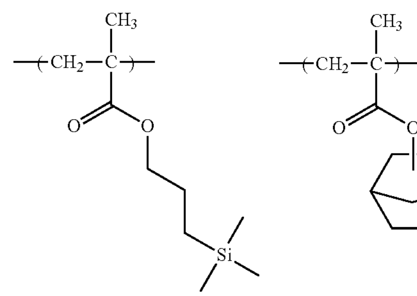
(HR-12)
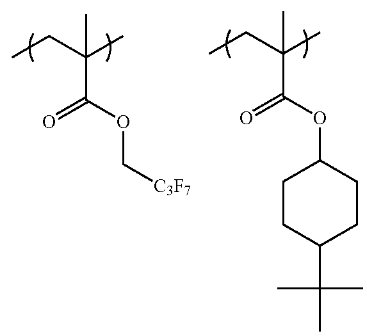
(HR-13)
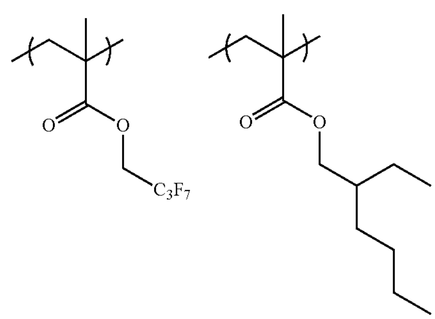
(HR-14)
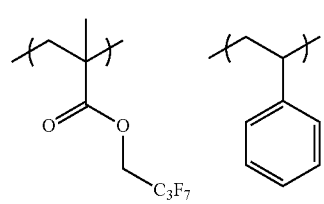

(HR-15)
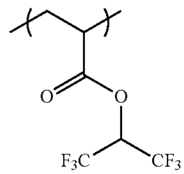
(HR-16)
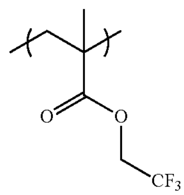
(HR-17)
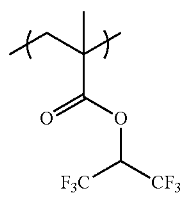
(HR-18)
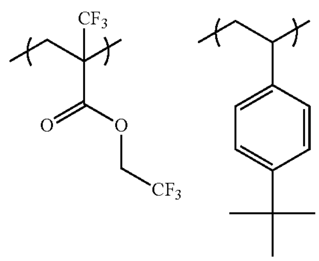
(HR-19)
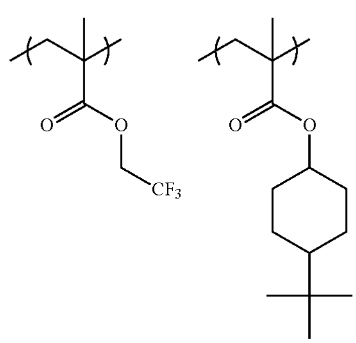
(HR-20)
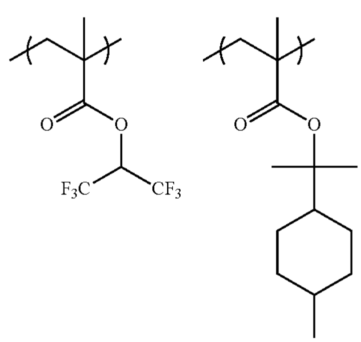
(HR-21)
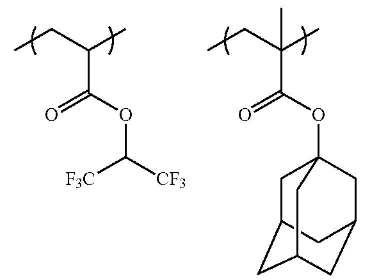
(HR-22)
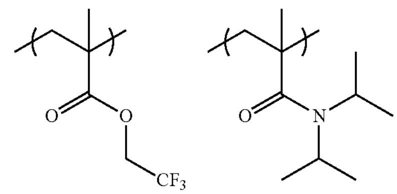
(HR-23)
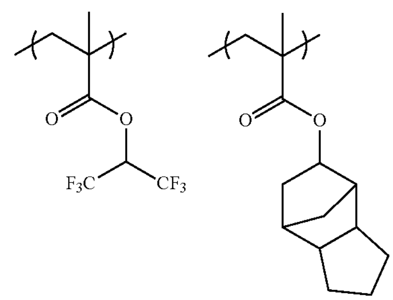
(HR-24)
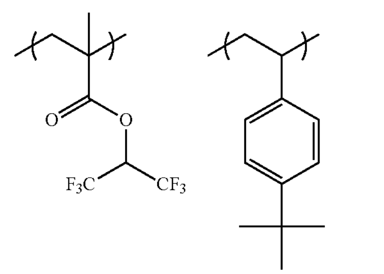
(HR-25)
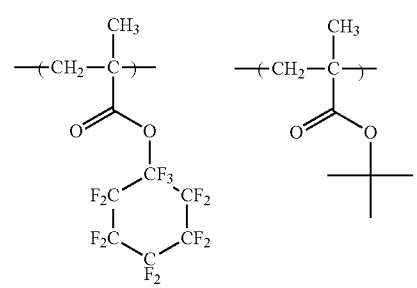
(HR-26)
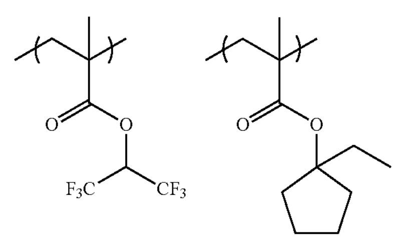

-continued
(HR-27)
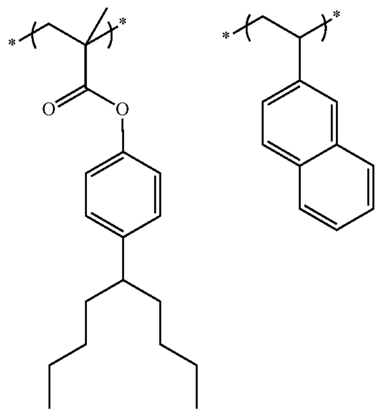
(HR-28)
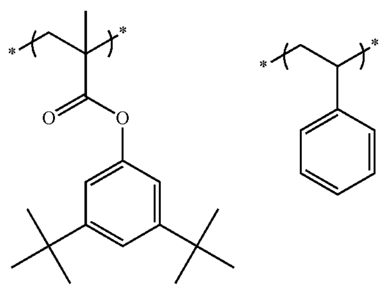
(HR-29)
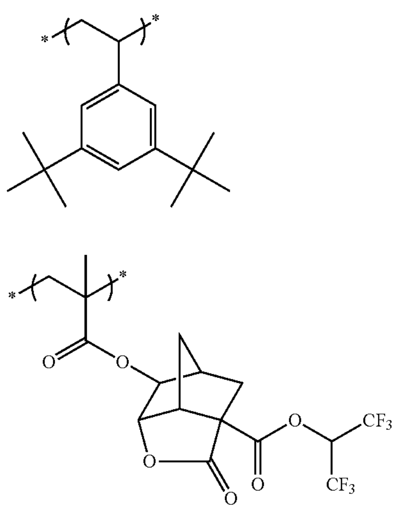
(HR-30)
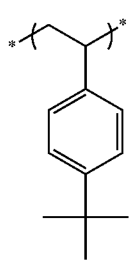
-continued
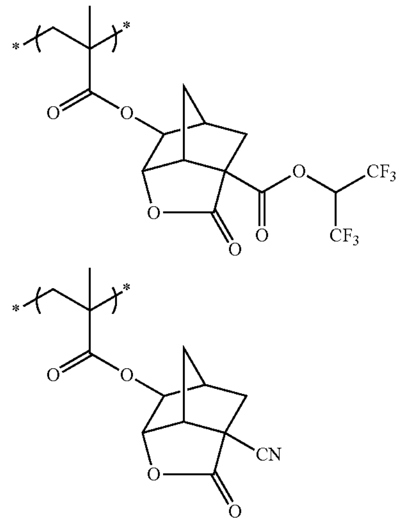
(HR-31)
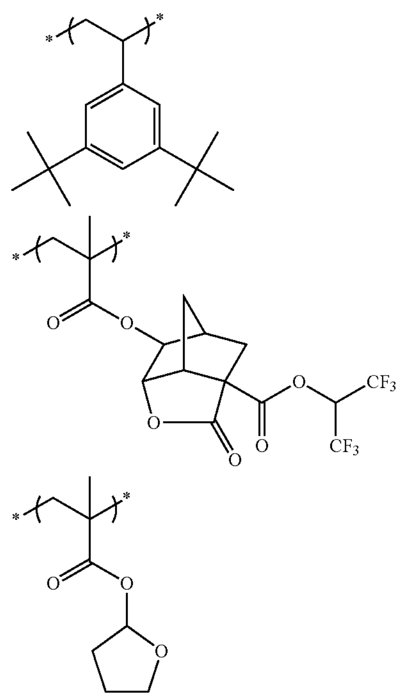
(HR-32)
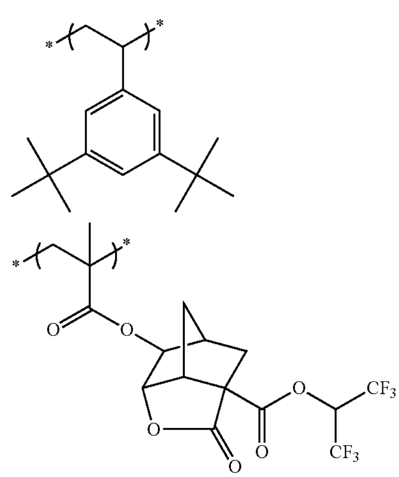

-continued

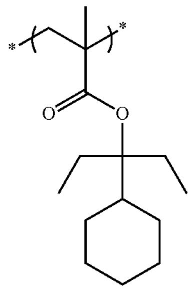

(HR-33)

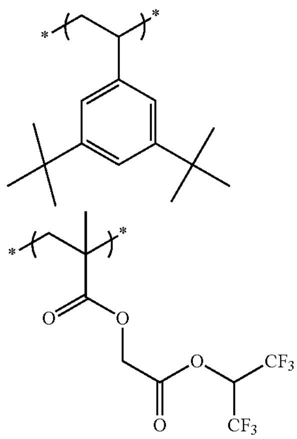

(HR-34)

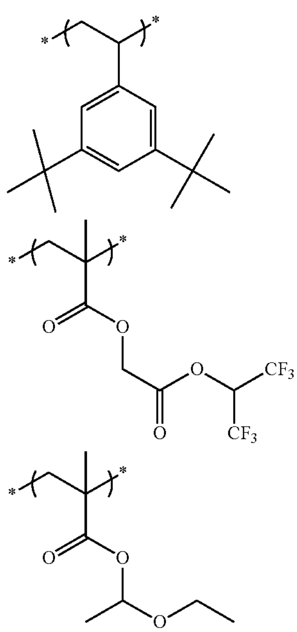

Further, as the hydrophobic resin (HR), resin described in Japanese Patent Laid-Open Publication Nos. 2011-248019, 2010-175859 and 2012-032544 is preferably used.

As for a film formed from a resist composition according to the present invention, liquid (liquid immersion medium) which is higher in refractive index than air may be filled between the film and a lens upon irradiation with an actinic ray or radiation to perform exposure (liquid-immersion exposure). Thereby, it is possible to enhance resolution. Any liquid may be used as the liquid immersion medium as long as it is higher in refractive index than air, and pure water is preferred.

A liquid for liquid immersion, which is used in the liquid-immersion exposure, will be described below.

The liquid for liquid immersion is preferably a liquid which is transparent to light at the exposure wavelength and has a temperature coefficient of refractive index as small as possible in order to minimize the distortion of an optical image projected on the resist film. However, water is preferably used from the viewpoint of easy availability and easy handleability in addition to the above-described viewpoint.

In addition, a medium having the refractive index of 1.5 or more may be used to further enhance the refractive index. This medium may be aqueous solution or an organic solvent.

When water is used as the liquid-immersion liquid, an additive (liquid) that does not dissolve the resist film on the wafer and has only a negligible effect on the optical coat at the underside of the lens element may be added in a small ratio to decrease the surface tension of water and increase the interfacial activity. Such an additive is preferably an aliphatic alcohol having a refractive index almost equal to that of water, and specific examples thereof may include methyl alcohol, ethyl alcohol, isopropyl alcohol and the like. By adding an alcohol having a refractive index almost equal to that of water, even when the alcohol component in water is evaporated and the content concentration thereof is changed, it is possible to obtain an advantage in that the change in the refractive index of the liquid as a whole may be made very small.

Meanwhile, when an impurity greatly differing from water in the refractive index is incorporated, the incorporation incurs distortion of the optical image projected on the resist film, and thus, the water used is preferably distilled water. Furthermore, pure water filtered through an ion exchange filter or the like may also be used.

The electrical resistance of water is preferably 18.3 MQcm or more, and TOC (organic concentration) is preferably 20 ppb or less and the water is preferably subjected to deaeration treatment.

Further, the lithography performance may be enhanced by raising the refractive index of the liquid-immersion liquid. From this viewpoint, an additive for raising the refractive index may be added to water, or heavy water ($D_2O$) may be used in place of water.

In order to cause the film not to directly contact the liquid-immersion liquid, a film (hereinafter, also referred to as a "topcoat") that is sparingly soluble in liquid-immersion liquid may be formed between the film formed using the composition of the present invention and the liquid-immersion liquid. Examples of a function required for the topcoat may include coating suitability to the upper layer portion of the resist and poor solubility in the liquid-immersion liquid. It is preferred that the topcoat is uniformly coated onto the upper layer of the film of the composition without being mixed therewith.

Specific examples of the topcoat may include a hydrocarbon polymer, an acrylic acid ester polymer, polymethacrylic acid, polyacrylic acid, polyvinyl ether, a silicone-containing polymer, a fluorine-containing polymer and the like. The described-above hydrophobic resin (HR) is also suitable as the topcoat. Further, it is possible to appropriately use topcoat materials that come onto the market. If impurities are eluted from the topcoat to the liquid-immersion liquid, the optical lens is contaminated, and thus it is preferred that the amounts of residual monomer components of the polymer included in the topcoat are small.

When the topcoat is peeled off, a developer may be used, or a peeling agent may separately be used. As the peeling agent, a solvent that rarely penetrates the film is preferred.

From the viewpoint that the peeling process may be performed simultaneously with the developing treatment process of the film, it is preferred that the topcoat is peeled off by a developer containing an organic solvent.

It is preferred that there is no difference or a small difference in the refractive index between the topcoat and the liquid-immersion liquid. In this case, the resolution may be enhanced. When water is used as the liquid-immersion liquid, the topcoat preferably has a refractive index close to the refractive index of the liquid-immersion liquid. From the viewpoint that the refractive index is close to that of the liquid-immersion liquid, the topcoat preferably contains a fluorine atom. Further, a thin film is preferred in view point of transparency and refractive index.

It is preferred that the topcoat is not mixed with the film and the liquid-immersion liquid. From this viewpoint, when the liquid-immersion liquid is water, it is preferred that the solvent used for the topcoat is sparingly soluble in the solvent used for the composition of the present invention and is a water-insoluble medium. Further, when the liquid-immersion liquid is an organic solvent, the topcoat may be water-soluble or water-insoluble.

Meanwhile, in the case of EUV exposure or EB exposure, a topcoat layer may be formed on the upper layer of the resist film formed of the actinic ray-sensitive or radiation-sensitive resin composition according to the present invention so as to suppress out-gas, suppress blob defects, prevent a collapse due to improvement on an inverted tapered shape, and prevent LWR from deteriorating due to a rough surface. Hereinafter, a topcoat composition used to form the topcoat layer will be described.

In the topcoat composition of the present invention, the solvent is preferably water or an organic solvent. Water or an alcohol-based solvent is more preferred.

When the solvent is the organic solvent, a solvent that does not dissolove the resist film is preferred. As the available solvent, an alcohol-based solvent, a fluorine-based solvent, and a hydrocarbon-based solvent are preferably used, and a non-fluorine alcohol-based solvent is more preferably used. As the alcohol-based solvent, primary alcohol is preferred and primary alcohol having 4 to 8 carbon atoms is more preferred in terms of coatability. As the primary alcohol having 4 to 8 carbon atoms, straight, branched or cyclic alcohol is used, but the straight alcohol and the branched alcohol are preferred. Specific examples thereof may include 1-butanol, 1-hexanol, 1-pentanol, 3-methyl-1-butanol and the like.

When the solvent of the topcoat composition according to the present invention is water or an alcohol-based solvent, it is preferred to contain water-soluble resin. It is thought that the water-soluble resin can further enhance the uniformity of solubility in the developer. Examples of the preferred water-soluble resin may include polyacrylic acid, polymethacrylic acid, polyhydroxystyrene, polyvinylpyrrolidone, polyvinylalcohol, polyvinylether, polyvinylacetal, polyacrylimide, polyethylene glycol, polyethyleneoxide, polyethyleneimine, polyesterpolyol, polyetherpolyol, polysaccharide and the like. The polyacrylic acid, the polymethacrylic acid, the polyhydroxystyrene, the polyvinylpyrrolidone and the polyvinylalcohol are particularly preferred. Further, the water-soluble resin is not limited to a homopolymer, but may be a copolymer. For example, it is possible to use a copolymer having a monomer corresponding to the repeating unit of the homopolymer that has been described above and other monomer units. Specifically, acrylic acid-methacrylic acid-copolymer, acrylic acid-hydroxystyrenecopolymer and the like may be applied to the present invention.

In addition, as the resin for the topcoat composition, it is possible to preferably use resin having an acidic group described in Japanese Patent Laid-Open Publication Nos. 2009-134177 and 2009-91798.

The weight average molecular weight of the water-soluble resin is not particularly limited, but is preferably 2,000 to 1,000,000, more preferably 5,000 to 500,000, and particularly preferably 10,000 to 10,000. Here, the weight average molecular weight of the resin represents a molecular weight in terms of polystyrene measured by the GPC (carrier: THF or N-methyl-2-pyrrolidone(NMP)).

The pH of the topcoat composition is not particularly limited, but is preferably 0 to 10, more preferably 0 to 8, and particularly preferably 1 to 7.

When the solvent of the topcoat composition is an organic solvent, the topcoat composition may contain hydrophobic resin such as the hydrophobic resin (HR) which has previously been described in the paragraph of the actinic ray-sensitive or radiation-sensitive resin composition. As the hydrophobic resin, hydrophobic resin described in Japanese Patent Laid-Open Publication No. 2008-209889 is preferably used.

The resin concentration in the topcoat composition is preferably 0.1 to 10% by mass, more preferably 0.2 to 5% by mass, and particularly preferably 0.3 to 3% by mass.

The topcoat material may include components other than the resin, and the ratio of the resin occupied in the solid content of the topcoat composition is preferably 80 to 100% by mass, more preferably 90 to 100% by mass, and particularly preferably 95 to 100% by mass.

The solid concentration of the topcoat composition in the present invention is preferably 0.1 to 10, more preferably 0.2 to 6% by mass, and still more preferably 0.3 to 5% by mass. By setting the solid concentration within the above-described range, the topcoat composition can be uniformly coated onto the resist film.

Examples of the components other than the resin, which may be added to the topcoat material, may include a surfactant, a light acid generator, a basic compound and the like. Specific examples of the light acid generator and the basic compound may include a compound that generate acid upon irradiation with an actinic ray or radiation and a compound such as a basic compound.

In the case of using the surfactant, the amount of the surfactant used is preferably 0.0001 to 2% by mass, and more preferably 0.001 to 1% by mass, baased on the total amount of the topcoat composition.

By adding the surfactant to the topcoat composition, coatability can be enhanced upon coating the topcoat composition. As the surfactant, nonionic, anionic, cationic and ampholytic surfactants are used.

As the nonionic surfactant, the following products are available: PLUFARAC series of BASF, ELEBASE series, FINE SURF series and BROWNON series manufactured by Aoki Oil Industrial co., Ltd., ADEKAFLURONIC P-103 manufactured by ADEKA, EMALGEN series, AMITE series, AMINON PK-02S, EMANON CH-25, and LEODOL series manufactured by Kao Chemical Corporation, SURFLON S-141 manufactured by AGC SEIMI CHEMICAL CO., LTD., NOIGEN series manufactured by Dai-ichi Kogyo Seiyaku Co., Ltd., NEWKALGEN series manufactured y TAKEMOTO OIL & FAT CO., LTD, DYNOL604, ENBYLOZEM AD01, OLFIN EXP series, and SAPINOL series manufactured by Nissin Chemical Industry Co., Ltd., HUTAZENT 300 manufactured by RYOKO CHEMICAL CO., LTD. and the like.

As the anionic surfactant, the following products are available: EMAL 20T and POIS 532A manufactured by Kao Chemical Corporation, PHOSPHANOL ML-200 manufactured by TOHO Co., Ltd., EMULSOGEN series manufactured by Clariant (Japan) K.K., SURFLON S-111N and SURFLON S-211 manufactured by AGC SEIMI CHEMICAL CO., LTD., FLYSURF series manufactured by Dai-ichi Kogyo Seiyaku Co., Ltd., PIONINE series manufactured by TAKEMOTO OIL & FAT CO., LTD, OLFIN PD-201 and OLFIN PD-202 manufactured by Nissin Chemical Industry Co., Ltd., AKYPO RLM45 and ECT-3 manufacutred by NihonSurfactant Kyogyo K.K., LIFON manufactured by Lion Corporation and the like.

As the cationic surfactant, ACETAMINE 24 and ACETAMINE 86 manufactured by Kao Chemical Corporation are available.

As the ampholytic surfactant, SURFLON S-131 (manufactured by AGC SEIMI CHEMICAL CO., LTD.), and ENAGYCOL C-40H, LIFOMIN LA (all of them are manufactured by Kao Chemical Corporation) are available.

Further, these surfactants may be mixed with each other and then used.

In the pattern forming method of the present invention, the resist film is formed on the substrate using the actinic ray-sensitive or radiation-sensitive resin composition, and the topcoat layer is formed on the resist film using the above-described topcoat composition. The film thickness of the resist film is preferably 10 to 100 nm, and the film thickness of the topcoat layer is preferably 10 to 200 nm, more preferably 20 to 100 nm, and particularly preferably 40 to 80 nm.

As a method of coating the actinic ray-sensitive or radiation-sensitive resin composition onto the substrate, spin coating is preferred. Here, its rotational speed is preferably 1,000 to 3,000 rpm.

For example, the actinic ray-sensitive or radiation-sensitive resin composition is coated onto a substrate (for example, silicone/silicone dioxide coating) used to manufacture a precision integrated circuit element by a proper coating method such as a spinner or a coater, and then is dried, thus forming a resist film. Further, it is possible to previously form a known antireflection film. Furthermore, the resist film is preferably dried before the topcoat layer is formed.

Subsequently, the topcoat composition is coated and dried on the obtained resist film by means that are the same as the method of forming the resist film, thus forming the topcoat layer.

An electron beam (EB), X-ray or EUV light is usually irradiated on the resist film having on an upper layer thereof the topcoat layer through a mask, and a bake (heating) is preferably performed to implement development. Consequently, it is possible to obtain a good pattern.

[F] Surfactant

The composition according to the present invention may or may not contain a surfactant. The composition contains a surfactant, thereby imparting a resist pattern with adhesion and reduced development defects due to improved sensitivity and resolution when using an exposure light source with a wavelength of 250 nm or less, particularly 220 nm or less.

As the surfactant, a fluorine-based and/or silicone-based surfactant is particularly preferably used.

Examples of the fluorine-based and/or silicone-based surfactants may include surfactants described in [0276] of U.S. Patent Application Publication No. 2008/0248425. Further, the following products may be used: FTOP EF301 or EF303 (manufactured by Shin-Akita Chemical Co., Ltd.), Fluorad FC430, 431 or 4430 (manufactured by Sumitomo-3M Co., Ltd.), Megafac F171, F173, F176, F189, F113, F110, F177, F120 or R08 (manufactured by DIC Corporation), Surflon S-382, SC101, 102, 103, 104, 105 or 106 (manufactured by Asahi Glass Co., Ltd.), Troysol S-366 (manufactured by Troy Chemical Corp.), GF-300 or GF-150 (manufactured by TOAGOSEI Chemical Industry Co., Ltd.), Surflon S-393 (manufactured by Seimi Chemical Co., Ltd.), FTOP EF121, EF122A, EF122B, RF122C, EF125M, EF135M, EF351, EF352, EF801, EF802 or EF601 (manufactured by JAPAN EXTERIOR MENTENANCE COMPANY), PF636, PF656, PF6320 or PF6520 (manufactured by OMNOVA Solutions, Inc.), FTX-204G, 208G, 218G, 230G, 204D, 208D, 212D, 218D or 222D (manufactured by Neos Company Limited) and the like. In addition, polysiloxane polymer KP-341 (manufactured by Shin-Etsu Chemical Co., Ltd.) may also be used as the silicon-based surfactant.

Furthermore, other than those publicly known surfactants described above, it is possible to use a surfactant using a fluoro-aliphatic compound which is prepared by a telomerization method (also referred to as a telomer method) or an oligomerization method (also referred to as an oligomer method) as the surfactant. Specifically, a polymer having a fluoro-aliphatic group derived from the fluoroaliphatic compound may be used as the surfactant. For example, the fluoro-aliphatic compound may be synthesized by the method described in Japanese Patent Application Laid-Open Publication No. 2002-90991.

As the polymer having a fluoro-aliphatic group, a copolymer formed by a monomer having the fluoro-aliphatic group and (poly(oxyalkylene))acrylate or methacrylate and/or (poly(oxyalkylene))methacrylate is preferred, and block copolymerization is possible even if they are irredgularly distributed.

Examples of the poly(oxyalkylene) group may include a poly(oxyethylene) group, a poly(oxypropylene) group and a poly(oxybutylene) group. Further, a unit having alkylene of a different chain length in the same chain, such as poly(block connector of oxyethylene, oxypropylene and oxyethylene) and poly(block connector of oxyethylene and oxypropylene) may be used.

Further, the copolymer formed by uniting a monomer having a fluoro-aliphatic group and (poly(oxyalkylene)) acrylate or methacrylate may be a ternary or more copolymer formed by simultaneously copolymerizing a monomer having two or more different fluoro-aliphatic groups and two or more different (poly(oxyalkylene))acrylate or methacrylate.

Examples of the available surfactant may include Megafac F178, F-470, F-473, F-475, F-476 and F-472 (manufactured by DIC Corporation). Further, a copolymer of acrylate or methacrylate having a $C_6F_{13}$ group with (poly(oxyalkylene))acrylate or methacrylate, a copolymer of acrylate or methacrylate having a $C_6F_{13}$ group, (poly(oxyethylene)) acrylate or methacrylate and (poly(oxypropylene))acrylate or methacrylate, a copolymer of acrylate or methacrylate having a $C_8F_{17}$ group with (poly(oxyalkylene))acrylate or methacrylate, a copolymer of acrylate or methacrylate having a $C_8F_{17}$ group, (poly(oxyethylene))acrylate or methacrylate and (poly(oxypropylene))acrylate or methacrylate and the like may be used. Further, it is also possible to use a surfactant other than the fluorine-based and/or silicone-based surfactant, described in [0280] of U.S. Patent Application Publication No. 2008/0248425.

The surfactant may be used either alone or in combination of two or more thereof When the composition contains a surfactant, the amount of surfactant is preferably 0 to 2% by mass, more preferably 0.0001 to 2% by mass, and still more preferably 0.0005 to 1% by mass, based on the total solid content of the composition.

[G] Other Additives

The composition according to the present invention may further include a dissolution inhibiting compound, dye, a plasticizer, a photosensitizer, a light absorbent, and/or a compound (for example, a phenol compound having a molecular weight of 1,000 or less, or an alicylic or aliphatic compound including a carboxyl group) for promoting solubility with respect to the developer.

The composition according to the present invention may further include a dissolution inhibiting compound. Here, the term "dissolution inhibiting compound" means a compound having the molecular weight of 3,000 or less, which is capable of decomposing by the action of an acid and thus is reduced in solubility in the organic-based developer.

As the dissolution inhibiting compound, an alicylic or aliphatic compound containing an acid-decomposable group, such as a cholic acid derivative including an acid-decomposable group described in Proceeding of SPIE, 2724, 355 (1996), because this does not decrease the transmissivity of light having the wavelength of 220 nm or less. Examples of the acid-decomposable group and alicylic structure are the same as those described hereinbefore.

Further, when the resist composition according to the present invention is exposed by the KrF excimer laser or irradiated by the electron beam, the dissolution inhibiting compound is preferably a compound having a structure in which a phenolic hydroxy group of the phenol compound is substituted with an acid-decomposable group. The phenol compound contains preferably 1 to 9 phenol skeletons, and more preferably 2 to 6 phenol skeletons.

When the composition according to the present invention contains the dissolution inhibiting compound, its content is preferably 3 to 50% by mass, and more preferably 5 to 40% by mass, based on the total solid content of the composition.

Hereinafter, specific examples of the dissolution inhibiting compound will be described.

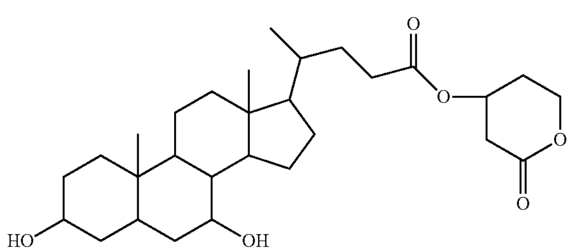

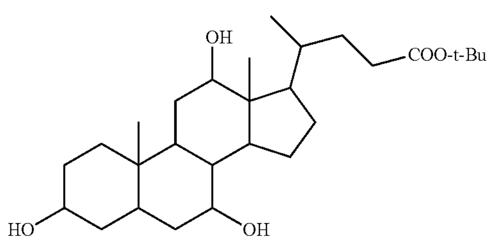

-continued

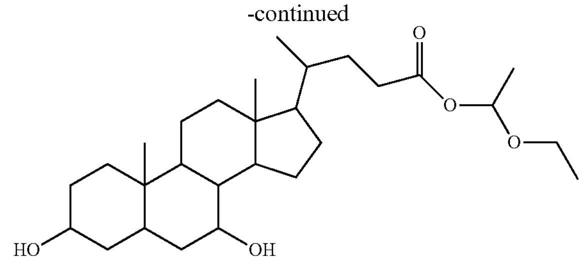

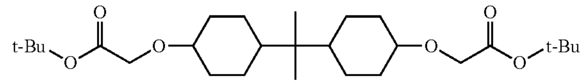

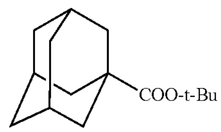

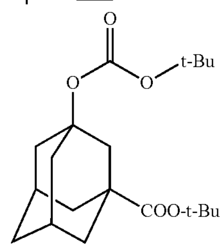

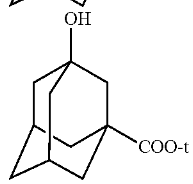

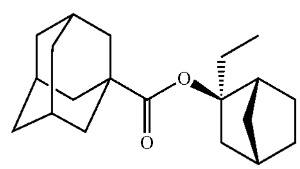

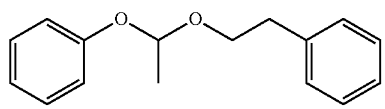

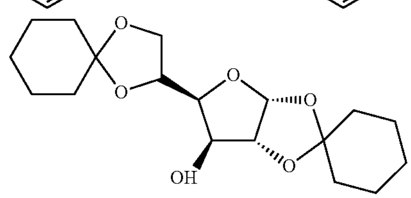

The phenol compound having a molecular weight of 1,000 or less may be easily synthesized by referring to the methods described in, for example, Japanese Patent Application Laid-Open No. H4-122938, Japanese Patent Application Laid-Open No. H2-28531, U.S. Pat. No. 4,916,210, European Patent No. 219294 and the like.

Specific examples of the alicyclic or aliphatic compound having a carboxyl group may include a carboxylic acid derivative having a steroid structure, such as cholic acid, deoxycholic acid and lithocholic acid, an adamantanecarboxylic acid derivative, adamantanedicarboxylic acid, cyclohexanecarboxylic acid, cyclohexanedicarboxylic acid and the like.

EXAMPLES

Resin

The following resins (A-1) to (A-30) were synthesized as shown below.

The weight average molecular weight (Mw) and polydispersity (Mw/Mn) of the resins are described below. Further, the composition ratio of each repeating unit of the resins is shown in molar ratio.

A-1
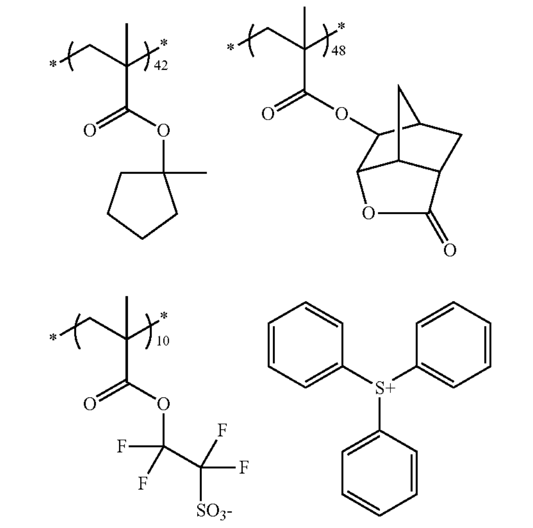
Mw 8000
Mw/Mn = 1.55
A-2
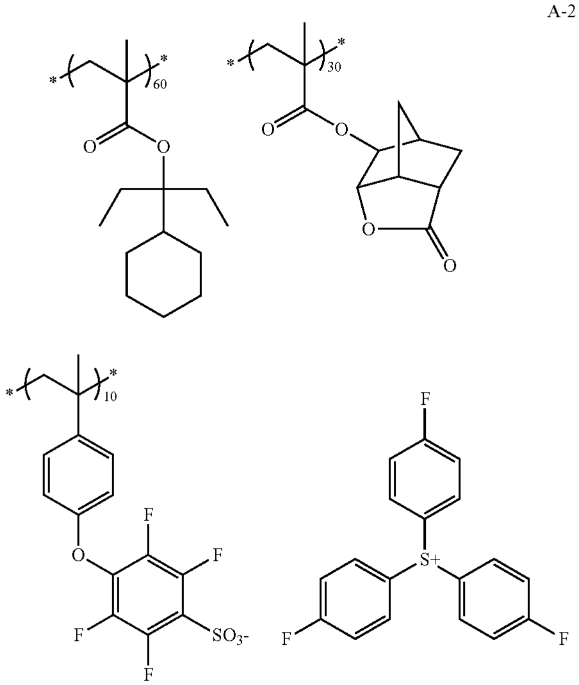
Mw 11000
Mw/Mn = 1.47
A-3
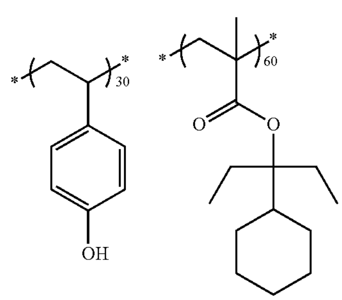
-continued
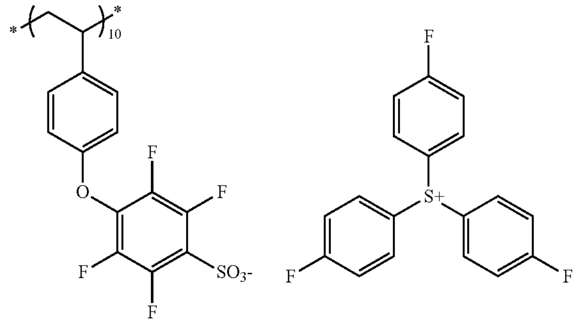
Mw 8000
Mw/Mn = 1.46
A-4
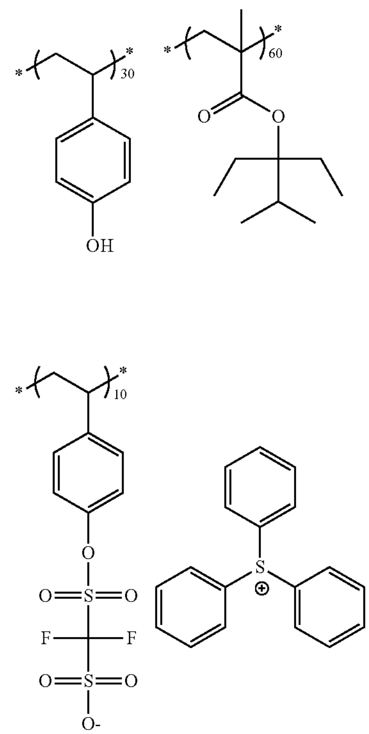
Mw 10000
Mw/Mn = 1.50
A-5
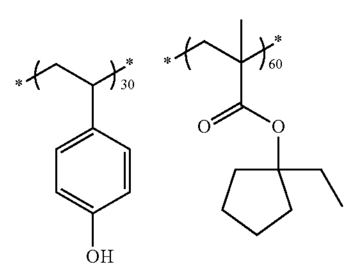

-continued
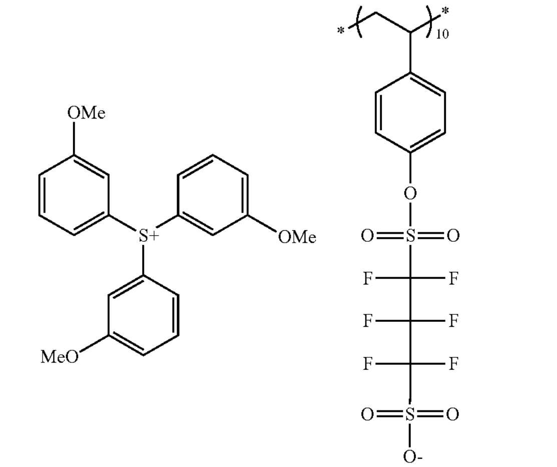
Mw 18000
Mw/Mn = 1.78
A-6
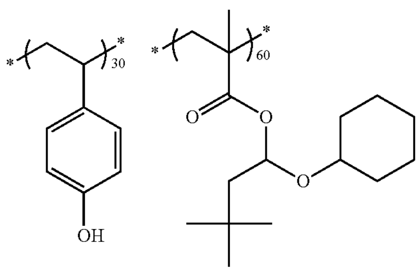
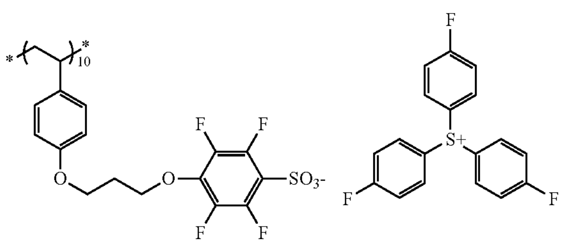
Mw 13000
Mw/Mn = 1.60
A-7
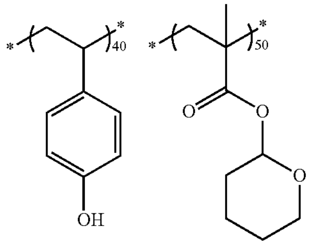
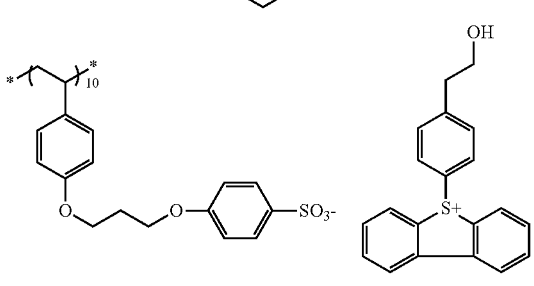
Mw 14000
Mw/Mn = 1.65
-continued
A-8
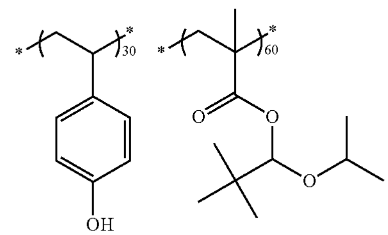
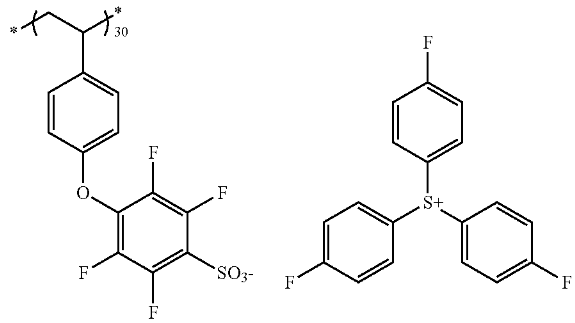
Mw 12000
Mw/Mn = 1.55
A-9
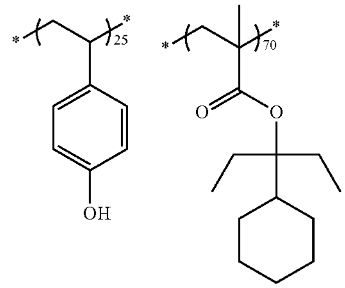
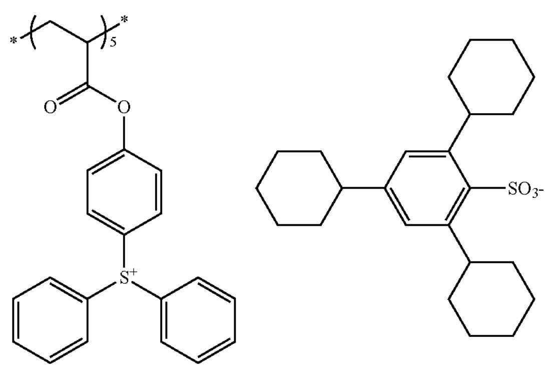
Mw 21000
Mw/Mn = 1.84
A-10
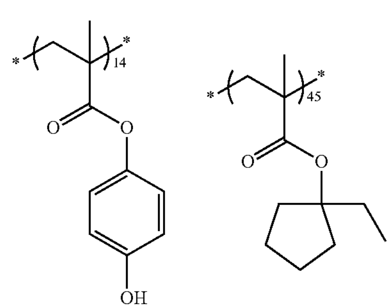

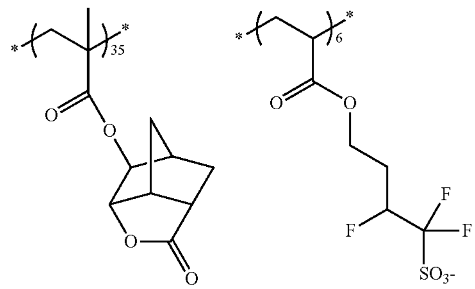
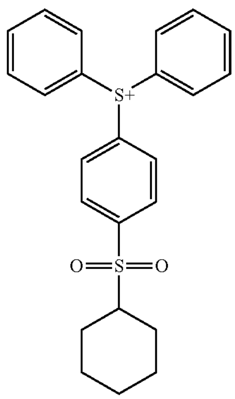
Mw 6700
Mw/Mn = 1.39
A-11
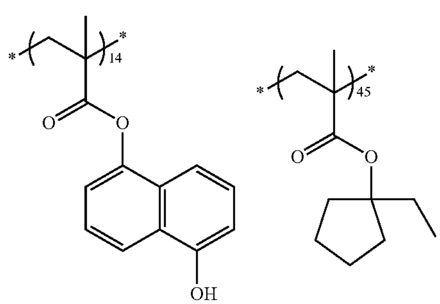
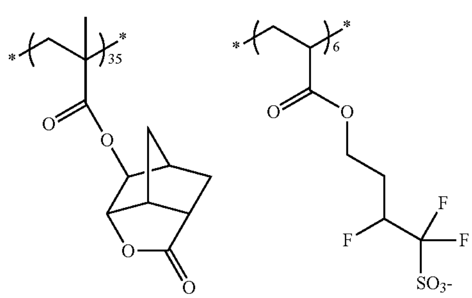
A-12
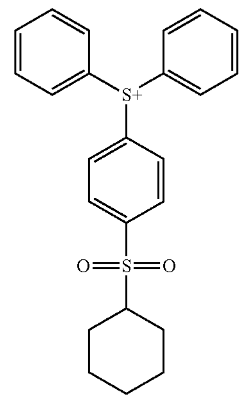
Mw 6700
Mw/Mn = 1.58
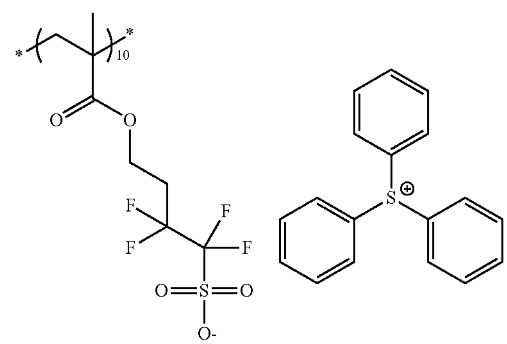
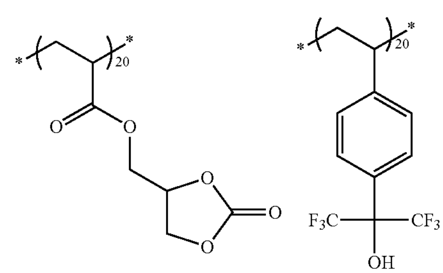
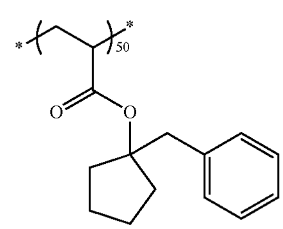
Mw 25000
Mw/Mn = 2.00

-continued
A-13
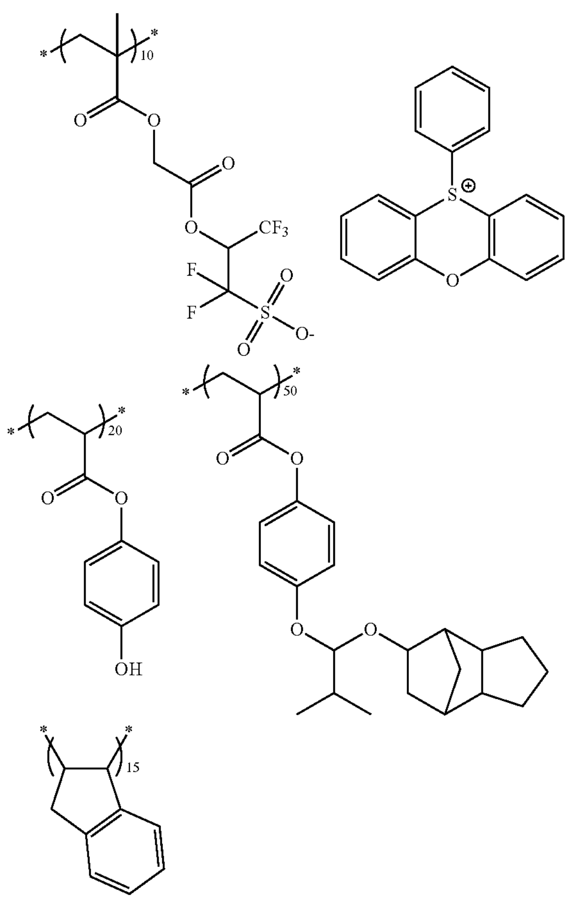
Mw 19000
Mw/Mn = 1.60
A-14
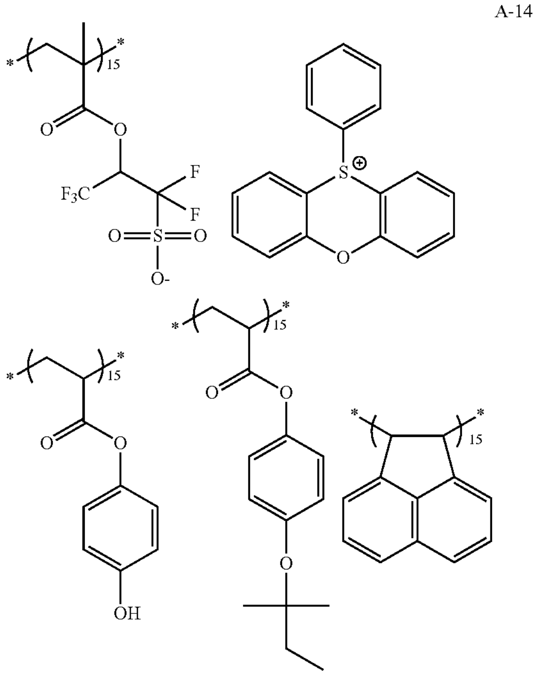
Mw 8500
Mw/Mn = 1.45
-continued
A-15
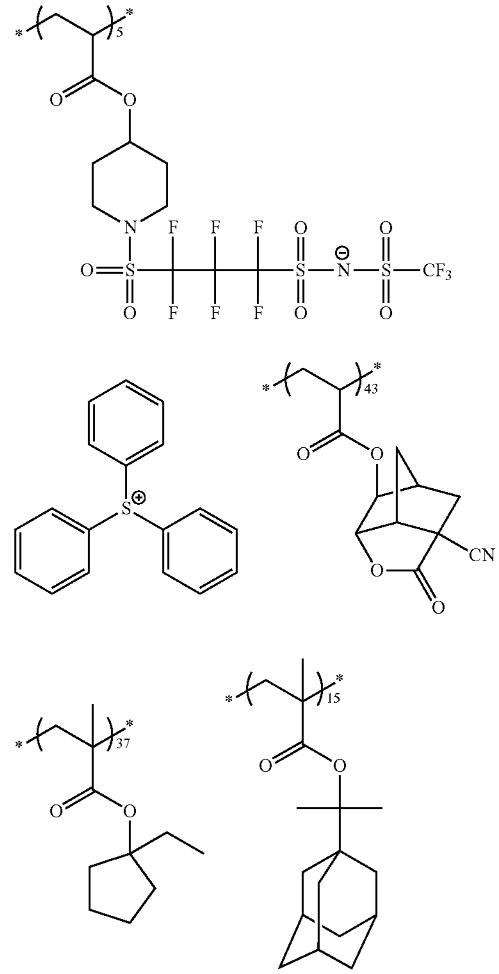
Mw 10500
Mw/Mn = 1.77
A-16
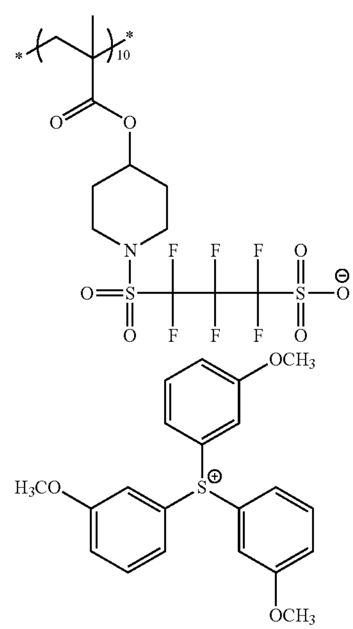

-continued
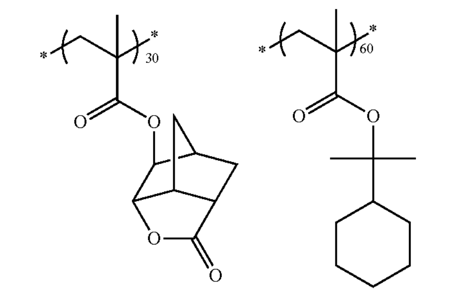
Mw 8500
Mw/Mn = 1.78
A-17
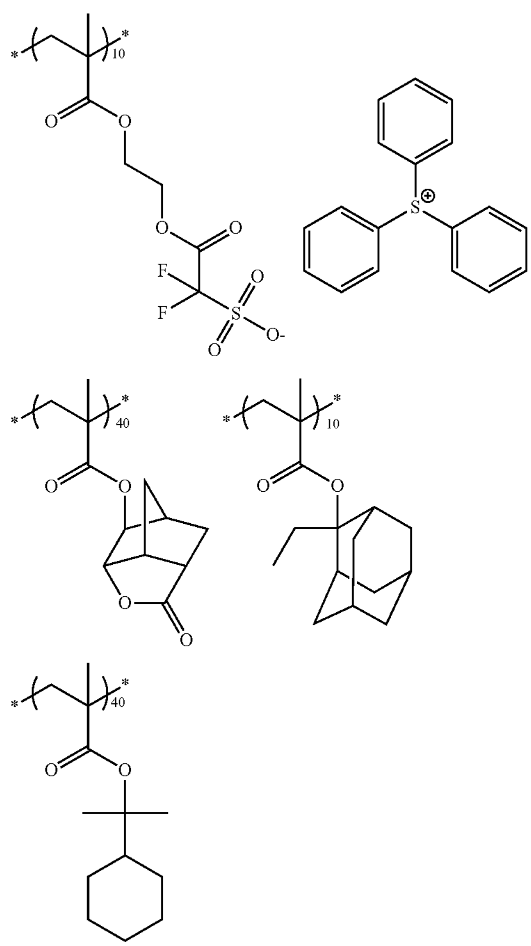
Mw 11500
Mw/Mn = 1.62
A-18
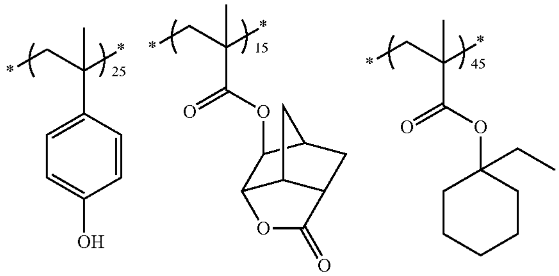
-continued
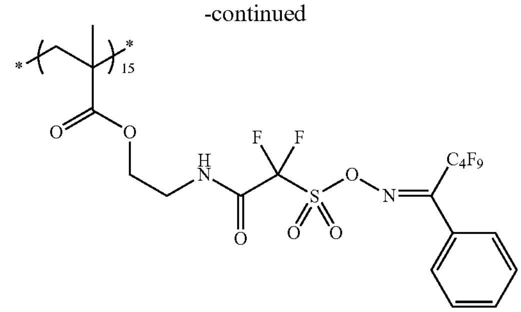
Mw 16000
Mw/Mn = 1.58
A-19
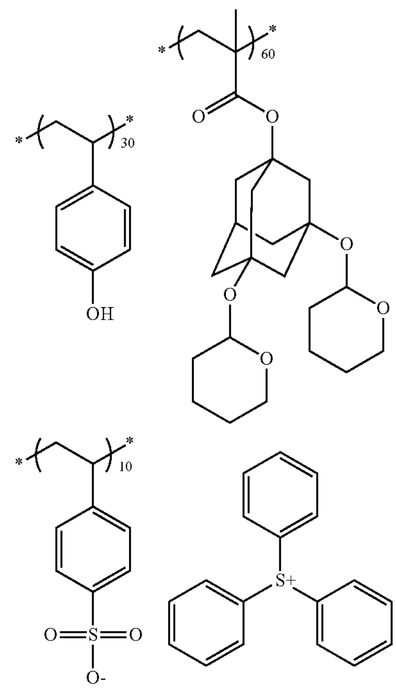
Mw 20500
Mw/Mn = 1.88
A-20
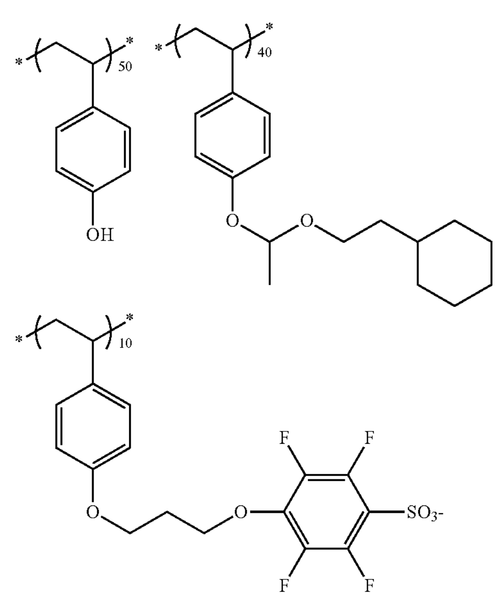

-continued
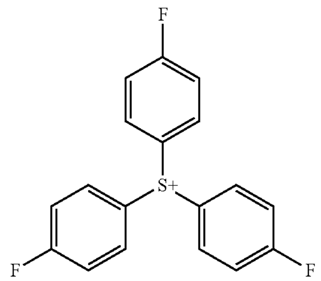
Mw 5300
Mw/Mn = 1.15
A-21
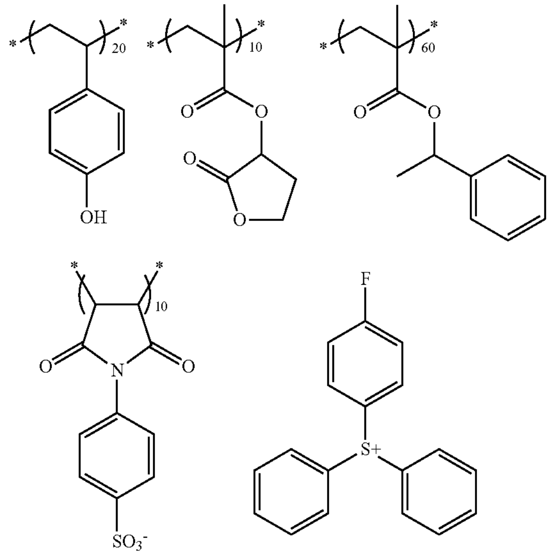
Mw 14000
Mw/Mn = 1.95
A-22
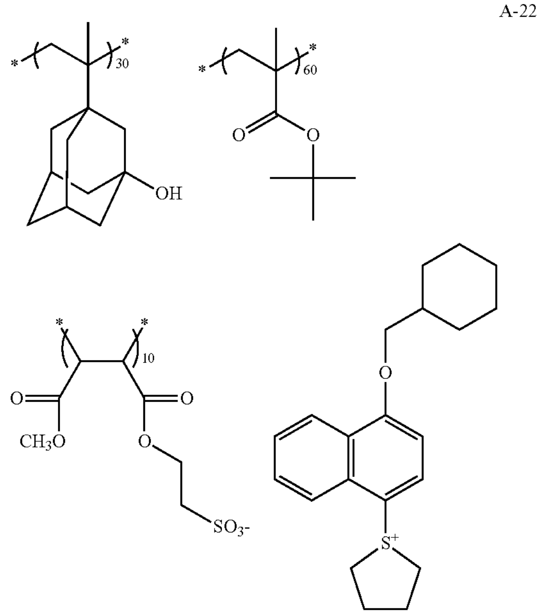
Mw 14500
Mw/Mn = 1.90
-continued
A-23
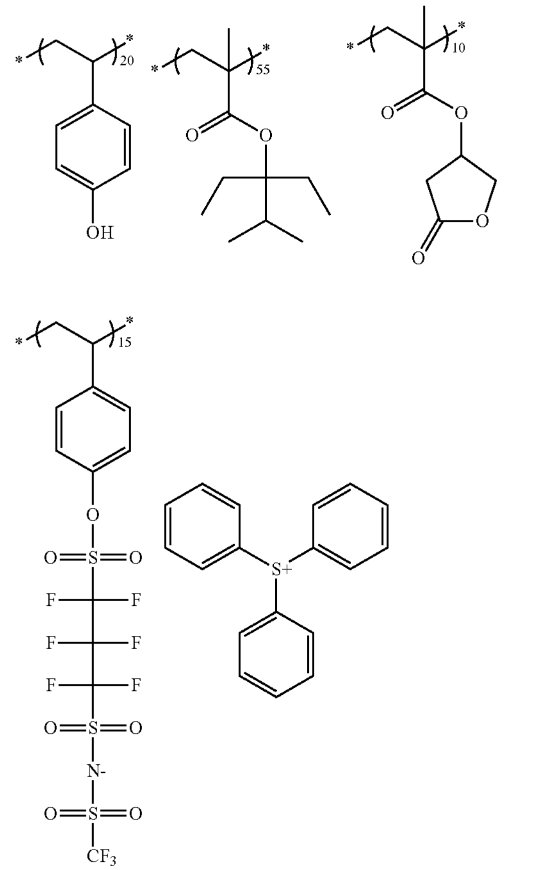
Mw 11000
Mw/Mn = 1.46
A-24
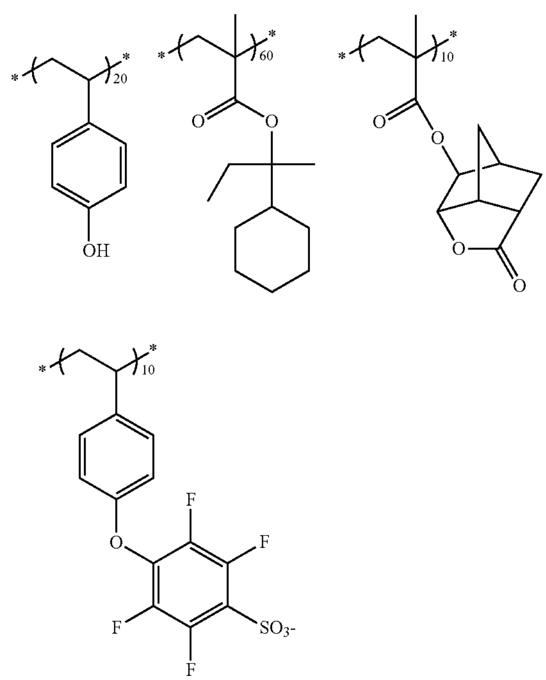

-continued
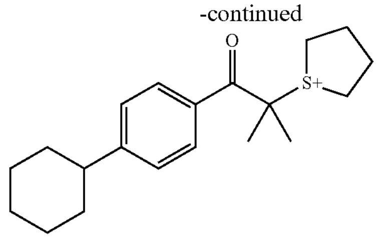
Mw 12000
Mw/Mn = 1.48
A-25
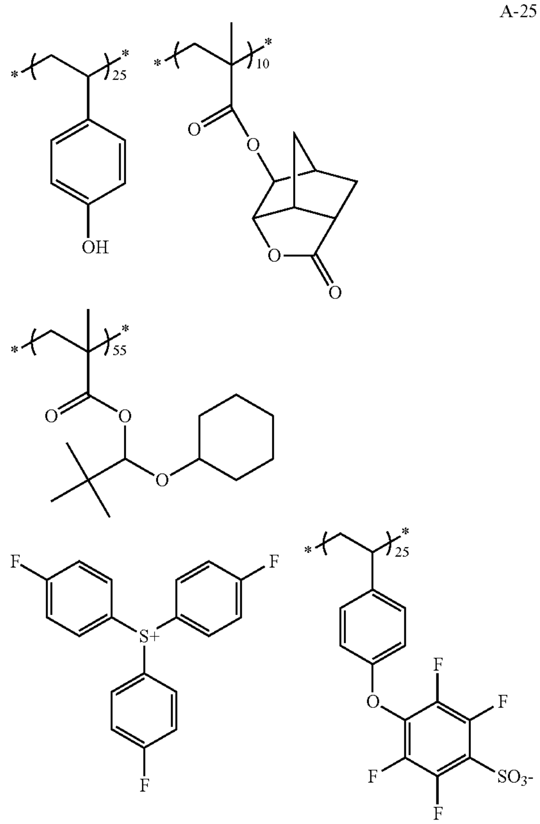
Mw 8500
Mw/Mn = 1.37
A-26
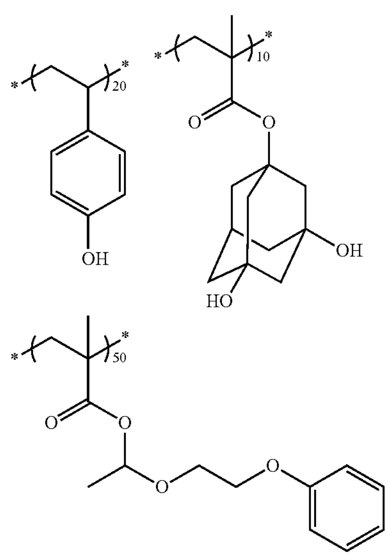
-continued
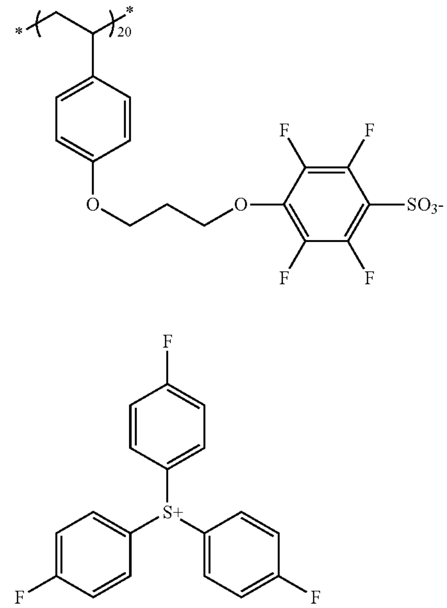
Mw 10500
Mw/Mn = 1.68
A-27
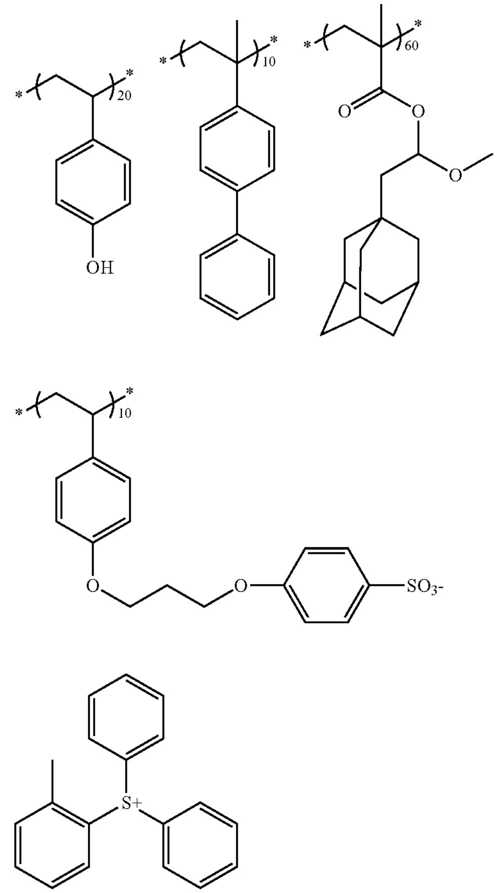
Mw 6000
Mw/Mn = 1.42

-continued

A-28

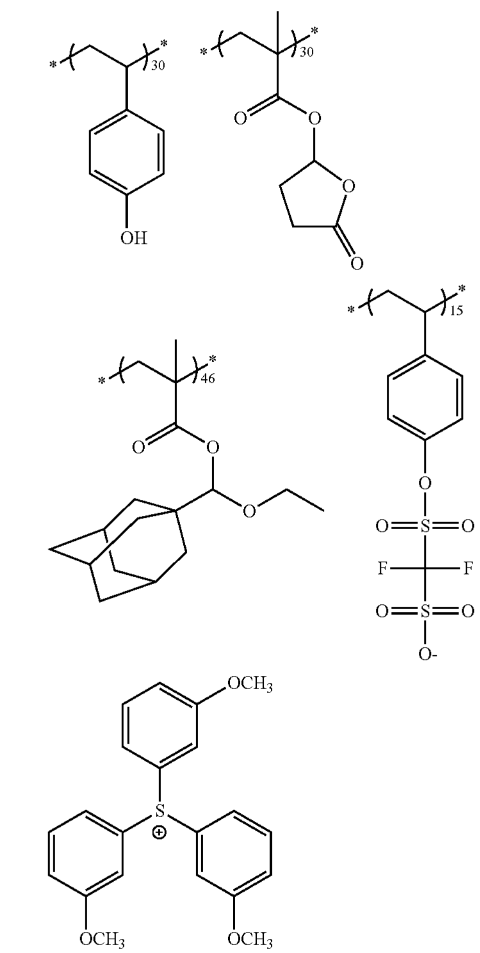

Mw 10000
Mw/Mn = 1.54

A-29

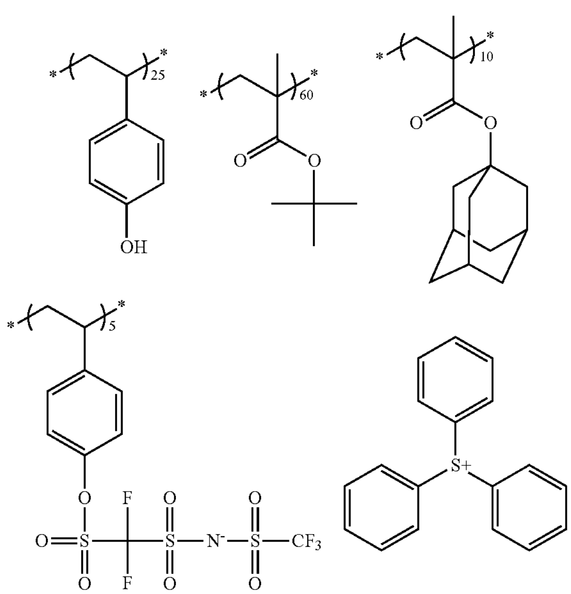

Mw: 10000
Mw/Mn: 1.53

-continued

A-30

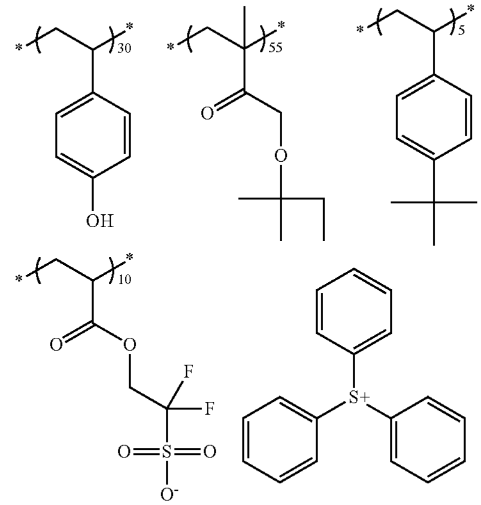

Mw; 12000
Mw/Mn; 1.58

Synthesis Example: Resin (A-15)

160 g cyclohexanone was put into a three neck flask under nitrogen flow and then heated at 80° C. (solvent 1). Next, monomer-A1 (13.58 g), monomer-1 (23.11 g), monomer-2 (12.48 g), and monomer-3 (31.35 g) were dissolved in cyclohexanone (297 g) to prepare a monomer solution. Further, 6.4 mol % of polymerization initiator V-601 (manufactured by Wako Pure Chemical Industries, Ltd.) was added to the monomers and then dissolved. The solution obtained as such was dropped to the solvent 1 over 6 hours. After the dropping has been completed, reaction was further performed for two hours at 80° C. The reaction solution was allowed to cool and was dropped in a mixing solvent of 3,000 g heptane/750 g ethyl acetate, and the precipitated powder was collected by filtration and dried to obtain 62 g of resin (A-15). The weight average molecular weight of the obtained resin (A-15) was 10,500, and the polydispersity (Mw/Mn) thereof was 1.77. The composition ratio (molar ratio) measured by 13C-NMR was 5/43/37/15. Further, all of the works were performed under a yellow lamp.

Other types of resin were synthesized in a similar manner.

monomer-A1

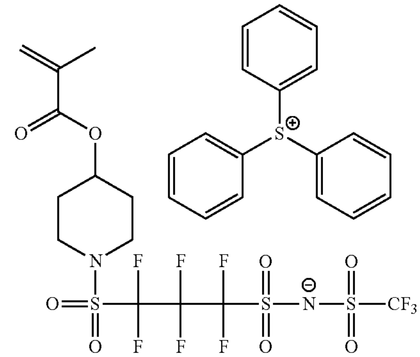

-continued monomer-1

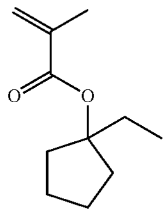

monomer-2

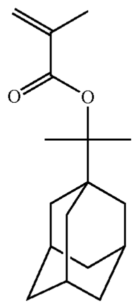

monomer-3

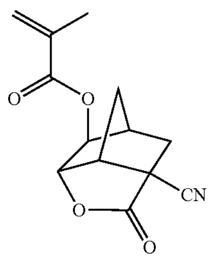

<Comparative Polymer, Comparative Acid Generator>

In comparative examples 2-1, 2-3, 3-1 and 3-3, the following resin and acid generator were used. The weight average molecular weight (Mw) and polydispersity (Mw/Mn) of the resin are described below. Further, the composition ratio of each repeating unit of the resin is shown in molar ratio.

RA-1

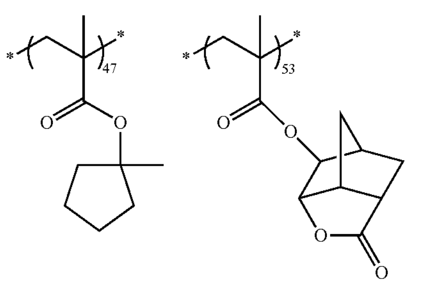

Mw 7120
Mw/Mn = 1.51

Z-10

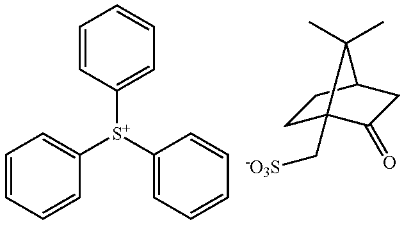

<Basic Compound>

Any one of the following compounds (N-1) to (N-11) was used as the basic compound.

N-1

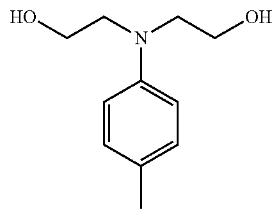

N-2

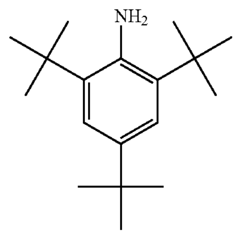

N-3

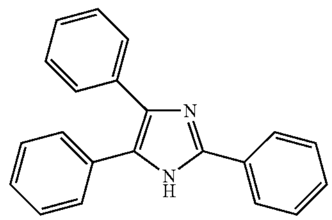

N-4

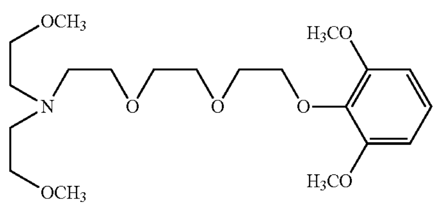

N-5

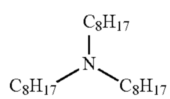

N-6

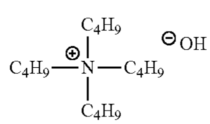

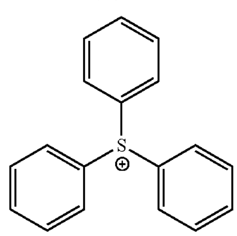

N-7

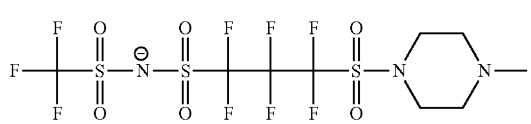

-continued

N-8

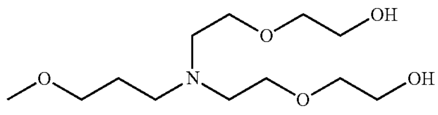

N-9

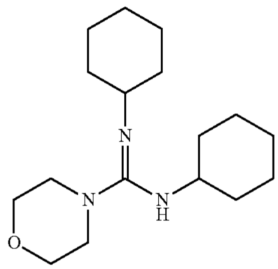

N-10

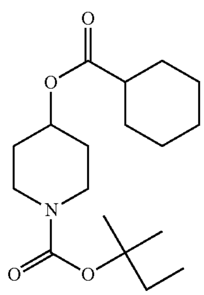

N-11

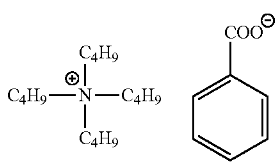

<Surfactant>

As the surfactant, the following products W-1 to W-4 were used.

W-1: Megafac R08 (manufactured by DIC corporation; fluorine and silicone-based)

W-2: polysiloxane polymer KP-341 (manufactured by Shin-Etsu Chemical Co., Ltd.; silicone-based)

W-3: Troysol S-366 (manufactured by Troy Chemical Corp.; fluorine-based)

W-4: PF6320 (manufactured by OMNOVA Solutions Inc.; fluorine-based)

<Coating Solvent>

As the coating solvent, the following were used.

S1: propylene glycol monomethyl ether acetate (PGMEA)

S2: propyleneglycolmonomethylether (PGME)

S3: ethyl lactate

S4: cyclohexanone

<Developer>

As the organic solvent for the developer, the following were used.

SG-1: anisole

SG-2: methyl amyl ketone (2-heptanone)

SG-3: butyl acetate

<Additive>

As the additive (a nitrogen-containing compound and the like) of the present invention used in the developer, the following were used.

(F-1): tri-n-octylamine (F-2): di-n-octylamine (F-3): 1-aminodecane (F-4): N,N-dibutylaniline (F-5): proline (F-6): tetramethylethylenediamine (F-7)

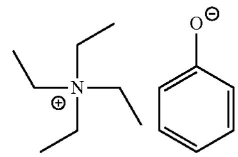

(F-8)

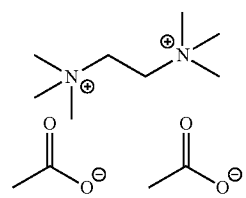

(F-9)

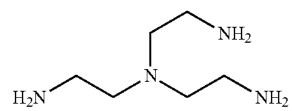

(F-10)

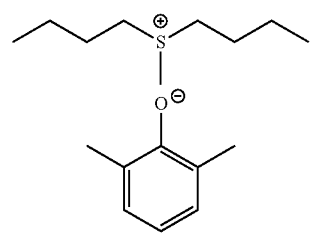

(F-11)

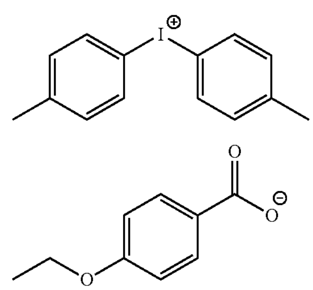

<Rinsing Liquid>

As the rinsing liquid, the following were used.

SR-1: 2-Pentanol

SR-2: 1-Hexanol

SR-3: methyl isobutyl carbinol

Example 1-1

0.1 g (0.1% by mass) additive (F-1) of the present invention was added to 99.9 g (99.9% by mass) butyl acetate and then stirred to obtain the developer (G-1).

Examples 1-2 to 1-19, Comparative Example 1-1

The examples were carried out in a similar manner as in Example 1-1 except that a predetermined amount of organic solvent described in Table 1 and a predetermined amount of additive of the present invention are blended, thereby obtaining the developers (G-2) to (G-19) and (g-1).

TABLE 1

| | | Organic Solvent | | Additive | |
|---|---|---|---|---|---|
| Ex. | Devel-oper | kind | used amount (% by mass) | kind | used amount (% by mass) |
| Ex. 1-1 | G-1 | SG-3: Butyl acetate | 99.9 | F-1 | 0.1 |
| Ex. 1-2 | G-2 | SG-3: Butyl acetate | 98 | F-1 | 2 |
| Ex. 1-3 | G-3 | SG-3: Butyl acetate | 90 | F-1 | 10 |
| Ex. 1-4 | G-4 | SG-3: Butyl acetate | 98 | F-2 | 2 |
| Ex. 1-5 | G-5 | SG-3: Butyl acetate | 98 | F-3 | 2 |
| Ex. 1-6 | G-6 | SG-3: Butyl acetate | 98 | F-4 | 2 |
| Ex. 1-7 | G-7 | SG-3: Butyl acetate | 98 | F-5 | 2 |
| Ex. 1-8 | G-8 | SG-3: Butyl acetate | 98 | F-6 | 2 |
| Ex. 1-9 | G-9 | SG-2: Methyl amyl ketone | 98 | F-1 | 2 |
| Ex. 1-10 | G-10 | SG-2: Methyl amyl ketone | 98 | F-3 | 2 |
| Ex. 1-11 | G-11 | SG-2: Methyl amyl ketone | 98 | F-4 | 2 |
| Ex. 1-12 | G-12 | SG-1: Anisole | 98 | F-1 | 2 |
| Ex. 1-13 | G-13 | " | 98 | F-3 | 2 |
| Ex. 1-14 | G-14 | " | 98 | F-4 | 2 |
| Ex. 1-15 | G-15 | SG-3: Butyl acetate | 98 | F-7 | 2 |
| Ex. 1-16 | G-16 | SG-3: Butyl acetate | 98 | F-8 | 2 |
| Ex. 1-17 | G-17 | SG-3: Butyl acetate | 98 | F-9 | 2 |
| Ex. 1-18 | G-18 | SG-3: Butyl acetate | 98 | F-10 | 2 |
| Ex. 1-19 | G-19 | SG-3: Butyl acetate | 98 | F-11 | 2 |
| Co Ex. 1-1 | g-1 | SG-3: Butyl acetate | 100 | | |

Examples 2-1 to 2-37, Comparative Examples 2-1 to 2-3 (Electron Beam (EB) Exposure)

(1) Preparation of Coating Solution of Actinic Ray-Sensitive or Radiation-Sensitive Resin Composition and Coating Formation A coating-solution composition having a composition shown in the following Table was precisely filtered by a membrane filter having the hole diameter of 0.1 μm, thus obtaining an actinic ray-sensitive or radiation-sensitive resin composition (resist composition: solid concentration 3.0% by mass).

The solution of the actinic ray-sensitive or radiation-sensitive resin composition is coated onto a 6-inch Si wafer, which was previously treated with hexamethyldisilazane (HMDS), using Spincoater Mark8 manufactured by Tokyo Electron Limited, and then was dried on a hot plate for 60 seconds at 100° C., thus obtaining a resist film having the film thickness of 50 nm.

(2) EB Exposure and Development

The wafer coated with the resist film obtained by (1) is pattern-irradiated using an electron-beam drawing apparatus (manufactured by Hitachi, Ltd. HL750, acceleration voltage 50 KeV). At this time, drawing was performed to form line and space of 1:1. After the completion of the electron beam drawing, the wafer was heated on the hot plate at 110° C. for 60 seconds and then was developed by paddling the organic-based developer shown in the following Table for 30 seconds. If necessary, the wafer was rinsed by paddling with the rinsing liquid described in the following Table for 30 seconds (examples in which the rinsing liquid was not described mean that no rinsing process was carried out). After the wafer was rotated at the rotational speed of 4,000 rpm for 30 seconds, it was heated at 90° C. for 60 seconds, thus obtaining the resist pattern having the line and space pattern of 1:1 with the line width of 50 nm.

(3) Evaluation of Resist Pattern

The sensitivity and the resolution of the obtained resist pattern were evaluated in the following method using a scanning electron microscope (manufactured by Hitachi, Ltd. S-9220). Further, the reduction amount of the film was evaluated. The results are shown in the following tables.

(3-1) Sensitivity

Irradiation energy required to resolve the line and space pattern of 1:1 with the line width of 50 nm was defined as sensitivity (Eop). It is shown that the lower the value is, the better the performance is.

(3-2) Resolution

In the above-described Eop, a minimum line width of separated line and space pattern of (1:1) was defined as resolution. It is shown that the lower the value is, the better the performance is.

(3-3) Reduction Amount of Film

After a series of processes has been completed, the thickness of a remaining resist film was measured, and a value obtained by subtracting the remaining film thickness from an initial thickness was defined as a reduction amount of film (nm). In addition, an optical-interference-type apparatus for measuring a film thickness (Lamudaace, manufactured by SCREEN Holdings Co., Ltd.) was used.

TABLE 2

Evaluation Result in EB exposure

| | Resin | Conc. | Acid generator | Conc. | Basic compound | Conc. | Organic Solvent(B) (molar ratio) | Surfactant (molar ratio) | Conc. | Developer | Rinse liquid | Sensitivity ($\mu C/cm^2$) | Reso-lution (nm) | Film reduction amount (nm) |
|---|---|---|---|---|---|---|---|---|---|---|---|---|---|---|
| Ex. 2-1 | A-1 | 97.95 | | | N-11 | 2 | S1/S2 (40/60) | W-1 | 0.05 | G-2 | | 32.5 | 39 | 12.9 |
| Ex. 2-2 | A-2 | 97.95 | | | N-11 | 2 | S1/S2 (40/60) | W-1 | 0.05 | G-2 | | 29.0 | 34 | 9.5 |
| Ex. 2-3 | A-3 | 97.95 | | | N-11 | 2 | S1/S2 (40/60) | W-1 | 0.05 | G-2 | | 28.0 | 32 | 8.7 |
| Ex. 2-4 | A-4 | 97.95 | | | N-11 | 2 | S1/S3 (40/60) | W-1 | 0.05 | G-2 | | 28.0 | 32 | 8.6 |
| Ex. 2-5 | A-5 | 97.95 | | | N-11 | 2 | S1/S2 (40/60) | W-2 | 0.05 | G-2 | | 29.0 | 34 | 9.5 |

TABLE 2-continued

| Evaluation Result in EB exposure | | | | | | | | | | | | | | | |
|---|---|---|---|---|---|---|---|---|---|---|---|---|---|---|---|
| | Resin | Conc. | Acid generator | Conc. | Basic compound | Conc. | Organic Solvent(B) (molar ratio) | Surfactant (molar ratio) | Conc. | Developer | Rinse liquid | Sensitivity (μC/cm$^2$) | Reso-lution (nm) | Film reduction amount (nm) |
| Ex. 2-6 | A-6 | 97.95 | | | N-11 | 2 | S1/S2 (40/60) | W-1 | 0.05 | G-2 | | 27.0 | 30 | 7.0 |
| Ex. 2-7 | A-7 | 97.95 | | | N-11 | 2 | S1/S2 (40/60) | W-4 | 0.05 | G-3 | | 28.0 | 32 | 8.5 |
| Ex. 2-8 | A-8 | 97.95 | | | N-11 | 2 | S1/S2 (40/60) | W-1 | 0.05 | G-2 | | 27.0 | 30 | 7.1 |
| Ex. 2-9 | A-9 | 98 | | | N-1 | 2 | S1/S2/S3 (30/60/10) | | | G-1 | | 30.0 | 37 | 11.5 |
| Ex. 2-10 | A-10 | 97.95 | | | N-2 | 2 | S1/S2 (40/60) | W-1 | 0.05 | G-2 | SR-1 | 31.0 | 38 | 12.3 |
| Ex. 2-11 | A-11 | 97.95 | | | N-5 | 2 | S1/S2 (40/60) | W-1 | 0.05 | G-2 | SR-2 | 31.0 | 38 | 12.4 |
| Ex. 2-12 | A-12 | 96.95 | | | N-10 | 3 | S1/S2 (40/60) | W-1/W-2 (1/1) | 0.05 | G-12 | SR-3 | 32.0 | 39 | 12.8 |
| Ex. 2-13 | A-13 | 97.95 | | | N-8 | 2 | S1/S2 (40/60) | W-3 | 0.05 | G-13 | | 30.0 | 37 | 11.1 |
| Ex. 2-14 | A-14 | 97.95 | | | N-3 | 2 | S1/S2 (40/60) | W-1/W-2 (1/1) | 0.05 | G-14 | | 30.0 | 37 | 11.1 |
| Ex. 2-15 | A-15 | 96.95 | | | N-7 | 3 | S1/S2 (40/60) | W-1 | 0.05 | G-9 | | 30.0 | 37 | 10.9 |
| Ex. 2-16 | A-16 | 97 | | | N-5 | 3 | S1/S2/S3 (30/60/10) | | | G-10 | SR-1 | 30.0 | 37 | 10.7 |
| Ex. 2-17 | A-17 | 97.95 | | | N-3 | 2 | S1/S4 (40/60) | W-1 | 0.05 | G-11 | SR-2 | 30.0 | 37 | 10.8 |
| Ex. 2-18 | A-18 | 96.95 | | | N-4 | 3 | S1/S4 (40/60) | W-1 | 0.05 | G-4 | | 29.5 | 36 | 10.3 |
| Ex. 2-19 | A-19 | 97.95 | | | N-11 | 2 | S1/S4 (40/60) | W-2 | 0.05 | G-5 | | 29.5 | 36 | 10.0 |
| Ex. 2-20 | A-20 | 97.95 | | | N-11 | 2 | S1/S2 (40/60) | W-2 | 0.05 | G-6 | | 28.5 | 33 | 9.1 |
| Ex. 2-21 | A-21 | 97.95 | | | N-6 | 2 | S1/S2 (40/60) | W-1 | 0.05 | G-7 | SR-3 | 29.5 | 36 | 10.1 |
| Ex. 2-22 | A-22 | 98.95 | | | N-9 | 1 | S1/S3 (40/60) | W-3 | 0.05 | G-8 | | 32.0 | 39 | 12.6 |
| Ex. 2-23 | A-23 | 97.95 | | | N-4 | 2 | S1/S2 (40/60) | W-1 | 0.05 | G-2 | | 28.0 | 32 | 8.6 |
| Ex. 2-24 | A-24 | 97.95 | | | N-9 | 2 | S1/S2 (40/60) | W-1 | 0.05 | G-2 | | 28.5 | 33 | 9.2 |
| Ex. 2-25 | A-25 | 97.95 | | | N-6 | 2 | S1/S2 (40/60) | W-1 | 0.05 | G-2 | | 27.5 | 31 | 7.7 |
| Ex. 2-26 | A-26 | 97.95 | | | N-6 | 2 | S1/S2 (40/60) | W-1 | 0.05 | G-2 | | 27.5 | 31 | 7.6 |
| Ex. 2-27 | A-27 | 97.95 | | | N-6 | 2 | S1/S2 (40/60) | W-1 | 0.05 | G-2 | | 27.5 | 31 | 7.7 |
| Ex. 2-28 | A-28 | 97.95 | | | N-6 | 2 | S1/S2 (40/60) | W-1 | 0.05 | G-2 | | 28.0 | 32 | 8.6 |
| Ex. 2-29 | A-6 | 97.95 | | | N-11 | 2 | S1/S2 (40/60) | W-1 | 0.05 | G-15 | SR-3 | 27.5 | 31 | 7.3 |
| Ex. 2-30 | A-3 | 97.95 | | | N-11 | 2 | S1/S2 (40/60) | W-1 | 0.05 | G-16 | SR-3 | 28.5 | 33 | 8.9 |
| Ex. 2-31 | A-25 | 97.95 | | | N-6 | 2 | S1/S2 (40/60) | W-1 | 0.05 | G-17 | SR-3 | 27.5 | 31 | 7.6 |
| Ex. 2-32 | A-4 | 97.95 | | | N-11 | 2 | S1/S3 (40/60) | W-1 | 0.05 | G-18 | SR-3 | 28.5 | 33 | 8.9 |
| Ex. 2-33 | A-5 | 97.95 | | | N-11 | 2 | S1/S2 (40/60) | W-2 | 0.05 | G-19 | SR-3 | 29.5 | 35 | 9.8 |
| Ex. 2-34 | A-29 | 99 | | | N-3 | 1 | S1/S2 (40/60) | | | G-1 | | 30.0 | 35 | 10.2 |
| Ex. 2-35 | A-30 | 98 | | | N-5 | 2 | S1/S2 (20/80) | | | G-2 | | 31.0 | 36 | 10.9 |
| Ex. 2-36 | A-4/A-5 | 49/49 | | | N-3 | 2 | S1/S2 (30/70) | | | G-3 | | 28.5 | 33 | 9.0 |
| Ex. 2-37 | A-29 | 98 | | | N-5/N-7 | 1/1 | S1/S2 (50/50) | | | G-2 | SR-3 | 30.5 | 36 | 10.8 |
| Co Ex. 2-1 | RA-1 | 89.95 | Z-10 | 8 | N-11 | 2 | S1/S2 (40/60) | W-1 | 0.05 | g-1 | | 38.0 | 45 | 20.1 |
| Co Ex. 2-2 | A-1 | 97.95 | | | N-11 | 2 | S1/S2 (40/60) | W-1 | 0.05 | g-1 | | 37.0 | 43 | 17.5 |
| Co Ex. 2-3 | RA-1 | 89.95 | Z-10 | 8 | N-11 | 2 | S1/S2 (40/60) | W-1 | 0.05 | G-2 | | 36.5 | 43 | 16.7 |

The concentration of each component represents a concentration (% by mass) in the total solid concentration.

As seen from the above Table, Examples 2-1 to 2-37 can simultaneously satisfy high sensitivity, high resolution and performance of decreasing the film reduction in a highly advanced manner.

Here, as for Comparative Example 2-1 using a comparative polymer RA-1 and a low-molecular-weight acid generator Z-10 described in the example of Patent Document 8 and using a common organic-based developer, which does not contain an "additive forming at least one interaction of ionic bond, hydrogen bond, chemical bond and dipole interaction with polar group (hereinafter, simply referred to as the "additive")" of the present invention, it was found that Comparative Example 2-3 using the organic-based developer containing the additive of the present invention was slightly improved in performance of decreasing the film reduction, resolution and sensitivity but was not very effective.

In contrast, as for Comparative Example 2-2 using resin having a repeating unit (R) with a structural moiety capable of decomposing upon irradiation with an actinic ray or radiation to generated acid and using the common organic-based developer, which does not contain the additive of the present invention, it was found that Examples 2-1 to 2-37 using the organic-based developer containing the additive of the present invention was remarkably improved in film reduction performance, resolution and sensitivity.

It is assumed that this result is due to the following reasons: when containing the additive of the present invention, above all, a nitrogen-containing compound (amines and the like) in the organic-based developer, there occurs interaction in which a salt is formed by an acidic group such as carboxylic acid generated in the exposed portion and the additive of the present invention in the organic-based developer, so that the exposed portion becomes more insoluble in the organic-based developer. As a result, the decrease in film reduction is achieved, enhanced resolution and high sensitivity are realized due to the enhanced contrast, and a side contact angle of the resit is improved due to the interaction such as the salt formation, thus preventing a collapse and enhancing the resolution.

However, in Comparative Example 2-3, only the interaction between the acidic group present in the polymer such as carboxylic acid and the additive of the present invention in the organic-based developer contributes to improvement on the performance of the film reduction, the resolution and the sensitivity, so that improvement effect is not big. On the contrary, as for Example 2-1 in which resin having the repeating unit (R) with the structural moiety capable of decomposing upon irradiation with an actinic ray or radiation to generated acid is used, sulfonic acid or the like generated in the polymer by the exposure further interacts with the additive of the present invention. Accordingly, it is expected that the decrease in film reduction, the improvement on resolution and the high sensitivity will be more remarkably achieved.

Further, it is apparent that Example 2-3 using resin further having a repeating unit containing a phenolic hydroxyl group represented by Formula (I) as well as the repeating unit (R) with the structural moiety capable of decomposing upon irradiation with an actinic ray or radiation to generated acid, more considerably realizes the decrease in film reduction, the improvement on resolution and the high sensitivity, as compared to Example 2-2 using the repeating unit (R) with the structural moiety capable of decomposing upon irradiation with an actinic ray or radiation to generated acid, and resin A-2 that has the same structure as the repeating unit having a group decomposed by the action of an acid but does not have the repeating unit represented by Formula (I). It is assumed that this result is due to the following reason: since the above-described repeating unit has the phenolic hydroxyl group, a lot of secondary electrons are generated at the time of exposure and thereby a large amount of acid is generated, so that fast and much deprotection is done for the acid-decomposable group of the resin, and in addition, the repeating unit represented by Formula (I) interacts with the additive of the present invention. Further, based on the comparison of Example 2-3 or 2-5 with Example 2-10, it can be seen that the effect is more remarkable and preferred when both X4 and L4 in the repeating unit represented by Formula (I) are a single bond, among repeating units represented by the same Formula (I).

Further, it can be seen that examples (for example, Examples 2-3, 2-4, 2-6, 2-8 and the like) using a resin having a repeating unit represented by Formula (II-1) or Formula (1) is particularly excellent in resolution and sensitivity, as compared to examples using a resin that does not have the repeating unit represented by Formula (II-1) or Formula (1) as in Example 2-1, for example. The reason is assumed that the deprotection activation energy of the acid-decomposable group is low and carboxylic acid is easily generated from a small amount of acid.

Further, as compared to Comparative Examples 2-1 and 2-3, the example using the resin having the repeating unit (R) can form a pattern with high resolution and enhanced performance of decreasing film reduction. It is assumed that this result is due to the following reason: since the resin has the repeating unit (R), namely, the structural moiety capable of decomposing upon irradiation with an electron beam or extreme ultraviolet to generate acid is bonded to the resin, (i) the diffusion length of the generated acid can be reduced, (II) the solubility of the exposed portion in the organic-based developer is decreased, thus enhancing dissolution contrast for the developer.

Examples 3-1 to 3-37, Comparative Example 3-1 to 3-3 (Extreme Ultraviolet (EUV) Exposure)

(4) Preparation of Coating Solution of Actinic Ray-Sensitive or Radiation-Sensitive Resin Composition and Coating Formation A coating-solution composition having a composition shown in the following Table was precisely filtered by a membrane filter having the hole diameter of 0.05 μm, thus obtaining an actinic ray-sensitive or radiation-sensitive resin composition (resist composition: solid concentration 2.5% by mass).

The solution of the actinic ray-sensitive or radiation-sensitive resin composition is coated onto a 6-inch Si wafer, which was previously treated with hexamethyldisilazane (HMDS), using Spincoater Mark8 manufactured by Tokyo Electron Limited, and then was dried on a hot plate for 60 seconds at 100° C., thus obtaining a resist film having the film thickness of 50 nm.

(5) EUV Exposure and Development

The wafer coated with the resist film obtained by (4) was pattern-exposed using an EUV exposure apparatus (manufactured by Exitech corporation, Micro Exposure Tool, NA0.3, Quadrupole, outer sigma 0.68, inner sigma 0.36), and using an exposure mask (line/space=1/1). After the irradiation has been completed, the wafer was heated on the hot plate at 110° C. for 60 seconds and then was developed by paddling the organic-based developer shown in the following table for 30 seconds. If necessary, the wafer was rinsed by paddling with the rinsing liquid described in the following table for 30 seconds (examples in which the rinsing liquid was not described mean that no rinsing process was carried out). Subsequently, after the wafer was rotated at the rotational speed of 4,000 rpm for 30 seconds, it was baked at 90° C. for 60 seconds, thus obtaining the resist pattern having the line and space pattern of 1:1 with the line width of 50 nm.

(6) Evaluation of Resist Pattern

The sensitivity and the resolution of the obtained resist pattern were evaluated in the following method using a scanning electron microscope (manufactured by Hitachi, Ltd. S-938011). Further, the reduction amount of the film was evaluated. The results are shown in the following table.

(6-1) Sensitivity

Exposure amount required to resolve the line and space pattern of 1:1 with the line width of 50 nm was defined as sensitivity (Eop). It is shown that the lower the value is, the better the performance is.

(6-2) Resolution

In the above-described Eop, a minimum line width of separated line and space pattern of (1:1) was defined as resolution. It is shown that the lower the value is, the better the performance is.

(6-3) Reduction Amount of Film

After a series of processes has been completed, the thickness of a remaining resist film was measured, and a value obtained by subtracting the remaining film thickness from an initial thickness was defined as a reduction amount of film (nm). In addition, an optical-interference-type apparatus for measuring a film thickness (Lamudaace, manufactured by SCREEN Holdings Co., Ltd.) was used.

TABLE 3

Evaluation Result in EUV exposure

| | Resin | Conc. | Acid generator | Conc. | Basic compound | Conc. | Organic Solvent(B) (molar ratio) | Surfactant (molar ratio) | Conc. | Developer | Rinse liquid | Sensitivity ($mJ/cm^2$) | Reso-lution (nm) | Film reduction amount (nm) |
|---|---|---|---|---|---|---|---|---|---|---|---|---|---|---|
| Ex. 3-1 | A-1 | 97.95 | | | N-11 | 2 | S1/S2 (40/60) | W-1 | 0.05 | G-2 | | 18.0 | 28 | 13.5 |
| Ex. 3-2 | A-2 | 97.95 | | | N-11 | 2 | S1/S2 (40/60) | W-1 | 0.05 | G-2 | | 16.0 | 24 | 10.1 |
| Ex. 3-3 | A-3 | 97.95 | | | N-11 | 2 | S1/S3 (40/60) | W-1 | 0.05 | G-2 | | 15.0 | 22 | 9.3 |
| Ex. 3-4 | A-4 | 97.95 | | | N-11 | 2 | S1/S2 (40/60) | W-1 | 0.05 | G-2 | | 14.5 | 22 | 9.4 |
| Ex. 3-5 | A-5 | 97.95 | | | N-11 | 2 | S1/S2 (40/60) | W-2 | 0.05 | G-2 | | 16.0 | 24 | 10.2 |
| Ex. 3-6 | A-6 | 97.95 | | | N-11 | 2 | S1/S2 (40/60) | W-1 | 0.05 | G-2 | | 13.5 | 20 | 7.5 |
| Ex. 3-7 | A-7 | 97.95 | | | N-11 | 2 | S1/S2 (40/60) | W-4 | 0.05 | G-3 | | 14.5 | 22 | 9.1 |
| Ex. 3-8 | A-8 | 97.95 | | | N-11 | 2 | S1/S2 (40/60) | W-1 | 0.05 | G-2 | | 13.5 | 20 | 7.7 |
| Ex. 3-9 | A-9 | 98 | | | N-1 | 2 | S1/S2/S3 (30/60/10) | | | G-1 | | 17.0 | 26 | 12.1 |
| Ex. 3-10 | A-10 | 97.95 | | | N-2 | 2 | S1/S2 (40/60) | W-1 | 0.05 | G-2 | SR-1 | 17.5 | 27 | 12.8 |
| Ex. 3-11 | A-11 | 97.95 | | | N-5 | 2 | S1/S2 (40/60) | W-1 | 0.05 | G-2 | SR-2 | 17.5 | 27 | 12.9 |
| Ex. 3-12 | A-12 | 96.95 | | | N-10 | 3 | S1/S2 (40/60) | W-1/W-2 (1/1) | 0.05 | G-12 | SR-3 | 18.0 | 28 | 13.3 |
| Ex. 3-13 | A-13 | 97.95 | | | N-8 | 2 | S1/S2 (40/60) | W-3 | 0.05 | G-13 | | 17.0 | 26 | 11.7 |
| Ex. 3-14 | A-14 | 97.95 | | | N-3 | 2 | S1/S2 (40/60) | W-1/W-2 (1/1) | 0.05 | G-14 | | 17.0 | 26 | 11.7 |
| Ex. 3-15 | A-15 | 96.95 | | | N-7 | 3 | S1/S2 (40/60) | W-1 | 0.05 | G-9 | | 17.0 | 26 | 11.5 |
| Ex. 3-16 | A-16 | 97 | | | N-5 | 3 | S1/S2/S3 (30/60/10) | | | G-10 | SR-1 | 17.0 | 26 | 11.4 |
| Ex. 3-17 | A-17 | 97.95 | | | N-3 | 2 | S1/S4 (40/60) | W-1 | 0.05 | G-11 | SR-2 | 17.0 | 26 | 11.6 |
| Ex. 3-18 | A-18 | 96.95 | | | N-4 | 3 | S1/S4 (40/60) | W-1 | 0.05 | G-4 | | 16.5 | 26 | 10.9 |
| Ex. 3-19 | A-19 | 97.95 | | | N-11 | 2 | S1/S4 (40/60) | W-2 | 0.05 | G-5 | | 16.5 | 26 | 10.6 |
| Ex. 3-20 | A-20 | 97.95 | | | N-11 | 2 | S1/S2 (40/60) | W-2 | 0.05 | G-6 | | 15.5 | 23 | 9.7 |
| Ex. 3-21 | A-21 | 97.95 | | | N-6 | 2 | S1/S2 (40/60) | W-1 | 0.05 | G-7 | SR-3 | 16.5 | 26 | 10.7 |
| Ex. 3-22 | A-22 | 98.95 | | | N-9 | 1 | S1/S3 (40/60) | W-3 | 0.05 | G-8 | | 18.0 | 28 | 13.2 |
| Ex. 3-23 | A-23 | 97.95 | | | N-4 | 2 | S1/S2 (40/60) | W-1 | 0.05 | G-2 | | 15.0 | 22 | 9.3 |
| Ex. 3-24 | A-24 | 97.95 | | | N-9 | 2 | S1/S2 (40/60) | W-1 | 0.05 | G-2 | | 15.5 | 23 | 9.8 |
| Ex. 3-25 | A-25 | 97.95 | | | N-6 | 2 | S1/S2 (40/60) | W-1 | 0.05 | G-2 | | 14.0 | 21 | 8.4 |
| Ex. 3-26 | A-26 | 97.95 | | | N-6 | 2 | S1/S2 (40/60) | W-1 | 0.05 | G-2 | | 14.0 | 21 | 8.3 |
| Ex. 3-27 | A-27 | 97.95 | | | N-6 | 2 | S1/S2 (40/60) | W-1 | 0.05 | G-2 | | 14.0 | 21 | 8.5 |

TABLE 3-continued

| Evaluation Result in EUV exposure | | | | | | | | | | | | | | |
|---|---|---|---|---|---|---|---|---|---|---|---|---|---|---|
| | Resin | Conc. | Acid generator | Conc. | Basic compound | Conc. | Organic Solvent(B) (molar ratio) | Surfactant (molar ratio) | Conc. | Developer | Rinse liquid | Sensitivity (mJ/cm$^2$) | Reso-lution (nm) | Film reduction amount (nm) |
| Ex. 3-28 | A-28 | 97.95 | | | N-6 | 2 | S1/S2 (40/60) | W-1 | 0.05 | G-2 | | 15.0 | 22 | 9.2 |
| Ex. 3-29 | A-6 | 97.95 | | | N-11 | 2 | S1/S2 (40/60) | W-1 | 0.05 | G-15 | SR-3 | 14.0 | 21 | 8.2 |
| Ex. 3-30 | A-3 | 97.95 | | | N-11 | 2 | S1/S2 (40/60) | W-1 | 0.05 | G-16 | SR-3 | 15.0 | 23 | 9.5 |
| Ex. 3-31 | A-25 | 97.95 | | | N-6 | 2 | S1/S2 (40/60) | W-1 | 0.05 | G-17 | SR-3 | 14.0 | 21 | 8.3 |
| Ex. 3-32 | A-4 | 97.95 | | | N-11 | 2 | S1/S3 (40/60) | W-1 | 0.05 | G-18 | SR-3 | 15.0 | 23 | 9.6 |
| Ex. 3-33 | A-5 | 97.95 | | | N-11 | 2 | S1/S2 (40/60) | W-2 | 0.05 | G-19 | SR-3 | 16.0 | 25 | 10.4 |
| Ex. 3-34 | A-29 | 99 | | | N-3 | 1 | S1/S2 (40/60) | | | G-1 | | 17.0 | 25 | 10.8 |
| Ex. 3-35 | A-30 | 98 | | | N-5 | 2 | S1/S2 (20/80) | | | G-2 | | 18.0 | 26 | 11.2 |
| Ex. 3-36 | A-4/A-5 | 49/49 | | | N-3 | 2 | S1/S2 (30/70) | | | G-3 | | 15.0 | 23 | 9.8 |
| Ex. 3-37 | A-29 | 98 | | | N-5/N-7 | 1/1 | S1/S2 (50/50) | | | G-2 | SR-3 | 17.5 | 26 | 11.0 |
| Co Ex. 3-1 | RA-1 | 89.95 | Z-10 | 8 | N-11 | 2 | S1/S2 (40/60) | W-1 | 0.05 | g-1 | | 22.0 | 33 | 20.5 |
| Co Ex. 3-2 | A-1 | 97.95 | | | N-11 | 2 | S1/S2 (40/60) | W-1 | 0.05 | g-1 | | 21.0 | 31 | 18.0 |
| Co Ex. 3-3 | RA-1 | 89.95 | Z-10 | 8 | N-11 | 2 | S1/S2 (40/60) | W-1 | 0.05 | G-2 | | 21.0 | 31 | 17.2 |

The concentration of each component represents a concentration (% by mass) in the total solid concentration.

As seen from the above table, Examples 3-1 to 3-37 can simultaneously satisfy high sensitivity, high resolution and performance of decreasing the film reduction in a highly advanced manner.

Here, as for Comparative Example 3-1 using a comparative polymer RA-1 and a low-molecular-weight acid generator Z-10 described in the example of Patent Document 8 and using a common organic-based developer, which does not contain an “additive forming at least one interaction of ionic bond, hydrogen bond, chemical bond and dipole interaction with polar group (hereinafter, simply referred to as the “additive”)” of the present invention, it was found that Comparative Example 3-3 using the organic-based developer containing the additive of the present invention was slightly improved in performance of decreasing the film reduction, resolution and sensitivity but was not very effective.

In contrast, as for Comparative Example 3-2 using resin having a repeating unit (R) with a structural moiety capable of decomposing upon irradiation with an actinic ray or radiation to generated acid and using the common organic-based developer, which does not contain the additive of the present invention, it was found that Examples 3-1 to 3-37 using the organic-based developer containing the additive of the present invention was remarkably improved in film reduction performance, resolution and sensitivity.

It is assumed that this result is due to the following reasons: when containing the additive of the present invention, above all, a nitrogen-containing compound (amines and the like) in the organic-based developer, there occurs interaction in which a salt is formed by an acidic group such as carboxylic acid generated in the exposed portion and the additive of the present invention in the organic-based developer, so that the exposed portion becomes more insoluble in the organic-based developer. As a result, the decrease in film reduction is achieved, enhanced resolution and high sensitivity are realized due to the enhanced contrast, and a side contact angle of the resit is improved due to the interaction such as the salt formation, thus preventing a collapse and enhancing the resolution.

However, in comparative example 3-3, only the interaction between the acidic group present in the polymer such as carboxylic acid and the additive of the present invention in the organic-based developer contributes to improvement on the performance of the film reduction, the resolution and the sensitivity, so that improvement effect is not big. On the contrary, as for example 3-1 in which resin having the repeating unit (R) with the structural moiety capable of decomposing upon irradiation with an actinic ray or radiation to generated acid is used, sulfonic acid or the like generated in the polymer by the exposure further interacts with the additive of the present invention. Accordingly, it is expected that the decrease in film reduction, the improvement on resolution and the high sensitivity will be more remarkably achieved.

Further, it is apparent that Example 3-3 using resin further having a repeating unit containing a phenolic hydroxyl group represented by Formula (I) as well as the repeating unit (R) with the structural moiety capable of decomposing upon irradiation with an actinic ray or radiation to generated acid, more considerably realizes the decrease in film reduction, the improvement on resolution and the high sensitivity, as compared to Example 3-2 using the repeating unit (R) with the structural moiety that is decomposed upon irradiation with an actinic ray or radiation to generated acid, and resin A-2 that has the same structure as the repeating unit having a group capable of decomposing by the action of an acid but does not have the repeating unit represented by Formula (I). It is assumed that this result is due to the following reason: since the above-described repeating unit has the phenolic hydroxyl group, a lot of secondary electrons are generated and thereby a large amount of acid is generated, so that fast and much deprotection is done for the acid-decomposable group of the resin, and in addition, the repeating unit represented by Formula (I) interacts with the additive of the present invention. Further, based on the comparison of Example 3-3 or 3-5 with Example 3-10, it can be seen that the effect is more remarkable and preferred when both $X_4$ and $L_4$ in the repeating unit represented by Formula (I) are a single bond, among repeating units represented by the same Formula (I).

Further, it can be seen that examples (for example, Examples 3-3, 3-4, 3-6, 3-8 and the like) using a resin having a repeating unit represented by Formula (II-1) or Formula (1) is particularly excellent in resolution and sensitivity, as compared to examples using a resin that does not have the repeating unit represented by Formula (II-1) or Formula (1) as in Example 3-1, for example. The reason is assumed that the deprotection activation energy of the acid-decomposable group is low and carboxylic acid is easily generated from a small amount of acid.

Further, as compared to Comparative Examples 3-1 and 3-3, the example using the resin having the repeating unit (R) can form a pattern with high resolution and enhanced performance of decreasing film reduction. It is assumed that this result is due to the following reason: since the resin has the repeating unit (R), namely, the structural moiety capable of decomposing by the irradiation of the electron beam or extreme ultraviolet to generate acid is bonded to the resin, (i) the diffusion length of the generated acid can be reduced, (II) the solubility of the exposed portion in the organic-based developer is decreased and dissolution contrast for the developer is enhanced.

Examples 4-1 to 4-37, Comparative Example 4-1 to 4-3 (Extreme Ultraviolet (EUV) Exposure) Contact Hole Evaluation (7) Preparation of Coating Solution of Actinic Ray-Sensitive or Radiation-Sensitive Resin Composition and Coating Formation A coating-solution composition having a composition shown in the following Table and the solid concentration of 2.5% by mass was precisely filtered by a membrane filter having the hole diameter of 0.05 μm, thus obtaining an actinic ray-sensitive or radiation-sensitive resin composition (resist composition).

The actinic ray-sensitive or radiation-sensitive resin composition is coated onto a 6-inch Si wafer, which was previously treated with hexamethyldisilazane (HMDS), using Spincoater Mark 8 manufactured by Tokyo Electron Limited, and then was dried on a hot plate for 60 seconds at 100° C., thus obtaining a resist film having the film thickness of 50 nm.

(8) EUV exposure and Development (Examples 4-1 to 4-37, Comparative Examples 4-1 to 4-3)

The wafer coated with the resist film obtained by (7) was pattern-exposed through a halftone mask having a square arrangement in which a pitch between holes is 72 nm while having holes with a hole size of 36 nm (here, a portion corresponding to the hole is shielded to form a negative image), using an EUV exposure apparatus (manufactured by Exitech corporation, Micro Exposure Tool, NA0.3, Quadrupole, outer sigma 0.68, inner sigma 0.36). After the irradiation, the wafer was heated on the hot plate at 110° C. for 60 seconds and then was developed by paddling the organic-based developer shown in the following Table for 30 seconds. Afterwards, the wafer was rinsed using the rinsing liquid described in the following Table, was rotated at the rotational speed of 4,000 rpm for 30 seconds, and then was baked at 90° C. for 60 seconds. Thereby, a contact hole pattern having the hole diameter of 36 nm was obtained. The exposure amount used at this time was established as an optimum exposure amount.

(8-1) Exposure Latitude (EL, %)

A hole size was observed by a critical dimension scanning electron microscope (SEM) (manufactured by Hitachi, Ltd., S-9380 II), and an optimal exposure amount at the time of resolving a contact hole pattern having a hole portion of 36 nm was defined as the sensitivity (Eopt) (mJ/cm$^2$). An exposure amount was obtained when the obtained optimal exposure amount (Eopt) was used as a reference and subsequently, the hole size became 36 nm±10% (that is, 39.6 nm and 32.4 nm) which was a desired value. Moreover, an exposure latitude (EL, %) defined as the following equation was calculated. The larger EL value, the smaller the change in performance due to change in exposure amount, indicating that EL was good.

[EL (%)]=[(exposure amount when the hole portion was 32.4 nm)−(exposure amount when the hole portion was 39.6 nm)]/Eopt×100

(8-1) Uniformity of Local Pattern Dimension (Local CDU, nm)

Within one shot exposed as the optimal exposure amount in the exposure latitude evaluation, in twenty sites having an interval of 1 μm therebetween, hole sizes at arbitrary 25 points in each site (i.e. 500 points in total) were measured and a standard deviation thereof was obtained to calculate 3σ. It was shown that the smaller the value is, the smaller the variation in dimension is and the better the performance is.

(8-3) Minimum Dimension Evaluation (Evaluation of Resolution of Contact Hole Pattern) (Unit: nm)

The resist film obtained using the actinic ray-sensitive or radiation-sensitive resin compositions of example and comparative example was exposed by an exposure amount which was changed. The hole diameter of an isolated hole pattern obtained as such was observed and measured by the scanning electron microscope (manufactured by Hitachi, Ltd. S 9380 II), thus obtaining a minimum pattern dimension at which the isolated hole pattern was resolved.

The small dimension means good pattern resolution.

TABLE 4

Evaluation Result in EUV exposure

| | Resin | Conc. | Acid generator | Conc. | Basic compound | Conc. | Organic Solvent(B) (molar ratio) | Surfactant (molar ratio) | Conc. | Developer | Rinse liquid | Contact hole resolution (nm) | Contact hole EL (%) | Local-CDU |
|---|---|---|---|---|---|---|---|---|---|---|---|---|---|---|
| Ex. 4-1 | A-1 | 97.95 | | | N-11 | 2 | S1/S2 (40/60) | W-1 | 0.05 | G-2 | SR-3 | 32 | 16.1 | 6.2 |
| Ex. 4-2 | A-2 | 97.95 | | | N-11 | 2 | S1/S2 (40/60) | W-1 | 0.05 | G-2 | SR-3 | 28 | 17.0 | 5.2 |

TABLE 4-continued

| Evaluation Result in EUV exposure | | | | | | | | | | | | | | |
|---|---|---|---|---|---|---|---|---|---|---|---|---|---|---|
| | Resin | Conc. | Acid generator | Conc. | Basic compound | Conc. | Organic Solvent(B) (molar ratio) | Surfactant (molar ratio) | Conc. | Developer | Rinse liquid | Contact hole resolution (nm) | Contact hole EL (%) | Local-CDU |
| Ex. 4-3 | A-3 | 97.95 | | | N-11 | 2 | S1/S2 (40/60) | W-1 | 0.05 | G-2 | SR-3 | 26 | 17.6 | 4.6 |
| Ex. 4-4 | A-4 | 97.95 | | | N-11 | 2 | S1/S3 (40/60) | W-1 | 0.05 | G-2 | SR-3 | 26 | 17.6 | 4.6 |
| Ex. 4-5 | A-5 | 97.95 | | | N-11 | 2 | S1/S2 (40/60) | W-2 | 0.05 | G-2 | SR-3 | 28 | 17.1 | 5.1 |
| Ex. 4-6 | A-6 | 97.95 | | | N-11 | 2 | S1/S2 (40/60) | W-1 | 0.05 | G-2 | SR-3 | 24 | 18.2 | 4.2 |
| Ex. 4-7 | A-7 | 97.95 | | | N-11 | 2 | S1/S2 (40/60) | W-4 | 0.05 | G-3 | SR-3 | 26 | 17.5 | 4.7 |
| Ex. 4-8 | A-8 | 97.95 | | | N-11 | 2 | S1/S2 (40/60) | W-1 | 0.05 | G-2 | SR-3 | 24 | 18.1 | 4.2 |
| Ex. 4-9 | A-9 | 98 | | | N-1 | 2 | S1/S2/S3 (30/60/10) | | | G-1 | SR-3 | 30 | 16.5 | 5.7 |
| Ex. 4-10 | A-10 | 97.95 | | | N-2 | 2 | S1/S2 (40/60) | W-1 | 0.05 | G-2 | SR-1 | 31 | 16.2 | 6.0 |
| Ex. 4-11 | A-11 | 97.95 | | | N-5 | 2 | S1/S2 (40/60) | W-1 | 0.05 | G-2 | SR-2 | 31 | 16.2 | 6.0 |
| Ex. 4-12 | A-12 | 96.95 | | | N-10 | 3 | S1/S2 (40/60) | W-1/W-2 (1/1) | 0.05 | G-12 | | 32 | 16.0 | 6.3 |
| Ex. 4-13 | A-13 | 97.95 | | | N-8 | 2 | S1/S2 (40/60) | W-3 | 0.05 | G-13 | SR-3 | 30 | 16.6 | 5.7 |
| Ex. 4-14 | A-14 | 97.95 | | | N-3 | 2 | S1/S2 (40/60) | W-1/W-2 (1/1) | 0.05 | G-14 | SR-3 | 30 | 16.5 | 5.6 |
| Ex. 4-15 | A-15 | 96.95 | | | N-7 | 3 | S1/S2 (40/60) | W-1 | 0.05 | G-9 | SR-3 | 30 | 16.6 | 5.7 |
| Ex. 4-16 | A-16 | 97 | | | N-5 | 3 | S1/S2/S3 (30/60/10) | | | G-10 | SR-1 | 30 | 16.5 | 5.6 |
| Ex. 4-17 | A-17 | 97.95 | | | N-3 | 2 | S1/S4 (40/60) | W-1 | 0.05 | G-11 | SR-2 | 30 | 16.5 | 5.7 |
| Ex. 4-18 | A-18 | 96.95 | | | N-4 | 3 | S1/S4 (40/60) | W-1 | 0.05 | G-4 | SR-3 | 29 | 16.8 | 5.4 |
| Ex. 4-19 | A-19 | 97.95 | | | N-11 | 2 | S1/S4 (40/60) | W-2 | 0.05 | G-5 | SR-3 | 29 | 16.7 | 5.5 |
| Ex. 4-20 | A-20 | 97.95 | | | N-11 | 2 | S1/S2 (40/60) | W-2 | 0.05 | G-6 | SR-3 | 27 | 17.3 | 4.9 |
| Ex. 4-21 | A-21 | 97.95 | | | N-6 | 2 | S1/S2 (40/60) | W-1 | 0.05 | G-7 | SR-3 | 29 | 16.7 | 5.5 |
| Ex. 4-22 | A-22 | 98.95 | | | N-9 | 1 | S1/S3 (40/60) | W-3 | 0.05 | G-8 | | 32 | 15.9 | 6.3 |
| Ex. 4-23 | A-23 | 97.95 | | | N-4 | 2 | S1/S2 (40/60) | W-1 | 0.05 | G-2 | SR-3 | 26 | 17.6 | 4.6 |
| Ex. 4-24 | A-24 | 97.95 | | | N-9 | 2 | S1/S2 (40/60) | W-1 | 0.05 | G-2 | SR-3 | 27 | 17.3 | 4.9 |
| Ex. 4-25 | A-25 | 97.95 | | | N-6 | 2 | S1/S2 (40/60) | W-1 | 0.05 | G-2 | SR-3 | 25 | 17.8 | 4.5 |
| Ex. 4-26 | A-26 | 97.95 | | | N-6 | 2 | S1/S2 (40/60) | W-1 | 0.05 | G-2 | SR-3 | 25 | 17.7 | 4.4 |
| Ex. 4-27 | A-27 | 97.95 | | | N-6 | 2 | S1/S2 (40/60) | W-1 | 0.05 | G-2 | SR-3 | 25 | 17.8 | 4.5 |
| Ex. 4-28 | A-28 | 97.95 | | | N-6 | 2 | S1/S2 (40/60) | W-1 | 0.05 | G-2 | SR-3 | 26 | 17.5 | 4.7 |
| Ex. 4-29 | A-6 | 97.95 | | | N-11 | 2 | S1/S2 (40/60) | W-1 | 0.05 | G-15 | SR-3 | 25 | 17.7 | 4.4 |
| Ex. 4-30 | A-3 | 97.95 | | | N-11 | 2 | S1/S2 (40/60) | W-1 | 0.05 | G-16 | SR-3 | 27 | 17.3 | 4.9 |
| Ex. 4-31 | A-25 | 97.95 | | | N-6 | 2 | S1/S2 (40/60) | W-1 | 0.05 | G-17 | SR-3 | 25 | 17.8 | 4.4 |
| Ex. 4-32 | A-4 | 97.95 | | | N-11 | 2 | S1/S3 (40/60) | W-1 | 0.05 | G-18 | SR-3 | 27 | 17.3 | 4.9 |
| Ex. 4-33 | A-5 | 97.95 | | | N-11 | 2 | S1/S2 (40/60) | W-2 | 0.05 | G-19 | SR-3 | 29 | 16.8 | 5.5 |
| Ex. 4-34 | A-29 | 99 | | | N-3 | 1 | S1/S2 (40/60) | | | G-1 | | 30 | 16.5 | 5.4 |
| Ex. 4-35 | A-30 | 98 | | | N-5 | 2 | S1/S2 (20/80) | | | G-2 | | 31 | 16.2 | 5.7 |
| Ex. 4-36 | A-4/A-5 | 49/49 | | | N-3 | 2 | S1/S2 (30/70) | | | G-3 | | 27 | 17.3 | 4.8 |
| Ex. 4-37 | A-29 | 98 | | | N-5/N-7 | 1/1 | S1/S2 (50/50) | | | G-2 | SR-3 | 31 | 16.1 | 5.6 |
| Co Ex. 4-1 | RA-1 | 89.95 | Z-10 | 8 | N-11 | 2 | S1/S2 (40/60) | W-1 | 0.05 | g-1 | SR-3 | 36 | 13.5 | 8.0 |

TABLE 4-continued

Evaluation Result in EUV exposure

| | Resin | Conc. | Acid generator | Conc. | Basic compound | Conc. | Organic Solvent(B) (molar ratio) | Surfactant (molar ratio) | Conc. | Developer | Rinse liquid | Contact hole resolution (nm) | Contact hole EL (%) | Local-CDU |
|---|---|---|---|---|---|---|---|---|---|---|---|---|---|---|
| Co Ex. 4-2 | A-1 | 97.95 | | | N-11 | 2 | S1/S2 (40/60) | W-1 | 0.05 | g-1 | SR-3 | 36 | 14.5 | 7.8 |
| Co Ex. 4-3 | RA-1 | 89.95 | Z-10 | 8 | N-11 | 2 | S1/S2 (40/60) | W-1 | 0.05 | G-2 | SR-3 | 34 | 15.2 | 7.6 |

The concentration of each component represents a concentration (% by mass) in the total solid concentration.

As seen from the above table, Examples 4-1 to 4-37 can simultaneously satisfy resolution for the contact hole, the exposure latitude (EL) and the uniformity of the local pattern (Local-CDU) in a highly advanced manner Here, as for Comparative Example 4-1 using a comparative polymer RA-1 and a low-molecular-weight acid generator Z-10 described in the example of Patent Document 8 and using a common organic-based developer, which does not contain an “additive forming at least one interaction of ionic bond, hydrogen bond, chemical bond and dipole interaction with polar group (hereinafter, simply referred to as the “additive”)” of the present invention, it was found that Comparative Example 4-3 using the organic-based developer containing the additive of the present invention was slightly improved in resolution and Local-CDU but was not very effective.

In contrast, as for Comparative Example 4-2 using resin having a repeating unit (R) with a structural moiety capable of decomposing upon irradiation with an actinic ray or radiation to generated acid and using the common organic-based developer, which does not contain the additive of the present invention, it was found that Examples 4-1 to 4-37 using the organic-based developer containing the additive of the present invention was remarkably improved in resolution and Local-CDU.

It is assumed that this result is due to the following reasons: when containing the additive of the present invention, above all, a nitrogen-containing compound (amines and the like) in the organic-based developer, there occurs interaction in which a salt is formed by an acidic group such as carboxylic acid generated in the exposed portion and the additive of the present invention in the organic-based developer, so that the exposed portion becomes more insoluble in the organic-based developer. As a result, a decrease in film reduction can be achieved, and resolution and Local-CDU can be enhanced due to the enhanced contrast.

However, in Comparative Example 4-3, only the interaction between the acidic group present in the polymer such as carboxylic acid and the additive of the present invention in the organic-based developer contributes to improvement on the performance of the film reduction, the resolution and the sensitivity, so that improvement effect is not big. On the contrary, as for Example 4-1 in which resin having the repeating unit (R) with the structural moiety capable of decomposing upon irradiation with an actinic ray or radiation to generated acid is used, sulfonic acid or the like generated in the polymer by the exposure further interacts with the additive of the present invention. Accordingly, it is expected that the resolution and Local-CDU will be more remarkably achieved.

Moreover, as for Examples 4-1 to 4-37 of the present invention, an acid generating portion is carried in resin, so that an acid diffusion length is short, with the result that EL is superior, as compared to Comparative Examples 4-1 and 4-3.

Further, it is apparent that Example 4-3 using resin further having a repeating unit containing a phenolic hydroxyl group represented by Formula (I) as well as the repeating unit (R) with the structural moiety that is decomposed upon irradiation with an actinic ray or radiation to generated acid, more considerably improves resolution, EL and Local-CDU, as compared to Example 4-2 using the repeating unit (R) with the structural moiety capable of decomposing upon irradiation with an actinic ray or radiation to generated acid, and resin A-2 that has the same structure as the repeating unit having a group capable of decomposing by the action of an acid but does not have the repeating unit represented by Formula (I). It is assumed that this result is due to the following reason: since the above-described repeating unit has the phenolic hydroxyl group, a lot of secondary electrons are generated and thereby a large amount of acid is generated, so that fast and much deprotection is done for the acid-decomposable group of the resin, and in addition, the repeating unit represented by Formula (I) interacts with the additive of the present invention. Further, based on the comparison of Example 4-3 or 4-5 with example 4-10, it can be seen that the effect is more remarkable and preferred when both $X_4$ and $L_4$ in the repeating unit represented by Formula (I) are a single bond, among repeating units represented by the same Formula (I).

Further, it can be seen that examples (for example, Examples 4-3, 4-4, 4-6, 4-8 and the like) using a resin having a repeating unit represented by Formula (II-1) or Formula (1) is particularly excellent in resolution, as compared to examples using a resin that does not have the repeating unit represented by Formula (II-1) or Formula (1) as in example 3-1, for example. The reason is assumed that the deprotection activation energy of the acid-decomposable group is low and carboxylic acid is easily generated from a small amount of acid.

Further, when comparing a case in which the rinsing process is performed using methyl isobutyl carbinol and the like with a case in which the rinsing process is not performed, the former is superior in resolution. The reason is why this rinsing process allows the dissolution of the polymer obtained by interacting the carboxylic acid or the phenol group present in the unexposed portion or the side-wall portion with the additive of the present invention.

The present invention is to provide a pattern forming method, an actinic ray-sensitive or radiation-sensitive resin composition, a resist film, a method of manufacturing an electronic device using the same, and an electronic device, which are capable of simultaneously satisfying high sensitivity, high resolution and performance of decreasing film reduction, a exposure latitude (EL), and a local-pattern-dimension uniformity (Local-CDU) in a highly advanced manner.

Although the present invention has been described with reference to detailed and specific aspects, it is obvious to those skilled in the art that various changes or modifications can be made without departing from the spirit and scope of the present invention.

The present application is based on Japanese Patent Application (Patent Application No. 2013-075279) filed on Mar. 29, 2013, Japanese Patent Application (Patent Application No. 2013-153102) filed on Jul. 23, 2013, and Japanese Patent Application (Patent Application No. 2014-064613) filed on Mar. 26, 2014, the contents of which are incorporated herein by reference.

What is claimed is:

1. A pattern forming method, comprising:

(1) forming a film using an actinic ray-sensitive or radiation-sensitive resin composition, (2) exposing the film with actinic ray or radiation, (3) developing the film exposed by using a developer containing an organic solvent, wherein the actinic ray-sensitive or radiation-sensitive resin composition contains (A) a resin having a repeating unit (R) with a structural moiety capable of decomposing upon irradiation with an actinic ray or radiation to generate an acid, and (B) a solvent, and the developer contains an additive that causes at least one interaction selected from the group consisting of an ionic bond, a hydrogen bond, a chemical bond and a dipole interaction with respect to a polar group contained in the resin (A) after the exposing, wherein the additive is at least one selected from a group consisting of an onium salt compound and a phosphorus-based compound.

2. The pattern forming method according to claim 1, wherein the additive is an onium salt compound.

3. The pattern forming method according to claim 1, wherein the structural moiety of the repeating unit (R) is a structural moiety capable of generating an acid group in a side chain of the resin (A) upon irradiation with an actinic ray or radiation.

4. The pattern forming method according to claim 3, wherein the structural moiety of the repeating unit (R), capable of generating an acid group in a side chain of the resin (A) upon irradiation with an actinic ray or radiation, is an ionic structural moiety.

5. The pattern forming method according to claim 3, wherein the acid group generated in the structural moiety of the repeating unit (R), capable of generating the acid group in the side chain of the resin (A) upon irradiation with an actinic ray or radiation, is a sulfonate group or an imidate group.

6. The pattern forming method according to claim 1, wherein the resin (A) further contains a repeating unit having a group capable of decomposing by the action of an acid.

7. The pattern forming method according to claim 6, wherein the repeating unit having the group capable of decomposing by the action of an acid is represented by Formula (II-1) or (1):

(II-1)

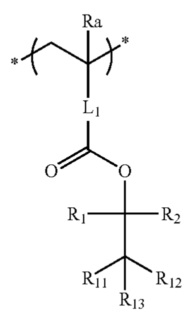

-continued (1)

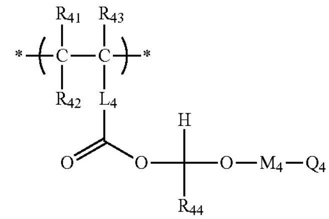

wherein, each of $R_1$ and $R_2$ independently represents an alkyl group, each of $R_{11}$ and $R_{12}$ independently represents an alkyl group, $R_{13}$ represents a hydrogen atom or an alkyl group, $R_{11}$ and $R_{12}$ may combine with each other to form a ring, $R_{11}$ and $R_{13}$ may combine with each other to form a ring, Ra represents a hydrogen atom, an alkyl group, a cyano group or a halogen, $L_1$ represents a single bond or a divalent linking group, each of $R_{41}$, $R_{42}$ and $R_{43}$ independently represents a hydrogen atom, an alkyl group, a cycloalkyl group, a halogen atom, a cyano group or an alkoxy carbonyl group, $R_{42}$ and $L_4$ may combine with each other to form a ring, in which $R_{42}$ represents an alkylene group, $L_4$ represents a single bond or a divalent linking group, and represents a trivalentlinking group when $R_{42}$ and $L_4$ combine with each other to form the ring, $R_{44}$ represents a hydrogen atom, an alkyl group, a cycloalkyl group, an aryl group, an aralkyl group, an alkoxy group, an acyl group or a heterocyclic group, $M_4$ represents a single bond or a divalent linking group, $Q_4$ represents an alkyl group, a cycloalkyl group, an aryl group or a heterocyclic group, and at least two of $Q_4$, $M_4$ and $R_{44}$ may combine with each other to form a ring.

8. The pattern forming method according to claim 7, wherein the repeating unit having the group capable of decomposing by the action of an acid is a repeating unit represented by Formula (1).

9. The pattern forming method of claim 1, wherein the resin (A) further contains a repeating unit represented by Formula (I):

(I)

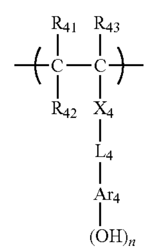

wherein each of $R_{41}$, $R_{42}$ and $R_{43}$ independently represents a hydrogen atom, an alkyl group, a halogen atom, a cyano group or an alkoxy carbonyl group, provided that $R_{42}$ may combine with $Ar_4$ to form a ring, and in this case, $R_{42}$ represents a single bond or an alkylene group, $X_4$ represents a single bond, —COO—, or —CONR$_{64}$—, and represents a trivalentlinking group when combining with $R_{42}$ to form a ring, $R_{64}$ represents a hydrogen atom or an alkyl group, $L_4$ represents a single bond or an alkylene group, $Ar_4$ represents a (n+1)-valent aromatic ring group, and represents a (n+2)-valent aromatic ring group when combining with $R_{42}$ to form a ring, and n is an integer of 1 to 4.

10. The pattern forming method according to claim 9, wherein $X_4$ and $L_4$ are a single bond.

11. A method of manufacturing an electronic device comprising the pattern forming method according to claim 1.

* * * * *